United States Patent
Whetsel

(10) Patent No.: US 9,746,515 B2
(45) Date of Patent: *Aug. 29, 2017

(54) ADDRESS-COMMAND PORT CONNECTED TO TRACE CIRCUITS AND TAP DOMAINS

(71) Applicant: TEXAS INSTRUMENTS INCORPORATED, Dallas, TX (US)

(72) Inventor: Lee D. Whetsel, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/336,139

(22) Filed: Oct. 27, 2016

(65) Prior Publication Data
US 2017/0045585 A1 Feb. 16, 2017

Related U.S. Application Data

(62) Division of application No. 15/075,808, filed on Mar. 21, 2016, now Pat. No. 9,506,985, which is a division
(Continued)

(51) Int. Cl.
*G01R 31/28* (2006.01)
*G01R 31/317* (2006.01)
(Continued)

(52) U.S. Cl.
CPC ... *G01R 31/31723* (2013.01); *G01R 31/3177* (2013.01); *G01R 31/31722* (2013.01);
(Continued)

(58) Field of Classification Search
CPC ........ G01R 31/31723; G01R 31/31722; G01R 31/31725; G01R 31/31727; G01R 31/3177; G01R 31/338555; G01R 31/318558; G01R 31/318572; G06F 11/267; G06F 11/27; G06F 11/261; G06F 11/3466
(Continued)

(56) References Cited

U.S. PATENT DOCUMENTS 4,691,316 A 9/1987 Phillips
5,367,394 A 11/1994 Chuter et al.
(Continued)

*Primary Examiner* — Christine Tu
(74) *Attorney, Agent, or Firm* — Lawrence J. Bassuk; Charles A. Brill; Frank D. Cimino

(57) ABSTRACT

An address and command port interface selectively enables JTAG TAP domain operations and Trace domain operations within an IC. The port carries TMS and TDI input and TDO output on a single pin and receives a clock signal on a separate pin. The addressable two pin interface loads and updates instructions and data to the TAP domain within the IC. The instruction or data update operations in multiple ICs occur simultaneously. A process transmits data from an addressed target device to a controller using data frames, each data frame comprising a header bit and data bits. The logic level of the header bit is used to start, continue, and stop the data transmission to the controller. A data and clock signal interface between a controller and multiple target devices provides for each target device to be individually addressed and commanded to perform a JTAG or Trace operation.

4 Claims, 81 Drawing Sheets

Related U.S. Application Data of application No. 14/939,100, filed on Nov. 12, 2015, now Pat. No. 9,322,877, which is a division of application No. 14/802,685, filed on Jul. 17, 2015, now Pat. No. 9,218,263, which is a division of application No. 14/531,459, filed on Nov. 3, 2014, now Pat. No. 9,116,208, which is a division of application No. 14/297,051, filed on Jun. 5, 2014, now Pat. No. 8,910,003, which is a division of application No. 14/097,738, filed on Dec. 5, 2013, now Pat. No. 8,819,510, which is a division of application No. 13/851,587, filed on Mar. 27, 2013, now Pat. No. 8,631,293, which is a division of application No. 13/627,553, filed on Sep. 26, 2012, now Pat. No. 8,433,963, which is a division of application No. 13/364,514, filed on Feb. 2, 2012, now abandoned, which is a division of application No. 12/970,148, filed on Dec. 16, 2010, now Pat. No. 8,136,002, which is a division of application No. 12/822,694, filed on Jun. 24, 2010, now Pat. No. 7,877,654, which is a division of application No. 12/493,881, filed on Jun. 29, 2009, now Pat. No. 7,770,084, which is a division of application No. 11/463,479, filed on Aug. 9, 2006, now Pat. No. 7,571,364.

(60) Provisional application No. 60/706,633, filed on Aug. 9, 2005.

(51) Int. Cl.
*G06F 11/27* (2006.01)
*G01R 31/3185* (2006.01)
*G01R 31/3177* (2006.01)
*G06F 11/26* (2006.01)
*G06F 11/34* (2006.01)

(52) U.S. Cl.
CPC . *G01R 31/31725* (2013.01); *G01R 31/31727* (2013.01); *G01R 31/318572* (2013.01); *G06F 11/27* (2013.01); *G06F 11/261* (2013.01); *G06F 11/3466* (2013.01)

(58) Field of Classification Search
USPC ........ 714/730–731, 733–734, 724, 742, 726, 714/741–744, 30–34, 46
See application file for complete search history.

(56) References Cited

U.S. PATENT DOCUMENTS

| | | |
|---|---|---|
| 5,654,971 A | 8/1997 | Heitele et al. |
| 5,898,704 A | 4/1999 | Kawano |
| 6,154,856 A | 11/2000 | Madduri et al. |
| 6,189,140 B1 | 2/2001 | Madduri |
| 6,430,718 B1 * | 8/2002 | Nayak .............. G01R 31/31853 714/727 |
| 6,567,942 B1 | 5/2003 | Shepard, III |
| 6,631,504 B2 * | 10/2003 | Dervisoglu ...... G01R 31/31853 716/136 |
| 6,687,811 B1 | 2/2004 | Yamada |
| 6,721,317 B2 | 4/2004 | Chong, Jr. |
| 6,760,865 B2 | 7/2004 | Ledford et al. |
| 6,886,121 B2 | 4/2005 | Dervisoglu et al. |
| 6,922,795 B2 | 7/2005 | Miyayama et al. |
| 6,988,232 B2 | 1/2006 | Ricchetti et al. |
| 7,007,201 B1 | 2/2006 | Byrne et al. |
| 7,017,081 B2 | 3/2006 | Gomez |
| 7,088,704 B1 | 8/2006 | Byers et al. |
| 7,106,730 B1 | 9/2006 | Bass et al. |
| 7,213,186 B2 | 5/2007 | Chien |
| 7,278,073 B2 | 10/2007 | Kimelman et al. |
| 7,310,749 B2 | 12/2007 | Swoboda et al. |
| 7,337,366 B2 | 2/2008 | Taniguchi |
| 7,376,137 B2 | 5/2008 | Sung et al. |
| 7,383,367 B2 | 6/2008 | Nardini et al. |
| 7,386,775 B2 | 6/2008 | Birmiwal et al. |
| 7,421,633 B2 * | 9/2008 | Whetsel ............. G01R 31/3172 714/726 |
| 7,493,535 B2 | 2/2009 | Whetsel |
| 7,500,162 B2 | 3/2009 | Smith |
| 7,551,907 B2 | 6/2009 | French et al. |
| 7,565,576 B2 | 7/2009 | Seroff |
| 7,830,917 B2 | 11/2010 | Sato |
| 8,065,574 B1 | 11/2011 | Cheng et al. |
| 8,073,996 B2 | 12/2011 | Cardoso |
| 8,145,959 B2 | 3/2012 | Mims et al. |
| 8,375,264 B2 | 2/2013 | Whetsel |
| 8,407,528 B2 | 3/2013 | Larson |
| 8,473,794 B2 | 6/2013 | Whetsel |
| 8,775,884 B2 | 7/2014 | Portolan et al. |
| 8,910,003 B2 | 12/2014 | Whetsel |
| 8,978,017 B2 | 3/2015 | Sohm et al. |
| 2010/0332909 A1 | 12/2010 | Larson |
| 2016/0077156 A1 | 3/2016 | Whetsel |

* cited by examiner

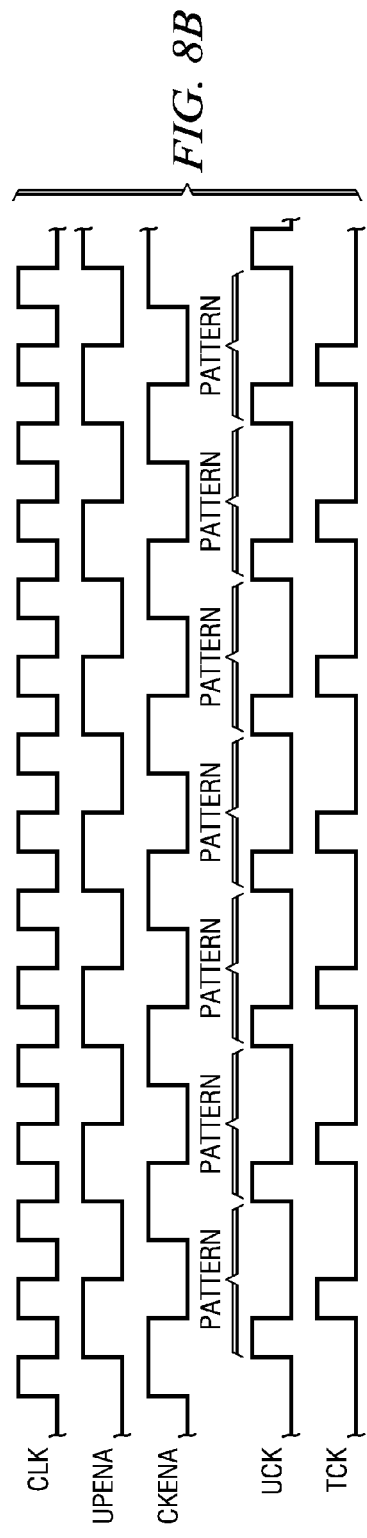
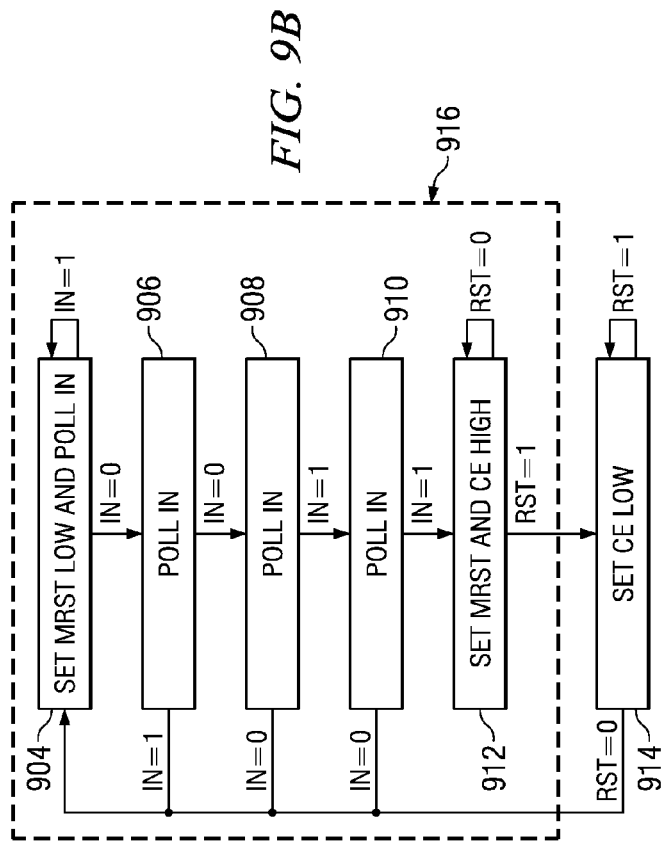
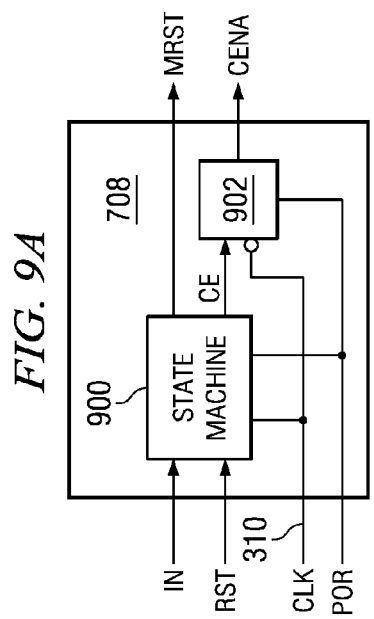

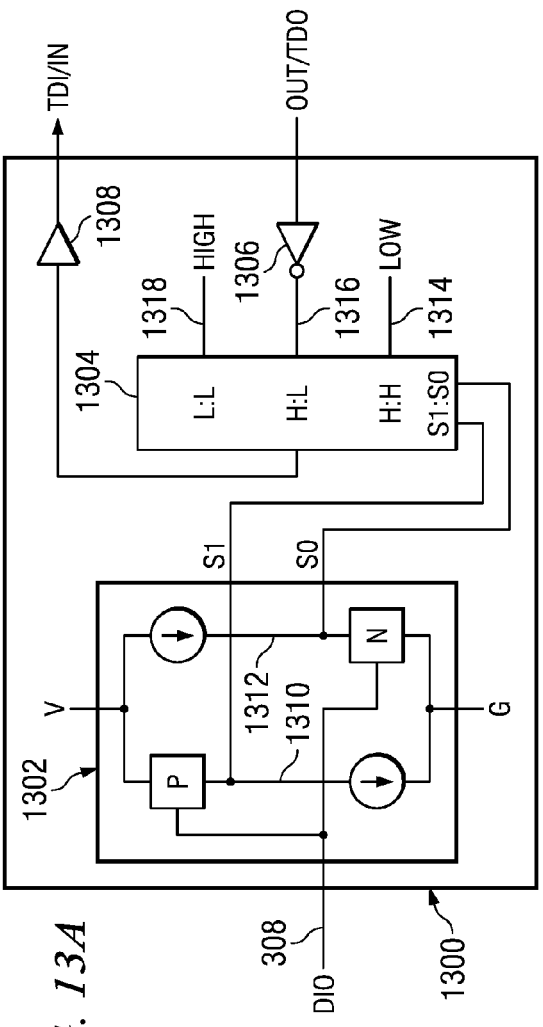
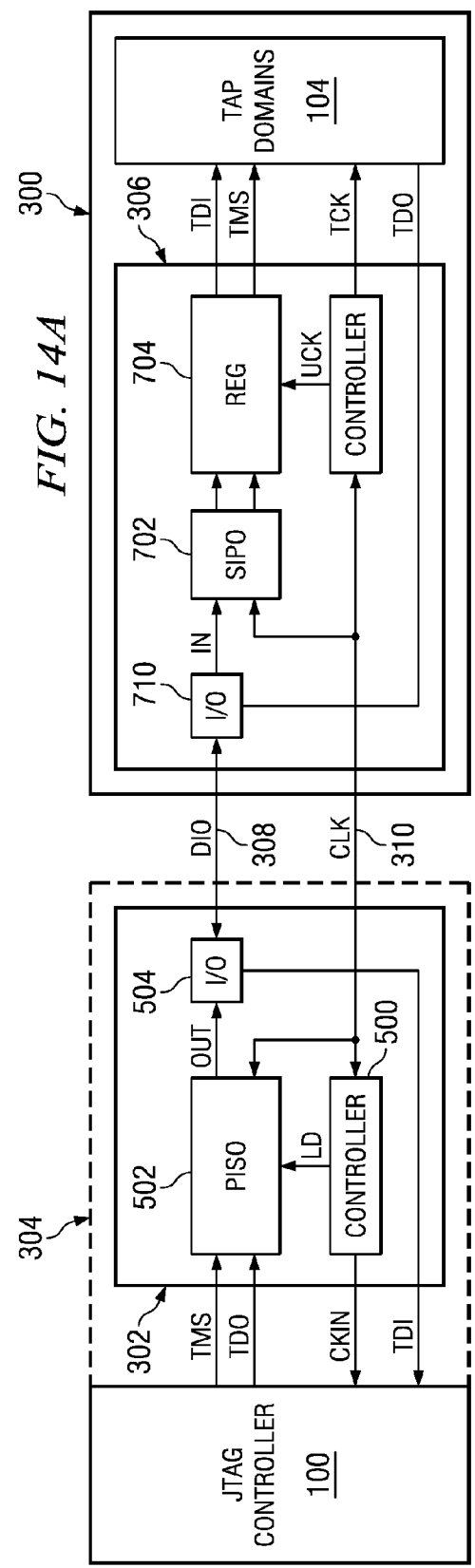

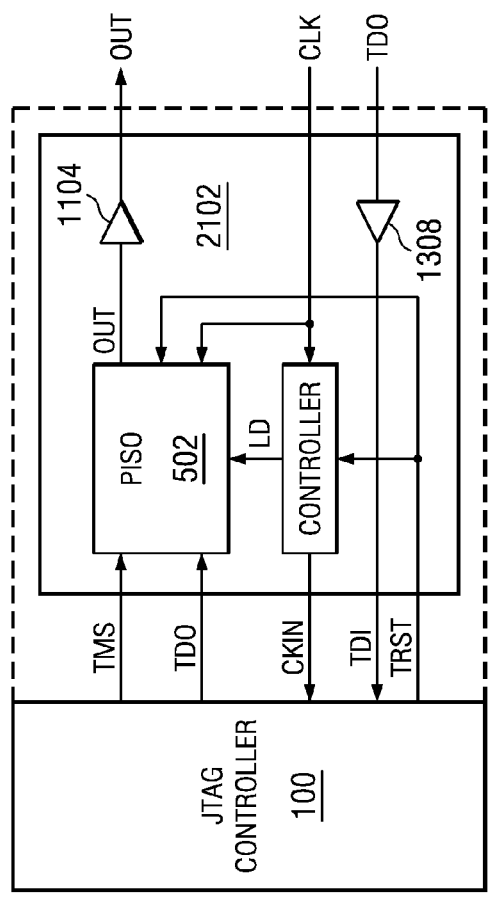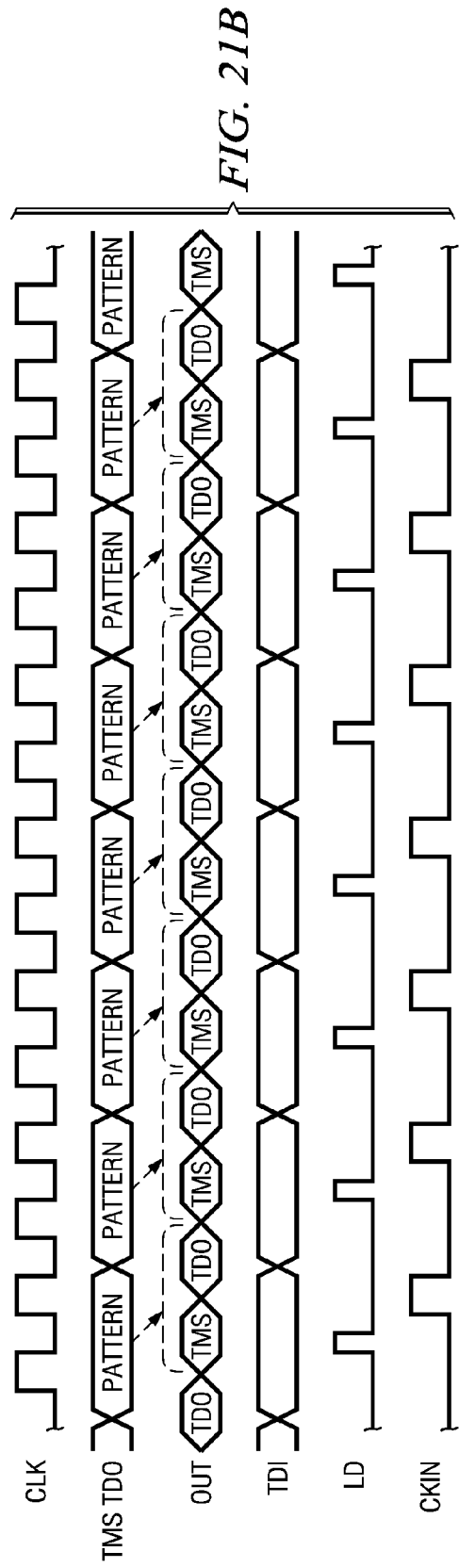

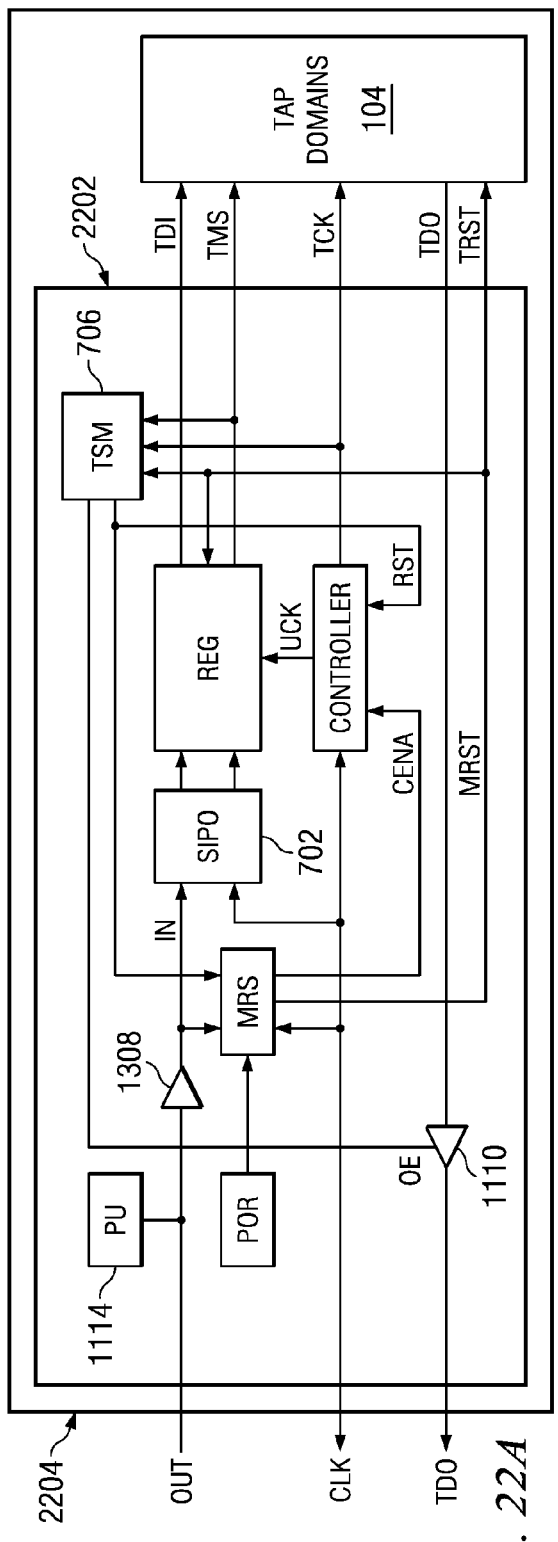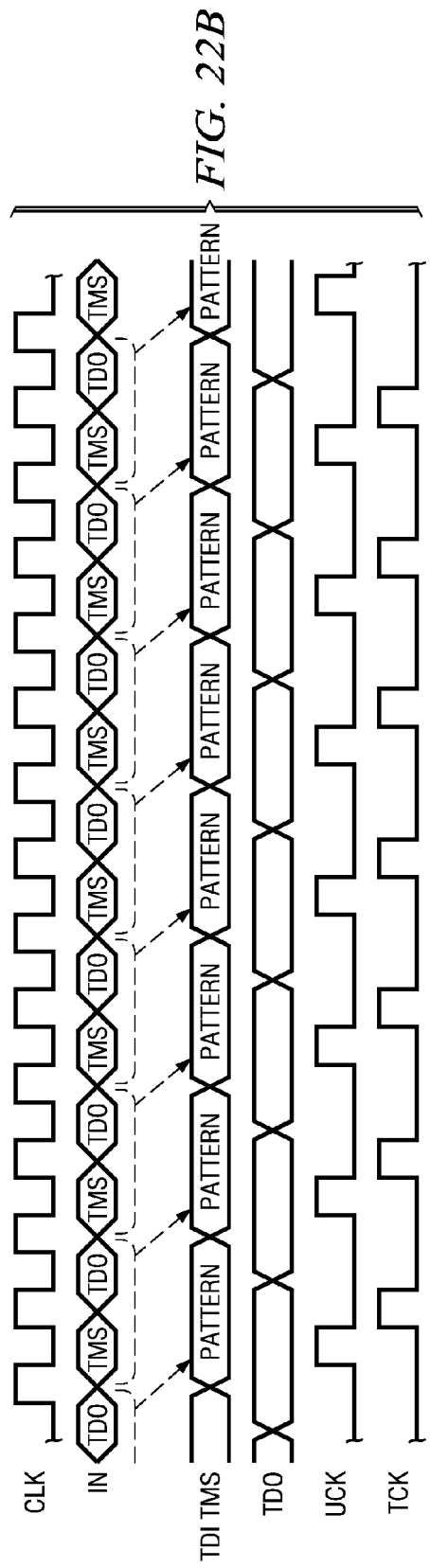
FIG. 22A
FIG. 22B

ADDRESS-COMMAND PORT CONNECTED TO TRACE CIRCUITS AND TAP DOMAINS

CROSS-REFERENCE TO RELATED APPLICATIONS

This Application is a divisional of prior application Ser. No. 15/075,808, filed Mar. 21, 2016, now U.S. Pat. No. 9,506,985, issued Nov. 29, 2016;

Which was a divisional of prior application Ser. No. 14/939,100, filed Nov. 12, 2015, now U.S. Pat. No. 9,322,877, granted Apr. 26, 2016;

Which was a divisional of prior application Ser. No. 14/802,685, filed Jul. 17, 2015, now U.S. Pat. No. 9,218,263, granted Dec. 22, 2015;

Which was a divisional of prior application Ser. No. 14/531,459, filed Nov. 3, 2014, now U.S. Pat. No. 9,116,208, granted Aug. 25, 2015;

Which was a divisional of prior application Ser. No. 14/297,051, filed Jun. 5, 2014, now U.S. Pat. No. 8,910,003, granted Dec. 9, 2014;

Which was a divisional of prior application Ser. No. 14/097,738, filed Dec. 5, 2013, now U.S. Pat. No. 8,819,510, granted Aug. 26, 2014;

Which was a divisional of prior application Ser. No. 13/851,587, filed Mar. 27, 2013, now U.S. Pat. No. 8,631,293, granted Jan. 14, 2014;

Which was a divisional of prior application Ser. No. 13/627,553, filed Sep. 26, 2012, now U.S. Pat. No. 8,433,963, granted Apr. 30, 2013;

Which was a divisional of prior application Ser. No. 13/364,514, filed Feb. 2, 2012, now abandoned;

Which was a divisional of prior application Ser. No. 12/970,148, filed Dec. 16, 2010, now U.S. Pat. No. 8,136,002, granted Mar. 13, 2012;

Which was a divisional of prior application Ser. No. 12/822,694, filed Jun. 24, 2010, now U.S. Pat. No. 7,877,654, granted Jan. 25, 2011;

Which was a divisional of prior application Ser. No. 12/493,881, filed Jun. 29, 2009, now U.S. Pat. No. 7,770,084, granted Aug. 3, 2010;

which was a divisional of prior application Ser. No. 11/463,479, filed Aug. 9, 2006, now U.S. Pat. No. 7,571,364, granted Aug. 4, 2009;

which claimed priority from Provisional Application No. 60/706,633, filed Aug. 9, 2005.

This disclosure is related to the following pending US patent applications and patents:

Application Ser. No. 11/292,643, filed Dec. 2, 2005, now U.S. Pat. No. 7,308,629, granted Dec. 11, 2007;

Application Ser. No. 11/293,061, filed Dec. 2, 2005, now U.S. Pat. No. 7,328,387, granted Feb. 5, 2008;

Application Ser. No. 11/258,315, filed Oct. 25, 2005, now U.S. Pat. No. 8,412,853, granted Apr. 2, 2013;

Application Ser. No. 08/918,872, filed Aug. 26, 1997, now U.S. Pat. No. 6,073,254, granted Jun. 6, 2000;

Application Ser. No. 11/292,597, filed Dec. 2, 2005, now U.S. Pat. No. 7,571,366, granted Aug. 4, 2009;

Application Ser. No. 08/427,947, filed Apr. 24, 1995, now U.S. Pat. No. 5,483,518, granted Jan. 9, 1996;

Application Ser. No. 11/370,017, filed Mar. 7, 2006, now U.S. Pat. No. 7,421,633, granted Sep. 2, 2008;

Application Ser. No. 07/308,272, filed Feb. 8, 1989, now U.S. Pat. No. 5,001,713, granted Mar. 19, 1991;

Application Ser. No. 07/668,715, filed Mar. 12, 1991, now U.S. Pat. No. 5,103,450, granted Apr. 7, 1992;

Application Ser. No. 08/542,746, filed Oct. 13, 1995, now U.S. Pat. No. 5,623,500, granted Apr. 22, 1997;

Application Ser. No. 08/134,510, filed Oct. 8, 1993; now U.S. Pat. No. 5,353,308, granted Oct. 4, 1994; and Application Ser. No. 08/929,389, filed Sep. 15, 1997, now U.S. Pat. No. 5,905,738, granted May 18, 1999.

BACKGROUND OF THE DISCLOSURE

This disclosure relates in general to IC signal interfaces and in particular to IC signal interfaces related to JTAG based test, emulation, debug, and trace operations. This disclosure is a further development of a previous disclosure (TI-60187) titled "Optimized JTAG Interface". The previous material of TI-60187 is completely incorporated into this new disclosure. The new material of this disclosure starts with FIG. 29.

DESCRIPTION OF THE RELATED ART

FIG. 1 illustrates a conventional 5 wire JTAG interface 106 between an external JTAG controller 100 and Tap Domains 104 within a target IC 102. Modern day ICs typically have a Tap Domain associated with the IC's JTAG boundary scan test operations and/or one or more Tap Domains associated with each one or more core circuits designed into the IC. The interface couples the TDO output of JTAG controller to the IC's TDI pin input, the TMS output of the JTAG controller to the IC's TMS pin input, the TCK output of the JTAG controller to the IC's TCK pin input, the TDI input of the JTAG controller to the IC's TDO pin output, and the TRST output of the JTAG controller to the IC's TRST pin input. The IC's TDI, TDO, TMS, TCK, and TRST pins 108 are dedicated for interfacing to the JTAG controller and cannot be used functionally.

In response to the TMS and TCK signals, the Tap Domains 104 of IC 102 communicates data to and from the JTAG controller via the TDO to TDI connections. A low output on the JTAG controller's TRST output causes the Tap Domains of IC 102 to enter a reset state. The JTAG controller receives a clock input (CKIN) from a clock source 110. The CKIN input times the operation of the JTAG controller, which in turn times the operation of the Tap Domains in IC 102. The JTAG controller can be used to perform test, emulation, debug, and trace operations in the target IC by accessing the embedded Tap Domains via the 5 wire interface. The arrangement between the JTAG controller and the target IC and its use in performing test, emulation, debug, and trace operations is well known in the industry.

FIG. 2 illustrates an alternate arrangement whereby a JTAG controller 200 is interfaced to a target IC 202 via the JTAG bus 108 and a Debug/Trace bus 204. The JTAG controller 200 differs from the JTAG controller of FIG. 1 in that it includes additional circuitry and input/outputs for interfacing to the IC's Debug/Trace circuitry 204. As in FIG. 1, the JTAG bus 108 is coupled to Tap Domains 104 within the IC via IC pins 108. The Debug/Trace bus 204 is coupled to Debug/Trace circuitry 206 within the IC via N IC pins 208. The JTAG bus is used to input commands and data that enable the Debug/Trace circuitry to perform debug and/or trace operations. The Debug/Trace bus signals can be used for a myriad of operations including but not limited to; (1) importing and/or exporting data between the JTAG controller 200 and Debug/Trace circuitry 206 during debug and/or trace operations, (2) operating as a communications bus between the JTAG controller 200 and Debug/Trace circuitry 206, and (3) inputting and/or outputting trigger signals between the JTAG controller 200 and Debug/Trace circuitry 206 during debug and trace operations.

One of the key advantages of the debug/trace bus 204 is that it increases the data input/output bandwidth between the JTAG controller and target IC during debug/trace operation over what is possible using only the 5 wire JTAG bus 106. For example, the data input/output bandwidth of the JTAG bus is limited to the amount of data that can flow between the JTAG controller and IC over the single TDO to TDI signal wire connections. Since the debug/trace bus can have N signal wire connections between the JTAG controller and IC (N), its data bandwidth can be much greater than the JTAG bus bandwidth. Increased data bandwidth between the JTAG controller and IC facilitates debug/trace operations such as; (1) monitoring real time code execution, (2) accessing embedded memories, (3) uploading/downloading code during program debug, and (4) triggered output trace functions.

With the current trend towards smaller IC packaging to allow more ICs to be placed on smaller assemblies used in mobile applications, such as cell phones and personal digital assistants, the number of IC pins is being reduced. The present disclosure provides a reduced pin count interface on ICs for test, emulation, debug, and trace operations; this will allow more IC pins to be available for functional purposes. While it is advantageous to reduce the pin counts of both the JTAG and Debug/Trace buses of FIGS. 1 and 2, the disclosure of this application focuses on reducing the JTAG bus pins of an IC.

In addition to reducing the JTAG bus pins of an IC, a second aspect of the present disclosure is to maintain a high communication bandwidth over the reduced JTAG pins. As will be shown, the present disclosure provides a data communication bandwidth using the reduced JTAG pins that is equal to one half the data communication bandwidth using a full set of JTAG pins. For example, if the JTAG controller 100 can communicate data to and from Tap Domains 104 of FIG. 1 at 100 Mhz using the full JTAG bus 106, a JTAG controller adapted according to the present disclosure can communicate data to and from Tap Domains 104 of an IC, also adapted according to the present disclosure, at 50 Mhz.

One prior art technique, referenced herein, is called the J-Link System. The J-Link system provides a way to reduce the JTAG pins of an IC from the standard five pins to a reduced set of one or two pins. In a chart shown in the J-Link reference, it is seen that the J-Link interface provides a data communication bandwidth that is one sixth that of the conventional JTAG 5 pin interface. For example and as stated in the J-Link reference, if the standard 5 pin JTAG interface can operate at 48 Mhz, the J-Link interface operates at one sixth of the 48 Mhz frequency, or at 8 Mhz. In comparison and as will be shown herein, if the standard 5 pin JTAG interface can operate at 48 Mhz, the reduce pin approach of the present disclosure can operate at one half the 48 Mhz frequency, or at 24 Mhz. Thus the present disclosure provides a three times improvement in operating frequency over the referenced J-Link approach. The present disclosure is therefore capable of performing operations related to IC test, debug, emulation, and trace at three times the bandwidth of the referenced J-Link approach.

SUMMARY OF THE DISCLOSURE

The present disclosure provides a reduced pin interface for JTAG based test, emulation, debug, and trace transactions between a JTAG controller and a target IC.

An addressable interface selectively enables JTAG TAP domain operations or Trace domain operations within an IC. After being enabled, the TAP receives TMS and TDI input from a single data pin. After being enabled, the Trace domain acquires data from a functioning circuit within the IC in response to a first clock and outputs the acquired data from the IC in response to a second clock.

An addressable two pin interface loads and updates instructions and data to a TAP domain within the IC. The instruction or data update operations in multiple ICs occur simultaneously.

A process transmits data from an addressed target device to a controller using data frames, each data frame comprising a header bit and data bits. The logic level of the header bit is used to start, continue, and stop the data transmission to the controller.

A data and clock signal interface between a controller and multiple target devices provides for each target device to be individually addressed and commanded to perform a JTAG or Trace operation.

Trace circuitry within an IC can operate autonomously to store and output functional data occurring in the IC. The store and output operations of the trace circuitry are transparent to the functional operation of the IC.

An auto-addressing RAM memory stores input data at an input address generated in response to an input clock, and outputs stored data from an output address generated in response to an output clock.

DESCRIPTION OF THE VIEWS OF THE DRAWINGS

FIG. 8B illustrates a timing diagram of the operation of the controller of FIG. 8A.

FIG. 9A illustrates a circuit example of the master reset and synchronizer (MRS) circuit within the SPC circuit of FIG. 7A.

FIG. 9B illustrates a state diagram of the operation of the MRS circuit of FIG. 9A.

FIG. 13A illustrates an example circuit for determining the appropriate TDI or IN signal output of the I/O circuits of FIG. 11.

FIG. 13B illustrates the truth table used for determining the appropriate TDI or IN signal output based on the voltage level of the data I/O (DIO) signal.

FIG. 14A illustrates the 2 signal connection between the PSC of the JTAG controller and the SPC of the target IC according to the present disclosure.

FIG. 21A illustrates an alternate circuit example of the parallel to serial controller (PSC) circuit of the present disclosure.

FIG. 21B illustrates a timing diagram of the operation of the alternate PSC circuit of FIG. 5A.

FIG. 22A illustrates an alternate circuit example of the serial to parallel controller (SPC) circuit of the present disclosure.

FIG. 22B illustrates a timing diagram of the operation of the SPC circuit of FIG. 7A.

DETAILED DESCRIPTION

Figure 3:
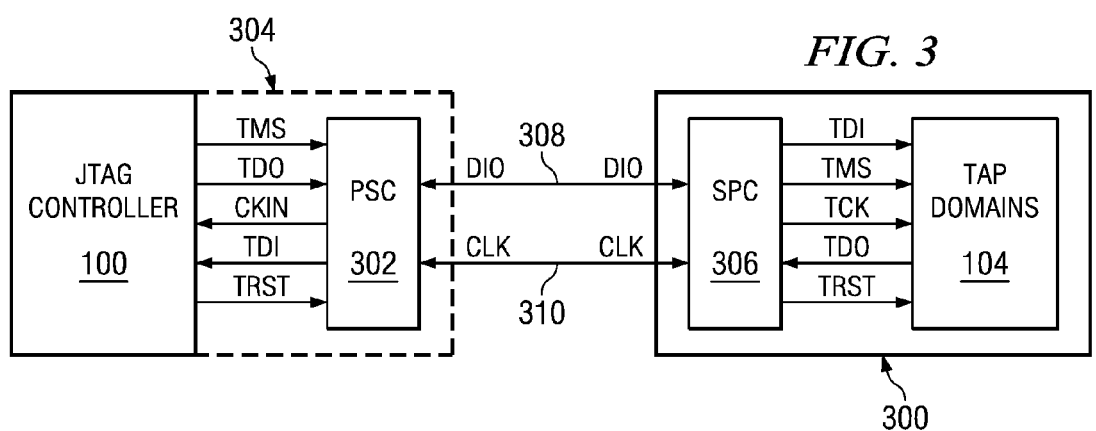
FIG. 3 illustrates a JTAG controller interfaced to a target IC via a 2 signal JTAG bus according to the present disclosure.

FIG. 3 illustrates the approach of the present disclosure to reduce the number of JTAG pins on an IC 300 and the number of JTAG bus signal connections between the IC 300 and JTAG controller 100. IC 300 and others illustrated in this disclosure could represent any type of integrated circuit including but not limited to, a microcontroller IC, a microprocessor IC, a digital signal processor IC, a mixed signal IC, an FPGA/CPLD IC, an ASIC, a system on chip IC, a peripheral IC, a ROM memory IC, or a RAM memory IC. In FIG. 3, the JTAG controller 100 is interfaced to a Parallel to Serial Controller (PSC) circuit 302 via TDO, TMS, CKIN, TDI, and TRST signals. The PSC 302 may be a separate circuit from the JTAG controller 100 or the PSC 302 and JTAG controller 100 may be integrated to form a new JTAG controller 304. The PSC 302 is interfaced to a Serial to Parallel Controller (SPC) circuit 306 in IC 300 via a bus comprising a data I/O (DIO) signal 308 and a clock (CLK) signal 310. The SPC 306 is interfaced to Tap Domains 104 in the IC 300 via TDI, TMS, TCK, TDO, and TRST signals. As will be described later in regard to FIGS. 16-20, the CLK signal 310 may be driven by a clock source associated with the JTAG controller 100, a clock source associated with the IC 300, or a clock source not associated with the JTAG controller 100 or IC 300.

Figure 4A:
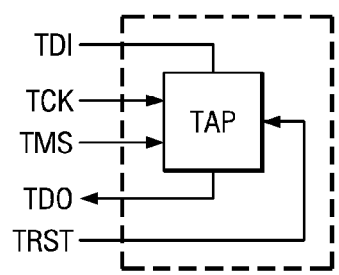
FIGS. 4A-4C illustrate various conventional Tap Domain arrangements within a target IC.

FIG. 4A illustrates that the Tap Domain block 104 of IC 300 may consist of a single 1149.1 Tap architecture.

Figure 4B:
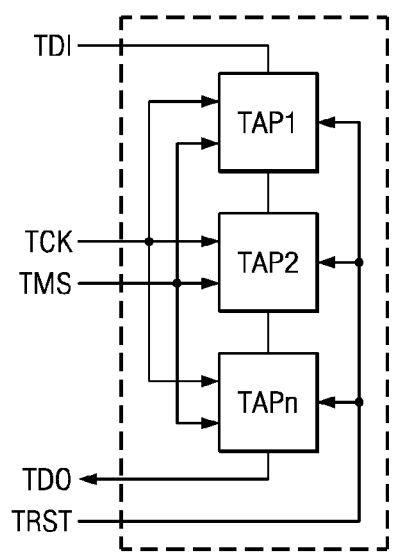

FIG. 4B illustrates that the Tap Domain block 104 of IC 300 may consist of a series of daisy-chained Tap architectures 1-N.

Figure 4C:
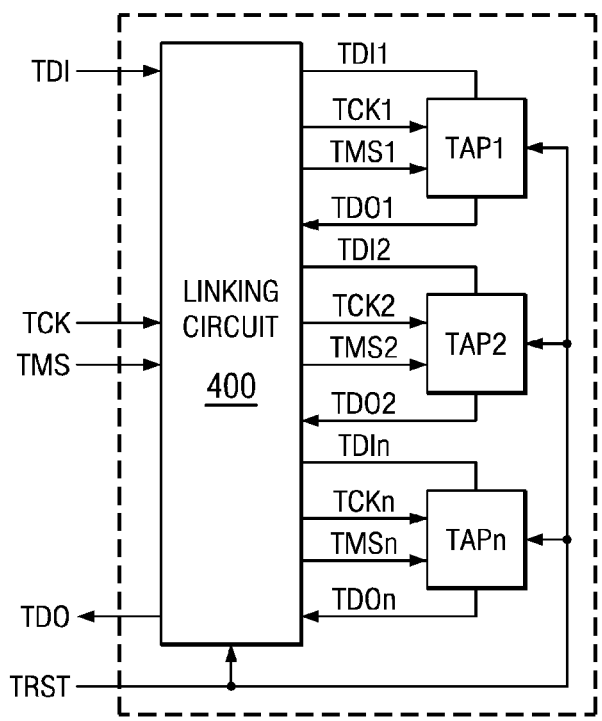

FIG. 4C illustrates that the Tap Domain block 104 of IC 300 may consist of a group of Tap architectures 1-N that may be selected individually or linked serially together in various daisy-chain arrangements using linking circuitry 400. An example of such linking circuitry 400 has been described in referenced U.S. Pat. No. 6,073,254.

Figure 5A:
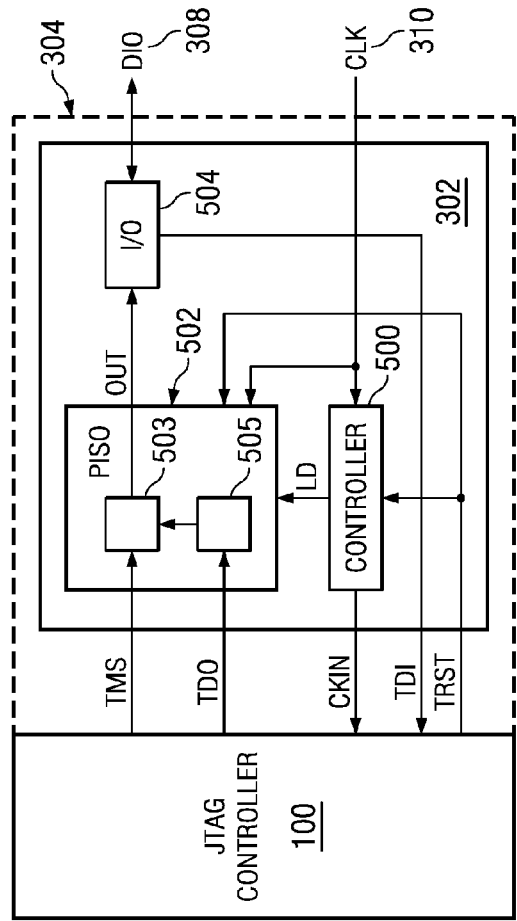
FIG. 5A illustrates a circuit example of the parallel to serial controller (PSC) circuit of the present disclosure.

FIG. 5A illustrates the PSC circuit 302 in more detail. The PSC consists of a controller 500, a parallel input serial output (PISO) register 502, and an input/output (I/O) circuit 504. PISO 502 inputs parallel TMS and TDO signals from the JTAG controller 100, the TRST signal from the JTAG controller 100, a load (LD) signal from controller 500, and outputs a serial output (OUT) signal to I/O circuit 504.

A simplified view of PISO 502 shows it containing two serially connected FFs 503 and 505. While the TRST signal from the JTAG controller is low, FFS 503 and 505 are asynchronously set to logic ones and do not respond to the CLK or LD inputs. This can be achieved, for example, by connecting the TRST signal to the Set input of FFs 503 and 505. The OUT signal is therefore high while TRST is low. When TRST goes high FFS 503 and 505 are enabled to respond to the CLK and LD inputs. In response to the LD input, FFs 503 and 505 asynchronously load TMS and TDO output from the JTAG controller, respectively. Once loaded, the FFs are shifted by CLK 310 to output TMS then TDO signals to I/O circuit 504 via the OUT signal.

Controller 500 inputs the CLK signal 310, the TRST signal from the JTAG controller 100. Controller 500 outputs the asynchronous LD signal to the PISO and a clock signal to the CKIN input of JTAG controller 100. While TRST is low, the controller is reset and does not respond to the CLK input. While reset the LD and CKIN outputs from the controller are low. When TRST goes high, the controller is enabled to respond to the CLK input and output LD and CKIN output signals.

I/O circuit 504 inputs the OUT signals from the PISO and outputs them on DIO 308. The I/O circuit 504 also inputs signals from DIO 308 and outputs them to the TDI input of JTAG controller 100. I/O circuit 504 is designed to allow the output of OUT signals to DIO 308 and the input of TDI signals from DIO 308 to occur simultaneously. The simultaneous input and output operation of I/O circuit 504 will be described in detail later in regard to FIGS. 11A, 11B, 12, 13A, and 13B.

Figure 5B:
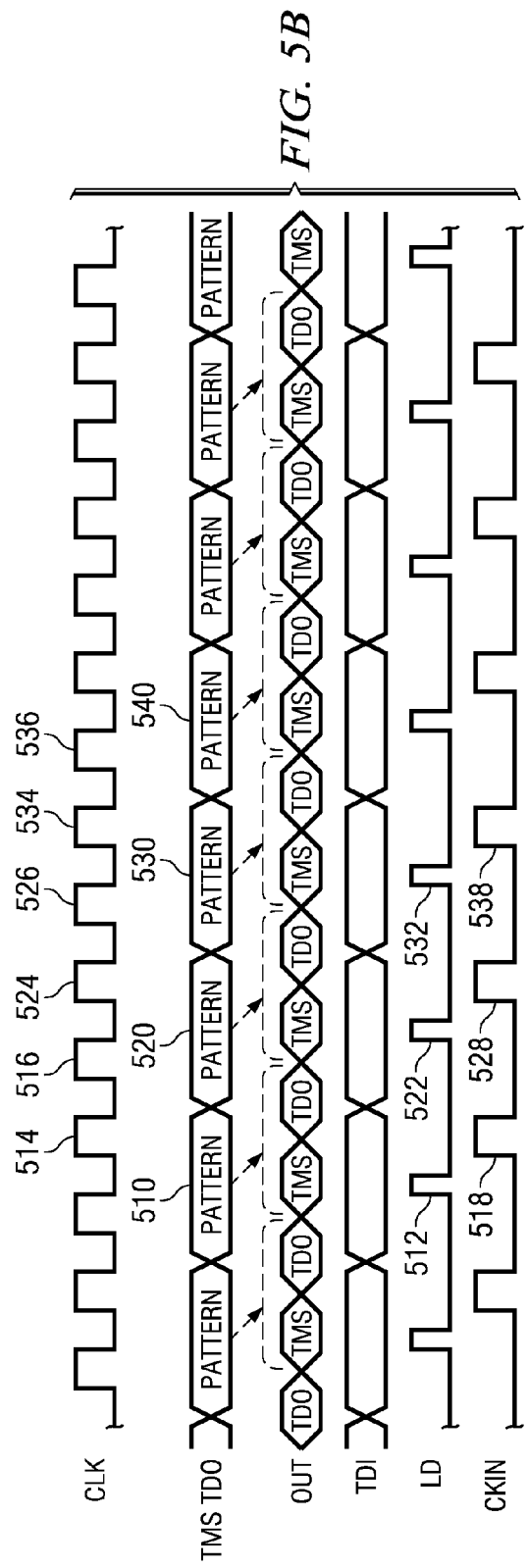
FIG. 5B illustrates a timing diagram of the operation of the PSC circuit of FIG. 5A.

The operation of PSC 302 (while TRST is high) is illustrated in the timing diagram of FIG. 5B. In response to the CLK input 310, the controller 500 operates to periodically output the LD signal to PISO 502 and the CKIN signal to JTAG controller 100. Also the CLK input 310 times the PISO 502 to shift data from its OUT output to the I/O circuit 504. The I/O circuit passes the OUT signal to the DIO 308 signal. The CKIN signal times the operation of the JTAG controller 100. The LD signal causes the PISO to asynchronously load the TMS and TDO signal pattern from JTAG controller 100. Once loaded, the TMS and TDO pattern is shifted out of the PISO to the I/O circuit in response to the CLK signal.

The following describes the PSC's repeating load and shift out sequence. A TMS and TDO pattern 510 is asynchronously loaded into the PISO in response to LD signal 512. CLK signal 514 shifts out the TMS signal portion of pattern 510 on the OUT output of the PISO, then CLK signal 516 shifts out the TDO signal portion of pattern 510 on the OUT output of the PISO. CKIN signal 518 advances the JTAG controller to output the next TMS and TDO pattern 520. LD signal 522 asynchronously loads the next TMS and TDO pattern 520 into the PISO. CLK signal 524 shifts out the TMS signal portion of pattern 520 on the OUT output of the PISO, then CLK signal 526 shifts out the TDO signal portion of pattern 520 on the OUT output of the PISO. CKIN signal 528 advances the JTAG controller to output the next TMS and TDO pattern 530 which is asynchronously loaded into the PISO by LD signal 532 and shifted out by CLK signals 534 and 536. The JTAG controller is advanced to output the next TMS and TDO pattern 540 during CKIN 538. The above described pattern load, pattern shift, and JTAG controller advancement process repeats as long as the CLK input 310 is active.

When the JTAG controller 100 receives a CKIN input it will output a new TMS and TDO signal pattern to PISO 502 and input the TDI signal from I/O circuit 504. The TMS signal output will control the Tap state machine of the target IC's Tap Domain 104 according to FIG. 10, the TDO signal will provide the TDI input signal to the target IC's Tap Domain (if in the Shift-DR/IR state), and the TDI input signal will input data to the JTAG controller from the target IC's Tap Domain (if in the Shift-DR/IR state).

Figure 6A:
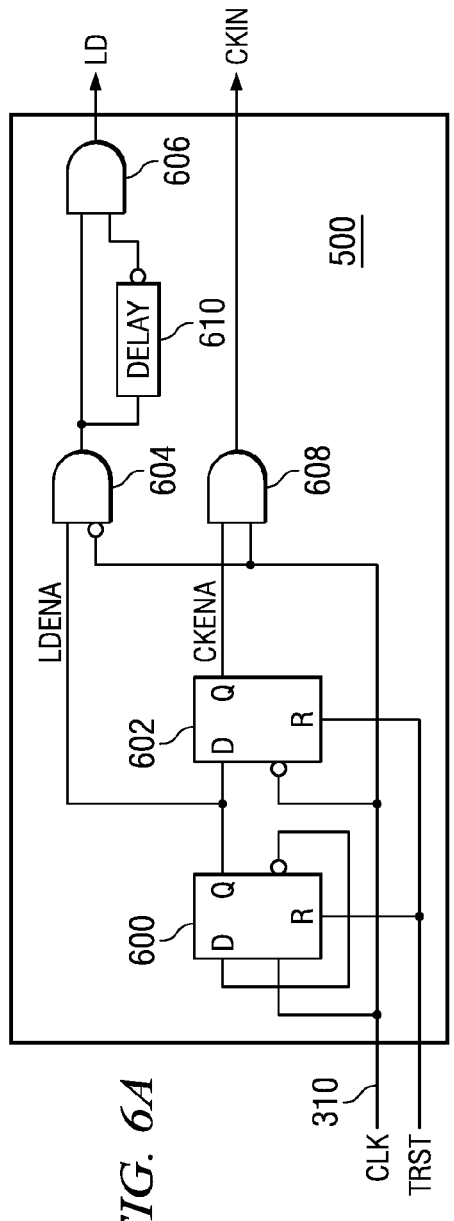
FIG. 6A illustrates a circuit example of the controller within the PSC circuit of FIG. 5A.

FIG. 6A illustrates an example implementation of controller 500. Controller 500 consists of FF 600, FF 602, AND gates 604-608, and delay inverter 610. While the TRST input from the JTAG controller 100 is low, FFs 600 and 602 are reset and the LD and CKIN outputs are low. When TRST goes high, FFs 600 and 602 are enabled to respond to the CLK input 310. FF 600 toggles its load enable (LDENA) output during each rising edge of CLK input 310. FF 602 stores the LDENA output of FF 600 at its clock enable (CKENA) output on each falling edge of CLK input 310. AND gate 604 outputs a high when LDENA is high and CLK is low. AND Gate 606 and delay inverter 620 operate together to produce a high going pulse on the LD output whenever the output of AND gate 604 goes high.

The duration of the high going pulse on the LD signal is determined by the input to output signal delay through delay inverter 610. The duration of the LD pulse should be long enough to asynchronously load the PISO with the TMS and TDO pattern but not long enough to interfere with the shifting operation of the PISO. For example, the high going LD pulse should return low for a sufficient amount of time prior to the next rising edge of the shifting CLK input so as to not interfere with the shift operation. The CKENA output of FF 602 enables AND gate 608 to pass the CLK signal 310 to the CKIN output. CKENA changes state on the falling edge of CLK 310 to allow a AND gate 608 to be enabled prior to the rising edge of CLK 310 to allow for good clock gating operation at the CKIN output.

Figure 6B:
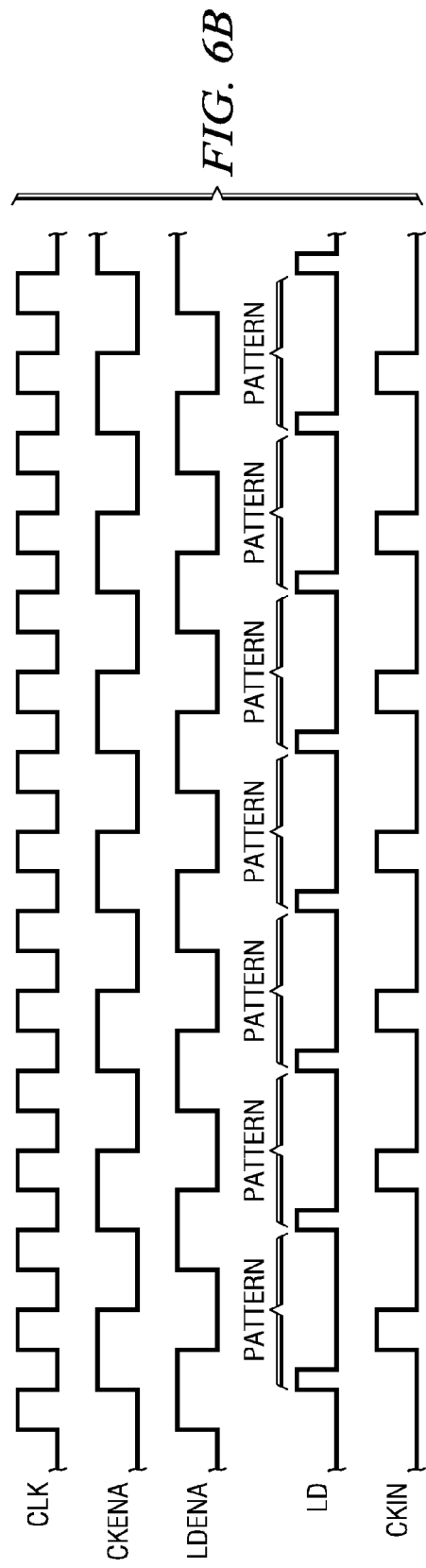
FIG. 6B illustrates a timing diagram of the operation of the controller of FIG. 6A.

The operation of controller 500 is illustrated in the timing diagram of FIG. 6B. In response to the CLK input 310, the controller 500 operates to periodically output the LD and CKIN signals. As mentioned, the CKIN signal times the operation of the JTAG controller 100 and the LD signal causes the PISO to asynchronously load the TMS and TDO pattern from the JTAG controller 100. On each rising edge of CLK 310 the LDENA output of FF 600 toggles its state. On each falling edge of CLK 310 the CKENA output of FF 602 is set to the state of the LDENA input to FF 602. A LD pulse output occurs each time LDENA is high and the CLK goes low. A CKIN output occurs each time CKENA is high and the CLK is high.

Figure 7A:
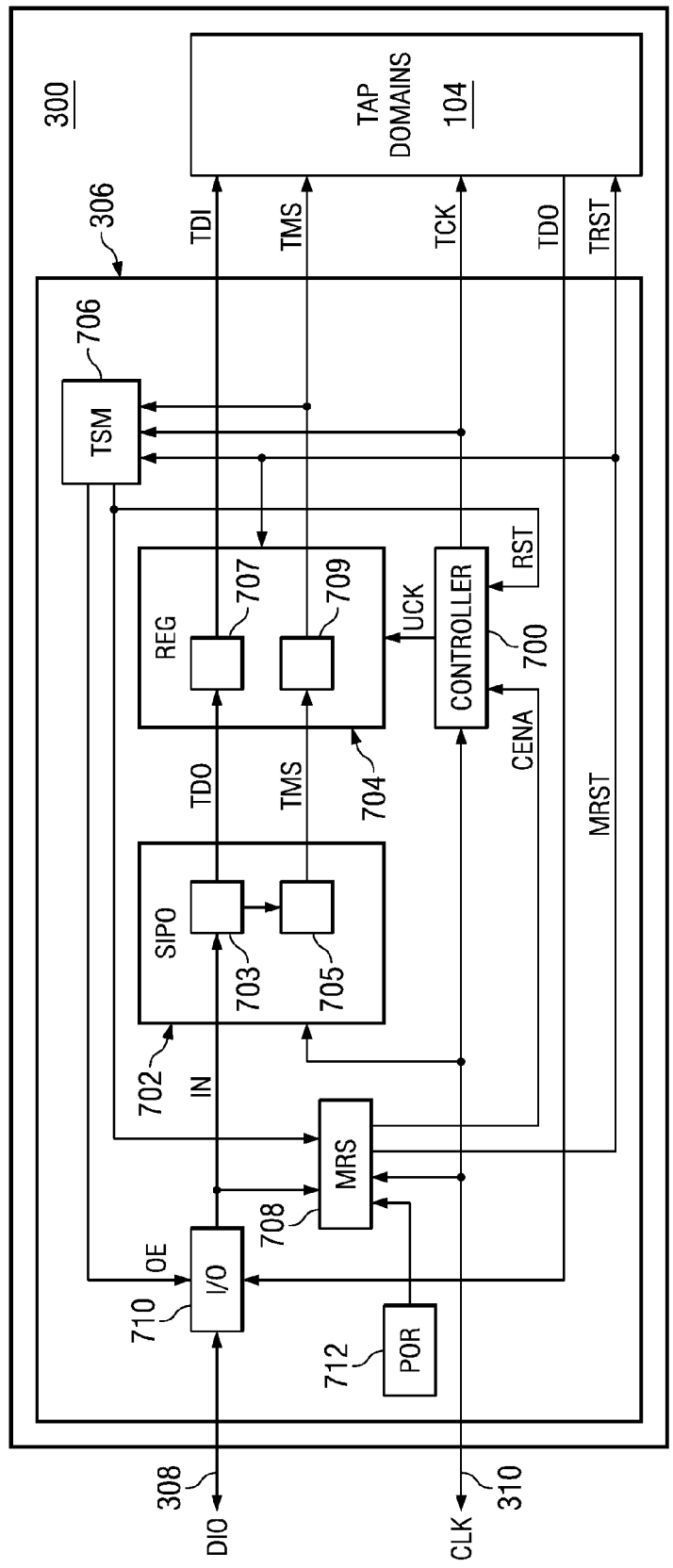
FIG. 7A illustrates a circuit example of the serial to parallel controller (SPC) circuit of the present disclosure.

FIG. 7A illustrates the SPC circuit 306 in more detail. The PSC consists of a controller 700, a serial input parallel output (SIPO) register 702, update register 704, Tap state machine (TSM) 706, master reset and synchronizer (MRS) circuit 708, input/output (I/O) circuit 710, and power on reset circuit (POR) 712.

POR circuit 712 produces a temporary low active power on reset pulse whenever the target IC is first power up. This power on reset pulse is used to initialize the MRS circuit. When initialized, the MRS circuit 708 outputs a low on the master reset (MRST) signal to initialize other circuitry within the SPC 306 and to set TRST input of the connected Tap Domains 104 low. When TRST is low, the Tap Domains 104 are forced to the Test Logic Reset state. The Test Logic Reset state is a state of the 1149.1 Tap state machine and is shown in the Tap state machine diagram of FIG. 10. The POR circuit 712 may exist in the SPC 306 as shown or it may exist external to the SPC, i.e. as a separate circuit within the target IC. The function of the POR circuit to initialize the MRS circuit 708 may be achieved by other means. For example a reset pin of the IC may be substituted for the POR circuit 712 and used to initialize the MRS circuit 708.

Controller 700 inputs the CLK signal 310, a controller enable (CENA) signal from MRS 708, a reset (RST) signal from TSM 706. The controller outputs an update clock (UCK) to update register 704 and a TCK signal to Tap Domains 104 and TSM 706. A detail description of controller 700 will be given in FIGS. 8A and 8B.

I/O circuit 710 inputs an output enable (OE) signal from TSM 706. The OE signal is used to enabled or disable the output drive of I/O circuit 710. I/O circuit 710 inputs signals from DIO 308 and outputs them to SIPO 702 via the IN signal. If the OE is set to enable the output drive of I/O circuit 710, TDO signals input from Tap Domains 104 are output on DIO. If the OE is set to disable the output drive of I/O circuit 710, TDO signals are not output on DIO and the I/O circuit operates to only input DIO signals to SIPO 702 via the IN signal. I/O circuit 504 is designed to allow the output of TDO signals to DIO 308, if enabled by OE, and the input of IN signals from DIO 308 to occur simultaneously. The simultaneous input and output operation of I/O circuit 710 will be described in detail later in regard to FIGS. 11A, 11B, 12, 13A, and 13B.

SIPO 702 inputs the serialized TMS and TDO signal patterns from the IN output of I/O circuit 710 in response to the CLK input 310 and outputs them to update register 704. The update register 704 inputs the TDO and TMS outputs from the SIPO and outputs them as TDI and TMS signals to Tap Domains 104. The update register also inputs the MRST signal from the MRS circuit 708. While the MRST signal is active low the TDO and TMS outputs of the update register 704 are set high. While the MRST signal is inactive high the update register can respond to the update clock (UCK) signal from controller 700 to load TDO and TMS signals from the SIPO 702.

A more detail view of SIPO 702 and update register 704 shows the SIPO containing two serially connected FFs 703 and 705. In response to the CLK signal 310, FFs 703 and 705 shift in the serialized TMS and TDO signals from the IN output of I/O circuit 710. Once the TMS and TDO signals are shifted in they are transferred in parallel to FFs 707 and 709 in the update register 704 in response to the UCK signal where they are input to the TDI and TMS inputs of Tap Domains 104. The update register serves to provide the current TDI and TMS input pattern to the Tap Domains 104 while the SIPO operates to serially input the next TDO and TMS pattern to be input to the Tap Domains 104. As mentioned, the outputs of FFs 707 and 709 are asynchronously forced high in response to a low on the MRS signal, which results in highs being input to the TDI and TMS inputs of Tap Domain 104. This can be achieved, for example, by connecting the MRS signal to the Set input of FFs 707 and 709.

TSM circuit 706 inputs the TMS output from the update register, the TCK output of controller 700, and the MRST output from MRS circuit 708. TSM circuit 706 outputs a reset (RST) signal to controller 700 and MRS circuit 708, and the OE signal to I/O circuit 710. The TSM is simply the Tap state machine defined in IEEE standard 1149.1. The MRST input from MRS circuit 708 is connected to the standard "TRST" input of 1149.1 TSM, the TCK input from controller 700 is connected to the standard "TCK" input of the 1149.1 TSM, the TMS input from controller 700 is connected to the standard "TMS" input of the 1149.1 TSM, the RST output from TSM is connected to the standard "Reset*" output of the 1149.1 TSM, and the OE output of the TSM is connected to the standard "Enable" output of the 1149.1 TSM.

The TSM circuit is used by the present disclosure to allow the SPC to track the Tap states of the connected Tap Domains, especially the states that control the OE and RST outputs. The operation of the 1149.1 Tap state machine is defined in the 16 states shown in FIG. 10. While it is possible to actually use signals from the Tap state machine(s) of the connected Tap Domains 104 for tracking, instead of implementing a dedicated TSM circuit 706 in the SPC 306, the required signals (OE and RST) may not always be available from the Tap Domains 104. For example, connected Tap Domains 104 of hard cores (i.e. cores that are fixed and cannot be modified) may not provide OE and RST output signal terminals for connection to the SPC's OE and RST terminals. Further, Tap Domains 104 having linking arrangements as shown in FIG. 4C may present OE and RST signal switching complexities between the SPC 306 and linked Taps within Tap Domains 104. Therefore, the SPC 306 preferably includes a TSM circuit 706 to insure simplicity in tracking the states of connected Tap Domains 104.

MRS circuit 708 inputs the IN output of I/O circuit 710, the CLK signal 310, the RST signal from TSM 706, and the power on reset output of POR circuit 712. MRS circuit 708 outputs the MRST signal to Tap Domains 104, TSM 706, and update register 704 and the CENA signal to controller 700. The purposes of the MRS circuit 708 are; (1) to maintain the SPC and connected Tap Domains 104 in a reset state when the target IC is operating normally in a system with no JTAG controller 100 and PSC 302 connected to the SPC's DIO 308 and CLK 310 signals, and (2) to allow synchronizing the operation of the SPC 306 to the operation of a JTAG controller 100 and PSC 302 when the JTAG controller and PSC are connected to the SPC's DIO and CLK signals. Synchronizing the operation of the SPC to the operation of the JTAG controller and PSC is important since it allows the serialized TMS and TDO patterns output from PSC to be correctly input as serialized TMS and TDO patterns to the SPC. A detail description of MRS circuit 708 will be given in regard to FIGS. 9A-9C.

Figure 7B:
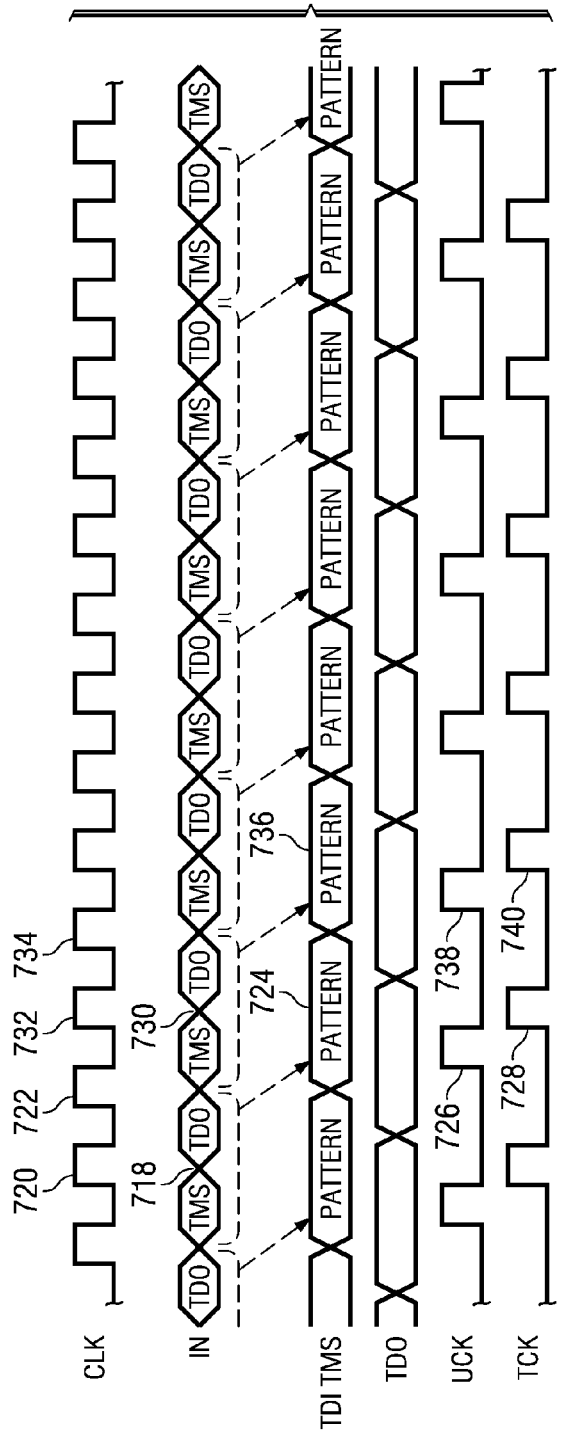
FIG. 7B illustrates a timing diagram of the operation of the SPC circuit of FIG. 7A.

The operation of SPC 306 is illustrated in the timing diagram of FIG. 7B. In response to the CLK input 310, the controller 700 operates to periodically output the UCK signal to the update register 704 and the TCK signal to Tap Domains 104 and TSM 706. Also the CLK input 310 times the SIPO 702 to shift in data from the IN output of the I/O circuit 710. The I/O circuit passes DIO input signals to the IN output. The TCK signal times the operation of the Tap Domains 104. The UCK signal causes the update register 704 to load the parallel TDO and TMS signal pattern output of the SIPO 702. Once loaded, the TDO and TMS signal pattern is applied to the TDI and TMS inputs of Tap Domains 104. The Tap Domains 104 respond to the TDI and TMS signal pattern in response to the TCK.

The following describes the SPC's repeating shift in and update sequence. A serial TMS and TDO bit stream 718 is shifted into SIPO 702 in response to CLK signals 720 and 722. The shifted in TMS and TDO signals form a parallel TDO and TMS output pattern 724 from SIPO 702 that is clocked into to the update register 704 in response to UCK signal 726. The TDO and TMS pattern 724 in the update register 704 is applied to the TDI and TMS inputs of Tap Domains 104. TCK signal 728 clocks the Tap Domains 104 to respond to the TDI and TMS pattern 724 from update register 704. The next serial TMS and TDO bit stream 730 is shifted into SIPO 702 in response to CLK signals 732 and 734. The shifted in TMS and TDO signals form a parallel TDO and TMS output pattern 736 from SIPO 702 that is clocked into to the update register 704 in response to UCK signal 738. The TDO and TMS pattern 738 in the update register 704 is applied to the TDI and TMS inputs of Tap Domains 104. TCK signal 740 clocks the Tap Domains 104 to respond to the TDI and TMS pattern 730 from update register 704. The above described serial pattern shift in, parallel pattern update, and Tap Domain clock operation repeats as long as the CLK input 310 is active.

Figure 10:
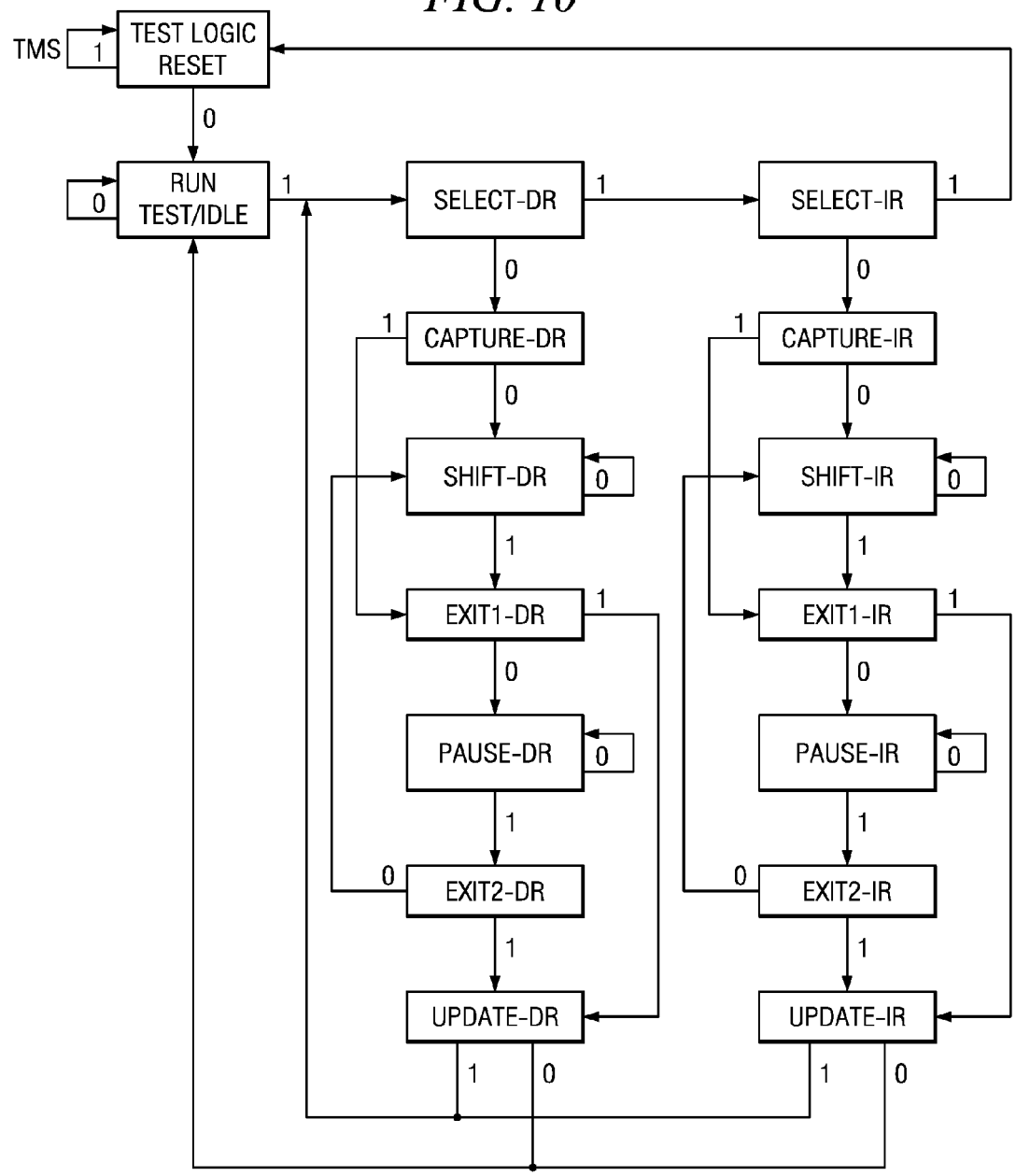
FIG. 10 illustrates the state diagram of the IEEE standard 1149.1 Tap controller state machine.

When the Tap Domain 104 receives a TCK input, the Tap state machine of the Tap Domain responds to the TMS input to perform state transitions as seen in FIG. 10. Also the Tap Domain 104 will input data from its TDI input and output data on its TDO output in response to a TCK input, if the Tap state machine is in the Shift-DR/IR state of FIG. 10.

Figure 8A:
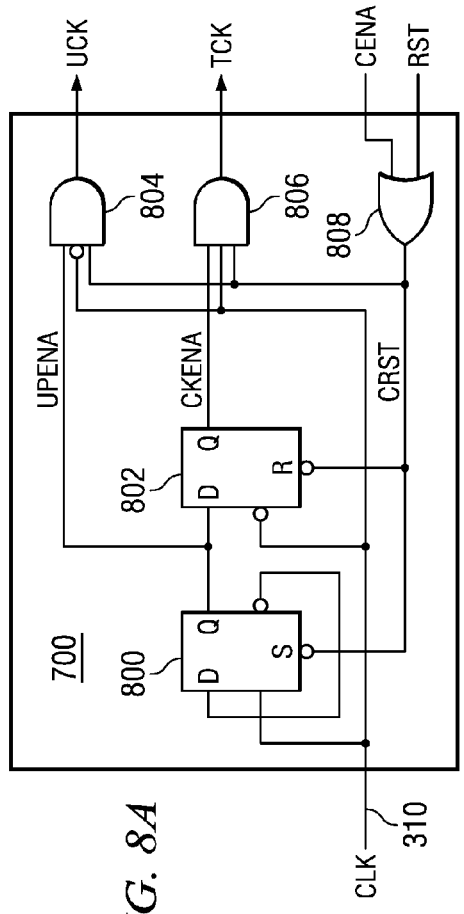
FIG. 8A illustrates a circuit example of the controller within the SPC circuit of FIG. 7A.

FIG. 8A illustrates an example implementation of controller 700. Controller 700 consists of FF 800, FF 802, AND gates 804 and 806, and OR gate 808. FF 800 toggles its update enable (UPENA) output during each rising edge of CLK 310. FF 802 stores the UPENA output of FF 800 at its clock enable (CKENA) output on each falling edge of CLK 310. AND gate 804 outputs a high on its UCK output when UPENA is high, CLK is low, and the controller reset (CRST) output of OR gate 808 is high. AND gate 806 is gated on to pass its CLK 310 input to its TCK output whenever CKENA and CRST are high, otherwise the TCK output is forced low. OR gate 808 outputs a high on CRST whenever the CENA input from CS circuit 708 is high and/or the RST input from TSM 706 is high, otherwise CRST outputs a low. CKENA changes state on the falling edge of CLK 310 to allow AND gate 806 to be enabled prior to the rising edge of CLK 310 to allow for good clock gating operation at the TCK output.

The operation of controller 700 is illustrated in the timing diagram of FIG. 8B. While the CRST output of OR gate 808 is high, the controller 700 operates to periodically output the UCK and TCK signals in response to the CLK input 310. As mentioned, the TCK signal times the operation of the Tap Domains 104 and the UCK signal causes the update register to load the parallel TDO and TMS pattern from SIPO 702. On each rising edge of CLK 310 the update enable (UPENA) output of FF 800 toggles its state. On each falling edge of CLK 310 the CKENA output of FF 802 is set to the state of the UPENA input to FF 802. An UCK output occurs each time LDENA is high and the CLK goes low. A CKIN output occurs each time CKENA is high and the CLK is high. If CENA and RST are both low, the CRST output of OR gate 808 will be low to reset controller 700. While CRST is low, the UPENA output of FF 800 is set high, the CKENA output of FF 802 is set low, the UCK output of AND gate 804 is set low, and the TCK output of AND gate 806 is set low.

FIG. 9A illustrates an example implementation of the MRS circuit 708. MRS circuit 708 consists of a state machine 900 and a FF 902. The state machine 900 operates on the rising edge of CLK 310 and FF 902 operates on the falling edge of CLK 310. The state machine 900 inputs the IN signal from I/O circuit 710, the RST signal from TSM 706, a clock signal from CLK 310, and a power on reset signal from POR 712. The state machine 900 outputs the previously mentioned MRST signal and a controller enable (CE) signal. The CE signal is connected to the D input of FF 902. The Q output of FF 902 drives the previously mentioned CENA signal. The reset input of the FF 902 is connected to the power on reset output of POR 712.

As previously mentioned the purposes of the MRS circuit 708 are to maintain the SPC and Tap Domains in a reset condition when the SPC's DIO 308 signal is not externally driven and to synchronize the operation of the SPC with an external circuit driving the SPC's DIO 308 signal.

The operation of state machine 900 is shown in the state diagram of FIG. 9B. In response to a low active power on reset input from POR 712 or in response to the RST output of TSM 706 going low, the state machine 900 will enter "Set MRST Low & Poll IN" state 904. In state 904 the state machine will output a low on the MRST output signal. The state machine will remain in state 904 while the IN input from I/O circuit 710 is high. The state machine will transition to "Poll IN" state 906 if the IN input goes low. The MRST output remains low in state 906. The state machine will return to state 904 from state 906 if the IN input goes high, otherwise the state machine will transition from state 906 to "Poll IN" state 908. The MRST output remains low in state 908. The state machine will return to state 904 from state 908 if the IN input goes low, otherwise the state machine will transition from state 908 to "Poll IN" state 910. The MRST output remains low in state 910. The state machine will return to state 904 from state 910 if the IN input goes low, otherwise the state machine will transition from state 910 to "Set MRST & CE High" state 912.

In state 912, the state machine sets the MRST and CE signals high. On the falling edge of CLK 310, FF 902 clocks in the high CE output from state machine 900 which sets the CENA output of FF 902 high. The state machine will remain in state 912 while the RST input is low. When the RST input goes high, the state machine will transition to the "Set CE Low" state 914. In state 914, the state machine sets the CE signal low. On the falling edge of CLK 310, FF 902 clocks in the low CE output from state machine 900 which sets the CENA output of FF 902 low. The state machine will remain in state 914 while the RST input is high and will transition to state 904 when the RST input goes low.

The state machine is designed to enter state 904 when it receives a power on reset input from POR 712 or a low input on the RST output of TSM 706. The state machine will remain in state 904 as long as the IN input from I/O circuit 710 is high. As will be described later in regard to FIG. 11A, I/O circuit is designed to output a high on the IN signal when the state machine outputs a low on the MRST signal and if the DIO input 308 to I/O circuit 710 is not being externally driven. The high on the IN signal maintains the state machine 900 in state 904 which maintains a low on the state machine MRST output. While MRST is low, SPC 306 circuitry and Tap Domains 104 are held in an inactive reset state that cannot interfere with the normal operation of the target IC.

Figure 9C:
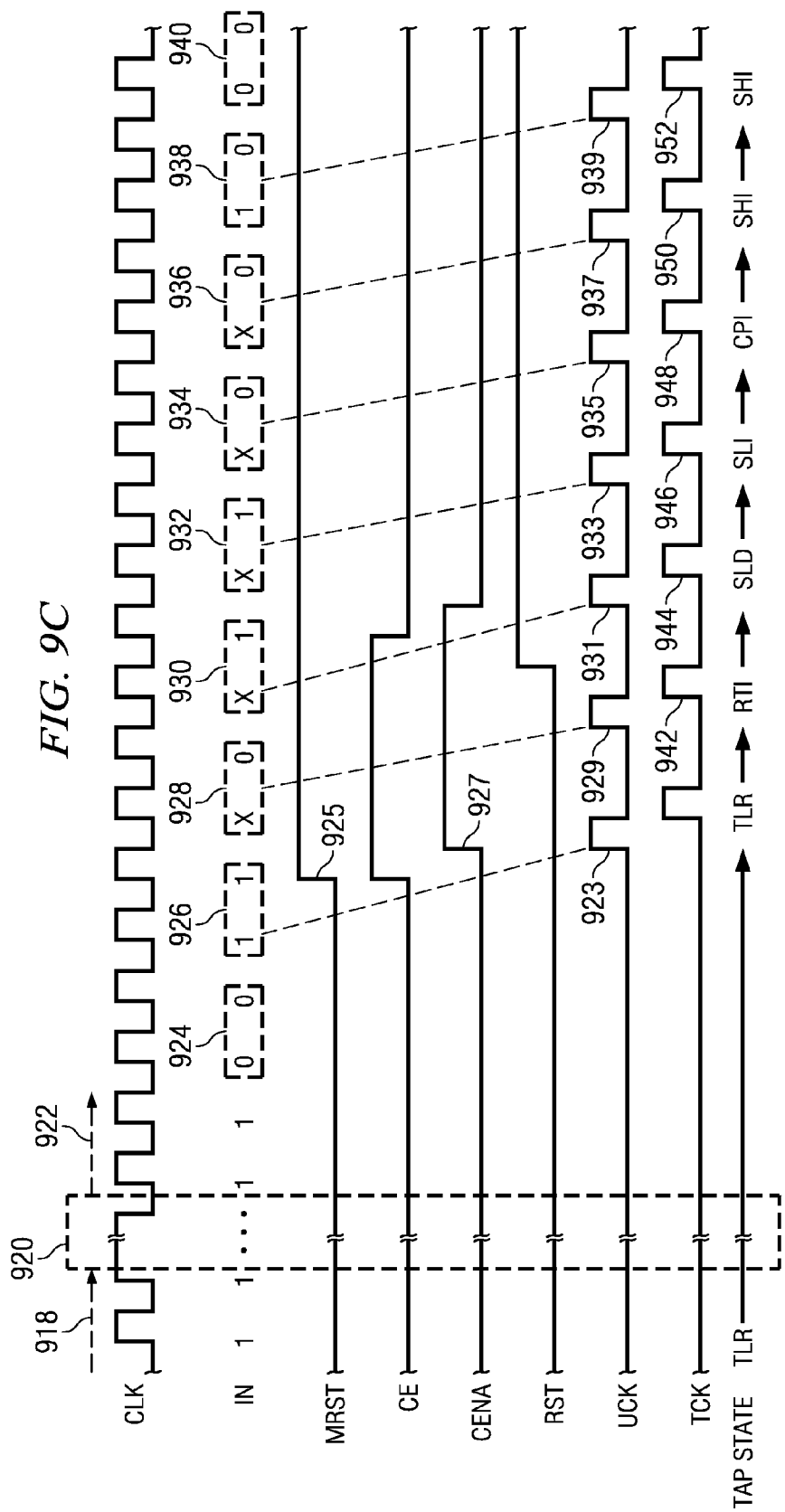
FIG. 9C illustrates a timing diagram of the operation of the MRS circuit of FIG. 9A.

When the JTAG controller 100 and PSC circuit 302 of FIG. 5A are first connected to the DIO signal of the target IC's SPC circuit 306 of FIG. 7A, the operation of the PSC and SPC circuits need to be synchronized such that the serialized TMS and TDO patterns from the PSC are correctly input as serialized TMS and TDO patterns to the SPC. The states within section 916 of the state diagram of FIG. 9B provide one example of how this required synchronization step may be achieved. A timing diagram depicting this synchronization process is shown in FIG. 9C.

Time reference 918 of FIG. 9C indicates a time period where the PSC 302 is not connected to SPC 306, i.e. DIO 308 is not being externally driven. The circuitry in the SPC 306 and Tap Domains 104 of the target IC have been initialized as previously described and the state machine 900 is in state 904 polling the high output of the IN signal and outputting a low on the MRST output. Time 918 could be a time where the target IC in which the SPC 306 and Tap Domains 104 reside is operating normally in a system and the SPC's DIO signal is not being externally driven to perform test, emulation, debug, and/or trace operations. In this timing example it is assumed that CLK signal 310 is being actively driven by a clock source within the target IC. Thus state machine 900 state 904 is polling the high logic level of the IN signal during each rising edge of the active CLK signal 310. It is worth noting that if the IN signal were to temporarily go low during a CLK cycle input for some unknown reason, the state machine would return to state 904 via state 906. Further, the state machine would return to state 904 from states 908 and 910 in response to the IN signal having other temporarily low and high signal sequences for some unknown reason.

Time reference 920 of FIG. 9C indicates a time period where the PSC 302 has been externally connected to the SPC 306 via the DIO 308 and CLK 310 signals. During the physical connection process there may be undesirable temporary signaling sequence on DIO 308 due to the electrical connection being formed between the PSC and SPC. These temporary signal sequences could prevent the successful synchronization between the PSC and SPC. The state transition mapping in section 916 of FIG. 9B is provided to filter out the following three types of temporary signal sequences on the DIO so that they do not effect the synchronization process between PSC and SPC.

1. As seen in the state diagram, a temporary DIO signal sequence of 1-0-1 during the connection process would cause the state machine to transition from state 904 to state 906 and back to state 904. Thus this temporary DIO connection sequence is prevented from effecting the synchronization process.

2. As seen in the state diagram, a temporary DIO signal sequence of 1-0-0-0-1 during the connection process would cause the state machine to transition from state 904 to state 906 to state 908 and back to state 904. Thus this temporary DIO connection sequence is prevented from effecting the synchronization process.

3. As seen in the state diagram, a temporary DIO signal sequence of 1-0-0-1-0-1 during the connection process would cause the state machine to transition from state 904 to state 906 to state 908 to state 910 and back to state 904. Thus this temporary DIO connection sequence is prevented from effecting the synchronization process.

It should be understood that while the example state machine has been designed to filter out the above three types of temporary DIO sequences, it could be designed to filter out a greater number of DIO sequences if desired.

Time reference 922 of FIG. 9C indicates the start of a time period where the connection between the PSC 302 and SPC 306 has been made and the state machine is in state 904 with the IN signal driven high by DIO input from the connect PSC 302. The PSC 302 begins the synchronization process by serially inputting a pattern of two logic 0's 924 on the SPC's IN signal via DIO 308, which causes the state machine 900 to transition from state 904 to state 906 to state 908. As seen in FIG. 5A, the PSC outputs the two logic 0's by loading the PISO 502 with a TMS value of 0 and a TDO value of 0 using the LD signal, then shifting the PISO to output the two logic 0's using the CLK signal 310. Next the PSC 302 serially inputs a pattern of two logic 1's 926 on the SPC's IN signal via DIO 308, which causes the state machine 900 to transition from state 908 to state 910 to state 912. Again as seen in FIG. 5A, the PSC outputs the two logic 1's by loading the PISO 502 with a TMS value of 1 and a TDO value of 1 using the LD signal, then shifting the PISO to output the two logic 1's using the CLK signal 310. As seen, the state machine 900 can only transition from state 904 to state 912 in response to the exact input of a serial pattern of two logic 0's followed by a serial pattern of two logic 1's.

As seen in the timing diagram, the MRST and CE signal outputs of state machine 900 are set high in state 912 at time 925. MRST going high removes the reset condition from Tap Domains 104, TSM 706, and update register 704. CE going high causes FF 902 to set CENA high at time 927. When CENA goes high, the CRST signal of controller 700 is set high which enables the controller 700 to start outputting UCK and TCK signals at time 923. The first UCK signal at time 923 loads the two logic 1's of pattern 926 into update register 704. The enabling of the SPC's controller 700 at time 923 occurs such that the UCK and TCK signals of the SPC's controller 700 are synchronized with the LD and CKIN signals of the PSC's controller 500, respectively. By synchronizing the UCK signal with the LD signal and the TCK signal with the CKIN signal the SPC 306 can correctly receive subsequent serialized two bit patterns from PSC 302 via DIO 308. For example, when the PISO 502 is shifting out a two bit pattern the SIPO 702 is shifting in the two bit pattern, and when the PISO 502 is loading the next two bit pattern to be shifted the SIPO 702 is updating the current two bit pattern to the update register 704. The synchronized operation of the UCK and LD signals and the TCK and CKIN signals will be seen more clearly in regard to the description of FIG. 14A.

While state machine 900 of the present disclosure has been designed to use a sequence of two serialized two bit patterns 924 and 926 for synchronization, it could be designed to use a longer sequence of serialized two bit patterns for synchronization if desired. Using a longer sequence of two bit patterns would further reduce the possibility of synchronization failure between the PSC and SPC due to the previously mentioned connection process during time 920. Also a longer synchronization pattern sequence would improve the state machine's 900 ability to return to state 904, when DIO is not externally driven, in the event unexpected signaling were to occur on the state machine's IN input. While the example two bit patterns 924 and 926 used two 0's and two 1's respectively, the two bits of a pattern may use any desired or necessary combinations of 0's and 1's as well. The TMS portion of the last two bit pattern of a pattern sequence will be the first TMS input the Tap Domains 104 and TSM circuit 706 respond to. In the FIG. 9C example, the TMS portion of pattern 926 was set to logic 1 to cause the Tap Domains 104 and TSM circuit 706 to remain in the TLR state following synchronization. If the TMS portion of pattern 926 had been set to logic 0, the Tap Domains 104 and TSM circuit 706 would have transitioned to the RTI state following synchronization.

Following the above described PSC and SPC synchronization process, the PSC may begin inputting serialized TDO and TMS patterns to the SPC to scan JTAG instructions or data into the Tap Domains 104. The following example describes the PSC inputting serialized TDO and TMS patterns to the SPC to cause the Tap Domains 104 to perform an instruction scan operation according to the Tap state diagram of FIG. 10.

The SPC inputs a first serialized TDO (X) and TMS (0) pattern 928 from the PSC which is input to SIPO 702 and applied to the TDI and TMS input Tap Domains 104 and the TMS input of TSM 706 via update register 704 during UCK 929. The X in the TDO portion of the pattern indicates that TDO is a don't care signal. This first TDI and TMS pattern input to Tap Domains 104 and TSM 706 causes the Tap Domains and TSM to transition from the Test Logic Reset (TLR) state to the Run Test/Idle (RTI) state (FIG. 10) in response to TCK 942. On the falling edge of TCK 942 the TSM 706 sets its RST signal high to remove the reset condition at the input of OR gate 808 of controller 700. In response to RST going high, state machine 900 transitions to state 914 on the next rising edge of CLK 310. The state machine sets the CE output low in state 914 which causes FF 902 to output a low on CENA on the falling edge of CLK 310. State machine 900 will remain in state 914 while the RST signal is high.

The SPC inputs a second serialized TDO (X) and TMS (1) pattern 930 from PSC which is input to SIPO 702 and applied to the TDI and TMS input Tap Domains 104 and the TMS input of TSM 706 via update register 704 during UCK 931. This second TDI and TMS pattern causes the Tap Domains 104 and TSM to transition from the RTI state to the Select-DR (SLD) state in response to TCK 944.

The SPC inputs a third serialized TDO (X) and TMS (1) pattern 932 from PSC which is input to SIPO 702 and applied to the TDI and TMS input Tap Domains 104 and the TMS input of TSM 706 via update register 704 during UCK 933. This third TDI and TMS pattern causes the Tap Domains 104 and TSM to transition from the SLD state to the Select-IR (SLI) state in response to TCK 946.

The SPC inputs a fourth serialized TDO (X) and TMS (0) pattern 934 from PSC which is input to SIPO 702 and applied to the TDI and TMS input Tap Domains 104 and the TMS input of TSM 706 via update register 704 during UCK 935. This fourth TDI and TMS pattern causes the Tap Domains 104 and TSM to transition from the SLI state to the Capture-IR (CPI) state in response to TCK 948.

The SPC inputs a fifth serialized TDO (X) and TMS (0) pattern 936 from PSC which is input to SIPO 702 and applied to the TDI and TMS input Tap Domains 104 and the TMS input of TSM 706 via update register 704 during UCK 937. This fifth TDI and TMS pattern causes the Tap Domains 104 and TSM to transition from the CPI state to the Shift-IR (SHI) state in response to TCK 950. When the TSM 706 transitions to the SHI state it's OE output is set to enable the output drive of I/O circuit 710 such that the first TDO output from the Tap Domains 104 can be output on DIO 308 to be input to the JTAG controller's TDI input via I/O circuit 504 of PSC controller 500. TSM 706 sets its OE to enable the output drive of I/O circuit 710 whenever the TSM (and Tap Domains) is in the Shift-IR or Shift-DR states of FIG. 10.

The SPC inputs a sixth serialized TDO (1) and TMS (0) pattern 938 from PSC which is input to SIPO 702 and applied to the TDI and TMS input Tap Domains 104 and the TMS input of TSM 706 via update register 704 during UCK 939. This sixth TDI and TMS pattern causes the Tap Domains 104 and TSM to remain in the SHI state in response to TCK 952. In pattern 938, TDO is shown set to a 1 to indicate that the first TDI input to be shifted into the Tap Domains 104 is a logic 1. On the rising edge of TCK 952 the first TDI input (1) of the sixth pattern 938 is shifted into the Tap Domains 104. Also the first TDO output from the TAP Domains 104 is input to the TDI input of the JTAG controller 100 on the rising edge of a CKIN input which is synchronized to TCK 952.

For as long as serialized patterns are input to cause the Tap Domains 104 (and TSM 706) to remain in the SHI state (i.e. TMS portion of the patterns=0), the TDI input portion of each pattern will be input to the Tap Domains 104 while TDO outputs from the Tap Domains will be input to the JTAG controller 100. When the shifting in and out of TDI and TDO is complete, the PSC will input serialized patterns with the TMS portion of the patterns set to move the Tap Domains 104 and TSM 706 from the Shift-IR state (SHI) to the Exit1-IR state, then to any other state according to the Tap state diagram of FIG. 10.

While the above process described performing an instruction scan operation between the JTAG controller and Tap Domains of the target IC, data scan operations may be similarly performed. Instruction and data scan operations using serialized TDI and TMS inputs from the JTAG controller and TDO outputs from the Tap Domains can be used to perform test, emulation, debug, trace, and/or other operations via the two signal DIO 308 and CLK 310 interface between the PSC and SPC.

When an operation is complete, the JTAG controller can output a string of serialized TDO and TMS patterns with the TMS portion of each pattern set to a logic one to cause the Tap Domains 104 and the TSM circuit 706 to transition into the Test Logic Reset state of FIG. 10. As seen in FIG. 10, the Tap state machine is designed to transition from any of its states to the Test Logic Reset state whenever it receives at least 5 logic high inputs on TMS. Therefore 5 serialized TDO and TMS patterns each with TMS high will cause the Tap Domains 104 and TSM 706 to enter the Test Logic Reset state.

When the TSM 706 enters the Test Logic Reset state it will set the RST output low which will reset the controller 700 and cause the MRS 708 state machine 900 to enter state 904, which will result in the signal levels shown during time reference 918 of the timing diagram of FIG. 9C. After the SPC circuitry has been reset by the RST signal the DIO and CLK connection between the PSC and SPC can be removed. During the PSC and SPC disconnect step, temporary signal glitching/bounce may occur on the DIO signal. The previously described state machine 900 states in section 916 of FIG. 9B come into play once again to filter the IN input to the state machine such that the state machine remains in or returns to state 904 following any undesired temporary DIO signaling that may occur during the disconnect step. Following the disconnect step, the state machine will be in state 904 with the MRST output low, which maintains a reset condition on controller 700, TSM 706, and Tap Domains 104.

Figure 11A:
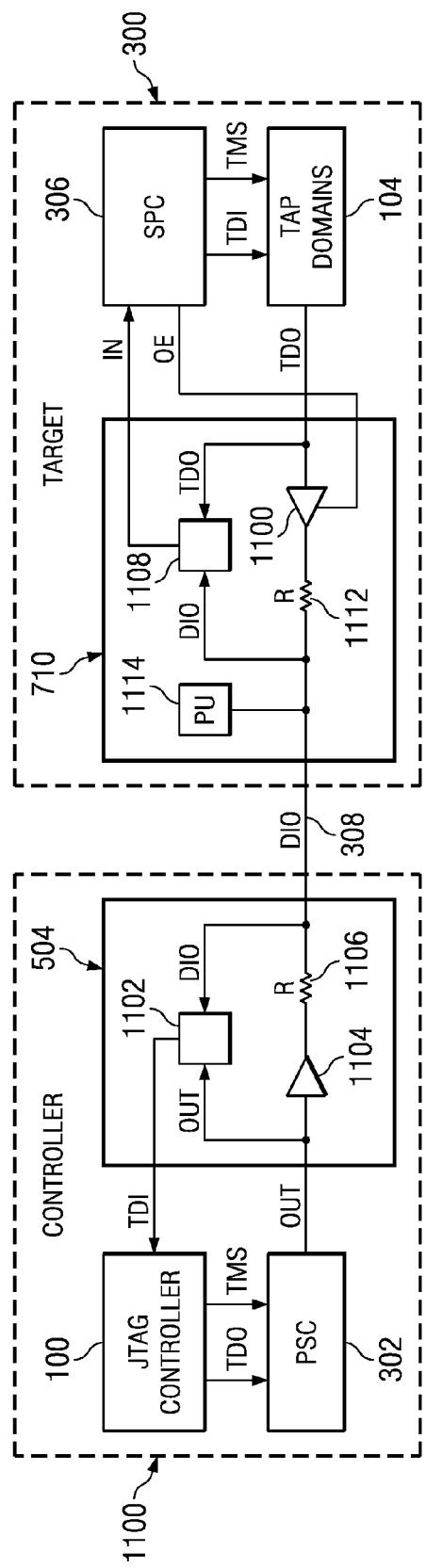
FIG. 11A illustrates a circuit example of the input/output (I/O) circuits within the PSC and SPC circuits.

FIG. 11A illustrates an example of a JTAG controller 100 and PSC 302 arrangement 1100 interfaced the SPC 306 and Tap Domains 104 of target IC 300 via DIO 308 signal connections between I/O circuit 504 of arrangement 1100 and I/O circuit 710 of the target IC. For simplification, the CLK 310 signal that accompanies the DIO signal 308 is not shown in this example. Also for simplification and ease of description, the I/O circuits 504 and 710 are shown to exist outside the PSC 302 and SPC 306 respectively, instead of inside as previously shown in FIGS. 5A and 7A. I/O circuit 504 is coupled to the PSC 302 via the OUT signal and to the JTAG controller 100 via the TDI signal. I/O circuit 710 is coupled to the Tap Domains 104 via the TDO signal and to the SPC via the IN and OE signals.

I/O circuit 504 consists of an input circuit 1102, an output buffer 1104, and a resistor 1106. The OUT signal is coupled to the input of buffer 1104 and to a first input of the input circuit 1102. The output of the buffer 1104 is coupled to the DIO signal via resistor 1106. The DIO signal is coupled to a second input of the input circuit 1102. The output of the input circuit 1102 is coupled to the TDI input of the JTAG controller 100.

I/O circuit 710 consists of an input circuit 1108, an output buffer 1110, a resistor 1112, and a pull up (PU) circuit 1114. The TDO signal is coupled to the input of buffer 1110 and to a first input of the input circuit 1108. The output of the buffer 1110 is coupled to the DIO signal via resistor 1112. The DIO signal is coupled to a second input of the input circuit 1108 and to the PU circuit 1112. The output of the input circuit 1108 is coupled to the IN input of SPC 306.

The PU circuit 1114 is used to set the DIO signal input to input circuit 1108 high when the DIO signal is not being driven by either buffer 1104 or 1110. For example, when the JTAG controller and PSC arrangement 1100 is not connected to the DIO of the target IC and while the output drive of buffer 1110 of the target IC is disabled by the OE signal, the PU circuit 1114 will set the DIO signal high so that logic ones are input to the SPC 306 from the IN signal output of input circuit 1108 high. The high on the IN signal will cause the state machine 900 of MRS circuit 708 to remain in state 904 of FIG. 9B, as previously described.

The output buffer 1104 of I/O circuit 504 and the output buffer 1110 of I/O circuit 710 will preferably be designed to have approximately the same current sink/source drive strength. Also the resistors 1106 and 1112 of I/O circuits 504 and 710 will have approximately the same resistance.

Figure 11B:
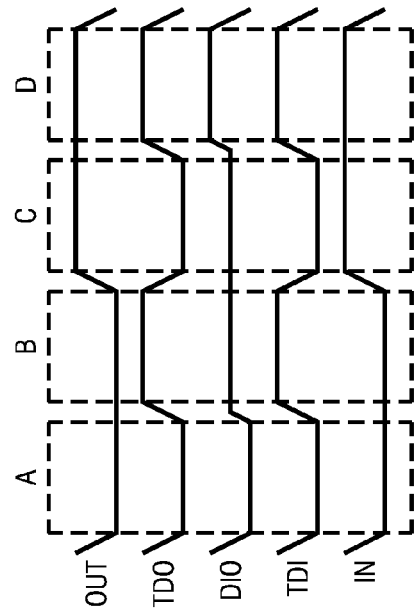
FIG. 11B illustrates the signaling cases for the I/O circuits of FIG. 11A.
Figure 12:
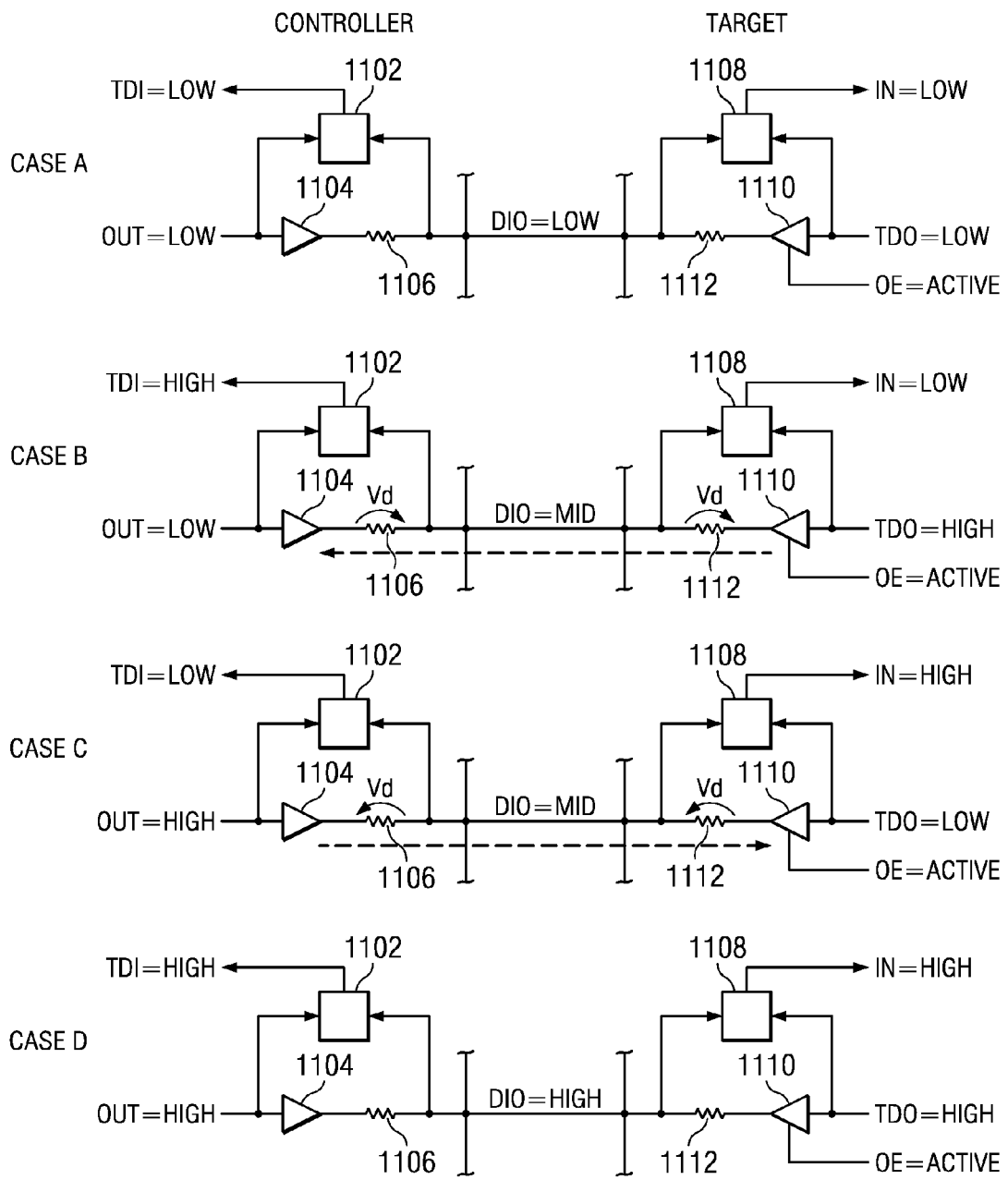
FIG. 12 illustrates each signaling case of FIG. 11B in more detail.

FIG. 11B illustrates timing waveforms for the four cases A-D in which simultaneous data communication occurs between the I/O circuits 504 and 710 via DIO 308. Each case A-D is indicated in the timing diagram by vertical dotted line boxes. FIG. 12 illustrates the current flow on the DIO signal wire during each of the four cases A-D. In these examples, the OE input to buffer 1110 is set to enable the buffer 1110 to drive the DIO signal.

Case A: If OUT=Low & TDO=Low, Then DIO=Low, TDI=Low, & IN=Low

Case B: If OUT=Low & TDO=High, Then DIO=Mid, TDI=High, & IN=Low

Case C: If OUT=High & TDO=Low, Then DIO=Mid, TDI=Low, & IN=High

Case D: If OUT=High & TDO=High, Then DIO=High, TDI=High, & IN=High

Case A shows PSC 302 driving OUT low and Tap Domains 104 driving TDO low. As seen in Case A of FIG. 12, with lows being output from both buffers 1104 and 1110 only a small amount of current flows on the DIO signal wire. This small current flow does not develop a significant voltage drop across resistors 1106 and 1112. Thus the DIO signal input to the input circuits 1102 and 1108 will be easily detectable as being a low signal input. In response to this OUT and TDO output condition the DIO signal is driven low. With OUT and DIO low, the input circuit 1102 inputs a low on the TDI input to JTAG controller 100. With TDO and DIO low, the input circuit 1108 inputs a low on the IN input to SPC 306.

Case B shows PSC 302 driving OUT low and Tap Domains 104 driving TDO high. As seen in Case B of FIG. 12, with a low being output from buffer 1104 and a high being output from buffer 1110 a larger current flows between the buffers on the DIO signal wire. The resistors 1106 and 1112 serve to limit this larger current flow and the voltage drops developed across them establish mid level voltage on the DIO wire that is easily detectable by the input circuits 1102 and 1108 from being either high or low. In response to this OUT and TDO output condition the DIO signal is driven to a mid voltage level. With OUT low and DIO at a mid voltage, the input circuit 1102 inputs a high on the TDI input to JTAG controller 100. With TDO high and DIO at a mid voltage, the input circuit 1108 inputs a low on the IN input to SPC 306.

Case C shows PSC 302 driving OUT high and Tap Domains 104 driving TDO low. As seen in Case C of FIG. 12, with a high being output from buffer 1104 and a low being output from buffer 1110 a larger current flows between the buffers on the DIO signal wire. The resistors 1106 and 1112 serve to limit this larger current flow and the voltage drops developed across them establish mid level voltage on the DIO wire that is easily detectable by the input circuits 1102 and 1108 from being either high or low. In response to this OUT and TDO output condition the DIO signal is driven to a mid voltage level. With OUT high and DIO at a mid voltage, the input circuit 1102 inputs a low on the TDI input to JTAG controller 100. With TDO low and DIO at a mid voltage, the input circuit 1108 inputs a high on the IN input to SPC 306.

Case D shows PSC 302 driving OUT high and Tap Domains 104 driving TDO high. As seen in Case D of FIG. 12, with highs being output from both buffers 1104 and 1110 only a small amount of current flows on the DIO signal wire. This small current flow does not develop a significant voltage drop across resistors 1106 and 1112. Thus the DIO signal input to the input circuits 1102 and 1108 will be easily detectable as being a high signal input. In response to this OUT and TDO output condition the DIO signal is driven high. With OUT and DIO high, the input circuit 1102 inputs a high on the TDI input to JTAG controller 100. With TDO and DIO high, the input circuit 1108 inputs a high on the IN input to SPC 306.

FIG. 13A illustrates one example of how to design an input circuit 1300 that can be used as either an input circuit 1102 or 1108. The input circuit 1300 includes a voltage comparator circuit 1302, a multiplexers 1304, an inverter 1306, and a buffer 1308. The voltage comparator circuit 1302 inputs voltages from DIO and outputs digital control signals S0 and S1 to multiplexer 1304. As seen, a first voltage (V) to ground (G) leg 1310 of voltage comparator circuit 1302 comprises a series P-channel transistor and a current source and a second voltage to ground leg 1312 comprises a series N-channel transistor and a current source. As seen, S1 is connected at a point between the P-channel transistor and current source of the first leg 1310 and S0 is connected at a point between the N-channel transistor and current source of the second leg 1312. The gates of the transistors are connected to DIO to allow voltages on DIO to turn the transistors on and off.

The operation of the voltage comparator circuit 1302 and multiplexer 1304 is shown in the truth table of FIG. 13B and described herein. If the voltage on DIO is low, the S0 and S1 outputs are set high, which causes the multiplexer 1304 to select its low input 1314 and output the low input on the TDI/IN (TDI for circuit 1102 and IN for circuit 1108) signal via buffer 1308. If the voltage on DIO is at a mid level, the S0 is set low and the S1 is set high, which causes the multiplexer 1304 to select its inverted OUT/TDO (OUT for circuit 1102 and TDO for circuit 1108) input signal 1316 and output the inverted OUT/TDO signal to the TDI/IN signal via and buffer 1308. If the voltage on DIO is high, the S0 and S1 outputs are set low, which causes the multiplexer 1304 to select its high input 1318 and output the high input to the TDI/IN signal via and buffer 1308.

From the above description it is clear that the input circuit 1300 will; (1) input a low on TDI/IN if the DIO signal is low, (2) input a high on TDI/IN if the DIO signal is high, and (3) will input the inverse of OUT/TDO on TDI/IN if the DIO signal is at a mid level voltage between high and low.

Referring back to FIG. 11A and in reference to the above description of input circuit 1300 it is clear that,
(1) If DIO is high, input circuits 1102 and 1108 will input highs to the JTAG controller 100 and SPC 306 respectively.
(2) If DIO is low, input circuits 1102 and 1108 will input lows to the JTAG controller 100 and SPC 306 respectively.
(3) If DIO is mid level and the OUT signal from PSC 302 is low, input circuit 1102 will know that the Tap Domain 104 is outputting a high on TDO to cause the mid level on DIO. Input circuit 1102 will therefore input a high to the TDI input of JTAG controller 100.
(4) If DIO is mid level and the OUT signal from PSC 302 is high, input circuit 1102 will know that the Tap Domain 104 is outputting a low on TDO to cause the mid level on DIO. Input circuit 1102 will therefore input a low to the TDI input of JTAG controller 100.
(5) If DIO is mid level and the TDO signal from Tap Domain 104 is low, input circuit 1108 will know that the PSC 302 is outputting a high on OUT to cause the mid level on DIO. Input circuit 1108 will therefore input a high to the IN input of SPC 306. and;
(6) If DIO is mid level and the TDO signal from Tap Domain 104 is high, input circuit 1108 will know that the PSC 302 is outputting a low on OUT to cause the mid level on DIO. Input circuit 1108 will therefore input a low to the IN input of SPC 306.

Figure 14B:
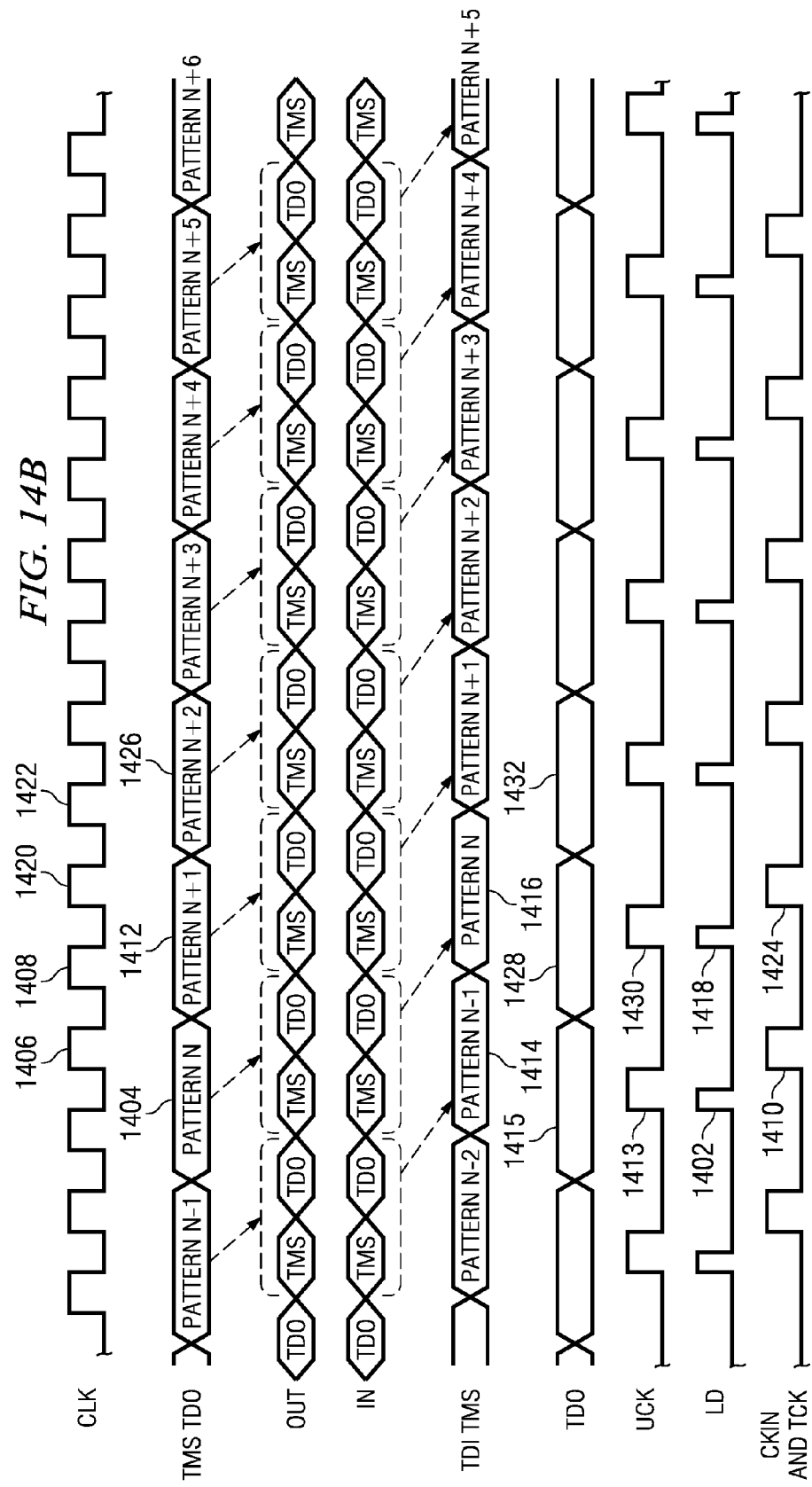
FIG. 14B illustrates a timing diagram of the operation of the PSC and SPC circuits of FIG. 14A performing JTAG transactions between the JTAG controller and the Tap Domains of the target IC.

FIG. 14A shows a complete arrangement where the JTAG controller 100 and PSC 302 are connected to and are communicating with the SPC 306 and Tap Domains 104 of target IC 300 via the DIO 308 and CLK 310 signals. For simplification only the circuit elements of the PSC 302 and SPC 306 that are involved with the communication process are shown. The timing diagram of FIG. 14B details the communication process.

In the timing diagram of FIG. 14B, both the controllers 500 and 700 of PSC and SPC, respectively, have been synchronized as previously described and are actively operating their respective LD and CKIN and UCK and TCK signals in response to the CLK signal 310. As seen and previously mentioned, the LD signal of the PSC operates synchronous with the UCK signal of the SPC, and the CKIN signal of the PSC operates synchronous with the TCK signal of the SPC. For simplification the CKIN and TCK signals are shown as one clock signal.

During LD signal 1402 TMS and TDO pattern N 1404 from JTAG controller 100 is loaded into PISO 502. The TMS portion of the loaded pattern is shifted from PISO 502 to SIPO 702 during CLK 1406 and the TDO portion of the loaded pattern is shifted from PISO 502 to SIPO 702 during CLK 1408. CKIN 1410 advances the JTAG controller to output the next TMS and TDO pattern N+1 1412 and to input the TDO output 1415 from the Tap Domains (if in the Shift-DR or Shift-IR state). TCK 1410 causes the TAP Domains 104 to respond to the previously transmitted TDI and TMS input pattern N−1 1414 input to the Tap Domains during UCK 1413. Also during TCK 1410, the Tap Domains will output the next TDO output to be input to the JTAG controller (if in the Shift-DR or Shift-IR state).

During LD signal 1418 TMS and TDO pattern N+1 1412 from JTAG controller 100 is loaded into PISO 502. The TMS portion of the loaded pattern is shifted from PISO 502 to SIPO 702 during CLK 1420 and the TDO portion of the loaded pattern is shifted from PISO 502 to SIPO 702 during CLK 1422. CKIN 1424 advances the JTAG controller to output the next TMS and TDO pattern N+2 1426 and to input the TDO output 1428 from the Tap Domains. TCK 1424 causes the TAP Domains 104 to respond to TDI and TMS input pattern N 1416 input to the Tap Domains during UCK 1413. Also during TCK 1424, the Tap Domains will output the next TDO output 1432 to be input to the JTAG controller.

The above described timing example of the communication between the JTAG controller 100 and Tap Domains 104, via PSC and SPC, continues while a DIO and CLK connection exists between the PSC and SPC and while the CLK signal 310 is active.

Figure 14C:
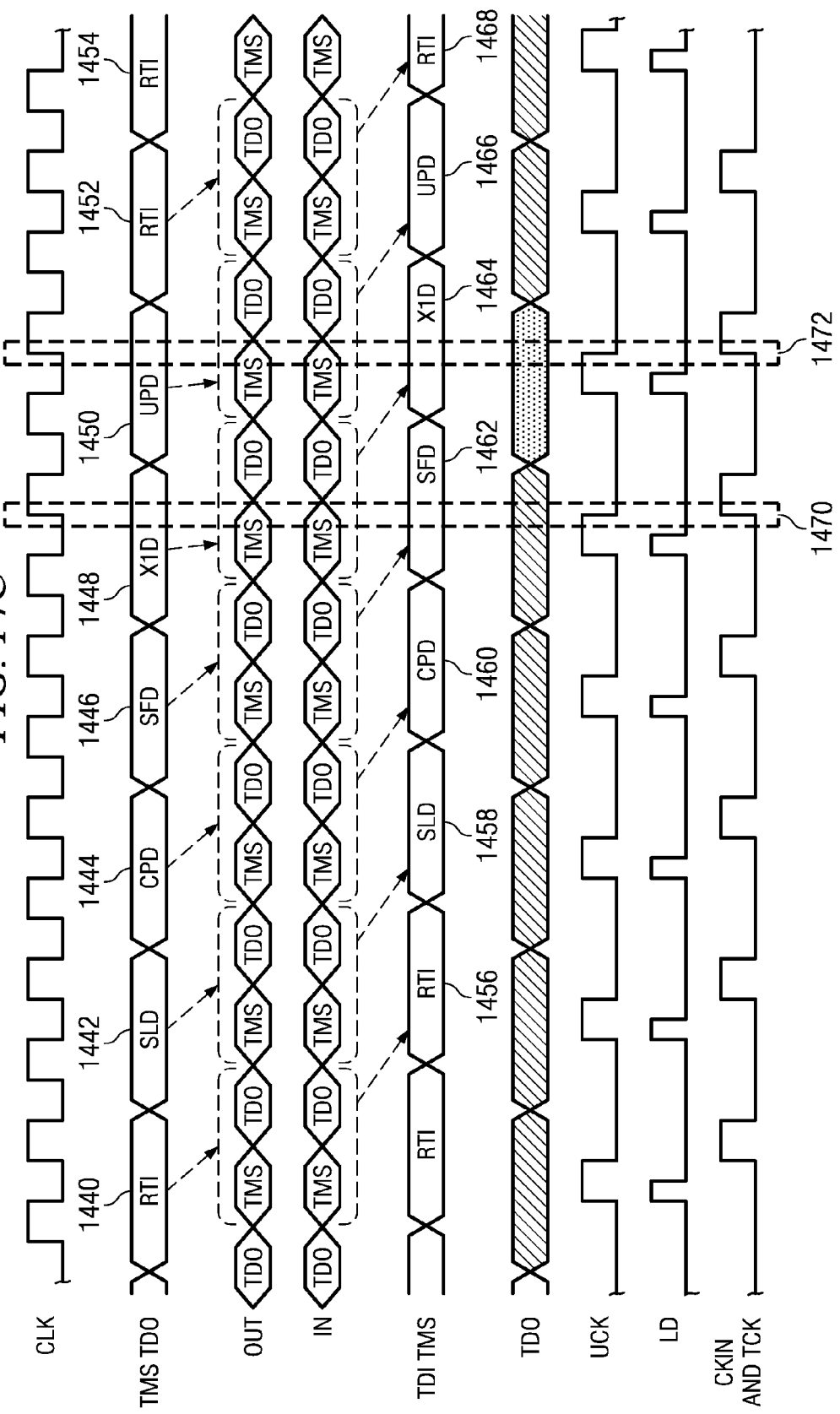
FIG. 14C illustrates a timing diagram of the operation of the PSC and SPC circuits of FIG. 14A performing a single bit data register scan between the JTAG controller and the Tap Domains of the target IC.

FIG. 14C illustrates a timing example of the arrangement of FIG. 14A performing a single data register shift operation between the JTAG controller and Tap Domains. As seen the JTAG controller outputs a sequence of TMS and TDO patterns 1440-1454 that will control the Tap Domains to transition from the Run Test/Idle (RTI) state, to the Select-DR (SLD) state, to the Capture-DR (CPD) state, to the Select-DR (SLD) state, to the Exit1-DR (X1D) state, to the Update-DR (UPD) state, and back to the RTI state of FIG. 10. This Tap state sequence will cause a one bit data register shift operation to occur between the JTAG controller and Tap Domains. The sequence of patterns 1440-1454 output from the JTAG controller is serialized by the PSC and de-serialized by the SPC to be input to the Tap Domains as TDI and TMS pattern sequences 1454-1468. As seen the process of serializing and de-serializing the patterns causes TDI and TMS patterns input to the Tap Domains to lag behind the TMS and TDO patterns output from the JTAG controller.

Figure 1:
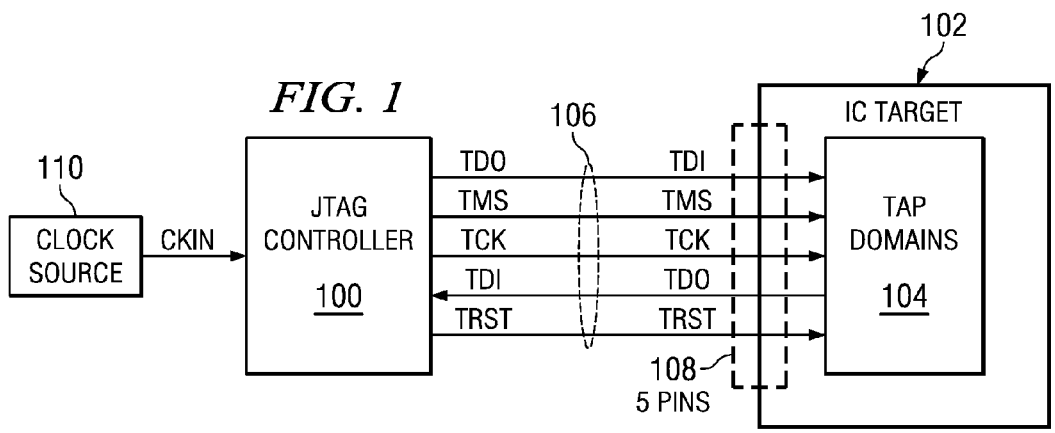
FIG. 1 illustrates a conventional 5 signal interface between a JTAG controller and target IC.
Figure 2:
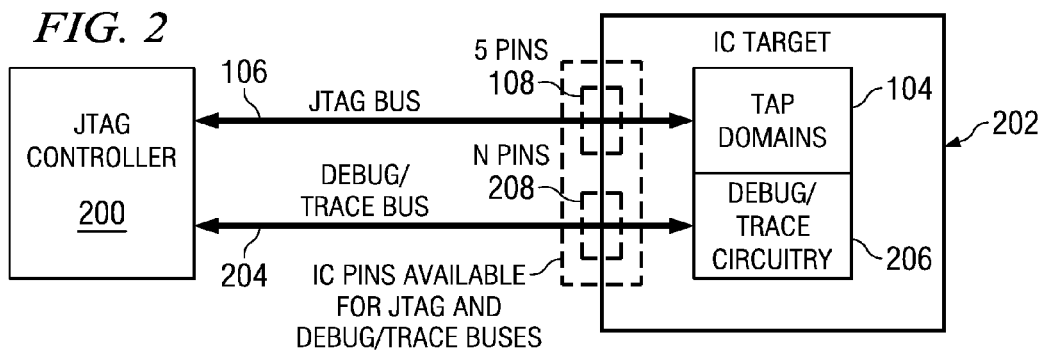
FIG. 2 illustrates a conventional JTAG controller interfaced to a target IC via a 5 signal JTAG bus and an N signal Debug/Trace bus.

If the JTAG controller were conventionally connected to the Tap Domains as seen in FIG. 1, the TDO to TDI data shift operation between them would occur on the rising edge of the CKIN and TCK at time 1470, i.e. when the Tap Domains transition from the Shift-DR (SFD) state to the Exit1-DR (X1D) state. However due to the pattern lag, the TDO to TDI data shift operation between them occurs on the rising edge of the CKIN and TCK at time 1472. The shift in of the TDO data output from the JTAG controller to the TDI input of the Tap Domains is not effected by the pattern lag since the TDO data remains in the TDI and TMS pattern input to the Tap Domains following the serialization and de-serialization process and is clocked into the Tap Domains on the rising edge of TCK 1472. However, the JTAG controller will not input the correct TDO output from the Tap Domains on the rising edge of CKIN 1470 since, due to the pattern lag, the correct TDO output (shown as dark filled) from the Tap Domains is not output from the Tap Domains until the falling edge of TCK 1470. Thus while TDO data from the JTAG controller is correctly input as TDI date to the Tap Domains, the TDO output from the Tap Domains is incorrectly input as TDI data to the JTAG controller.

JTAG controllers that are designed using Texas Instruments SN74/54ACT8990 JTAG bus controller chips can resolve the above mentioned pattern lag problem. The SN74/54ACT8990 JTAG bus controller chips were designed to operate with cabling between JTAG controllers and target ICs that can register the TMS and TDO outputs from the JTAG controller to the TMS and TDI inputs of the target IC.

Figure 15:
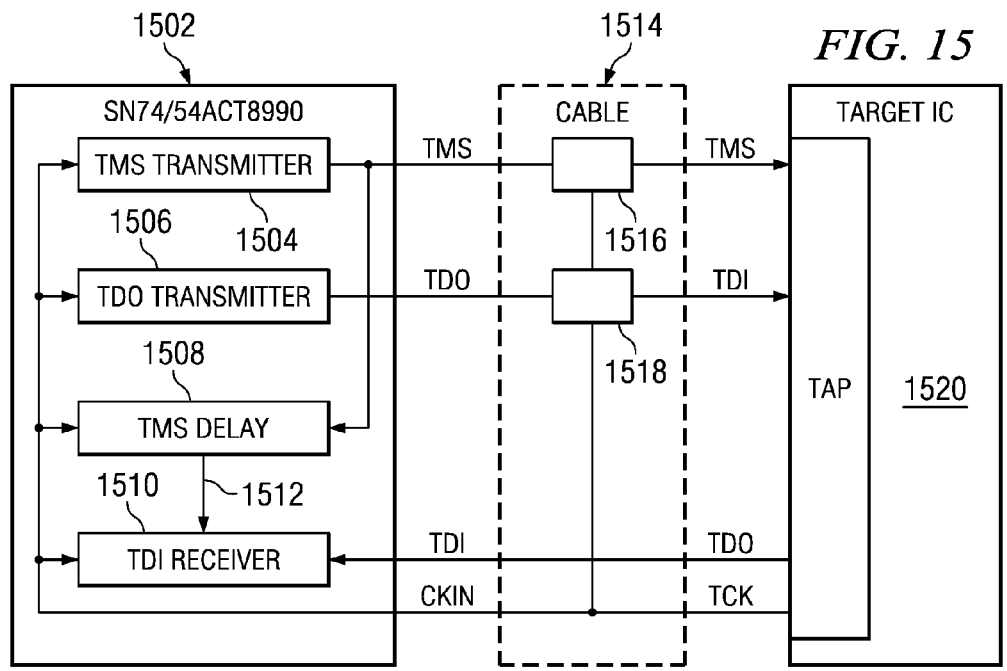
FIG. 15 illustrates a Texas Instruments SN74ACT8990 JTAG bus controller chip operating to compensate for cable delays.

FIG. 15 illustrates an arrangement whereby the ACT8990 JTAG controller chip 1502 is interfaced to a target IC 1520 via a cable 1514 that includes FFs 1516-1518 in the path between the ACT8990's TMS and TDO outputs and the target IC's TMS and TDI inputs. In this example the target IC sources the CKIN to the ACT8990 and also times the operation of FFs 1516 and 1518. As seen, the FFs 1516 and 1518 cause the TMS and TDI inputs to the target IC to lag the TMS and TDO output from the ACT8990 similar to the way the PSC and SPC circuits of FIG. 14A cause the TMS and TDI inputs to IC 300 to lag the TMS and TDO output of the JTAG controller 100 in FIG. 14A.

A simplified block diagram of the ACT 8990 shows it containing a circuit 1504 for transmitting the TMS signal, a circuit 1506 for transmitting the TDO signal, a circuit 1510 from receiving the TDI signal, and a circuit 1508 for delaying the TMS signal 1512 input to the TDI receiver circuit 1510. The TDI receiver circuit responds to the TMS signal 1512, as per the Tap state diagram of FIG. 10, to know when to input the TDI signal. In this example, all the circuits 1504-1510 are timed by the CKIN input from the TCK output of IC 1520.

If no FFs existed in the cable, i.e. TMS and TDO output of the ACT8990 were directly connected to TMS and TDI inputs of the target IC, the TMS delay circuit would be set to not delay the TMS signal input to the TDI receiver. In this case the TDI receiver 1510 operates in step with the Tap of the target IC 1520 such that TDI receiver 1510 inputs TDI data at the same time that the Tap of IC 1520 inputs TDI data.

If the FFs existed in the path as shown, the TMS delay circuit is set to delay the operation of the TDI receiver for one CKIN cycle to allow the operation of the TDI receiver to be synchronized with the operation of the Tap of IC 1520. By delaying the operation of the TDI receiver, the TDI receiver is made to operate in step with the delayed operation of the Tap of target IC 1520 such that TDI receiver 1510 inputs TDI data at the same time that the Tap of IC 1520 inputs TDI data.

While the delay circuit 1508 of the ACT8990 JTAG bus controller chip was originally designed to compensate for delays associated with cables, the present disclosure utilizes the delay circuit 1508 feature to compensate for the delay associated with the serialization and de-serialization operation of the PSC and SPC circuits in FIG. 14A.

For example, if the JTAG controller 100 of FIG. 14A used the ACT8990 chip to control the JTAG bus, the delay circuit 1508 of the ACT8990 could be set to delay the TDI input from the Tap Domains of IC 300 by one CKIN cycle such that the TDI input is correctly received on the rising edge of CKIN 1472, as shown in the timing diagram of FIG. 14C.

Thus the previously mentioned lag problem, due to the serialization and de-serialization process of the PSC and SPC circuits, is remedied by using JTAG controllers 100 that incorporate the ACT8990 JTAG bus controller chip or other chips/circuits that can similarly delay the inputting of TDI data from the Tap Domains 104 of FIG. 14A.

Figure 16:
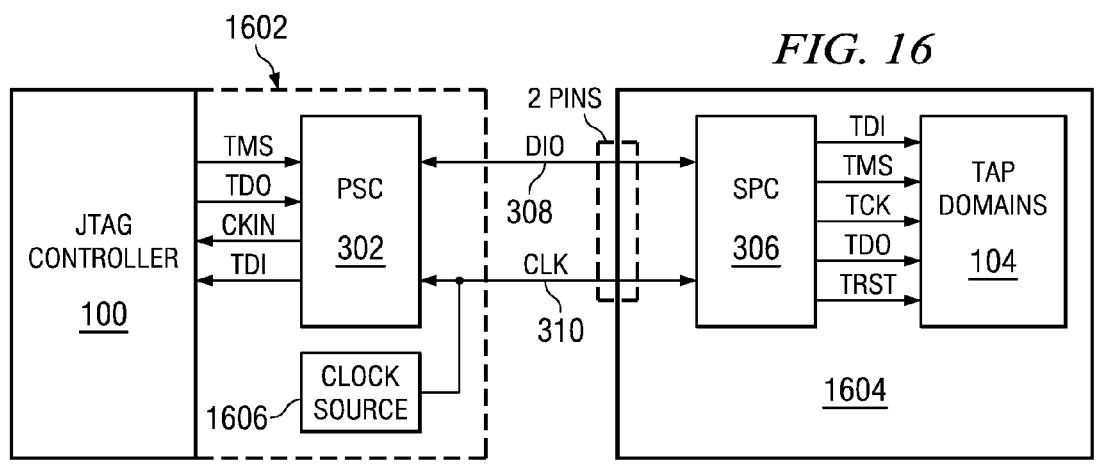
FIG. 16 illustrates a 2 pin realization of the present disclosure whereby the CLK signal is driven by a clock source within the JTAG controller.

FIG. 16 illustrates a first system example wherein a JTAG controller 100 and PSC 302 arrangement 1602 is coupled to the SPC 306 and Tap Domains 104 of a target IC 1604 via DIO 308 and CLK 310 signal wiring. In this example a clock source 1606 within arrangement 1602 is used to drive the CLK signal that times the operation of the PSC and SPC circuits. In this example the target IC 1604 requires two dedicated pins for the DIO and CLK signals.

Figure 17:
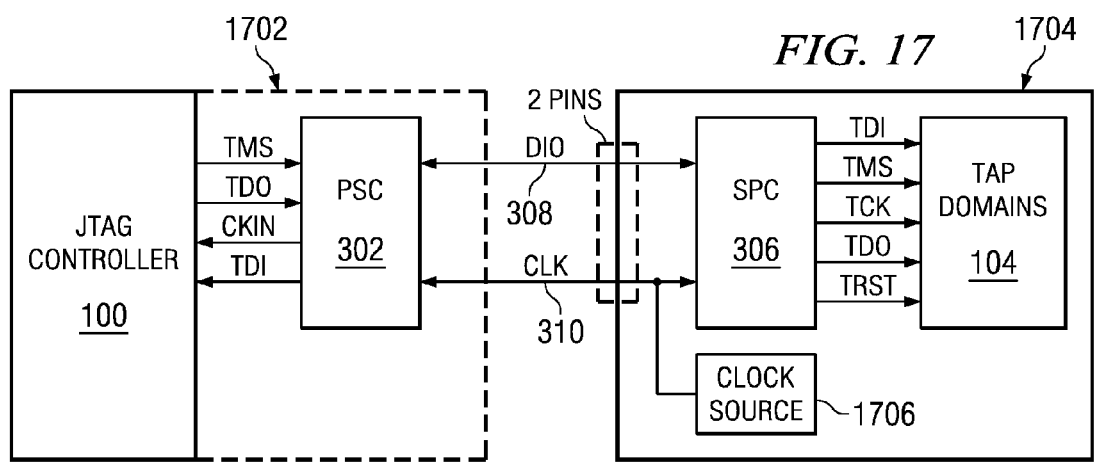
FIG. 17 illustrates a 2 pin realization of the present disclosure whereby the CLK signal is driven by an internal clock source of the target IC.

FIG. 17 illustrates a second system example wherein a JTAG controller 100 and PSC 302 arrangement 1702 is coupled to the SPC 306 and Tap Domains 104 of a target IC 1704 via DIO 308 and CLK 310 signal wiring. In this example a clock source 1706 within target IC 1704 is used to drive the CLK signal that times the operation of the PSC and SPC circuits. In this example the target IC 1704 requires two dedicated pins for the DIO and CLK signals.

Figure 18:
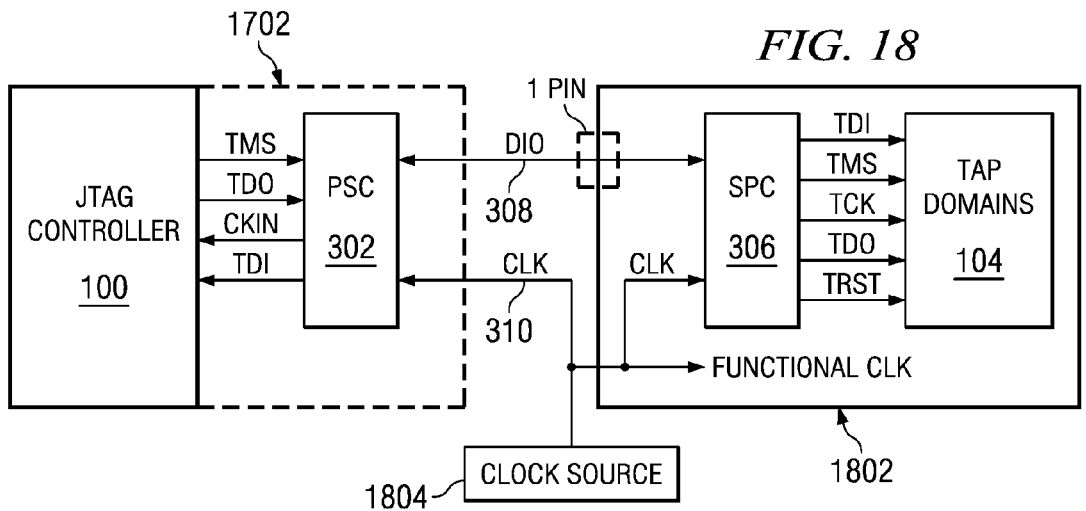
FIG. 18 illustrates a 1 pin realization of the present disclosure whereby the CLK signal is driven by an external clock source that functionally inputs to the target IC.

FIG. 18 illustrates a third system example wherein a JTAG controller 100 and PSC 302 arrangement 1702 is coupled to the SPC 306 and Tap Domains 104 of a target IC 1802 via a DIO 308 signal wire. In this example an external clock source 1804 used to input a functional clock to IC 1802 via a functionally required clock input pin. The external clock source also drives the CLK signal of PSC 302. Since the SPC 306 CLK input is connected to and driven by the IC's functional clock, a dedicated pin for the CLK signal 310 is not required on IC 1802. In this example the target IC 1802 requires only a dedicated pin for the DIO signal.

Figure 19:
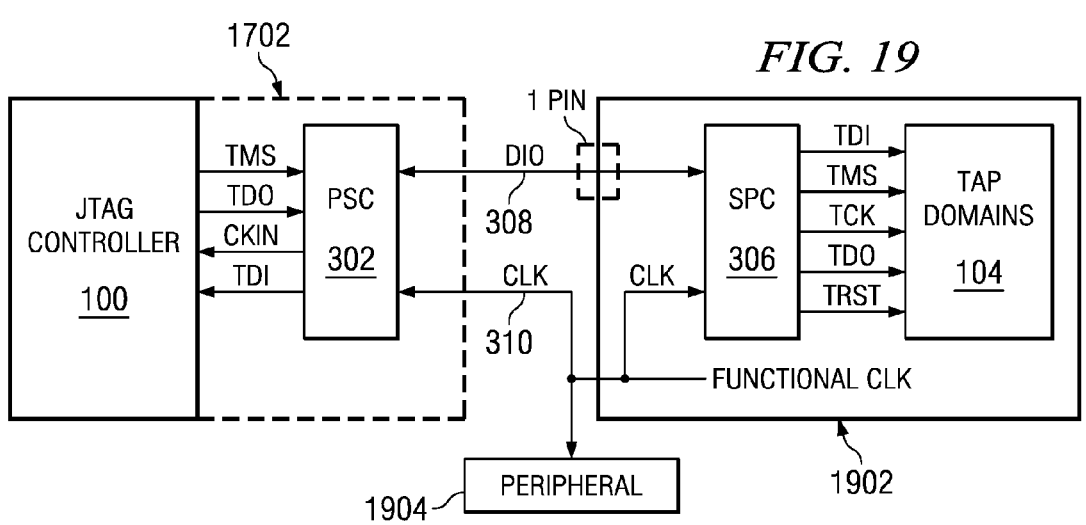
FIG. 19 illustrates a 1 pin realization of the present disclosure whereby the CLK signal is driven by an internal clock source of the target IC that functionally outputs from the IC.

FIG. 19 illustrates a fourth system example wherein a JTAG controller 100 and PSC 302 arrangement 1702 is coupled to the SPC 306 and Tap Domains 104 of a target IC 1802 via a DIO 308 signal wire. In this example a functional clock is output from IC 1902 to drive the clock input of a peripheral circuit 1904 via a functionally required clock output pin. Internal to the IC 1902, the functional clock is connected to and drives the CLK input of SPC 306. External of the IC 1902, the functional clock is connected to and drives the CLK input of PSC 302. Since the PSC 302 CLK input is connected to the external functional clock, a dedicated pin for the CLK signal 310 is not required on IC 1902. In this example the target IC 1902 requires only a dedicated pin for the DIO signal.

Figure 20:
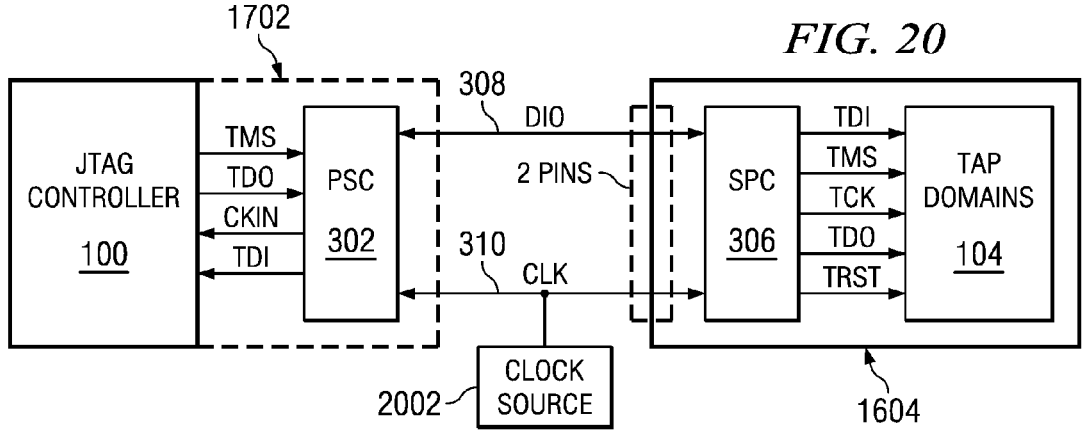
FIG. 20 illustrates a 2 pin realization of the present disclosure whereby the CLK signal is driven by an clock source external of the JTAG controller and target IC.

FIG. 20 illustrates a fifth system example wherein a JTAG controller 100 and PSC 302 arrangement 1702 is coupled to the SPC 306 and Tap Domains 104 of a target IC 1604 via DIO 308 and CLK 310 signal wiring. In this example a clock source 2002 external of both arrangement 1702 and IC 1604 is used to drive the CLK signal that times the operation of the PSC and SPC circuits. In this example the target IC 1604 requires two dedicated pins for the DIO and CLK signals.

The above system examples of FIGS. 16-20 have shown various ways to interface the PSC and SPC circuits together such that at most the interface requires two dedicated IC pins for DIO and CLK and at least the interface only requires one dedicated pin for DIO. Thus the present disclosure is seen to require only one or two dedicated pins on the target IC.

The following Figures illustrate an alternate version of the present disclosure whereby the SPC 302 and PSC 306 circuits do not use I/O circuits 504 and 710, respectively.

FIG. 21A illustrates a JTAG controller 100 interfaced to an alternate PSC circuit 2102. The PSC circuit 2102 is identical to the PSC 302 of FIG. 5A with the exception that the I/O circuit 504 is not used in PSC circuit 2102. As seen, without the I/O circuit 504 the OUT output from PISO 502 is directly output from the PSC via output buffer 1104. Also as seen, without the I/O circuit 504 the TDO input goes directly to the TDI input of the JTAG controller 100 via an input buffer 1308. As seen in FIG. 21B, the operation timing of the alternate PSC 2102 and JTAG controller 100 is identical to the FIG. 5B timing operation of the PSC 302 and JTAG controller 100 of FIG. 5A.

FIG. 22A illustrates an alternate SPC circuit 2202 interfaced to Tap Domains 104 of target IC 2204. The SPC circuit 2202 is identical to the SPC 302 of FIG. 7A with the exception that the I/O circuit 710 is not used in SPC circuit 2202. As seen, without the I/O circuit 710 the OUT input to SPC 2202 is directly input to the MRS 708 and SIPO 702 circuits via a second input buffer 1308. Also as seen, without the I/O circuit 710 the TDO output from Tap Domains 104 is directly output from SPC 2202 via 3-state buffer 1110. Buffer 2206 is enabled by the OE signal from TSM 706. The pull up (PU) element 1114 is connected to the IN signal to pull the IN signal high when it is not being externally driven for reasons previously mentioned. As seen in FIG. 22B, the operation timing of the alternate SPC 2202 and Tap Domains 104 is identical to the FIG. 7B timing operation of the SPC 302 and Tap Domains 104 of FIG. 7A.

Figure 23A:
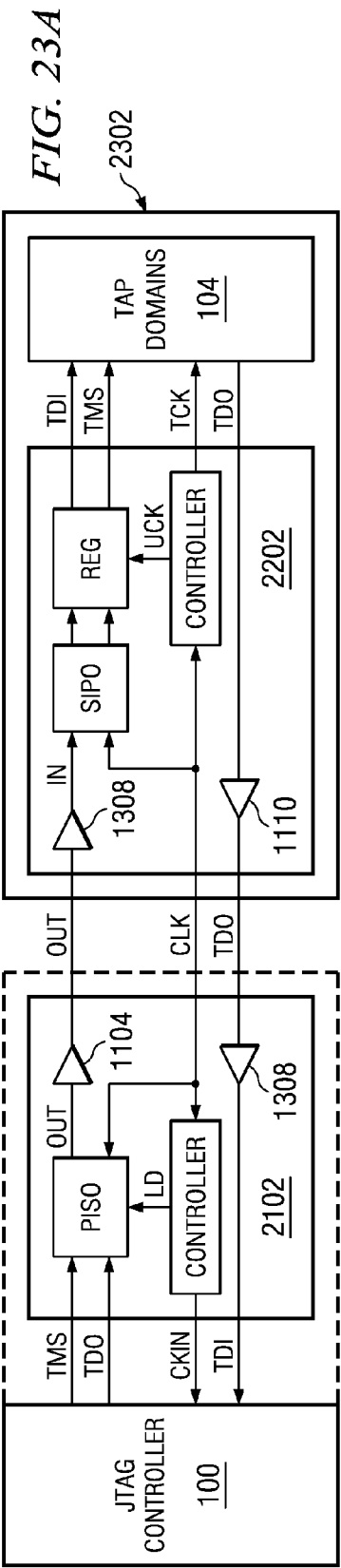
FIG. 23A illustrates the 3 signal connection between the FIG. 21A alternate PSC of the JTAG controller and the FIG. 22A alternate SPC of the target IC of according to the present disclosure.
Figure 23B:
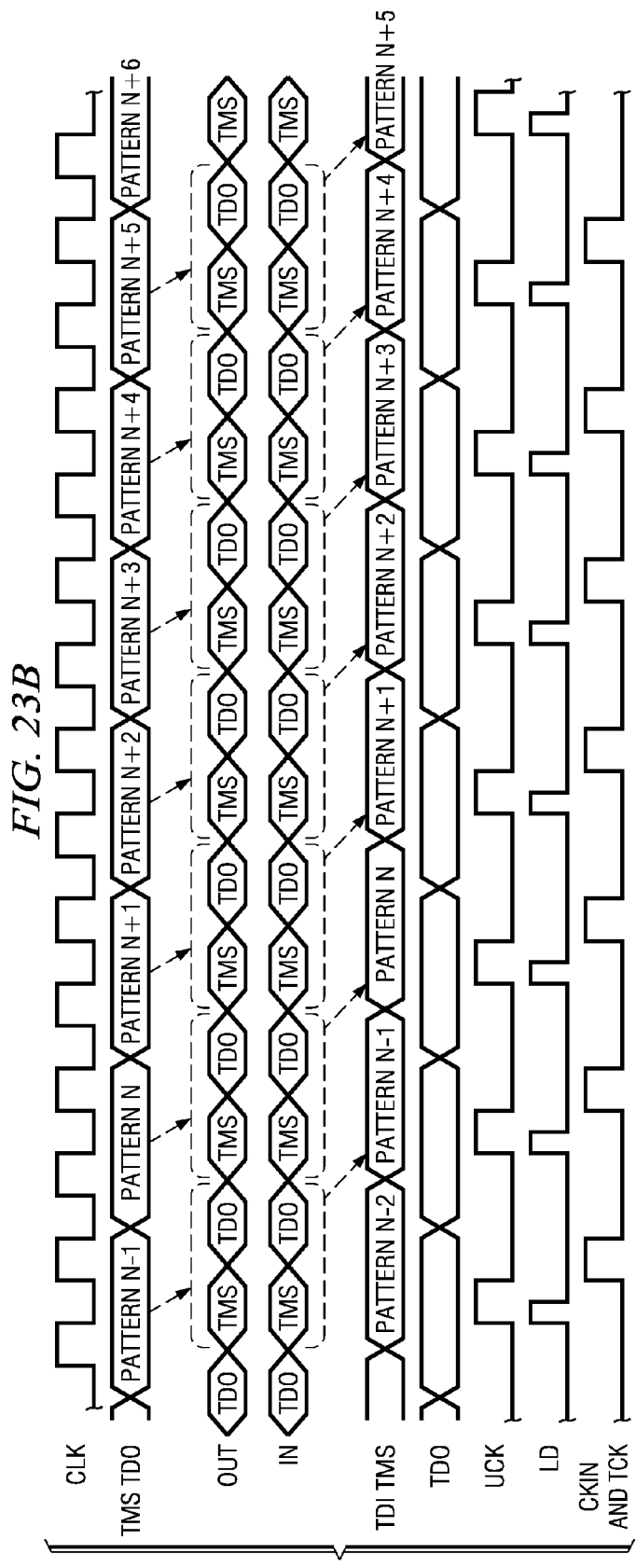
FIG. 23B illustrates a timing diagram of the operation of the alternate FIG. 21A PSC and FIG. 22A SPC circuits performing JTAG transactions between the JTAG controller and the Tap Domains of the target IC.

FIG. 23A shows a complete arrangement where the JTAG controller 100 and alternate PSC 2102 are connected to and are communicating with the alternate SPC 2202 and Tap Domains 104 of target IC 2302 via the OUT, CLK, and TDO signals. For simplification only the circuit elements of the alternate PSC 2102 and SPC 2202 that are involved with the communication process are shown. As seen the OUT output from PSC 2102 is directly input to the IN input of the SPC 2202 and the TDO output from Tap Domains 104 is directly input to the TDI input of JTAG controller 100. As seen in FIG. 23B, the operation timing of the FIG. 23A arrangement is identical to the FIG. 14B timing operation of the FIG. 14A arrangement.

Figure 24:
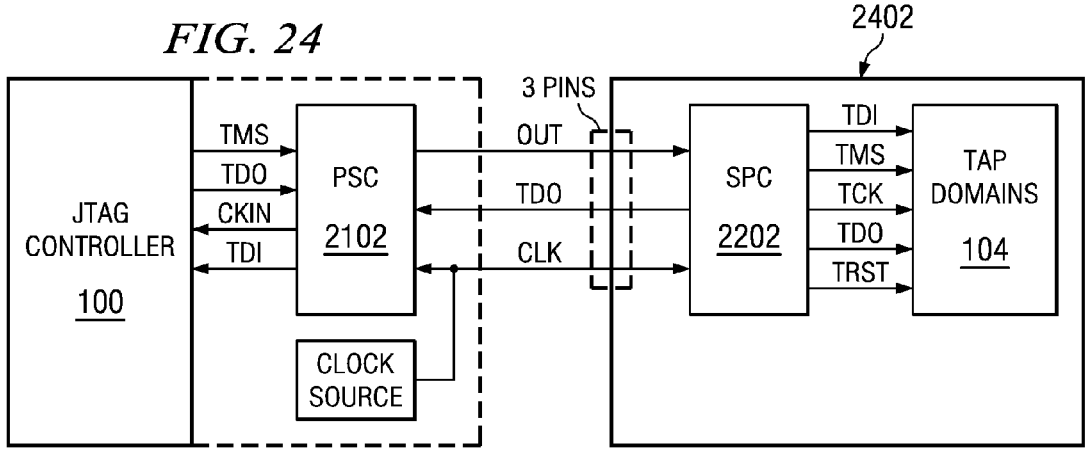
FIG. 24 illustrates a 3 pin realization of the alternate version of the present disclosure whereby the CLK signal is driven by a clock source within the JTAG controller.

FIG. 24 illustrates the previously described clocking arrangement of the FIG. 16 system. In FIG. 24, alternate PSC 2102 is used instead of PSC 302 and alternate SPC 2202 is used instead of SPC 306. As seen, the IC 2402 requires three dedicated pins for OUT, TDO, and CLK.

Figure 25:
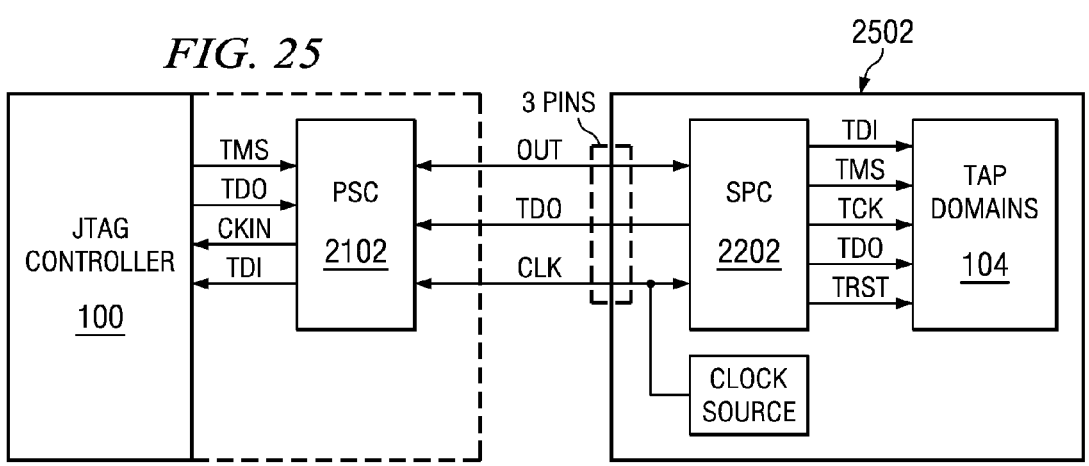
FIG. 25 illustrates a 3 pin realization of the alternate version of the present disclosure whereby the CLK signal is driven by an internal clock source of the target IC.

FIG. 25 illustrates the previously described clocking arrangement of FIG. 17 system. In FIG. 25, alternate PSC 2102 is used instead of PSC 302 and alternate SPC 2202 is used instead of SPC 306. As seen, the IC 2502 requires three dedicated pins for OUT, TDO, and CLK.

Figure 26:
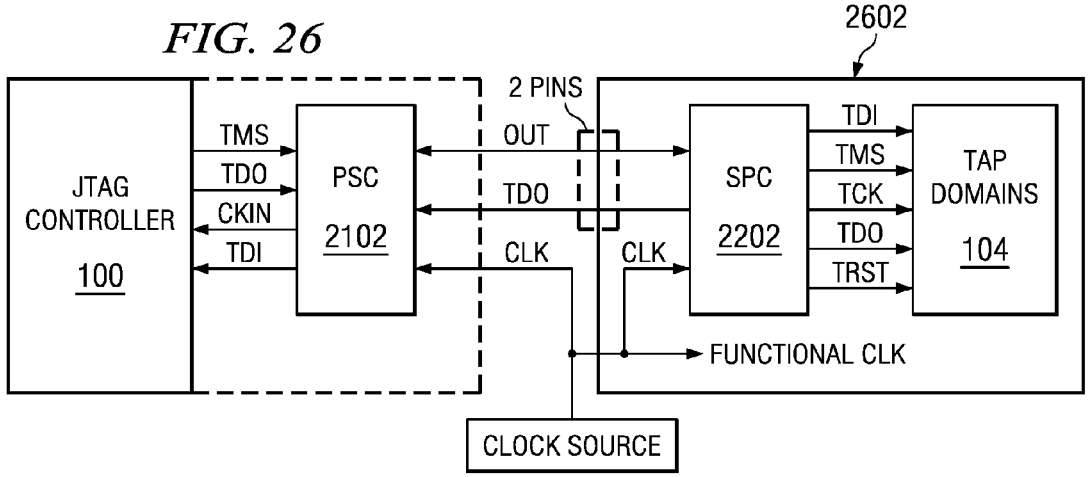
FIG. 26 illustrates a 2 pin realization of the alternate version of the present disclosure whereby the CLK signal is driven by an external clock source that functionally inputs to the target IC.

FIG. 26 illustrates the previously described clocking arrangement of FIG. 18 system. In FIG. 26, alternate PSC 2102 is used instead of PSC 302 and alternate SPC 2202 is used instead of SPC 306. As seen, the IC 2602 requires two dedicated pins for OUT and TDO.

Figure 27:
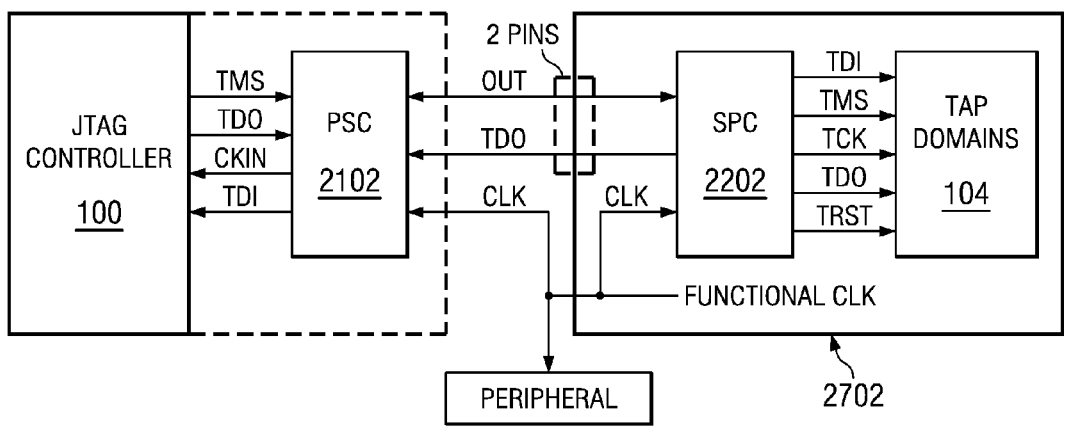
FIG. 27 illustrates a 2 pin realization of the alternate version of the present disclosure whereby the CLK signal is driven by an internal clock source of the target IC that functionally outputs from the IC.

FIG. 27 illustrates the previously described clocking arrangement of FIG. 19 system. In FIG. 27, alternate PSC 2102 is used instead of PSC 302 and alternate SPC 2202 is used instead of SPC 306. As seen, the IC 2702 requires two dedicated pins for OUT and TDO.

Figure 28:
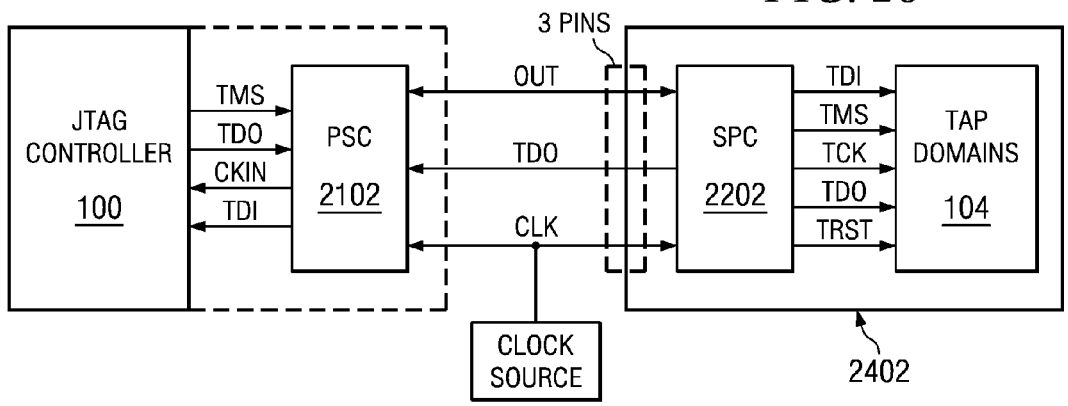
FIG. 28 illustrates a 3 pin realization of the alternate version of the present disclosure whereby the CLK signal is driven by an clock source external of the JTAG controller and target IC.

FIG. 28 illustrates the previously described clocking arrangement of FIG. 20 system. In FIG. 28, alternate PSC 2102 is used instead of PSC 302 and alternate SPC 2202 is used instead of SPC 306. As seen, the IC 2402 requires three dedicated pins for OUT, TDO, and CLK.

The above system examples of FIGS. 24-28 have shown various ways to interface the alternate PSC 2102 and SPC 2202 circuits together such that at most the interface requires three dedicated IC pins for OUT, TDO and CLK, and at least the interface only requires two dedicated pin for OUT and TDO. Thus the alternate version of the present disclosure is seen to require only two or three dedicated pins on the target IC.

In reference to FIGS. 14A, 14B, 14C, 23A, and 23B it is seen that the frequency of the CKIN and TCK signals is one half the frequency of the source driving the CLK signal. Therefore the JTAG controller and the Tap Domains operate together at one half the frequency of the CLK sources. For example, if the CLK frequency is 100 Mhz, the JTAG operations will occur at 50 Mhz. Thus the second objective of the present disclosure, stated in the DESCRIPTION OF THE RELATED ART section, of providing a reduced pin interface capable of operating at one half the frequency of the standard 5 pin JTAG interface is achieved.

It should be understood that while the SPC 306 and 2202 of the present disclosure has been shown as it would be used for accessing Tap Domains within ICs, the SPC is not limited to only accessing Tap Domains within ICs. Indeed, as the need may arise, the SPC can be used within embedded core circuits of an IC to allow accessing Tap Domains that exists within those embedded core circuits. The teaching in the present disclosure of how to use an SPC in an IC is sufficiently detailed to enable one skilled in the art to also use the SPC within an embedded core.

The following description describes an extension to the prior disclosure described above in regard to FIGS. 1-28. The extension enables the port of target devices to be addressable so that a controller may selectively enable one of a plurality of target device ports for communication. Further the ports may be made addressable and commandable to allow the controller to address a port and input a command to enable a JTAG or Trace operation on the addressed port.

As seen in FIG. 3, the interface between the PSC 302 and SPC 306 is a point to point interface, meaning that the JTAG controller 100 can only communicate to TAP Domains 104 of a connected target IC 300. If more that one target IC 300 existed, the DIO 308 and CLK 310 connection would have to be physically moved from one target IC to the next to allow the JTAG controller to communicate with multiple target ICs.

The following describes an extension of the present disclosure that allows a JTAG controller and PSC to selectively communicate to a plurality of connected target ICs through the use of an addressing technique. The extension of the present disclosure further includes a commanding technique that allows the addressed target IC to perform either a JTAG operation, as previously described, or a Trace operation to be described herein.

Figure 29:
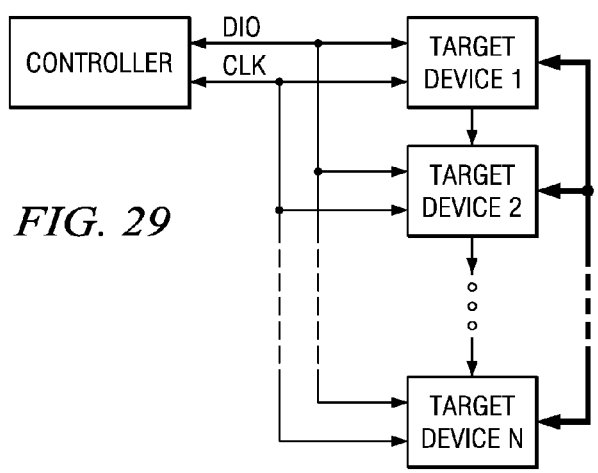
FIG. 29 illustrates an arrangement of target devices connected to a JTAG controller, each target device being addressable for communication with the controller via the DIO and CLK bus.

FIG. 29 illustrates the configuration of a JTAG controller 2902 connected to a plurality of target devices (ICs or cores within ICs) 2904-2908 via the DIO and CLK bus 2910 of the extension of the present disclosure. The addressing technique extension allows the JTAG controller 2902 to select any one of the target devices connected to the bus. Once selected the JTAG controller can communicate to the selected target device via the DIO and CLK bus as previously described. Further, the addressing technique extension allows the JTAG controller to select a group of target devices connected to the bus. Once selected the group of target devices can be controlled via the JTAG controller.

The commanding technique extension allows the JTAG controller to perform either JTAG operations or trace operations on a selected target device. The trace operation allows the target device to output trace data to the JTAG controller over the DIO bus signal. The trace data is typically data or address signals that can reveal the functioning operation of the target device in its normal operating mode. Trace operations are useful in the development and debug of target device software algorithms. The trace operations will be described in more detail later in this application.

Using the addressing technique, JTAG boundary scan operations can be performed on the interconnects 2912 between the target devices. For example each target device can be individually addressed to allow capturing boundary response test data from interconnects 2912 into their boundary scan registers and shifting the captured response test data out while shifting boundary stimulus test data in. Following the boundary capture and shift operations, all target devices may be group addressed to allow simultaneously updating the shifted in boundary stimulus test data to interconnects 2912 from their boundary scan registers. Thus the present disclosure allows the DIO and CLK bus to perform JTAG boundary scan operations on the target devices to test the interconnects between the target devices.

Figure 30:
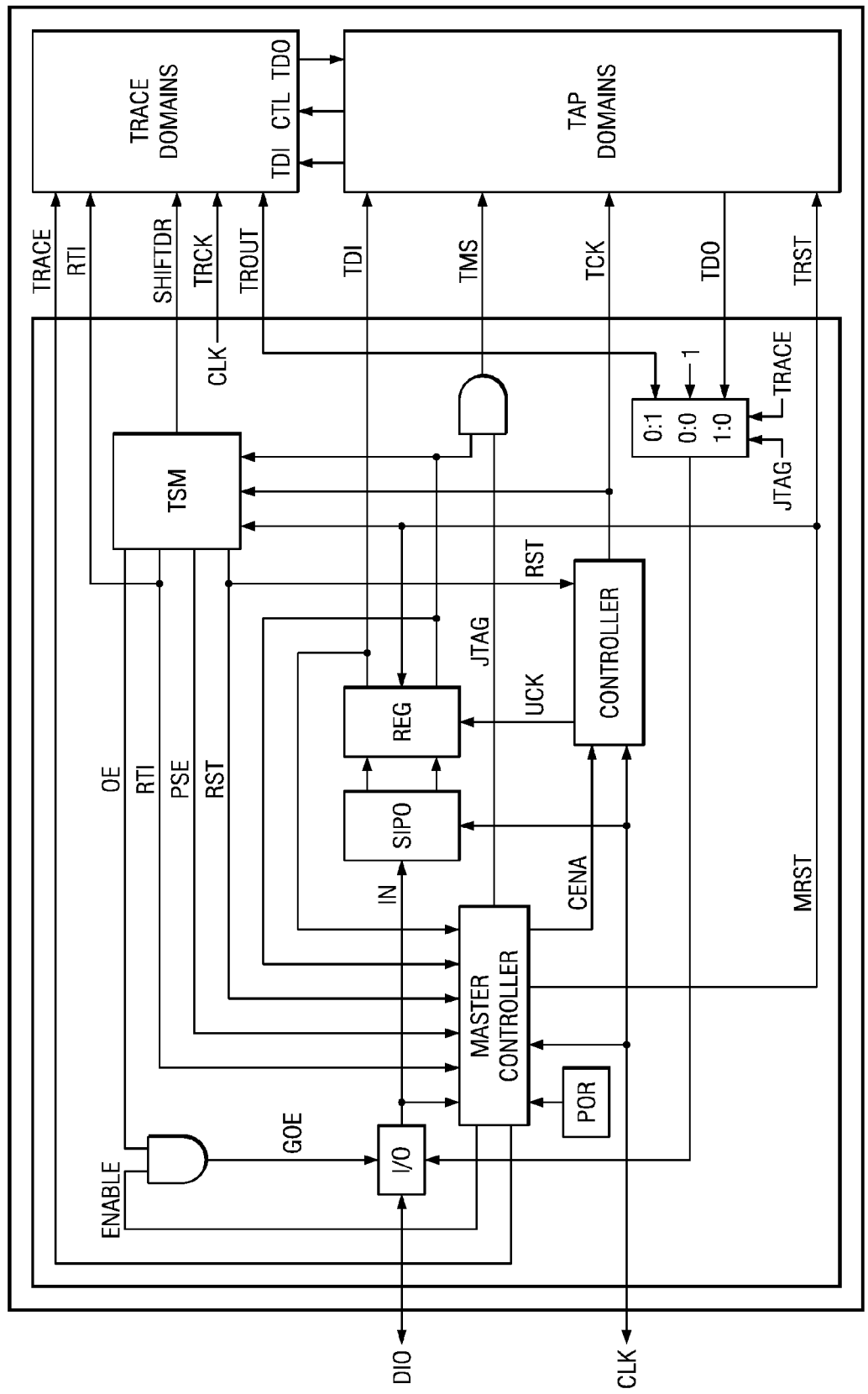
FIG. 30 illustrates a target device comprising an Address and Command Port (ACP), Trace Domains, and TAP domains.

FIG. 30 illustrates a target device 3002 comprising an address and command port (ACP) 3004, Tap domains 3006, and trace domains 3008. The Tap domains 3006 are similar to the previously described Tap domains 104 and detailed in FIGS. 4A-4C. The Tap domains 3006 are interfaced to the ACP 3004 via the TDI, TMS, TCK, TDO, and TRST signals as previously described. With the ability to perform JTAG boundary scan testing between target devices, as mentioned in regard to FIG. 29, the TAP domains 3006 preferably will contain a Tap domain for the standard IEEE 1149.1 boundary scan architecture, in addition to other TAP domains used for test, emulation, debug, and trace, to allow boundary scan testing to be performed on the interconnects 2912 between multiple target devices. The IEEE 1149.1 boundary scan architecture TAP domain will contain the TAP, bypass register, optional data registers, boundary scan register, and instruction register. The boundary scan register can be used to perform test input and output operations at the target device boundary as described in the IEEE 1149.1 standard. The other TAP domains will contain the TAP, bypass register, optional data registers, the instruction register, but not necessarily a boundary scan register.

The trace domains 3008 are interfaced to the ACP 3004 via Trace, Run Test/Idle (RTI), ShiftDR, trace clock (TRCK), and trace output (TROUT) signals. The trace domains are also interfaced to Tap domains within Tap domain 3006 via TDI, Tap control (CTL), and TDO signals.

Figure 31A:
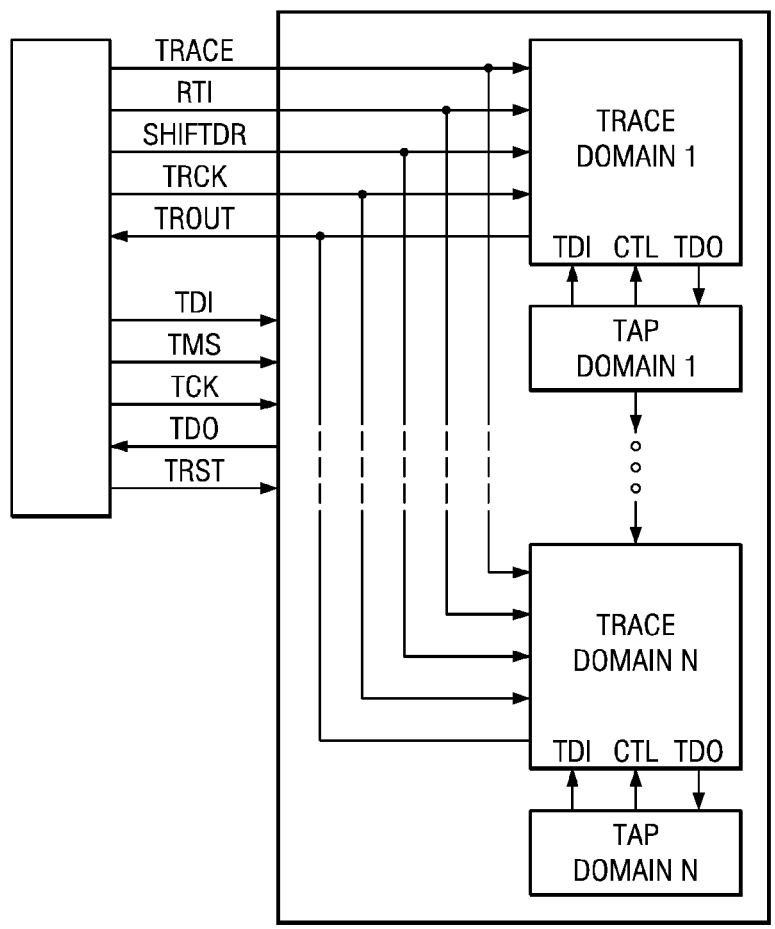
FIG. 31A illustrates a target device comprising an Address and Command Port, Trace Domains, and TAP domains, each Trace Domain being coupled to a TAP Domain.

FIG. 31A illustrates that each trace domain 1-N may be associated with a Tap domain 1-N in Tap domain block 3006. For example, Tap domain 1 may be coupled to trace domain 1 via TDI, CTL, and TDO signals, Tap domain 2 may be coupled to trace domain 2 via TDI, CTL, and TDO signals, and so on. The trace domains are all connected to the ACP 3004 via the Trace, RTI, ShiftDR, TRCK, and TROUT signals. In this example, a Tap domain may be selected by the ACP 3004 and operated to setup and enable its associated trace domain to perform a trace operation. A TAP domain sets up and enables a Trace domain to perform a trace operation by scanning data and command information into the Trace domain via the TDI, CTL, and TDO interface between the Trace domain and TAP domain. Multiple Trace domains may be enabled at the same time to perform a trace operation. However, only one trace domain may be selected at a time for outputting trace data acquired during the trace operation. When one trace domain is selected for outputting data on TROUT all other trace domains will disable their TROUT output to allow only the selected Trace domain to output data from its TROUT to the DIO 308 signal of the ACP, via I/O circuit 710. While multiple trace domains are shown in this example, only one trace domain may be used as well. Further, a trace domain does not have to be associated with each Tap domain.

Figure 31B:
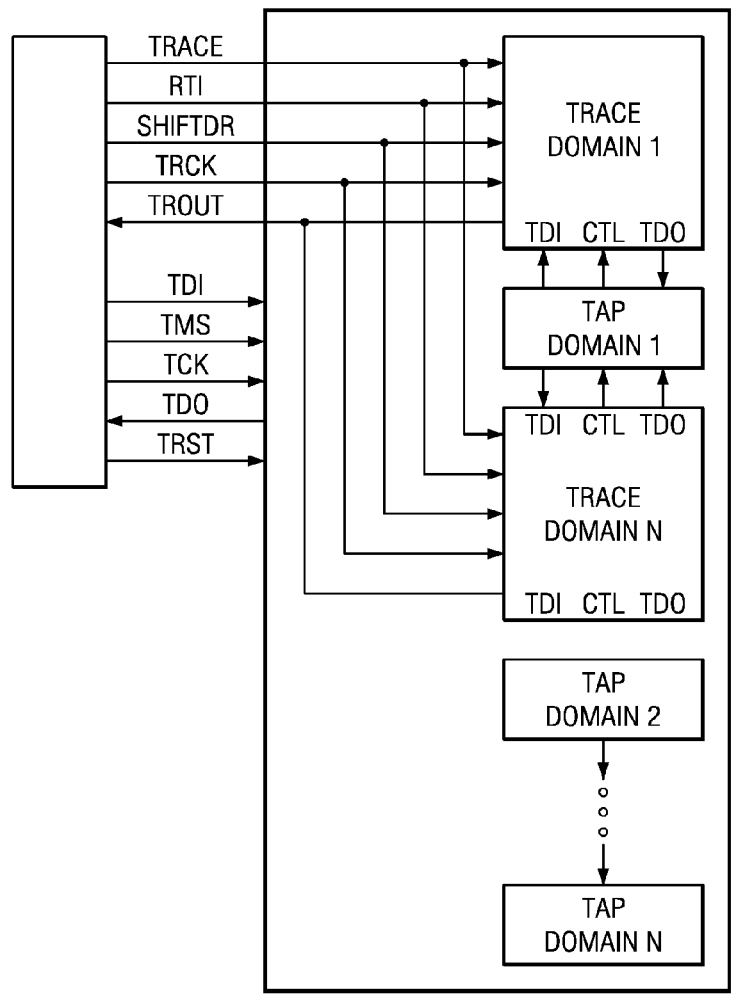
FIG. 31B illustrates a target device comprising an Address and Command Port, Trace Domains, and TAP domains, all Trace Domains coupled to a single TAP Domain.

FIG. 31B illustrates an alternate arrangement whereby a plurality of trace domains 1-N may be adapted for coupling to a single Tap domain, as per a multiplicity of TDI, CTL, and TDO signals, previously described, have been adapted for such a coupling as per the arrangement shown. In this example, the single Tap domain is used to setup and enable trace domains to perform trace operations. As in the FIG. 31A example, multiple Trace domains may be enabled to acquire trace data, but only one Trace domain at a time can be enabled to output its acquired trace data on TROUT. The other Tap domains 2-N in FIG. 31B may or may not be associated with trace domains.

Referring back to FIG. 30, the ACP 3004 is similar to the previously described SPC 306 in that it includes I/O circuit 710, SIPO 702, Register 704, controller 700, and POR 712, all having the same operation and structural inputs and outputs as previously described. The ACP differs from SPC 306 in that it includes master controller 3010, TSM 3012, gates 3014 and 3016, and multiplexer 3018. Multiplexer 3018 allows coupling the TDO output of Tap domains 3006 to the input of I/O circuit 710, the trace output (TROUT) of the trace domains 3008 to the input of I/O circuit 710, or to couple a fixed logic one to the input of I/O circuit 710, depending on the settings of the JTAG and Trace signal outputs of master controller 3010.

The master controller 3010 substitutes for the MRS circuit 708 of FIG. 7A and includes the master reset and PSC to SPC synchronization features of the MRS circuit. In addition, the master controller is extended to provide the additional feature of allowing the ACP to be addressed and commanded to perform either JTAG or Trace operations. Once the ACP has been addressed and commanded it either performs JTAG operations very similar to those described with the SPC, or it performs trace operations as described later in this application.

Master controller 3010 outputs the previously described CENA signal to controller 700, the previously described MRST signal to TSM 3012, register 704, and Tap Domains 3006. The master controller outputs a new signal referred to as "JTAG" to And gate 3016 and multiplexer 3018, a new signal referred to as "Enable" to And gate 3014, and a new signal referred to as "Trace" to Trace Domains 3008 and multiplexer 3018. The CENA output is used to enable controller 700, the MRST output is used to reset the ACP circuits, Tap domains, and Trace domains, the JTAG output is used to enable access to the Tap domains and to couple the TDO output of the Tap domains to the I/O circuit via multiplexer 3018, the Trace output is used to enable the trace domains for trace operations and to couple the TROUT output of the Trace domains to the I/O circuit via multiplexer 3018.

Master controller 3010 inputs the previously described RST signal from TSM 3012, the previously described IN signal from I/O circuit 710, the previously described CLK signal 310, and the previously described power on reset signal from POR circuit 712. The master controller inputs new signals referred to as "RTI" and "PSE" from TSM 3012. The master controller also inputs the TDI and TMS signals from register 704. The RST input is used to reset the master controller, the IN input is used to maintain the master controller in a reset state or to input the previously described synchronization pattern, the CLK input times the operation of the master controller, the POR input resets the master controller at power up, the RTI input indicates to the master controller when the TSM is in the Run Test/Idle state, the PSE input indicates to the master controller when the TSM is in the Pause-IR or Pause-DR state, and the TDI and TMS inputs are used to input address and command inputs to the master controller.

Figure 32:
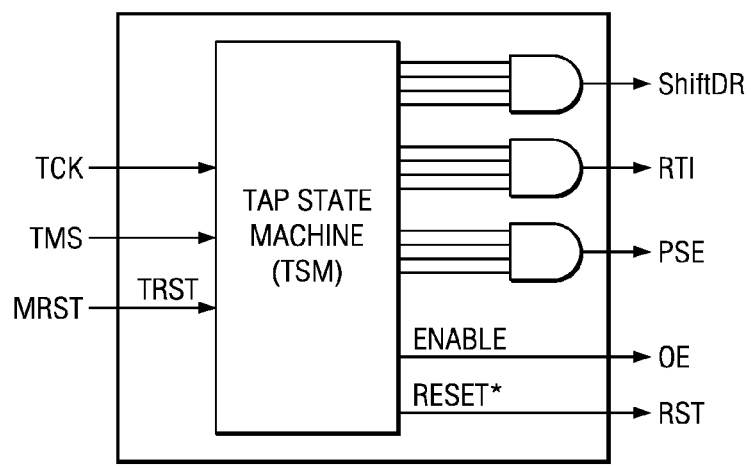
FIG. 32 illustrates a TAP State Machine having outputs for outputting ShiftDR, Run Test/Idle (RTI), Pause (PSE), Output Enable (OE), and Reset (RST) signals.

FIG. 32 illustrates an example design of the TSM 3012. The TSM 3012 includes an IEEE 1149.1 Tap state machine 3201 operating according to the state diagram of FIG. 10. The Tap state machine inputs the TCK, TMS and MRST (TRST) signals. The Tap state machine outputs are coupled to gating 3202-3206. Gating 3202 decodes when the Tap state machine is in the Shift-DR state (see FIG. 10) and outputs the ShiftDR signal in response. Gating 3204 decodes when the Tap state machine is in the Run Test/Idle state and outputs the RTI signal in response. Gating 3206 decodes when the Tap state machine is in either the Pause-IR or Pause-DR states and outputs the PSE signal in response. The OE enable signal is coupled to the Enable output of the Tap state machine. The RST output is coupled to the Reset* output of the Tap state machine.

Figure 33:
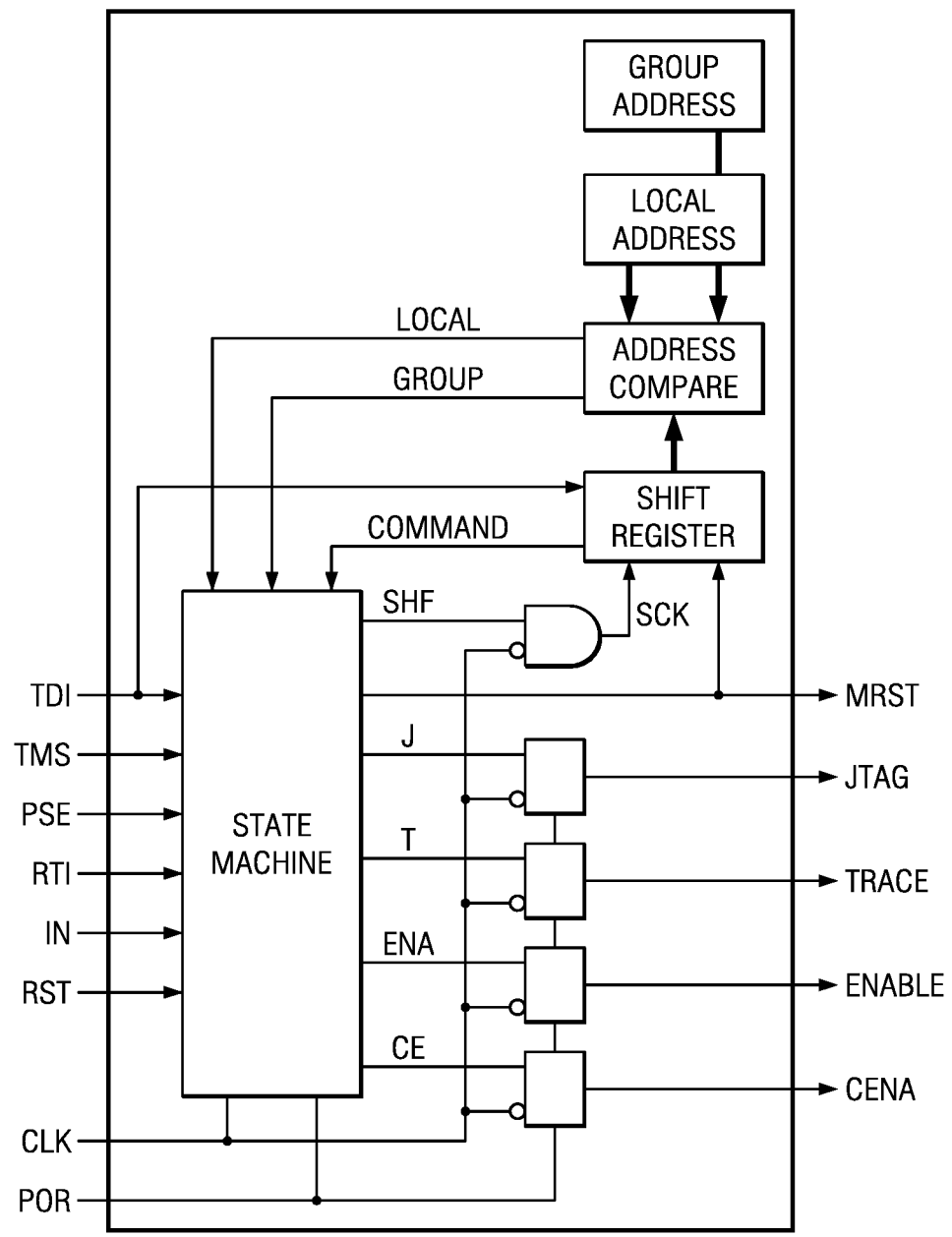
FIG. 33 illustrates the Master Controller of the Address and Command Port.

FIG. 33 illustrates an example design of the master controller 3010. By comparison with the MRS circuit 708 of FIG. 9A, it is seen that the master controller 3010 is an extension of MRS circuit 708. The master controller comprises a state machine 3302, a shift register 3304, an address compare circuit 3306, a local address source 3308, a group address source 3310, FFs 3312-3318, and And gate 3320. The TDI signal is input to the state machine and shift register. The TMS, PSE, RTI, IN, and RST signals are input to the state machine. The CLK signal is input to the state machine and an inverted CLK signal is input to the FFs. The POR signal is input to the state machine and the FFs. The MRST signal is output from the state machine. The JTAG, Trace, Enable, and CENA signals are output from the state machine via FFs 3312-3318.

The state machine inputs a local address indication signal (Local) and a global address indication signal (Global) from the address compare circuit 3306. The state machine inputs a command signal (Command) from shift register 3304. The state machine outputs a shift (SHF) signal to gate 3320 to gate the inverted CLK input to the shift clock (SCK) input of the shift register.

The shift register 3304 inputs the TDI signal, the SCK signal, and the TRST signal. The shift register outputs address signals to address compare circuit 3306 and command signals to state machine 3302. Address and command data is shifted into the shift register from the TDI input in response to the SCK. The shift register is reset to all zeros in response to a low on the MRST input.

The address compare circuit 3306 inputs the address signals from shift register 3304, the local address signals from local address source 3308, and the group address signals from group address source 3310. The address compare circuit outputs the Local and Group address indicator signals to the state machine 3302.

The local address source 3308 is the address of the ACP 3004. The Local address for each ACP is unique to allow each ACP to be individually addressed. An all zero address may not be used as a Local address, since the all zero address is the value contained in the shift register 3304 following a MRST reset input. No ACP is addressed when the shift register contains the all zero address. While this example implementation uses the all zero address as a non-address value, another address, such as all ones, could have been used as well for the non-address value. The address of the local address source may be provided as a hardwired address, a programmable address, an address randomly generated at power up, an address shifted into a shift register, an address written to a parallel register/memory location, an address provided at IC pins or core terminals, or by any other suitable means for providing a unique address.

The group address source 3310 is a source providing a single Group address that recognizable by all ACPs 3004. The Group address must be unique from any assigned local address. Also the Group address must not be an all zero value since, as mentioned above, that is the address value in the shift register following a MRST reset input. The Group address is a common and fixed address in all ACPs.

Figure 34:
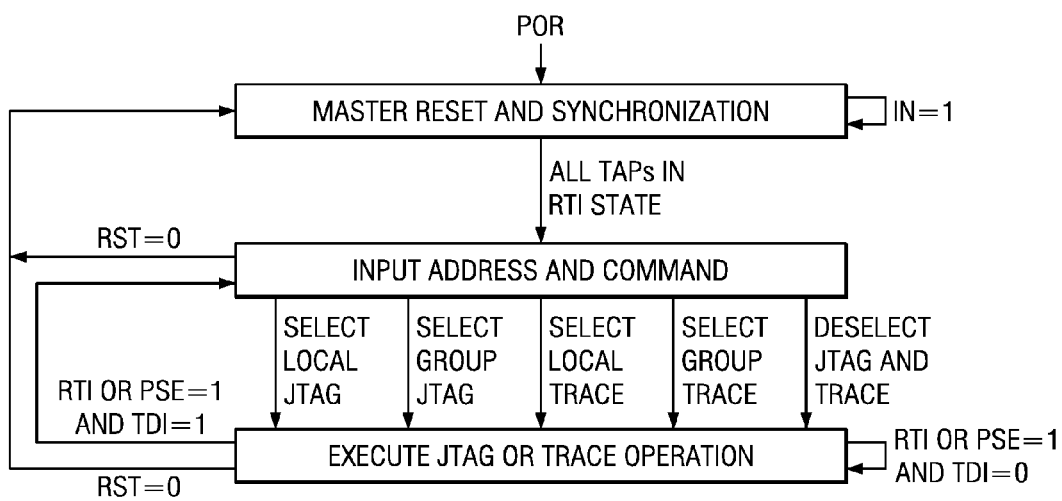
FIG. 34 illustrates the high level block diagram operation of the Master Controller of FIG. 33.

FIG. 34 illustrates the high-level block diagram operation of the master controller's state machine 3302. In response to a low on the POR input or a low on the RST input, the state machine will enter the Master Reset & Synchronization block 3402. The state machine will remain the Master Reset & Synchronization block while the IN input is high. When the previously described synchronization input sequence occurs on the IN input, the state machine will transition to the Input Address & Command block 3406 to input an address and a command.

Depending upon the address and command input, the state machine will; (1) select a local JTAG operation and transition to the Execute JTAG & Trace operation block 3408 to execute the JTAG operation, (2) select a group JTAG operation and transition to the Execute JTAG & Trace operation block 3408 to execute the group JTAG operation, (3) select a local Trace operation and transition to the Execute JTAG & Trace operation block 3408 to execute the Trace operation, (4) select a group Trace operation and transition to the Execute JTAG & Trace operation block 3408 to execute the Trace operation, or (5) deselect JTAG & Trace operations and transition to the Execute JTAG & Trace operation block 3408 and perform no JTAG or Trace operation. If the RST signal goes low while the state machine is in the Input Address & Command block 3406, the state machine will return to the Master Reset & Synchronization block 3402.

The state machine will remain in the Execute JTAG & Trace Operation block 3408 during transitions through JTAG instruction register scan operations as per FIG. 10, during transitions through JTAG data register scan operations as per FIG. 10, during transitions into the Run Test/Idle (RTI) state (if TDI is set low) as per FIG. 10, and during transitions into the Pause-IR or Pause-DR (PSE) states (if TDI is set low) as per FIG. 10.

The state machine will transition from the Execute JTAG & Trace Operation block 3408 to the Input Address & Command block 3406 in the Run Test/Idle state (RTI), the Pause-IR state (PSE), or the Pause-DR state (PSE) if TDI is set high. The process of setting TDI high in the Run Test/Idle, Pause-IR, or Pause-DR state is a signaling scheme use to cause the state machine to transition from the Execute JTAG or Trace operation block to the Input Address & Command block 3406 so that another address and command may be input to the ACP. The state machine will transition from the Execute JTAG & Trace Operation block 3408 to the Master Reset & Synchronization block 3402 when the RST signal is set low. Entry into the Master Reset & Synchronization block 3402 from the Execute JTAG & Trace Operation block 3408 is typically done after all pending JTAG or Trace operations have been completed.

Figure 35:
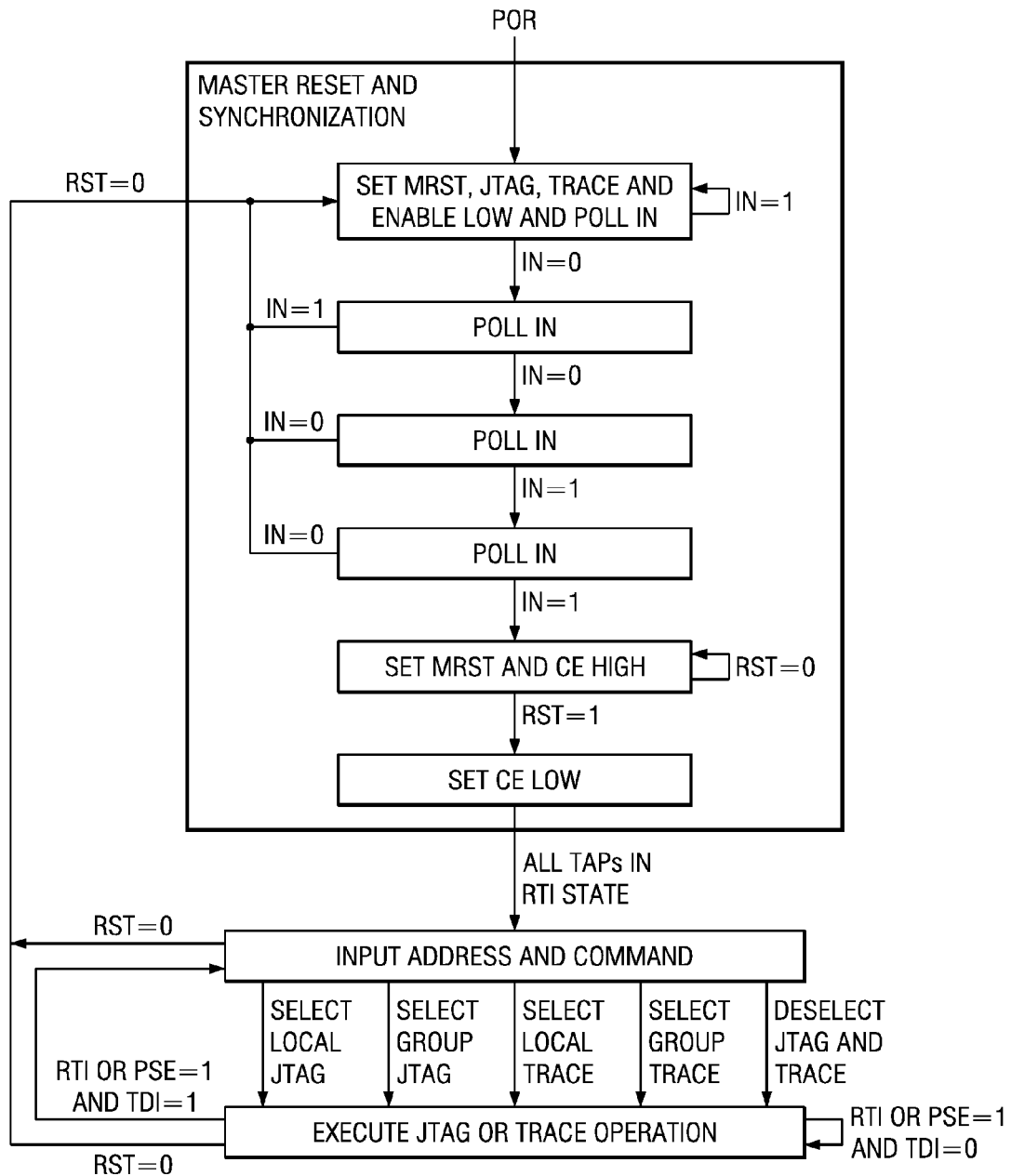
FIG. 35 illustrates the state diagram of the Master Reset and Synchronization block of the Master Controller.

FIG. 35 illustrates a more detailed state diagram of the Master Reset & Synchronization block 3402 of the master controller 3010. By inspection, the state diagram of the Master Reset & Synchronization block 3402 is seen to be similar to the previously described state diagram of the MRS circuit 708 of FIG. 9B. For example, state 3502 of FIG. 35 is similar to state 904 of FIG. 9B, states 3504-3510 of FIG. 35 are similar to states 906-912 of FIG. 9B, and state 3502 of FIG. 35 is similar to state 914 of FIG. 9B. Also a low on POR will cause entry into state 3502 of FIG. 35, as it caused entry into state 904 of FIG. 9B.

The differences between the state diagram of FIG. 35 and FIG. 9B is that; (1) state 3502 of FIG. 35 sets the new JTAG, Trace, and Enable signals low in addition to setting the previously described MRST signal low, and (2) state 3512 unconditionally transitions to the Input Address & Command block 3406 whereas state 914 of FIG. 9B either transitions to the state 904 if RST is low or remains in state 914 if RST is high.

As can be understood from the previous description of MRS circuit 708 and state diagram 9B, the state diagram of FIG. 35 provides the same master reset and synchronization features as provided in state diagram 9B. However, after having performed the synchronization feature, the state diagram of FIG. 35 transitions through the "Set CE Low" state 3512 to enter the Input Address & Command state 3406, instead of remaining in the "Set CE Low" state 914 as does the state diagram of FIG. 9B. As indicated in FIG. 35, all Tap domains 3006 will be in the Run Test/Idle (RTI) state when the transition occurs from state 3502 to the Input Address & Command block 3406.

Figure 36:
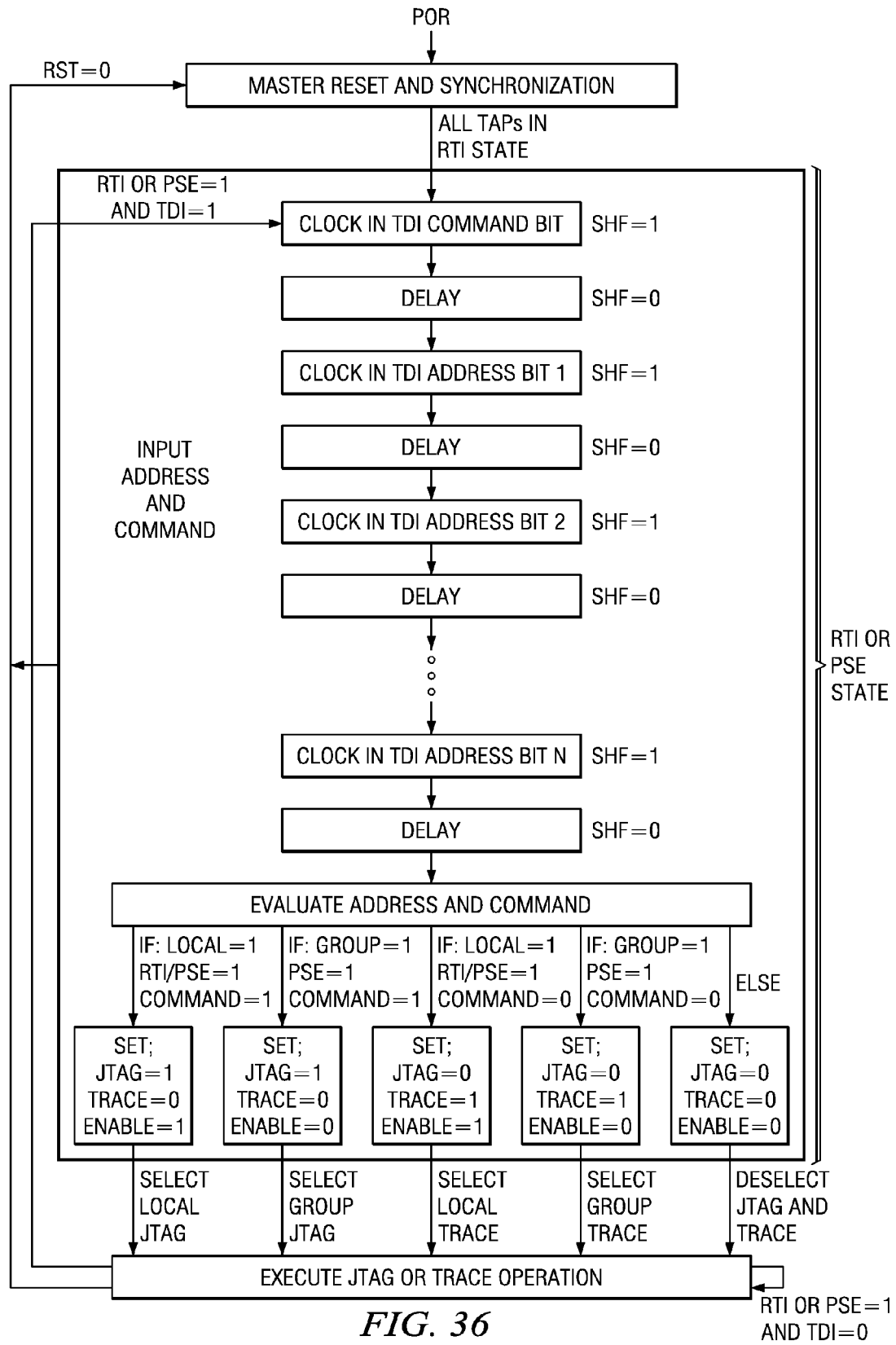
FIG. 36 illustrates the state diagram of the Input Address and Command block of the Master Controller.

FIG. 36 illustrates a more detailed state diagram of the Input Address & Command block 3406 of the master controller 3008. As seen, entry into the Input Address & Command block 3406 from either the Master Reset & Synchronization block 3402 or the Execute JTAG or Trace block 3408 will be to the "Clock in TDI Command Bit" state 3602. Also as seen, entry into the Input Address & Command block 3406 can only occur in the TSM is in either the Run Test/Idle (RTI) or Pause-IR/Pause-DR (PSE) states. In state 3602 the SHF signal output from state machine 3302 is set high to allow gating a CLK 310 input to the shift register 3304 so that the logic value on the TDI input from register 704 is shifted into shift register 3304 of FIG. 33. The TDI logic value is a command that determines whether the operation will be a JTAG operation or Trace operation. The next state 3604 is a "Delay" state that compensates for the shifting in of the TMS signal prior to the shifting in of the next TDI signal into SIPO 702. As previously described in FIGS. 7A and 7B, the SIPO 702 receives two bit packets of serial TMS and TDI signals from PISO 502. Thus "Delay" states are included in the state diagram to allow the shift register 3304 to correctly input the TDI signal of each shifted in two bit packet. During "Delay" states, the SHF signal output of state machine 3302 is set low to gate off the CLK input to shift register 3304. The next state 3606 is the "Clock in TDI Address Bit 1" state, which is used to shift the first address bit into shift register 3304. In state 3606, the SHF signal is set high to gate a CLK input to shift register 3304 to shift in the first address bit from TDI. As seen the state machine continues to transition through additional "Delay" and "Clock in TDI Address Bit" states 3608-3616 until the all address bits have been input to shift register 3304.

After the command and address bits have been shifted into shift register 3304, the state machine 3302 transitions to the "Evaluate Address & Command" state 3618. One of the following actions 3620-3628 will occur as a result of the evaluation in state 3618.

Action 3620—If the address bits match the Local address (Local=1), the RTI or PSE signal is high, and the command is a JTAG command (Command=1), the state machine will set the JTAG signal high (JTAG=1), the Trace signal low (Trace=0), and the Enable signal high (Enable=1), and transition to the Execute JTAG or Trace Operation block 3408 to perform a local JTAG operation.

Action 3622—If the address bits match the Group address (Group=1), the PSE signal is high, and the command is a JTAG command (Command=1), the state machine will set the JTAG signal high (JTAG=1), the Trace signal low (Trace=0), and the Enable signal low (Enable=0), and transition to the Execute JTAG or Trace Operation block 3406 to perform a group JTAG operation.

Action 3624—If the address bits match the Local address (Local=1), the RTI or PSE signal is high, and the command is a Trace command (Command=0), the state machine will set the JTAG signal low (JTAG=0), the Trace signal high (Trace=1), and the Enable signal high (Enable=1), and transition to the Execute JTAG or Trace Operation block 3406 to perform a local Trace operation.

Action 3626—If the address bits match the Group address (Group=1), the PSE signal is high, and the command is a Trace command (Command=0), the state machine will set the JTAG signal low (JTAG=0), the Trace signal high (Trace=1), and the Enable signal low (Enable=0), and transition to the Execute JTAG or Trace Operation block 3406 to perform a group Trace operation.

Action 3628—If the address bits do not match the Local or Group address, the state machine will set the JTAG signal low (JTAG=0), the Trace signal low (Trace=0), and the Enable signal low (Enable=0), and transition to the Execute JTAG or Trace Operation block 3406. No JTAG or Trace operation occurs in the Execute JTAG or Trace Operation block as a result of this action.

While the above described address and command input sequence used only a single command bit input, it could easily be expanded to include multiple command bit inputs as well. The use of multiple command bit inputs would allow future expansion of the commanding capability to allow additional operations beyond just JTAG or Trace to be performed by the present disclosure. Further, while the above described address and command input sequence choose to input the command first and the address second, this could be reversed to inputting the address first and the command second if desired.

To facilitate standardized use of the present disclosure, it is suggested that the length of the address and command bit fields be fixed, i.e. the command bit field is preferably a fixed number of bits and the address bit field is preferably a fixed number of bits. Further, and again to facilitate standardization, it is suggested that one of the addresses within the address field be designated as an address not to be used by any ACP 3004. This would allow for one address to be reserved as a global disconnect address that, if input to a group of ACPs, would guarantee that none of the ACPs would be addressed, i.e. Action 3628 would take place. It is logical that the previously mentioned all "zero address", i.e. the address contained in shift register 3304 of FIG. 33 following a MRST reset input, be used as the global disconnect address, since that address does not to select any ACP. The ability to globally disconnect all ACPs facilitates the JTAG and Trace group addressing feature of the present disclosure as will be describe in more detail later.

The following FIGS. 37-47 illustrate timing diagrams of the ACP 3004 of FIG. 30 operating to select and deselect JTAG TAP domain operations. In FIGS. 37-47, the CLK is running to; (1) input the previously described serial TMS and TDI signal packets (shown in dotted boxes) from the IN signal to SIPO 702, (2) generate the previously described UCK to register 704, and (3) generate the previously described TCK signal to the TAP domains 3006 and TSM 3012. A "D" signal in a TMS and TDI packet indicates that TDI is either an JTAG instruction or data bit, a "C" signal in a packet indicates that TDI is a command bit, an "A" signal in a packet indicates that TDI is an address bit, a "0" signal in a packet indicates when TMS or TDI is low, and a "1" signal in a packet indicates when TMS or TDI is high. To simplify the timing examples, it is assumed that the master controller 3010 of the ACP has been designed to include one command (C) bit and three address (A) bits.

Figure 37:
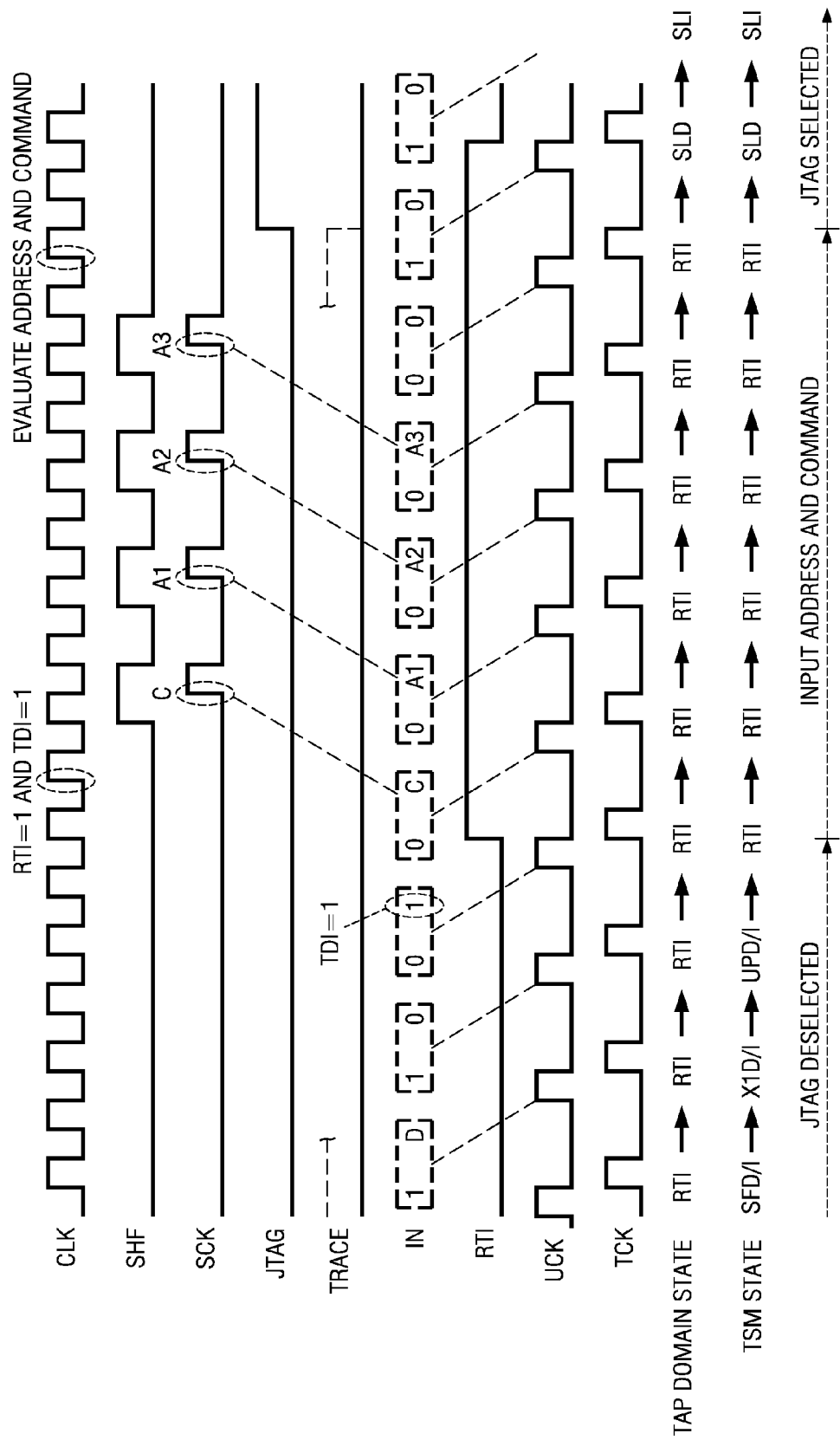
FIG. 37 illustrates an ACP timing example of selecting a JTAG operation in the Run Test/Idle state.

FIG. 37 illustrates the timing of selecting a JTAG TAP domain in the Run Test/Idle (RTI) state. As seen, initially the TAP domain is deselected in the RTI state, the master controller 3010 is in the Execute JTAG or Trace block 3408, and the TSM 3012 is transitioning through the TAP states of FIG. 10, according to the TMS signal updated from register 704. When TMS and TDO packet 3702 is updated from register 704 the TSM transitions from the Shift-DR or Shift-IR (SFD/I) state to the Exit1-DR or Exit1-IR (X1D/I) state, respectively, on TCK 3722. When packet 3704 is updated from register 704 the TSM transitions from the X1D/I state to the Update-DR or Update-IR (UPD/I) state, respectively, on TCK 3724. When packet 3706 is updated from register 704 the TSM transitions from the UPD/I state to the RTI state on TCK 3726 and sets the RTI signal high. The TDI value in packet 3706 is set high as the previously described signal that enables the master controller 3010 to transition from the Execute JTAG & Trace Operation block 3408 to the Input Address & Command block 3406. The master controller transitions to the Input Address & Command block upon detecting that RTI and TDI are both high at time 3740.

When packet 3708 is updated from register 704, the command (C) bit on TDI is shifted into shift register 3304 on SCK 3742. Since a JTAG operation is being selected, the command bit will be set high. When packet 3710 is updated from register 704, the first address (A1) bit on TDI is shifted into shift register 3304 on SCK 3744. When packet 3712 is updated from register 704, the second address (A2) bit on TDI is shifted into shift register 3304 on SCK 3746. When packet 3714 is updated from register 704, the third address (A3) bit on TDI is shifted into shift register 3304 on SCK 3748. At time 3750, the master controller evaluates the command (C) and address (A) bits in shift register 3304.

If the command bit is high and the address bits match the Local ACP address the master controller will perform action 3620 of FIG. 36 and transition to the Execute JTAG & Trace Operation block 3408. Since the enable input to And gate 3014 is set high by action 3620, the selected JTAG TAP domain outputs TDO data to DIO during Shift-DR and Shift-IR states. All non-addressed ACP master controllers will perform action 3628 and transition to the Execute JTAG & Trace Operation block 3408.

In FIG. 37, the dotted line 3752 on the Trace signal indicates that if a Trace operation was previously selected it would become deselected at time 3750 as a result of the above mentioned action 3620.

When packet 3718 is updated from register 704 the TSM and TAP domains of the addressed ACP will transition from the RTI state to the Select-DR (SLD) state on TCK 3738 to initiate a JTAG operation. In response to updated packet 3718 only the TSM of non-addressed ACPs will transition from the RTI state to the SLD state, i.e. the TAP domains of non-selected ACPs will remain deselected in the RTI state. As seen in this example, packet 3720 will cause the TSM and TAP domains of the addressed ACP and the TSM of non-addressed ACPs to further transition from the SLD to the Select-IR (SLI) state.

As seen in FIG. 37, the TDI bits of packets 3702-3720 remain low unless the TDI bit of a packet is inputting a JTAG instruction or data bit (D), a command bit (C), an address bit (A), or the high signal (packet 3706) that causes a transition from the Execute JTAG & Trace Operation block 3408 to the Input Address & Command block 3406 at time 3740. Also the TMS bits of packets 3708-3716 remain low until the ACP's address and command input operation has been completed. Maintaining TMS low during the address and command input operation causes the ACP's master controller, TSM, and any selected TAP domain to remain in the RTI state.

Figure 38:
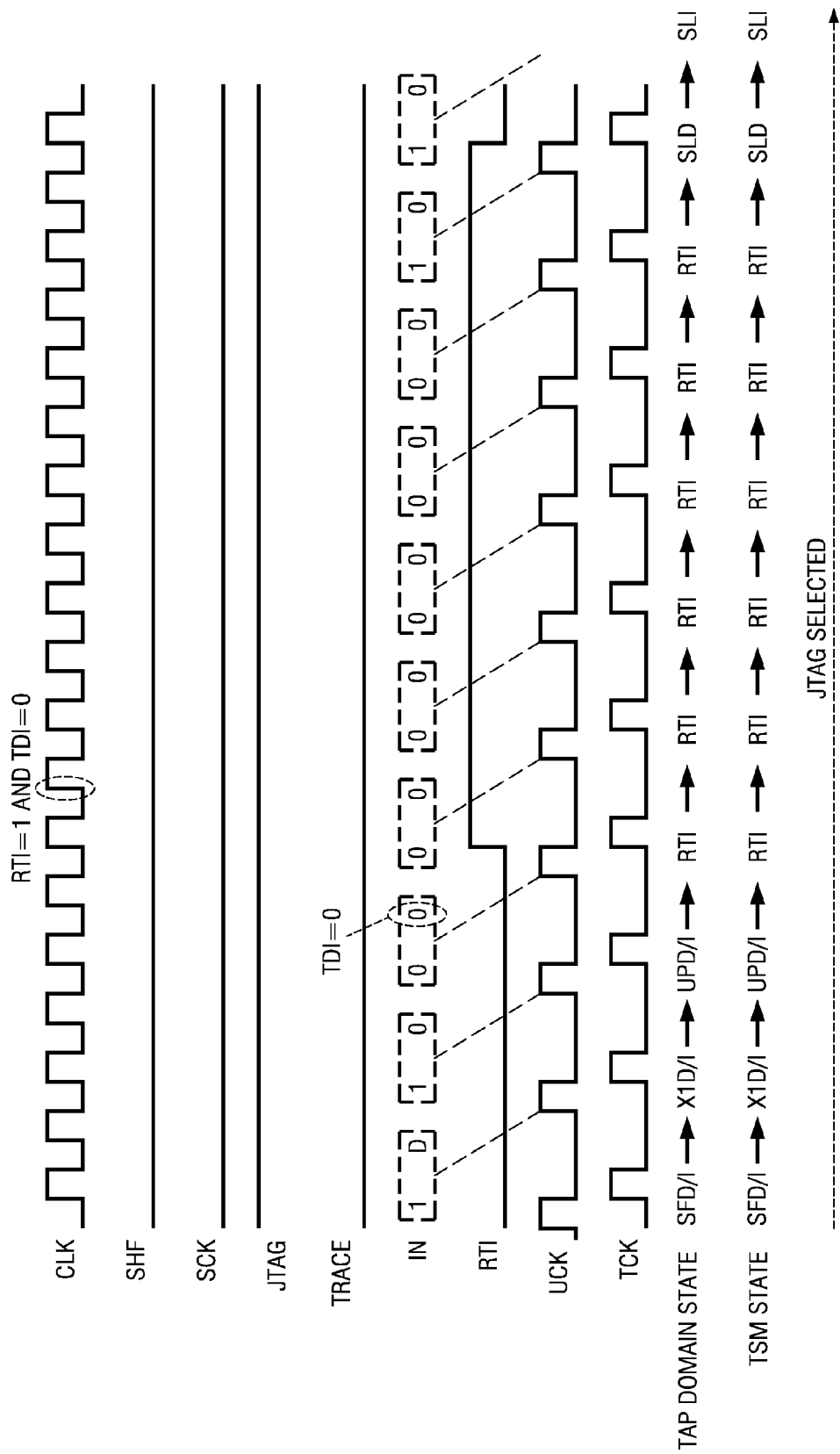
FIG. 38 illustrates an ACP timing example of JTAG operation through the Run Test/Idle state.

FIG. 38 illustrates the timing of the ACP and a selected JTAG TAP domain transitioning through the RTI state during the Execute JTAG & Trace Operation block 3408 without invoking an address and command input operation. As seen, with the TDI bit of packet 3806 set low the ACP's master controller remains in the Execute JTAG & Trace Operation block 3408 during transition through RTI state.

Figure 39:
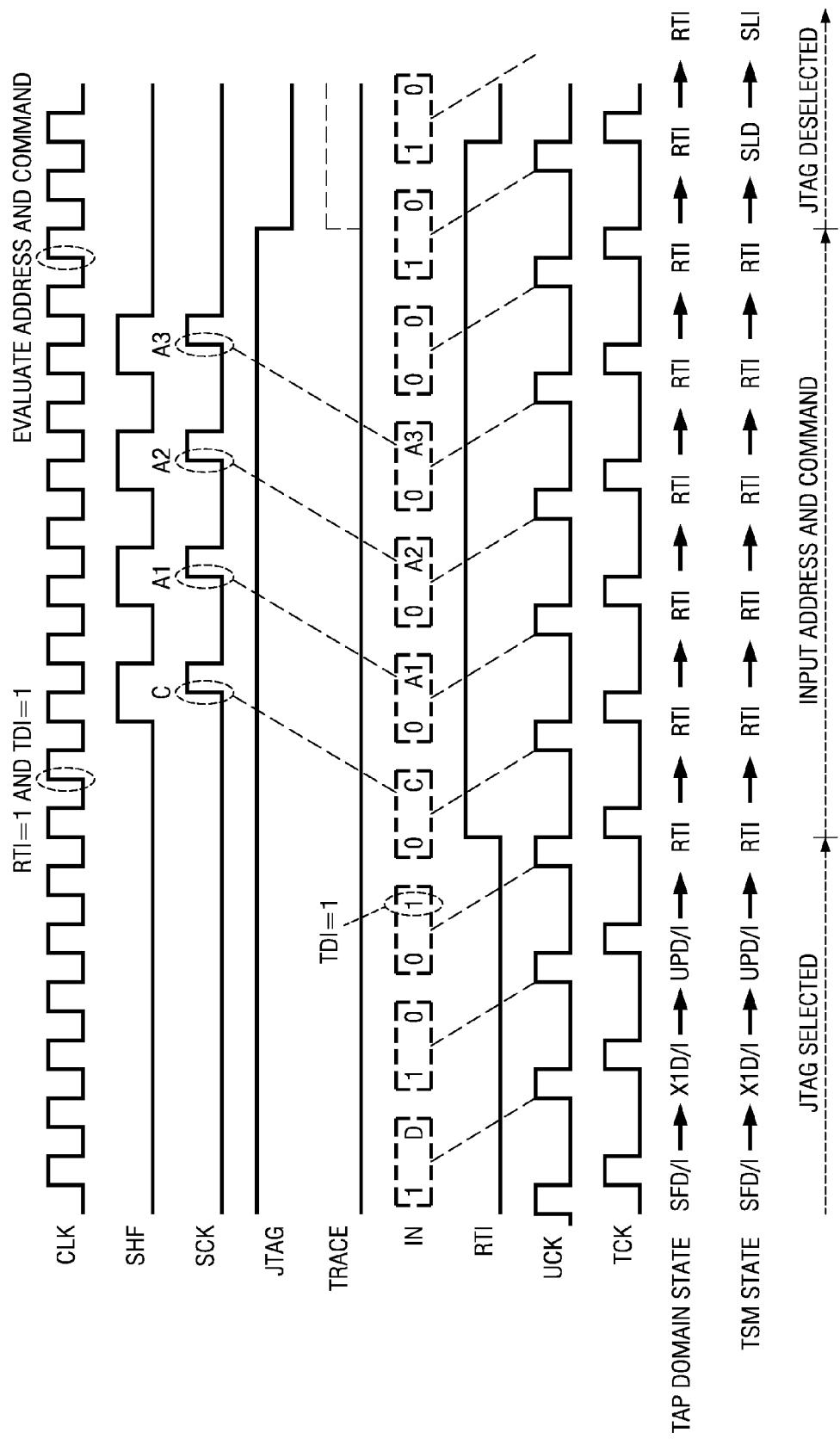
FIG. 39 illustrates an ACP timing example of de-selecting a JTAG operation in the Run Test/Idle state.

FIG. 39 illustrates the timing of the ACP and a selected JTAG TAP domain transitioning to the RTI state during the Execute JTAG & Trace Operation block 3408 and invoking an address and command input operation. As seen, with the TDI bit of packet 3906 set high the ACP's master controller transitions to the Input Address & Command block 3406 at time 3940 to input a new address and command. The new address and command are evaluated at time 3950. In this example, the result of the evaluation is action 3628 which deselects the currently selected ACP and JTAG TAP domain. The result of the evaluation at time 3950 could result in the selection of a another ACP and JTAG TAP domain, or it could result in the de-selection of all ACPs and JTAG TAP domains if the new address is the previously mentioned global disconnect address.

In FIG. 39, the dotted line 3952 on the Trace signal indicates that if the result of the evaluation at time 3950 were action 3624 instead of action 3628, a Trace operation would be selected.

Figure 40:
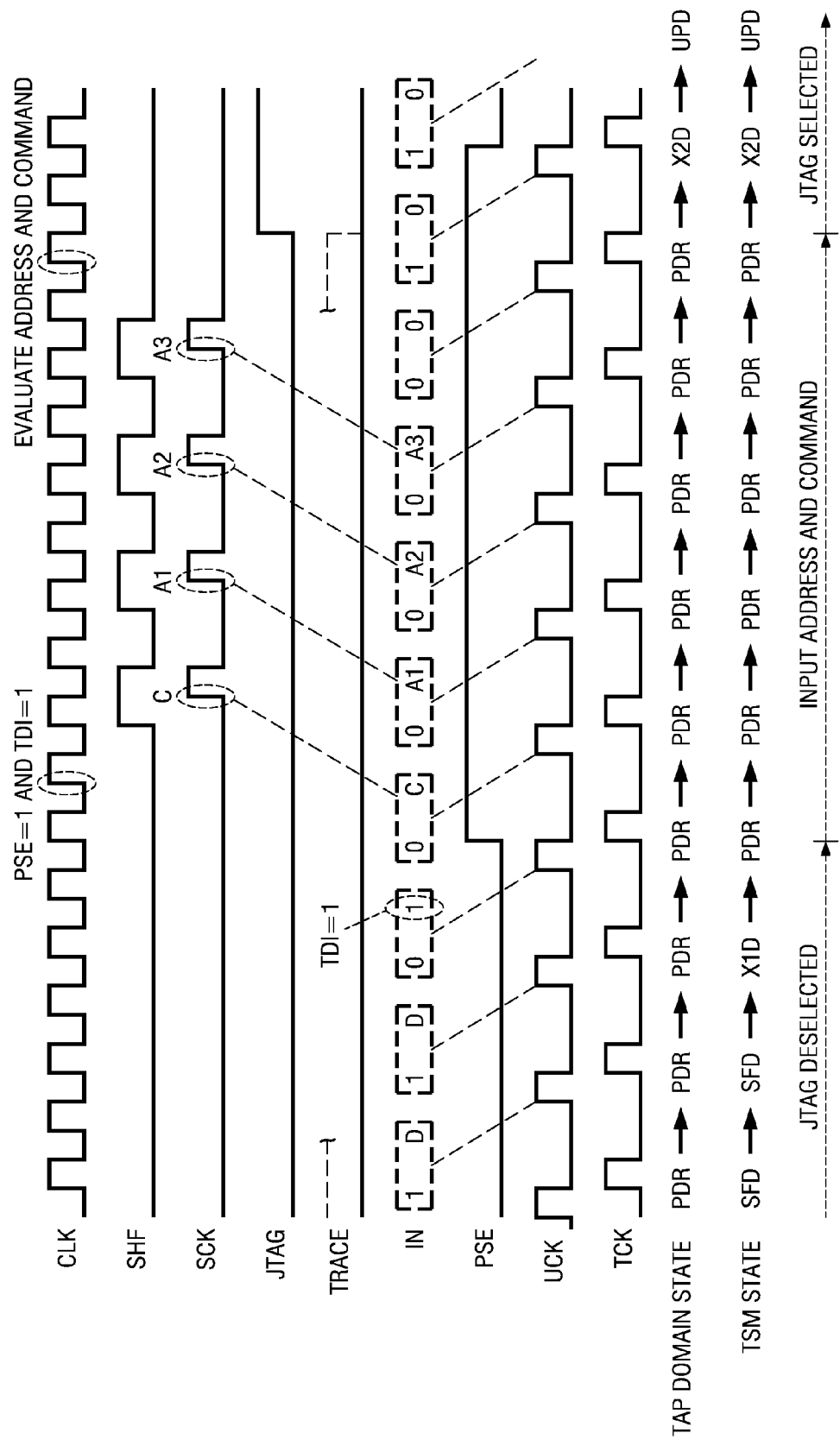
FIG. 40 illustrates an ACP timing example of selecting a JTAG operation in the Pause-DR state.

FIG. 40 illustrates the timing of selecting a JTAG TAP domain in the Pause-DR (PDR) state. As seen, initially the TAP domain is deselected in the PDR state, the master controller 3010 is in the Execute JTAG or Trace block 3408, and the TSM 3012 is transitioning through the TAP states of FIG. 10 in response to the TMS signal from register 704. When TMS and TDO packet 4004 is updated from register 704 the TSM transitions from the Shift-DR (SFD) state to the Exit1-DR (X1D) state on TCK 4024. When packet 4006 is updated from register 704 the TSM transitions from the X1D state to the Pause-DR (PDR) state on TCK 4026 and sets the PSE signal high. The TDI value in packet 4006 is set high as the previously described signal that enables the master controller 3010 to transition from the Execute JTAG & Trace Operation block 3408 to the Input Address & Command block 3406. The master controller transitions to the Input Address & Command block upon detecting that PSE and TDI are both high at time 4040.

When packet 4008 is updated from register 704, the command (C) bit on TDI is shifted into shift register 3304 on SCK 4042. Since a JTAG operation is being selected, the command bit will be set high. When packet 4010 is updated from register 704, the first address (A1) bit on TDI is shifted into shift register 3304 on SCK 4044. When packet 4012 is updated from register 704, the second address (A2) bit on TDI is shifted into shift register 3304 on SCK 4046. When packet 4014 is updated from register 704, the third address (A3) bit on TDI is shifted into shift register 3304 on SCK 4048. At time 4050, the master controller evaluates the command (C) and address (A) bits in shift register 3304.

If the command bit is high and the address bits match the Local ACP address the master controller will perform action 3620 of FIG. 36 and transition to the Execute JTAG & Trace Operation block 3408. Since the enable input to And gate 3014 is set high by action 3620, the selected JTAG TAP domain outputs TDO data to DIO during Shift-DR and Shift-IR states. All non-addressed ACP master controllers will perform action 3628 and transition to the Execute JTAG & Trace Operation block 3408.

If the command bit is high and the address bits match the Group ACP address all ACP master controllers that have been previously deselected in the PDR state will perform action 3622 of FIG. 36 and transition to the Execute JTAG & Trace Operation block 3408. During JTAG Group addressing, JTAG TAP domains of all Group selected ACPs transition through the TAP states of FIG. 10, but no JTAG TAP domain outputs TDO data on DIO since the enable input to And gate 3014 is set low by action 3622.

In FIG. 40, the dotted line 4052 on the Trace signal indicates that if a Trace operation was previously selected it would become deselected at time 4050 as a result of the above mentioned actions 3620 and 3622.

When packet 4018 is updated from register 704 the TSM and TAP domains of the addressed ACP(s) will transition from the PDR state to the Exit2-DR (X2D) state on TCK 4038 to initiate a JTAG operation. In response to updated packet 4018 only the TSM of non-addressed ACPs will transition from the PDR state to the X2D state, i.e. the TAP domains of non-selected ACPs will remain deselected in the PDR state. As seen in this example, packet 4020 will cause the TSM and TAP domains of the addressed ACP(s) and the TSM of non-addressed ACPs to further transition from the X2D to the Update-DR (UPD) state.

As seen in FIG. 40, the TDI bits of packets 4002-4020 remain low unless the TDI bit of a packet is inputting a JTAG instruction or data bit (D), a command bit (C), an address bit (A), or the high signal (packet 4006) that causes a transition from the Execute JTAG & Trace Operation block 3408 to the Input Address & Command block 3406 at time 4040. Also the TMS bits of packets 4008-4016 remain low until the ACP's address and command input operation has been completed. Maintaining TMS low during the address and command input operation causes the ACP's master controller, TSM, and any selected TAP domain to remain in the PDR state.

Figure 41:
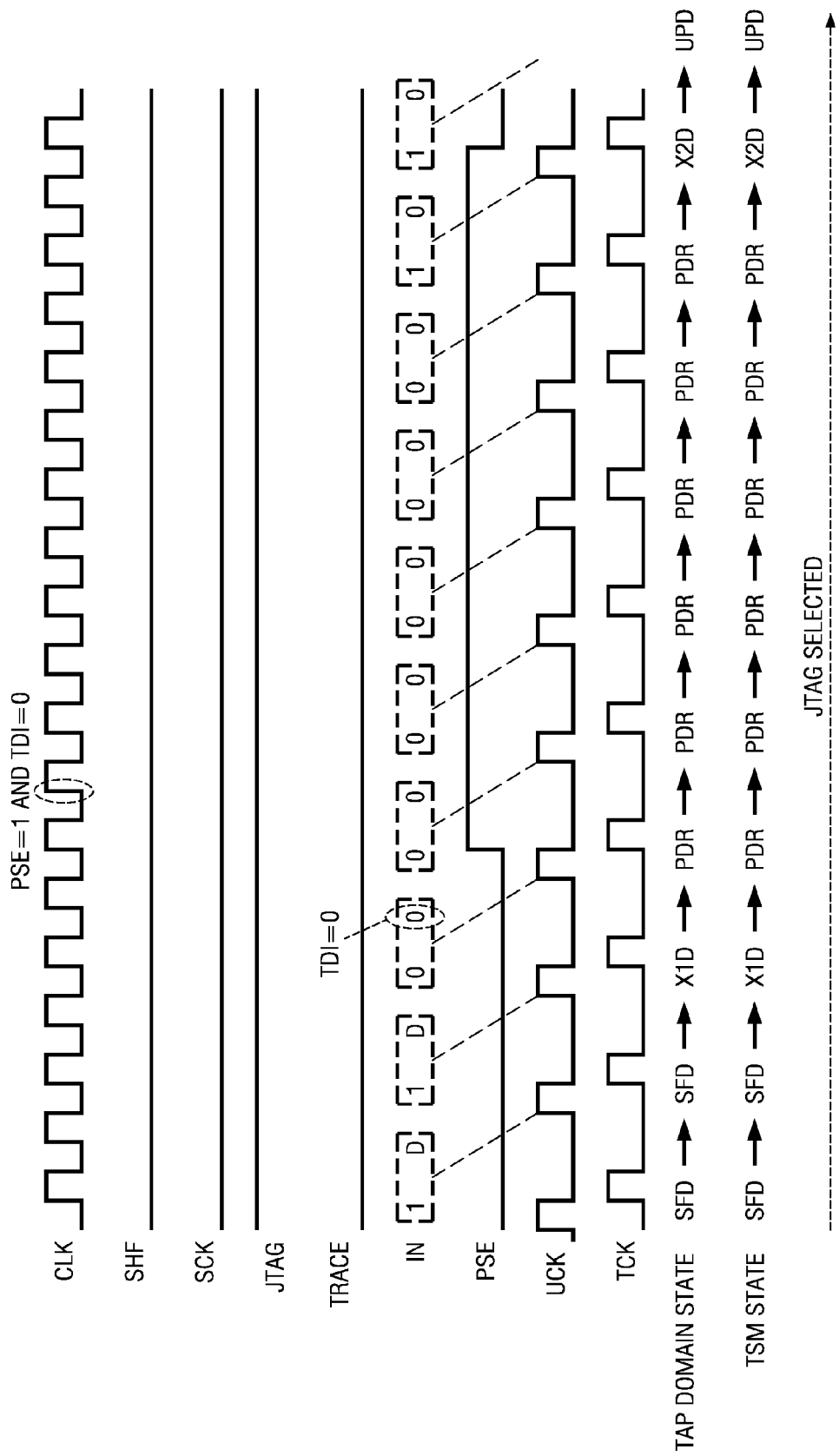
FIG. 41 illustrates an ACP timing example of JTAG operation through the Pause-DR state.

FIG. 41 illustrates the timing of the ACP and a selected JTAG TAP domain transitioning through the PDR state during the Execute JTAG & Trace Operation block 3408 without invoking an address and command input operation. As seen, with the TDI bit of packet 4106 set low the ACP's master controller remains in the Execute JTAG & Trace Operation block 3408 during transition through PDR state.

Figure 42:
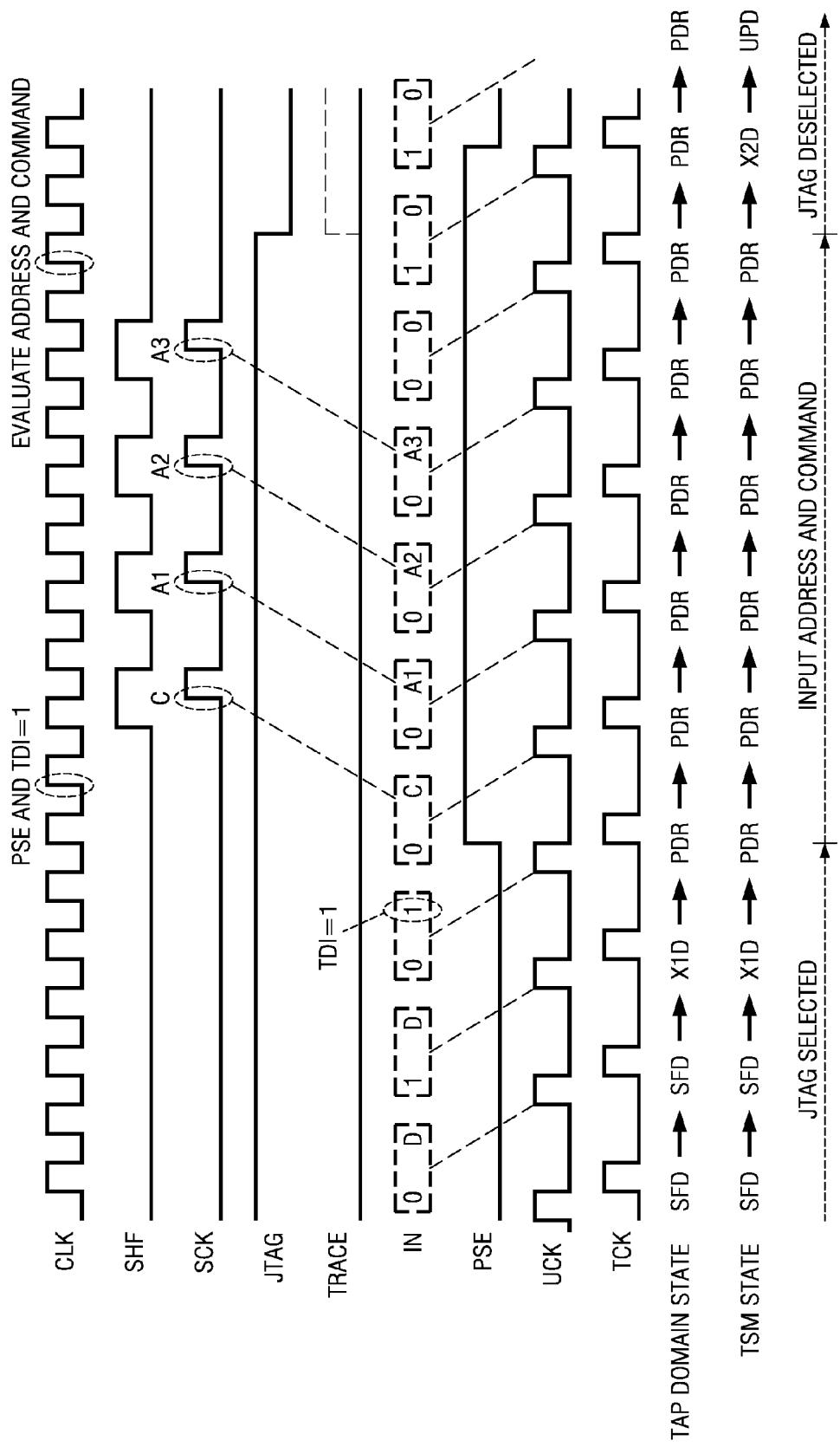
FIG. 42 illustrates an ACP timing example of de-selecting a JTAG operation in the Pause-DR state.

FIG. 42 illustrates the timing of the ACP and a selected JTAG TAP domain transitioning to the PDR state during the Execute JTAG & Trace Operation block 3408 and invoking an address and command input operation. As seen, with the TDI bit of packet 4006 set high the ACP's master controller transitions to the Input Address & Command block 3406 at time 4240 to input a new address and command. The new address and command are evaluated at time 4250. In this example, the result of the evaluation is action 3628 which deselects the currently selected ACP(s) and JTAG TAP domain(s). The result of the evaluation at time 4250 could result in the selection of a another ACP and JTAG TAP domain, or it could result in the de-selection of all ACPs and JTAG TAP domains if the new address is the previously mentioned global disconnect address.

In FIG. 42, the dotted line 4252 on the Trace signal indicates that if the result of the evaluation at time 4250 were action 3624 or 3626 instead of action 3628, a Trace operation would be selected.

Figure 43:
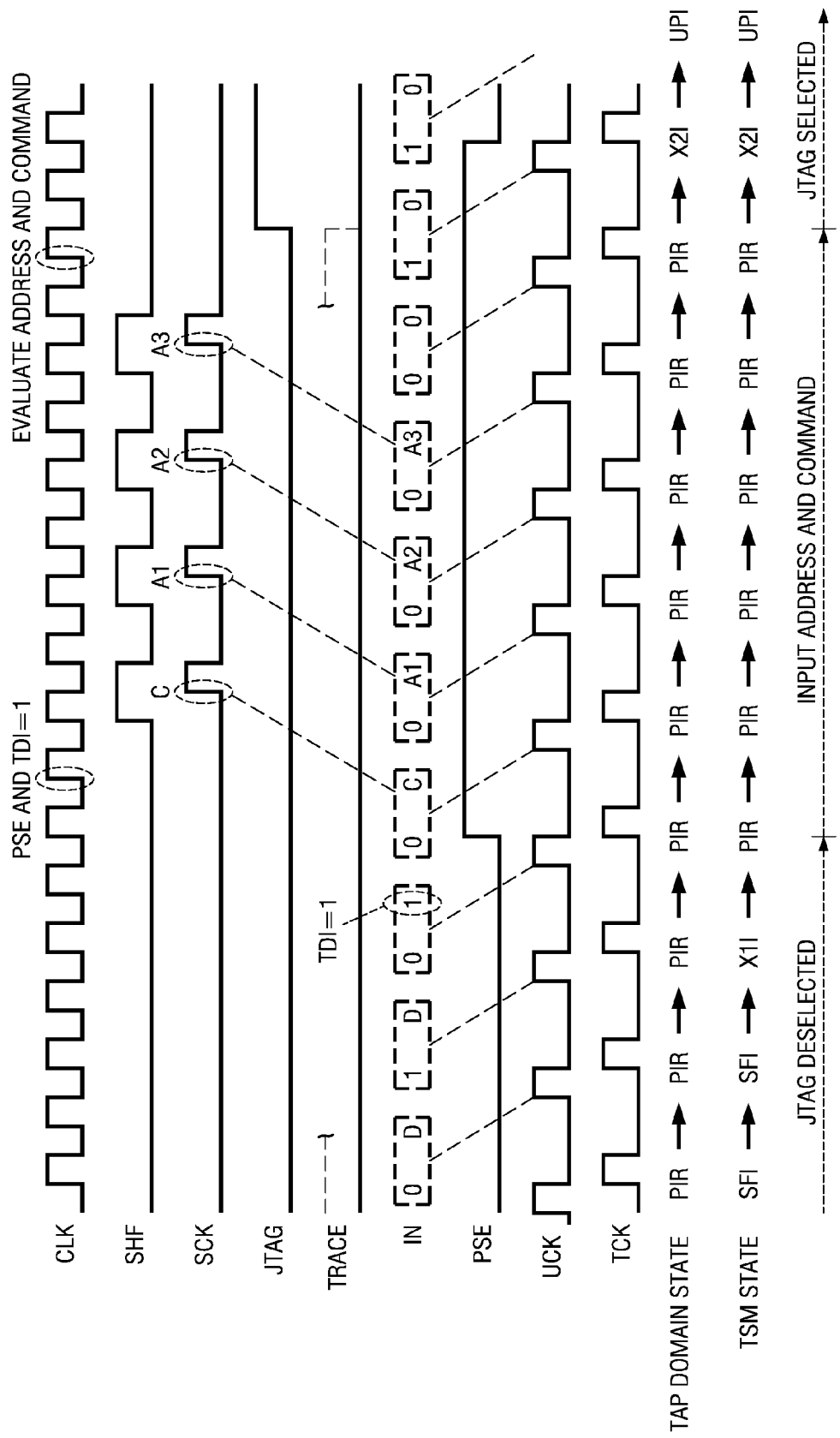
FIG. 43 illustrates an ACP timing example of selecting a JTAG operation in the Pause-IR state.

FIG. 43 illustrates the timing of selecting a JTAG TAP domain in the Pause-IR (PIR) state. As seen, initially the TAP domain is deselected in the PIR state, the master controller 3010 is in the Execute JTAG or Trace block 3408, and the TSM 3012 is transitioning through the TAP states of FIG. 10 in response to the TMS signal from register 704. When TMS and TDO packet 4304 is updated from register 704 the TSM transitions from the Shift-IR (SFI) state to the Exit1-IR (XII) state on TCK 4324. When packet 4306 is updated from register 704 the TSM transitions from the XII state to the Pause-IR (PIR) state on TCK 4326 and sets the PSE signal high. The TDI value in packet 4306 is set high as the previously described signal that enables the master controller 3010 to transition from the Execute JTAG & Trace Operation block 3408 to the Input Address & Command block 3406. The master controller transitions to the Input Address & Command block upon detecting that PSE and TDI are both high at time 4340.

When packet 4308 is updated from register 704, the command (C) bit on TDI is shifted into shift register 3304 on SCK 4342. Since a JTAG operation is being selected, the command bit will be set high. When packet 4310 is updated from register 704, the first address (A1) bit on TDI is shifted into shift register 3304 on SCK 4344. When packet 4312 is updated from register 704, the second address (A2) bit on TDI is shifted into shift register 3304 on SCK 4346. When packet 4314 is updated from register 704, the third address (A3) bit on TDI is shifted into shift register 3304 on SCK 4348. At time 4350, the master controller evaluates the command (C) and address (A) bits in shift register 3304.

If the command bit is high and the address bits match the Local ACP address the master controller will perform action 3620 of FIG. 36 and transition to the Execute JTAG & Trace Operation block 3408. Since the enable input to And gate 3014 is set high by action 3620, the selected JTAG TAP domain outputs TDO data to DIO during Shift-DR and Shift-IR states. All non-addressed ACP master controllers will perform action 3628 and transition to the Execute JTAG & Trace Operation block 3408.

If the command bit is high and the address bits match the Group ACP address all ACP master controllers that have been previously deselected in the PIR state will perform action 3622 of FIG. 36 and transition to the Execute JTAG & Trace Operation block 3408. During JTAG Group addressing, JTAG TAP domains of all Group selected ACPs transition through the TAP states of FIG. 10, but no JTAG TAP domain outputs TDO data on DIO since the enable input to And gate 3014 is set low by action 3622.

In FIG. 43, the dotted line 4352 on the Trace signal indicates that if a Trace operation was previously selected it would become deselected at time 4350 as a result of the above mentioned actions 3620 and 3622.

When packet 4318 is updated from register 704 the TSM and TAP domains of the addressed ACP(s) will transition from the PIR state to the Exit2-IR (X2I) state on TCK 4338 to initiate a JTAG operation. In response to updated packet 4318 only the TSM of non-addressed ACPs will transition from the PIR state to the X2I state, i.e. the TAP domains of non-selected ACPs will remain deselected in the PIR state.

As seen in this example, packet 4320 will cause the TSM and TAP domains of the addressed ACP(s) and the TSM of non-addressed ACPs to further transition from the X2I to the Update-IR (UPI) state.

As seen in FIG. 43, the TDI bits of packets 4302-4320 remain low unless the TDI bit of a packet is inputting a JTAG instruction or data bit (D), a command bit (C), an address bit (A), or the high signal (packet 4306) that causes a transition from the Execute JTAG & Trace Operation block 3408 to the Input Address & Command block 3406 at time 4340. Also the TMS bits of packets 4308-4316 remain low until the ACP's address and command input operation has been completed. Maintaining TMS low during the address and command input operation causes the ACP's master controller, TSM, and any selected TAP domain to remain in the PIR state.

Figure 44:
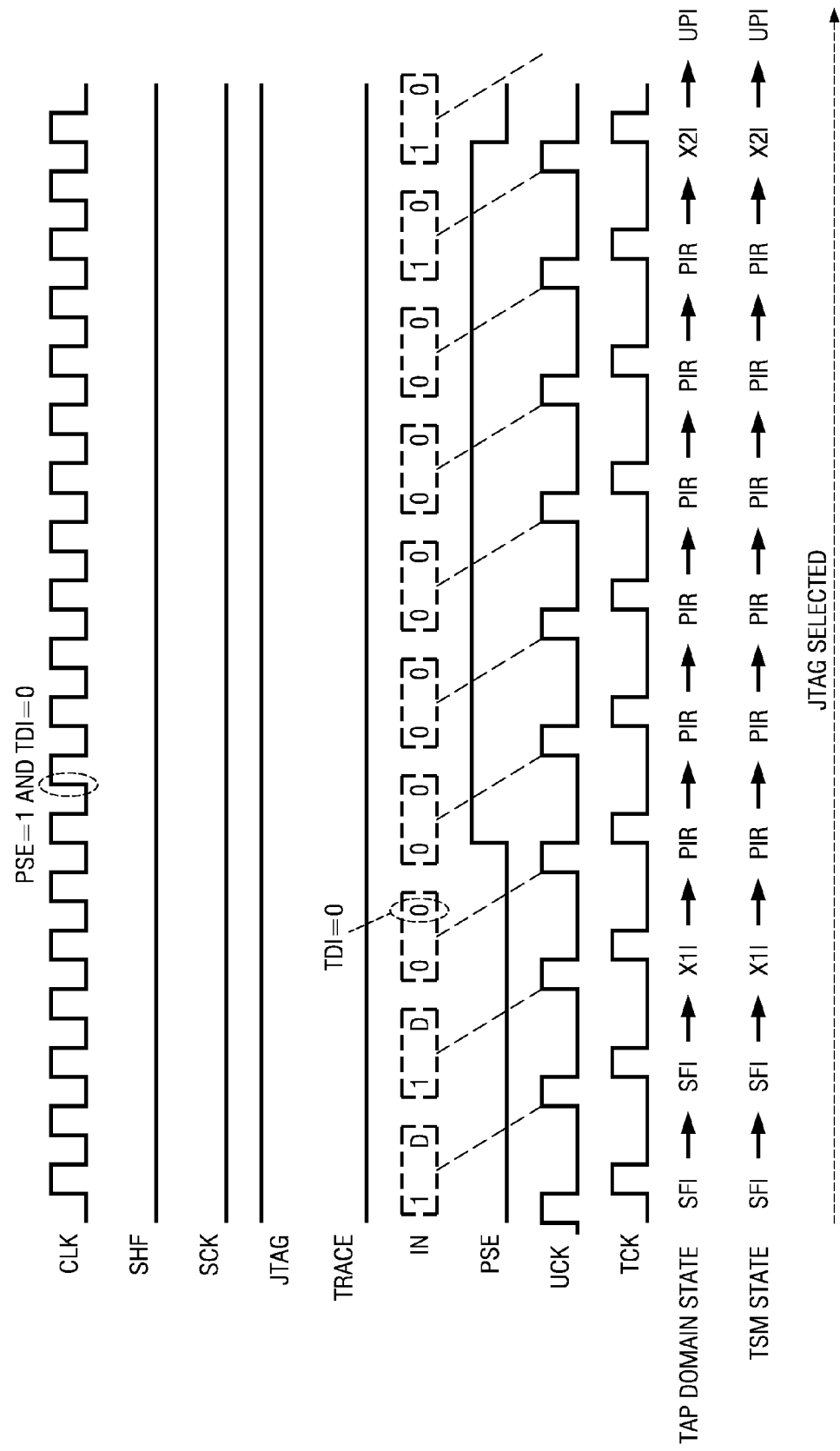
FIG. 44 illustrates an ACP timing example of JTAG operation through the Pause-IR state.

FIG. 44 illustrates the timing of the ACP and a selected JTAG TAP domain transitioning through the PIR state during the Execute JTAG & Trace Operation block 3408 without invoking an address and command input operation. As seen, with the TDI bit of packet 4406 set low the ACP's master controller remains in the Execute JTAG & Trace Operation block 3408 during transition through PIR state.

Figure 45:
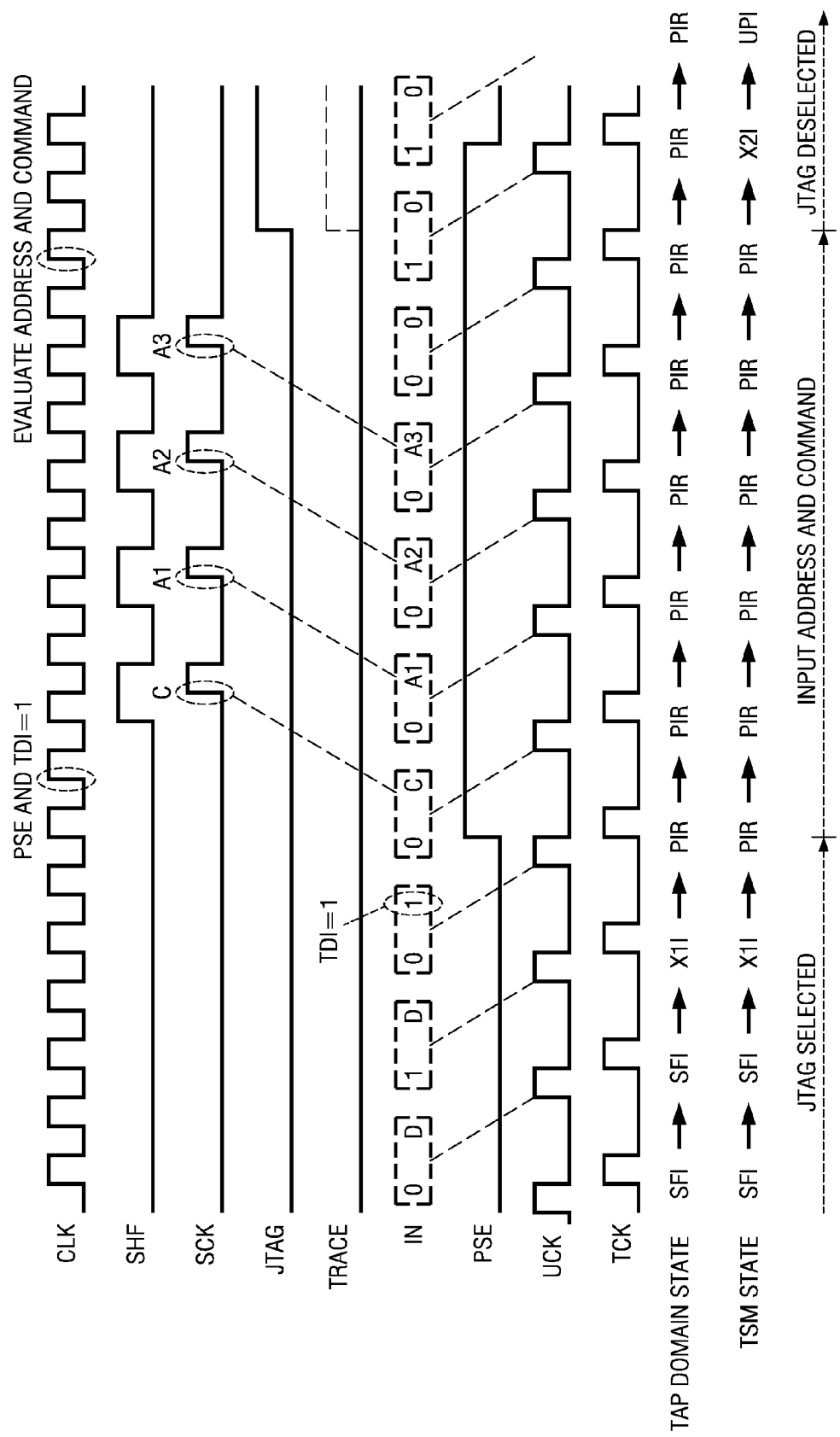
FIG. 45 illustrates an ACP timing example of de-selecting a JTAG operation in the Pause-IR state.

FIG. 45 illustrates the timing of the ACP and a selected JTAG TAP domain transitioning to the PIR state during the Execute JTAG & Trace Operation block 3408 and invoking an address and command input operation. As seen, with the TDI bit of packet 4506 set high the ACP's master controller transitions to the Input Address & Command block 3406 at time 4540 to input a new address and command. The new address and command are evaluated at time 4550. In this example, the result of the evaluation is action 3628 which deselects the currently selected ACP(s) and JTAG TAP domain(s). The result of the evaluation at time 4550 could result in the selection of a another ACP and JTAG TAP domain, or it could result in the de-selection of all ACPs and JTAG TAP domains if the new address is the previously mentioned global disconnect address.

In FIG. 45, the dotted line 4552 on the Trace signal indicates that if the result of the evaluation at time 4550 were action 3624 or 3626 instead of action 3628, a Trace operation would be selected.

Figure 46:
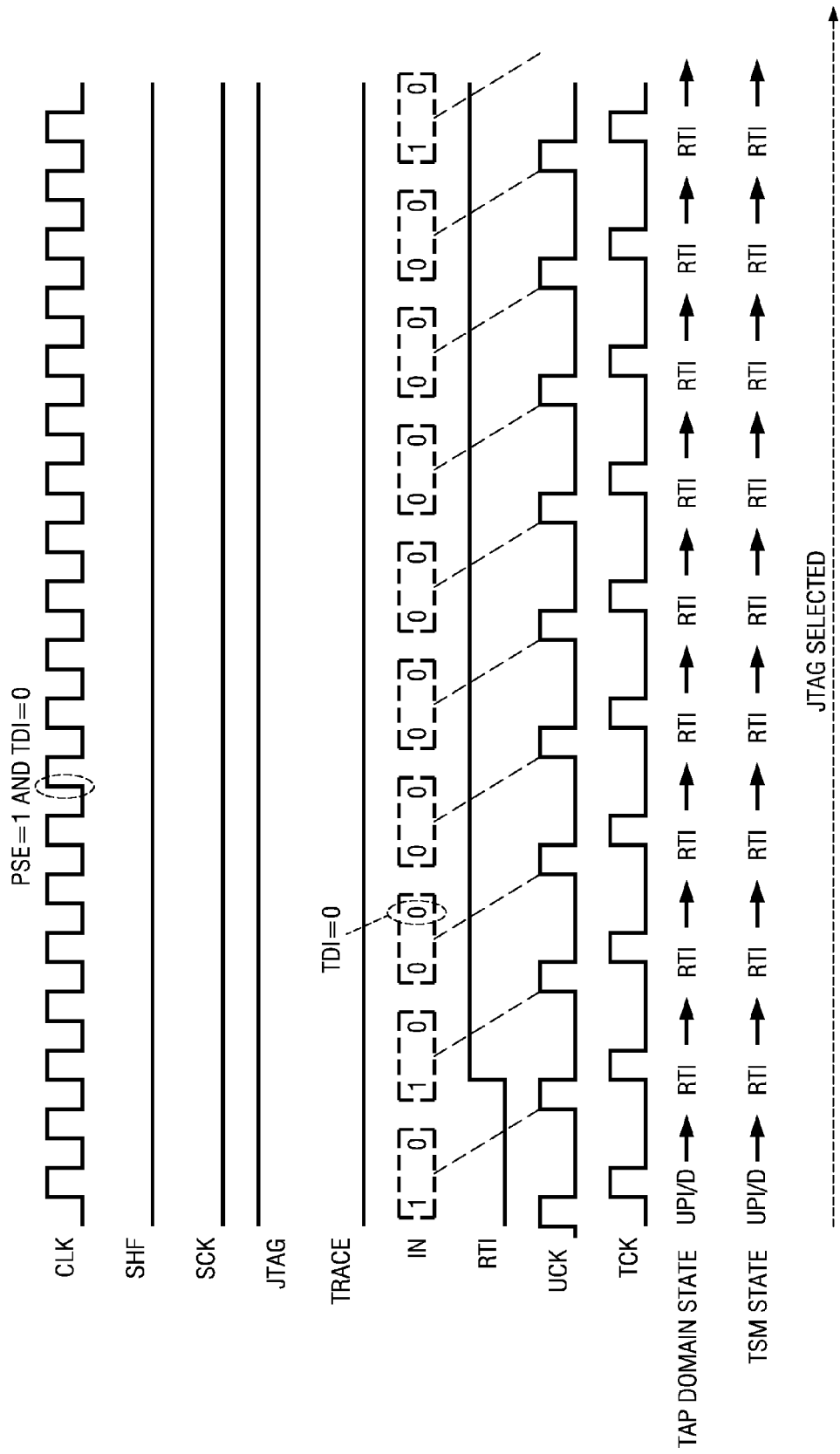
FIG. 46 illustrates an ACP timing example of transitioning a selected JTAG group from the Pause-IR/DR state to the Run Test/Idle state.

FIG. 46 illustrates a timing example of transitioning a Group of selected ACPs and JTAG TAP domains from the Pause-DR (PDR) of FIG. 40 or Pause-IR (PIR) state of FIG. 43 through the Update-DR (UPD) or Update-IR (UPI) state, respectively, to the RTI state. Passing through the Update-IR state allows JTAG instructions to be simultaneously updated in all Group selected JTAG TAP domain instruction registers. The ability to simultaneously update instructions to all selected Group JTAG TAP domains allows all the TAP domains to begin execution of the instructions at the same time. For example, JTAG RUNBIST instruction operations could all be enabled at the same time to allow self test operations to occur in multiple target devices. Passing through the Update-DR state allows JTAG data to be simultaneously updated in all Group selected JTAG TAP domain data registers. For example, JTAG EXTEST instruction operations in target devices connected as shown in FIG. 29 could all update boundary scan test data to interconnects 2912 from their boundary scan registers at the same time.

Figure 47:
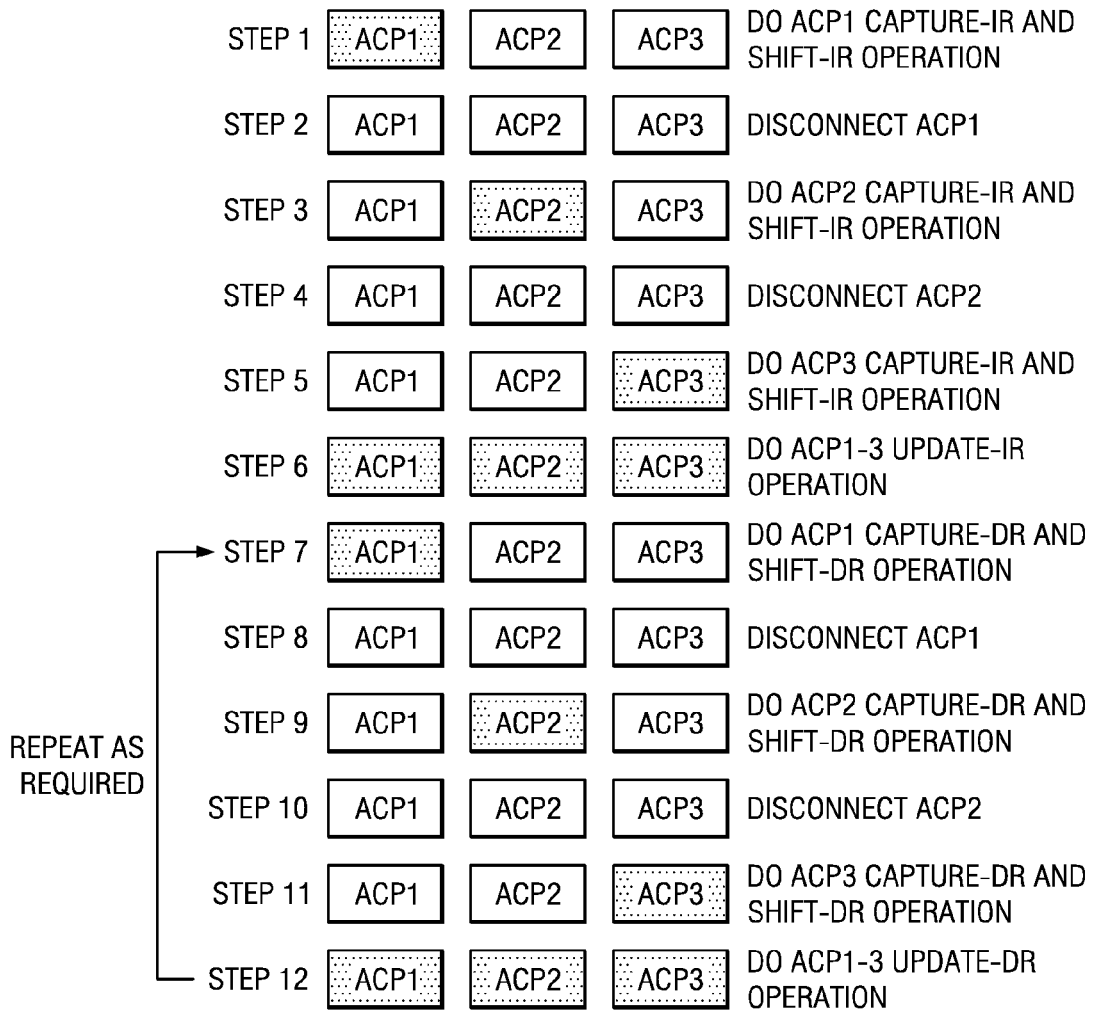
FIG. 47 illustrates the steps of performing a boundary scan operation on three target devices, each device having an Address and Command Port (ACP).

FIG. 47 illustrates an example of performing JTAG boundary scan operations on three target devices using the present disclosure. This example illustrates the ability to locally address a target device to input a JTAG instruction or data pattern and to group address all target devices to simultaneously update the JTAG instruction or data pattern as mentioned in regard to FIG. 46. In this example ACP1 is assumed to be the DIO CLK port of target device 1 2904 of FIG. 29, ACP2 is assumed to be the DIO CLK port of target device 2 2906 of FIG. 29, and ACP3 is assumed to be the DIO CLK port of target device N 2908 of FIG. 29. It is assumed that initially the JTAG boundary scan TAP domain of TAP domains 3006 of each target device has been selected for access, all target device ACPs are deselected, and that the JTAG boundary scan TAP domains are all in the RTI state.

Steps 1 through 6 are steps used to load the JTAG EXTEST instruction into the JTAG boundary scan TAP domains of the target devices. Steps 7-12 are used to execute the EXTEST boundary scan Capture-DR, Shift-DR, and Update-DR operations.

Step 1—In the RTI state, the controller 2902 inputs the Local address of ACP1 to select ACP1, then transitions from the RTI state to perform a JTAG instruction scan operation to load the EXTEST instruction into the JTAG boundary scan TAP domain of target device 1. The instruction scan operation ends in the Pause-IR state.

Step 2—In the Pause-IR state, the controller 2903 inputs the Global disconnect address to deselect ACP1, leaving the JTAG boundary scan TAP domain in the Pause-IR state, then transitions to the RTI state. All TSMs of ACP1-3 transition to the RTI state.

Step 3—In the RTI state, the controller 2902 inputs the Local address of ACP2 to select ACP2, then transitions from the RTI state to perform a JTAG instruction scan operation to load the EXTEST instruction into the JTAG boundary scan TAP domain of target device 2. The instruction scan operation ends in the Pause-IR state.

Step 4—In the Pause-IR state, the controller 2903 inputs the Global disconnect address to deselect ACP2, leaving the JTAG boundary scan TAP domain in the Pause-IR state, then transitions to the RTI state. All TSMs of ACP1-3 transition to the RTI state.

Step 5—In the RTI state, the controller 2902 inputs the Local address of ACP3 to select ACP3, then transitions from the RTI state to perform a JTAG instruction scan operation to load the EXTEST instruction into the JTAG boundary scan TAP domain of target device 3. The instruction scan operation ends in the Pause-IR state.

Step 6—In the Pause-IR state, the controller 2903 inputs the Group address to select ACP1-3, then transitions the TSM and JTAG boundary scan TAP domains through the Update-IR state to the RTI state. Passing through the Update-IR state causes all the EXTEST instructions in target device 1-3 to be updated from the instruction registers of the JTAG boundary scan TAP domains.

Step 7—In the RTI state, the controller 2902 inputs the Local address of ACP1 to select ACP1, then transitions from the RTI state to perform a JTAG data scan operation to capture boundary scan response data into the boundary register of target device 1 during Capture-DR state then to shift the boundary register during the Shift-DR state to load boundary stimulus data and unload the captured boundary response data. The boundary scan operation ends in the Pause-DR state.

Step 8—In the Pause-DR state, the controller 2903 inputs the Global disconnect address to deselect ACP1, leaving the JTAG boundary scan TAP domain in the Pause-DR state, then transitions to the RTI state. All TSMs of ACP1-3 transition to the RTI state.

Step 9—In the RTI state, the controller 2902 inputs the Local address of ACP2 to select ACP2, then transitions from the RTI state to perform a JTAG data scan operation to capture boundary scan response data into the boundary register of target 2 during Capture-DR state then to shift the boundary register during the Shift-DR state to load boundary stimulus data and unload the captured boundary response data. The boundary scan operation ends in the Pause-DR state.

Step 10—In the Pause-DR state, the controller 2903 inputs the Global disconnect address to deselect ACP2, leaving the JTAG boundary scan TAP domain in the Pause-DR state, then transitions to the RTI state. All TSMs of ACP1-3 transition to the RTI state.

Step 11—In the RTI state, the controller 2902 inputs the Local address of ACP3 to select ACP3, then transitions from the RTI state to perform a JTAG data scan operation to capture boundary scan response data into the boundary register of target 3 during Capture-DR state then to shift the boundary register during the Shift-DR state to load boundary stimulus data and unload the captured boundary response data. The boundary scan operation ends in the Pause-DR state.

Step 12—In the Pause-DR state, the controller 2903 inputs the Group address to select ACP1-3, then transitions the TSM and JTAG boundary scan TAP domains of ACP1-3 through the Update-DR state to the RTI state. Passing through the Update-DR state causes all the boundary stimulus data shifted into the boundary registers of target devices 1-3 to be updated and applied to the boundary outputs of target devices 1-3.

Step 1—In RTI, input Local ACP1 Address to select ACP1, then execute JTAG Instruction Scan ending in Pause-IR.

Step 2—In Pause-IR, input Disconnect Address to deselect ACP1, then transition TSM to RTI.

Step 3—In RTI, input Local ACP2 Address to select ACP2, then execute JTAG Instruction Scan ending in Pause-IR.

Step 4—In Pause-IR, input Disconnect Address to deselect ACP2, then transition TSM to RTI.

Step 5—In RTI, input Local ACP3 Address to select ACP3, then execute JTAG Instruction Scan ending in Pause-IR.

Step 6—In Pause-IR, input Group Address to select ACP1-3, then transition ACP1-3 through Update-IR to RTI.

Step 7—In RTI, input Local ACP1 Address to select ACP1, then execute JTAG Data Scan ending in Pause-DR.

Step 8—In Pause-DR, input Disconnect Address to deselect ACP1, then transition TSM to RTI Step 9—In RTI, input Local ACP2 Address to select ACP2, then execute JTAG Data Scan ending in Pause-DR.

Step 10—In Pause-DR, input Disconnect Address to deselect ACP2, then transition TSM to RTI.

Step 11—In RTI, input Local ACP3 Address to select ACP3, then execute JTAG Data Scan ending in Pause-DR.

Step 12—In Pause-DR, input Group Address to select ACP1-3, then transition ACP1-3 through Update-DR to RTI.

Steps 7-12 define one JTAG Capture-DR, Shift-DR, and Update-DR Boundary Scan Operation.

The boundary scan Capture-DR, Shift-DR and Update-DR operations, as described in Steps 7-12, are repeated as required to test the interconnects 2912 between the target devices 1-3 of FIG. 29.

The following FIGS. 48-58 illustrate timing diagrams of the ACP 3004 of FIG. 30 operating to select and deselect Trace domain operations. In FIGS. 48-58, the CLK is running to; (1) input the previously described serial TMS and TDI signal packets (shown in dotted boxes) from the IN signal to SIPO 702, (2) generate the previously described UCK to register 704, and (3) generate the previously described TCK signal to the TAP domains 3006 and TSM 3012. A "D" signal in a TMS and TDI packet indicates that TDI is either an JTAG instruction or data bit, a "C" signal in a packet indicates that TDI is a command bit, an "A" signal in a packet indicates that TDI is an address bit, a "0" signal in a packet indicates when TMS or TDI is low, and a "1" signal in a packet indicates when TMS or TDI is high. To simplify the timing examples, it is assumed that the master controller 3010 of the ACP has been designed to include one command (C) bit and three address (A) bits.

Figure 48:
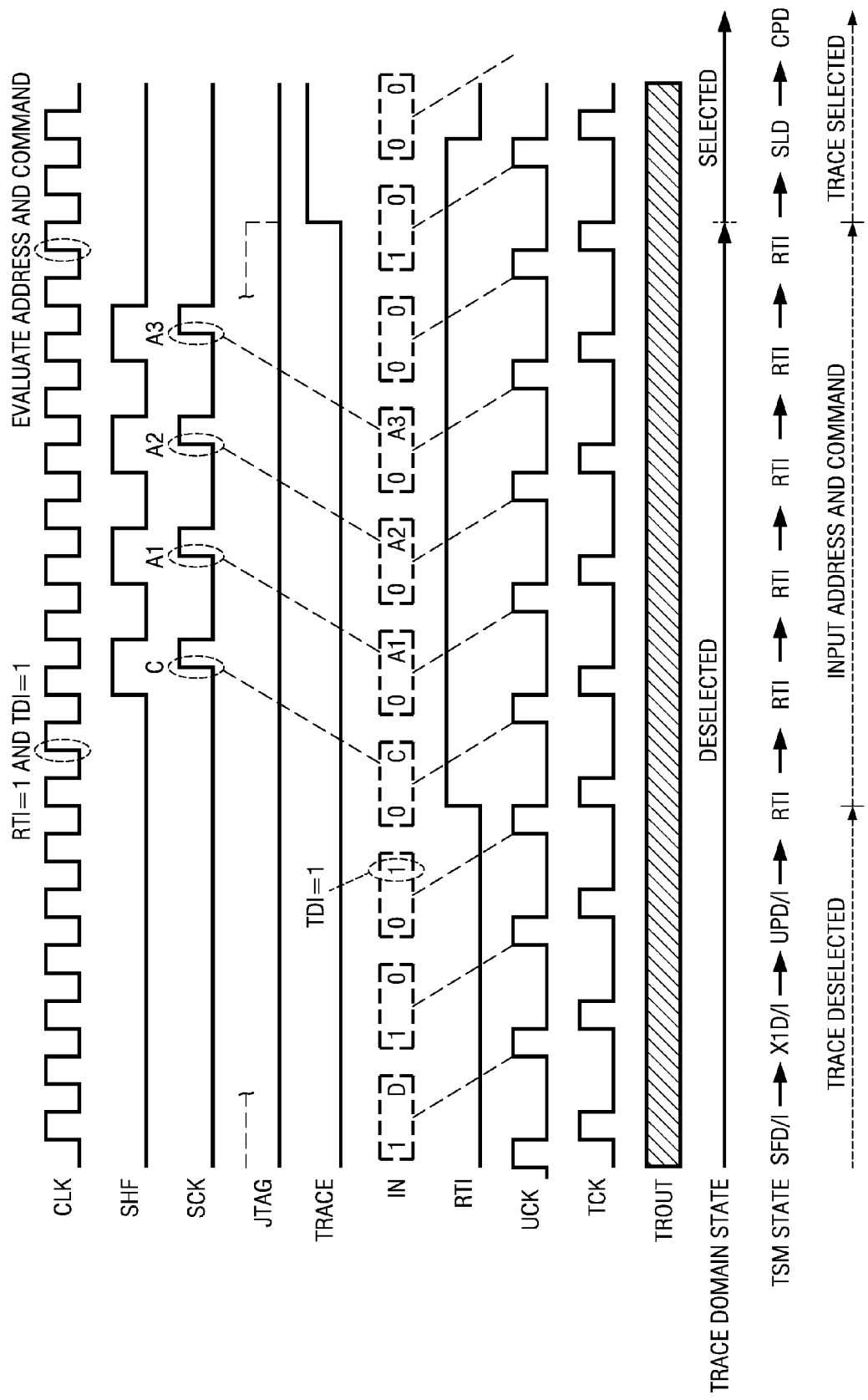
FIG. 48 illustrates an ACP timing example of selecting a Local Trace & Output Operation in the Run Test/Idle state.

FIG. 48 illustrates the timing of selecting a Trace domain to perform a Local Trace & Output operation. As the name implies, the Local Trace & Output operation comprises the step of acquiring trace data in a selected Trace domain followed by the step of outputting the acquired trace data from the selected Trace domain. Prior to selecting the Trace domain, the Trace domain will have been accessed by a JTAG TAP domain, via the TDI, CTL, and TDI interface as described in regard to FIGS. 31A and 31B, to setup and enable the Trace domain for the Trace & Output operation.

As described previously in timing diagrams 37-46, the ACP is operating to input TMS and TDI packets 4802-4820 and the TSM is responding to the TMS bit of each packet to move through JTAG states of FIG. 10, during each TCK 4822-4838. As seen the transitions include going from the SFD/I state to the RTI state via the X1D/I and UPD/I states. The TROUT signal from the Trace domain is disabled as indicated by dashed line.

At time 4840 the master controller 3010 detects the condition of the TSM being in the Run Test/Idle state (RTI=1) and the TDI signal being high (TDI=1). In response to this condition the master controller inputs the command (C) and address (A1-3) bits in packets 4808-4814. At time 4850 the master controller evaluates the command and address bits and executes action 3624, which sets the Trace signal high. While not shown in the timing diagram of FIG. 48, action 3624 also sets the enable signal from master controller 3010 high to enable the OE signal from TSM 3012 to enable the DIO output of I/O circuit 710 when the TSM is in the Shift-DR state.

In FIG. 48, the dotted line 4852 on the JTAG signal indicates that if a JTAG operation was previously selected it would become deselected at time 4850 as a result of the above mentioned action 3624.

Figure 49:
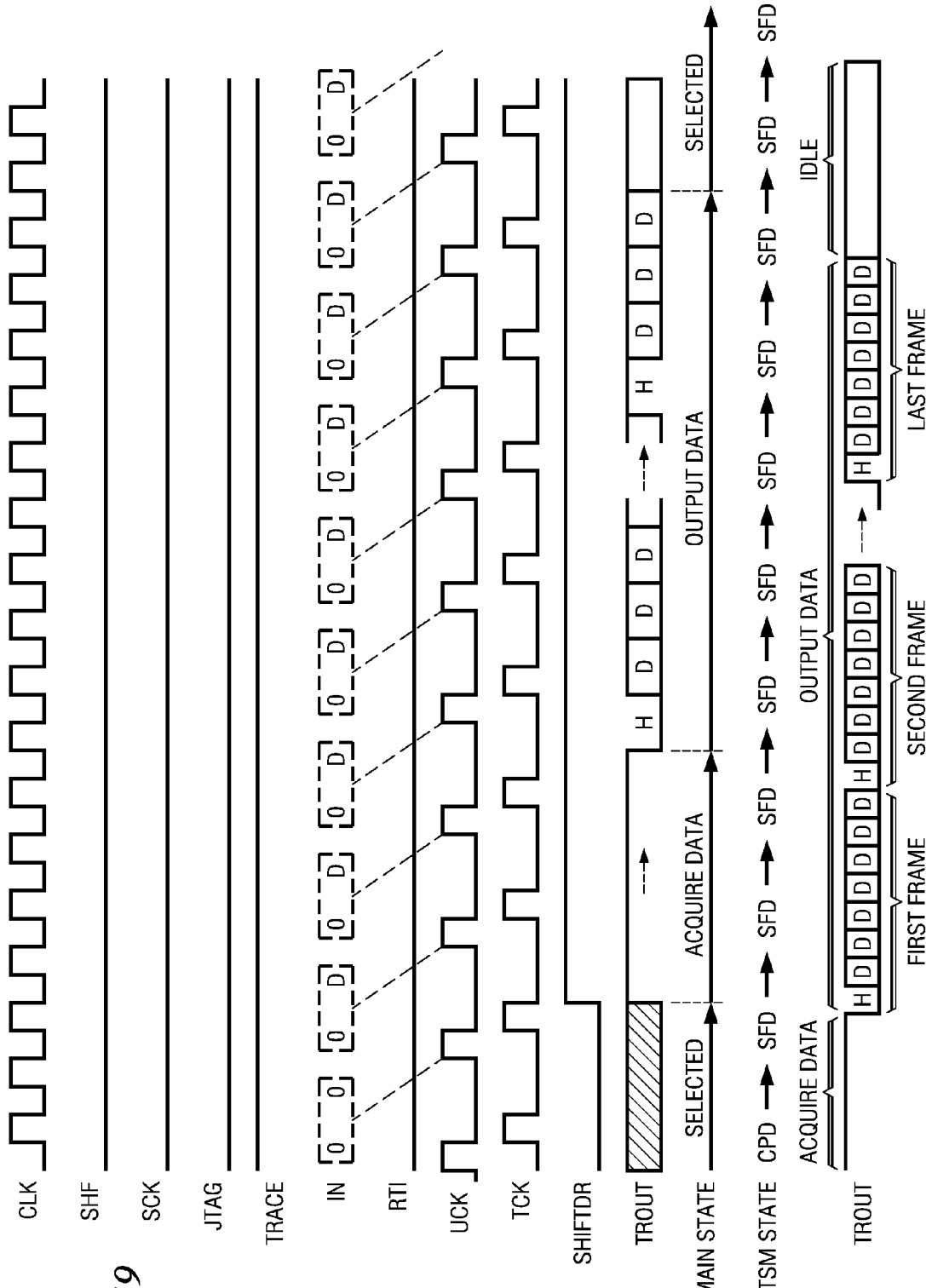
FIG. 49 illustrates an ACP timing example of enabling a selected Local Trace & Output operation in the Shift-DR state.

FIG. 49 is a continuation of the timing of FIG. 48 and illustrates how the selected Trace & Output operation is enabled when the TSM enters into the Shift-DR (SFD) state. When the TSM transitions from the Capture-DR (CPD) state to the Shift-DR (SFD) state it sets the ShiftDR signal high. As seen in FIG. 30, the ShiftDR signal is input to the Trace domains block 3008 to enable the Trace & Output operation of the selected Trace domain.

When the Trace & Output operation is enabled the Trace domain enters into a first mode 4902 of operation of acquiring data. Upon entering the first mode 4902 of operation the TROUT output from the Trace domain is set high and remains high while data is being acquired. The high on the TROUT output is output on the DIO signal via the I/O circuit 710 and multiplexer 3018 to be received by a controller 2902 adapted for inputting trace data. The data being acquired is typically data bus or address bus signal activity of a functioning circuit coupled to the Trace domain. The data being acquired is stored in a memory within the Trace domain. After the data has been acquired, the Trace domain enters into a second mode 4904 of operation whereby the data acquired is output from the Trace domain memory via the TROUT output. After the data has been output, the Trace domain enters into third mode 4906 of operation whereby the Trace domain is idle.

A detail view of the TROUT signal during the acquire data mode, the output data mode, and the idle mode is shown at the bottom of the timing diagram. As mentioned, when in the Trace domain is in the acquire data mode 4902 the TROUT signal is set high. When the Trace domain transitions to the data output mode 4904 the TROUT signal begins outputting frames of data. Each frame consists of a leading Header (H) bit 4908 followed by a number of data (D) bits 4910. The data frame output will continue as long as the Header bit of each frame is set low. The data frame output will stop when the Header bit is set high. So in this example data frame outputs will continue until the last data frame, which has its Header bit set high. Following the last data frame, the Trace domain enters into and remains in the Idle mode 4906.

Figure 50:
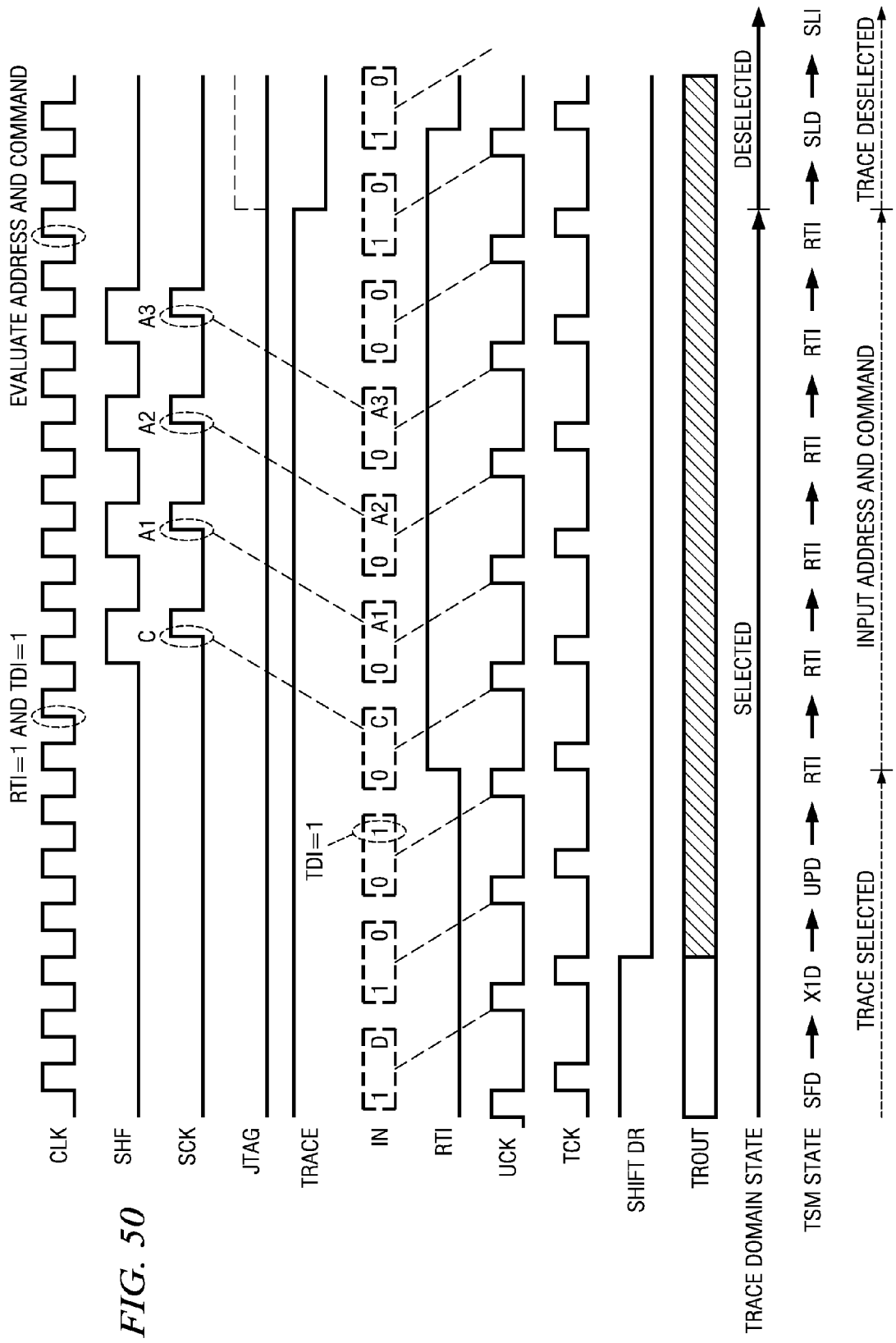
FIG. 50 illustrates an ACP timing example of de-selecting a Local Trace & Output Operation in the Run Test/Idle state.

FIG. 50 is a continuation of the timing of FIG. 49 and illustrates how the idled Trace & Output operation is deselected by transitioning the TSM from the Shift-DR (SFD) state to the RTI state so that an address and command can be input to the master controller to initiate an action that sets the Trace signal low at time 5050. The action may be action 3620 which will set the JTAG signal high in preparing for a JTAG operation or action 3628 which will not set the JTAG signal high.

In referring back to the timing diagram of FIG. 49, the format of the data frames is designed to indicate to a controller 2902 (adapted to receive the trace output data) when the Trace domain starts the output data mode of operation. For example, while the Trace domain is in the acquire data mode 4902, a logic high will be output to the controller via TROUT. When the Trace domain enters the output data mode 4904, the Header bit 4908 of the first frame is low, causing the TROUT signal to go low. This change from high to low on the TROUT signal indicates to the controller that the Trace domain has started the data output mode. In response the controller will start inputting the data frames. The controller will continue to input data frames as long as the Header bit of each data frame is low. When the Header bit goes high, the controller will know that the last data frame is being sent and will stop its data frame input mode of operation. After the controller stops receiving data frames it can transition the TSM 3012 from the Shift-DR (SFD) state to the RTI to deselect the Trace operation as describe in regard to FIG. 50.

The use of the data frame Header bits to instruct the controller to start, continue, and stop data frame input operations provides a very simple method of controlling the transmission of data frames between the Trace domain and controller. Design examples for a Trace domain and controller for using the Header bits for starting, continuing, and stopping the data output operation will be described later in regard to FIGS. 72-74.

It is important to note in FIG. 49 that during the output data mode 4904 of the present disclosure the bits of each data frame are output on TROUT at the CLK rate, not the TCK rate. Thus the TROUT data from a Trace domain can be output at twice the frequency of TDO data being output from a JTAG TAP domain. This can be understood by reference to FIG. 14A-14C which shows the TDI and TDO data flowing between a controller and a TAP domain at one half the CLK rate, i.e. at the TCK and CKIN rate.

It is also important to note that the data frames are transmitted to the controller while the TSM is in the Shift-DR (SFD) state and continuously until all data frames have been sent. Thus the data frames are transmitted autonomously and without having to transition through JTAG TAP states.

Figure 51:
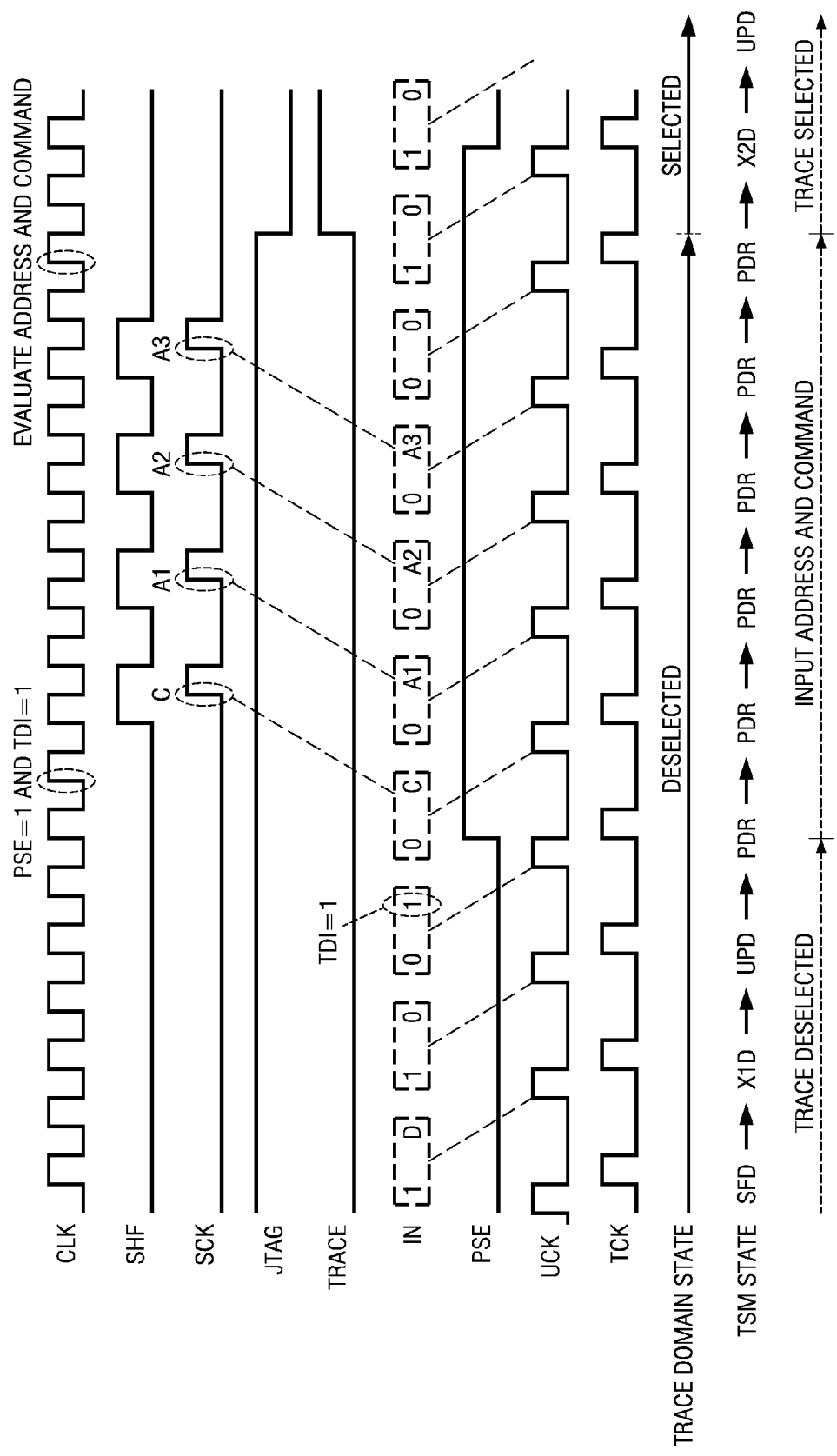
FIG. 51 illustrates an ACP timing example of selecting a Group Trace Only Operation in the Pause-DR state.

FIG. 51 illustrates the timing of selecting a Trace domain to perform a Group Trace Only operation in the Pause-DR state. As the name implies, the Group Trace Only operation comprises the step of acquiring trace data in a group of one or more selected Trace domains. Prior to selecting the Group Trace domains, the Trace domains will have been accessed by a JTAG TAP domain, via the TDI, CTL, and TDI interface as described in regard to FIGS. 31A and 31B, to setup and enable the selected Trace domains for the Group Trace Only operation.

As describe previously in timing diagrams 37-46, the ACP is operating to input TMS and TDI packets 5102-5120 and the TSM is responding to the TMS bit of each packet to move through JTAG states of FIG. 10, during each TCK 5122-5138. As seen the transitions include going from the SFD state to the RTI state via the X1D and UPD states. Since this is a Trace Only operation, the TROUT signal is disabled from outputting data, thus it is not shown in FIG. 51.

In the PDR state, the PSE signal from the TSM goes high. At time 5140 the master controller 3010 detects the condition of the TSM being in the Pause-DR state (PSE=1) and the TDI signal being high (TDI=1). In response to this condition the master controller inputs the command (C) and address (A1-3) bits in packets 5108-5114. At time 5150 the master controller evaluates the command and address bits and executes action 3626, which sets the JTAG and Enable signals low and the Trace signal high. At this time, all Group Trace domains that have been previously accessed by a JTAG data scan operation and setup to perform Trace Only operations and deselected in the Pause-DR state, as described in FIG. 42, are again selected. As seen in FIG. 51 and in response to the condition detected at time 5150, the JTAG signal goes low as the Trace signal goes high. This indicate that as the last JTAG data scan operation used to setup the last Trace domain of the Group becomes deselected, the Group Trace Only operation becomes selected. When the Group Trace domains are selected the TSM is transitioned from the PDR state to the UPD state.

Figure 52:
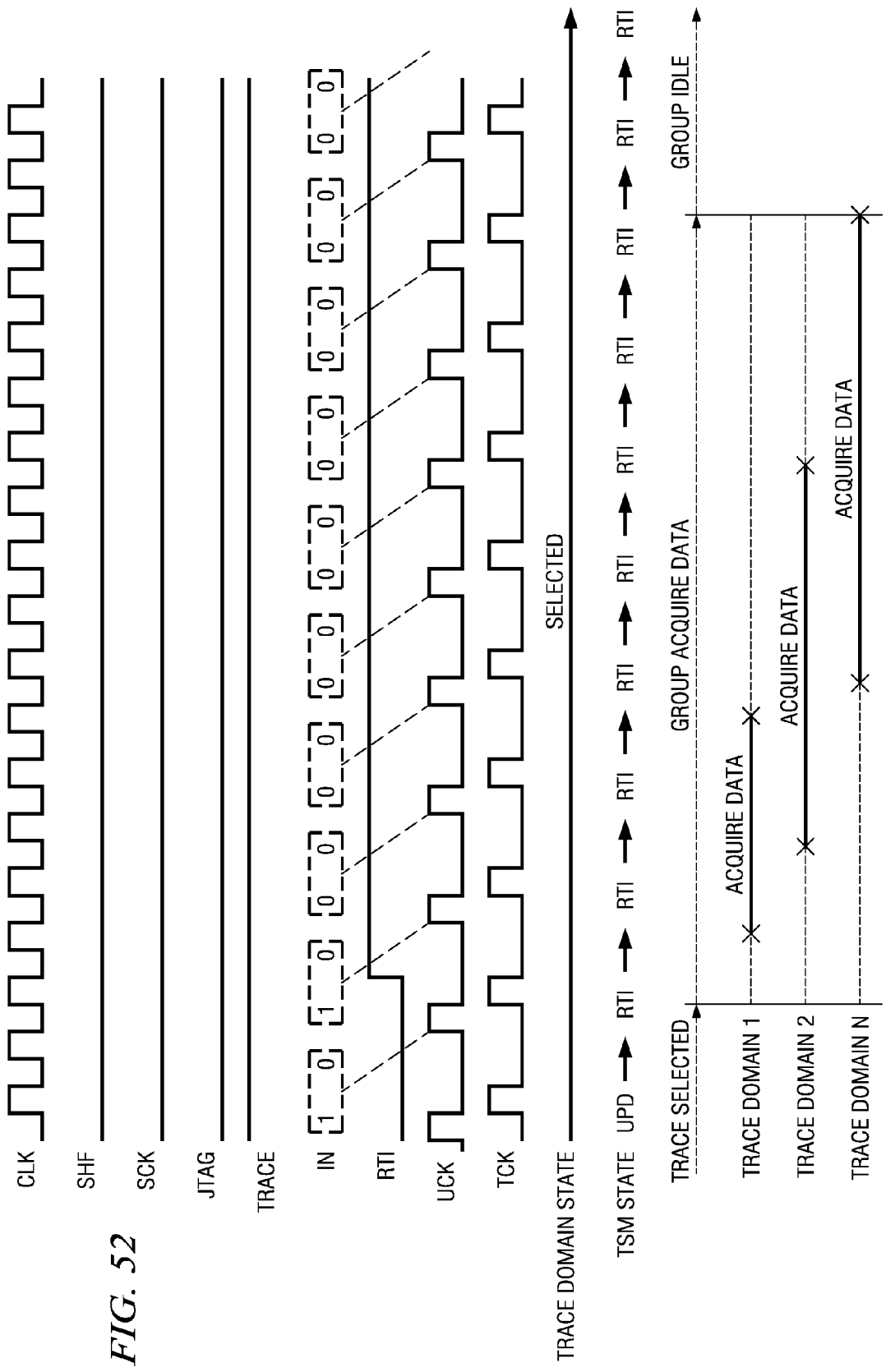
FIG. 52 illustrates an ACP timing example of transitioning from the Pause-DR state to the Run Test/Idle state to start a Group Trace Only Operation.

FIG. 52 is a continuation of the timing of FIG. 51 and illustrates how the Group Trace Only operation is enabled when the TSM enters into the RTI state. When the TSM transitions into the UPD state, the setup information scanned into the Trace domains by a preceding JTAG data scan operation is updated to take effect. This updating of setup information in the Trace domains will be described in more detail later in regard to FIG. 58. From the UPD state the TSM is transitioned into the RTI state and the RTI signal goes high. As seen in FIG. 30, the RTI signal is input to the Trace domains block 3008 to enable the Trace Only operation of the selected Group Trace domains.

When the Trace Only operation is enabled the Group Trace domains enters into the Group Acquire Data mode 5202 of operation. The data being acquired is again typically data bus or address bus signal activity of a functioning circuit coupled to the Group Trace domains. The data being acquired is stored in a memory within each Group Trace domain. Typically, but not necessarily, each Trace domain in the Group operates autonomously in their acquire data mode. That is to say, each Trace domain will typically start and stop its acquisition of data independently of other Trace domains in the Group. An example of this autonomous data acquisition mode of operation is shown in FIG. 52 whereby Group Trace domain 1 starts at time 5204 and stops at time 5206, Group Trace domain 2 starts at time 5208 and stops at time 5210, and Group Trace domain N starts at time 5212 and stops at time 5214. Following time 5214, all Group Trace domains have acquired their data and the Group Trace operations enter into a Group Idle mode 5216. The controller 2902 of FIG. 29 coupled to the ACPs 3004 of the target devices can anticipate when the Group Idle mode occurs. Alternately, an additional signal or signals may be interfaced between the controller and target devices to indicate to the controller when the Group Idle mode occurs.

Figure 53:
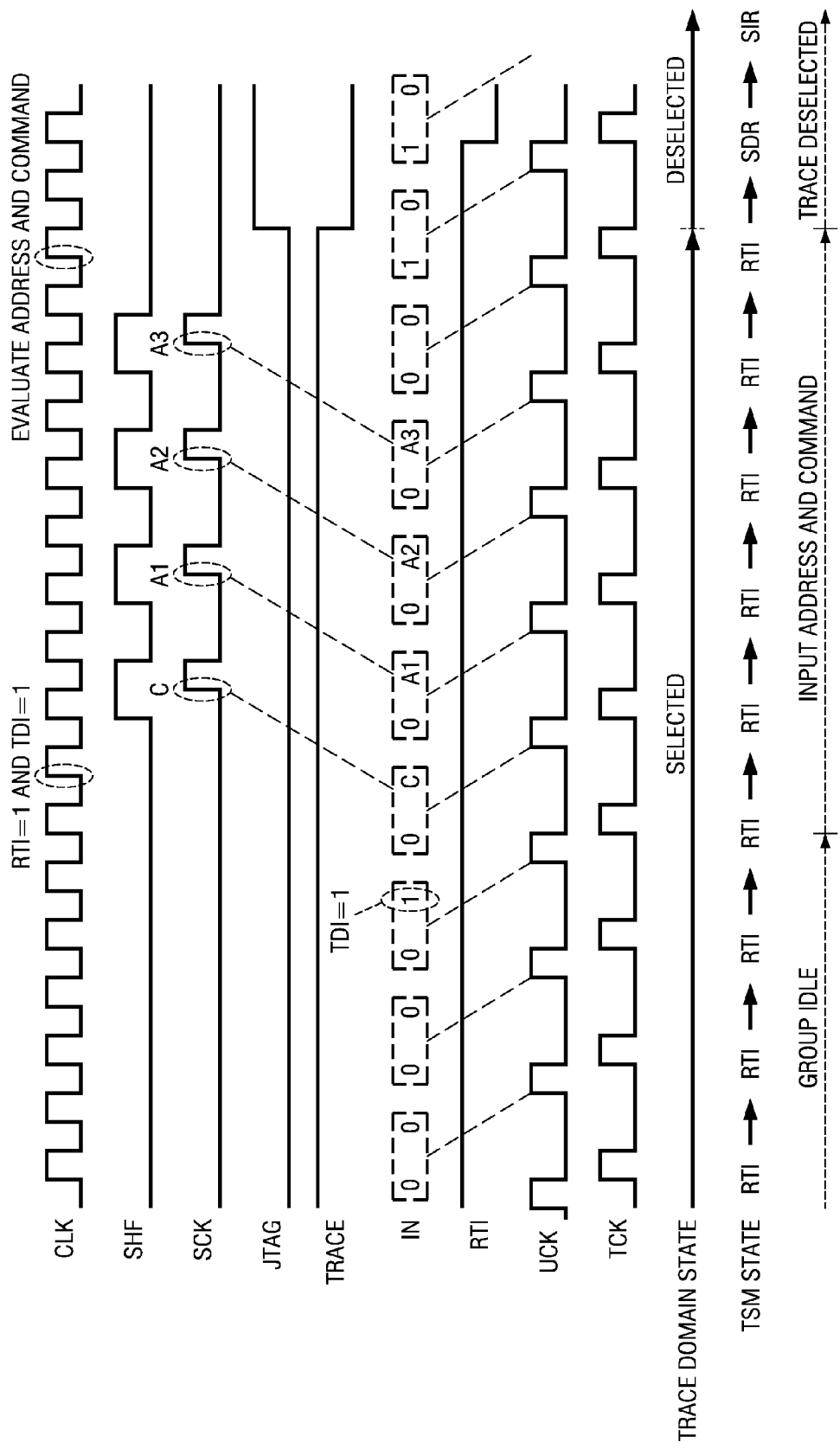
FIG. 53 illustrates an ACP timing example of de-selecting a Group Trace Only Operation in the Run Test/Idle state.
Figure 55:
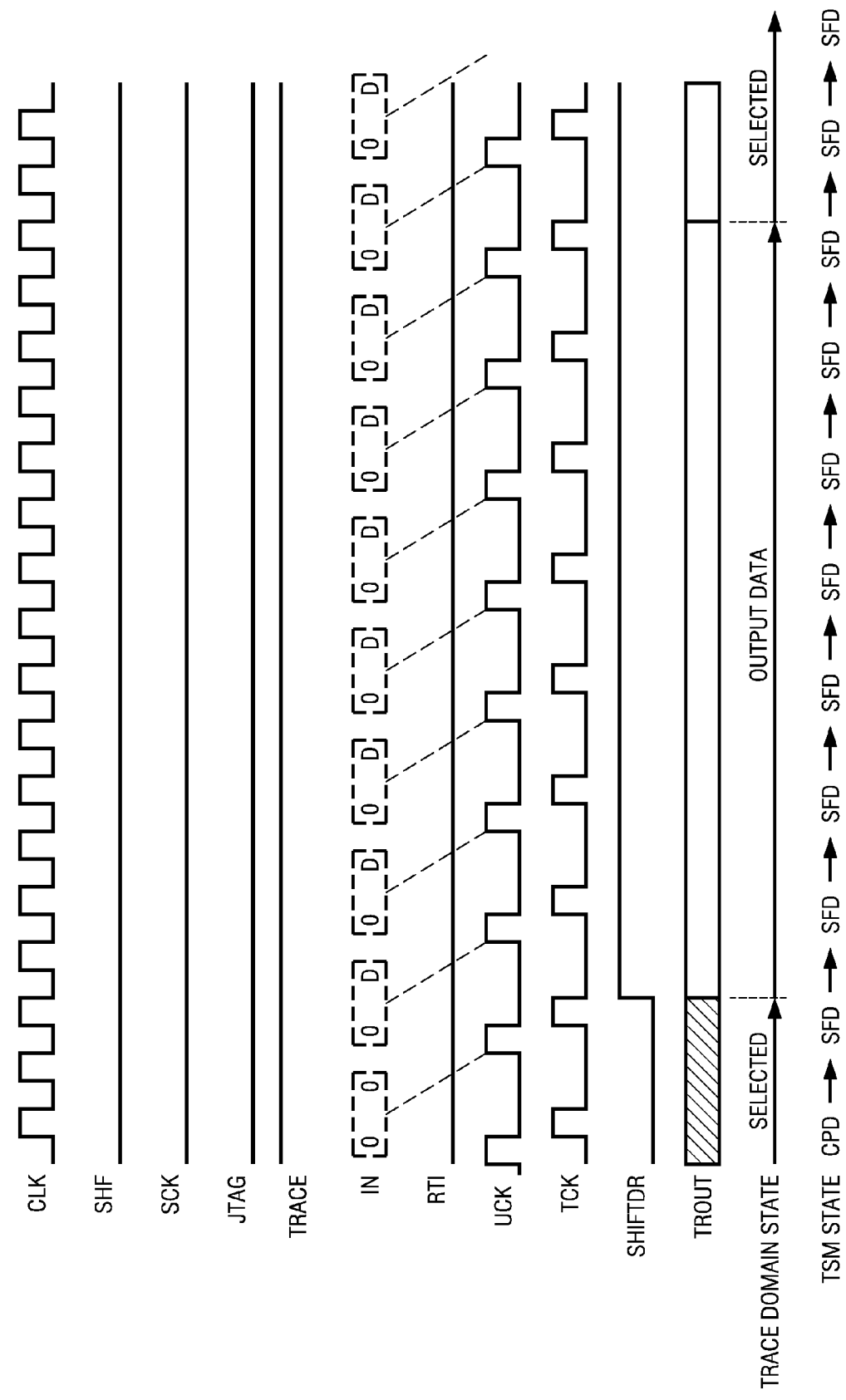
FIG. 55 illustrates an ACP timing example of enabling a selected Local Trace Output Only operation in the Shift-DR state.
Figure 56:
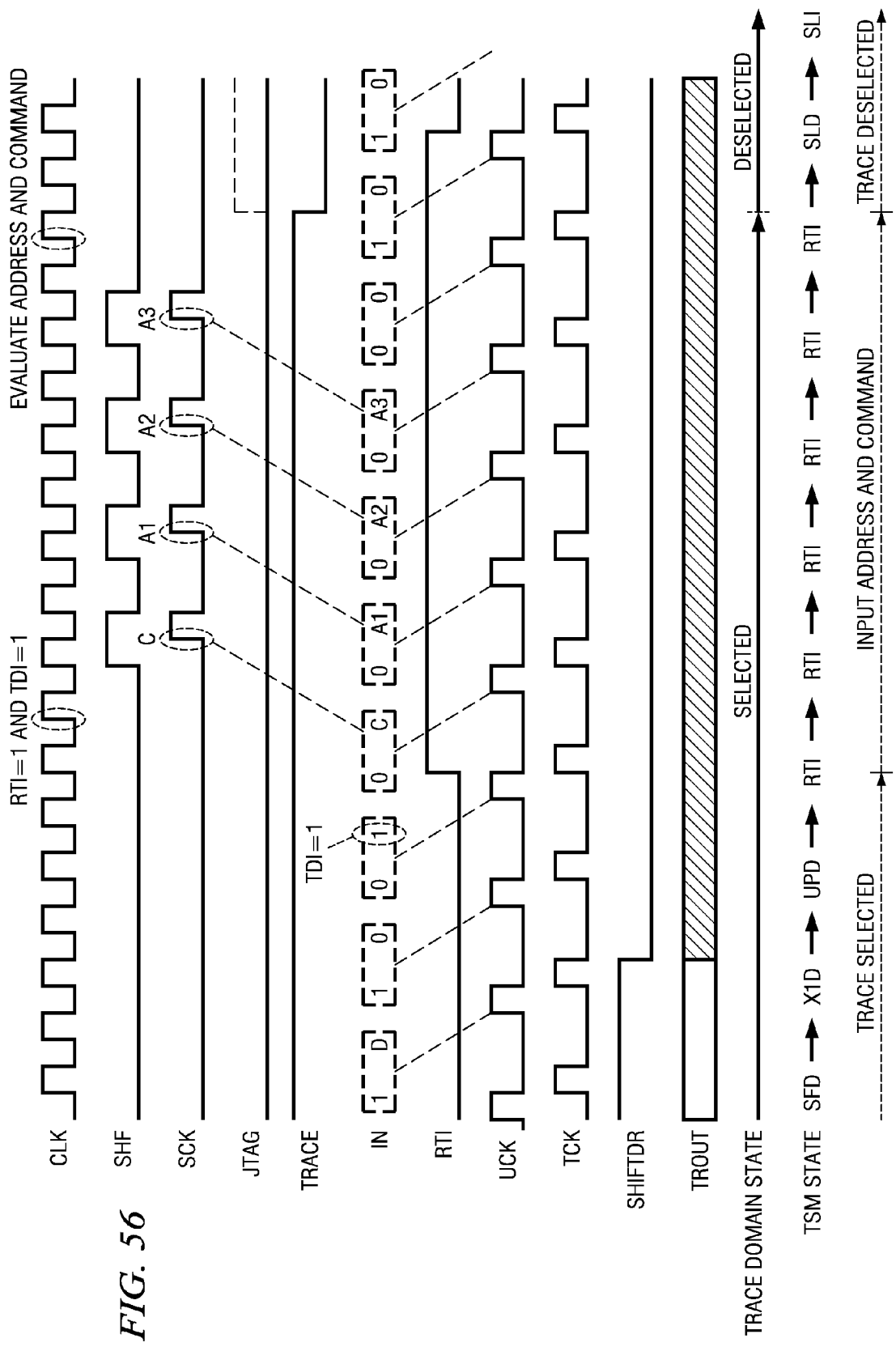
FIG. 56 illustrates an ACP timing example of de-selecting a Local Trace Output Only operation in the Run Test/Idle state.

FIG. 53 is a continuation of the timing of FIG. 52 and illustrates how the Group Trace domains in the Group Idle mode 5216 are deselected by setting TDI high (TDI=1) during the RTI state and inputting an address and command to the master controller 3010 beginning at time 5340 to select a Local JTAG operation via action 3620 at time 5350. The Local JTAG operation starts by transitioning the TSM from the RTI to the SDR state. The Local JTAG operation is used to select one of the Trace domains in the Group, via an associated TAP domain, to allow the Trace domain to be setup for a Trace Output Only operation. The Trace Output Only operate allows the Trace domain to output its acquired data to a controller 2902 (adapted to receive the trace data) via the Trace domain's TROUT output. This process of individually selecting and setting up a Trace domain to perform a Trace Output Only operation is repeated for each Trace domain in the Group of Trace domains that acquired data. The following FIGS. 54-56 illustrate the timing of performing the Trace Output Only operation.

Figure 54:
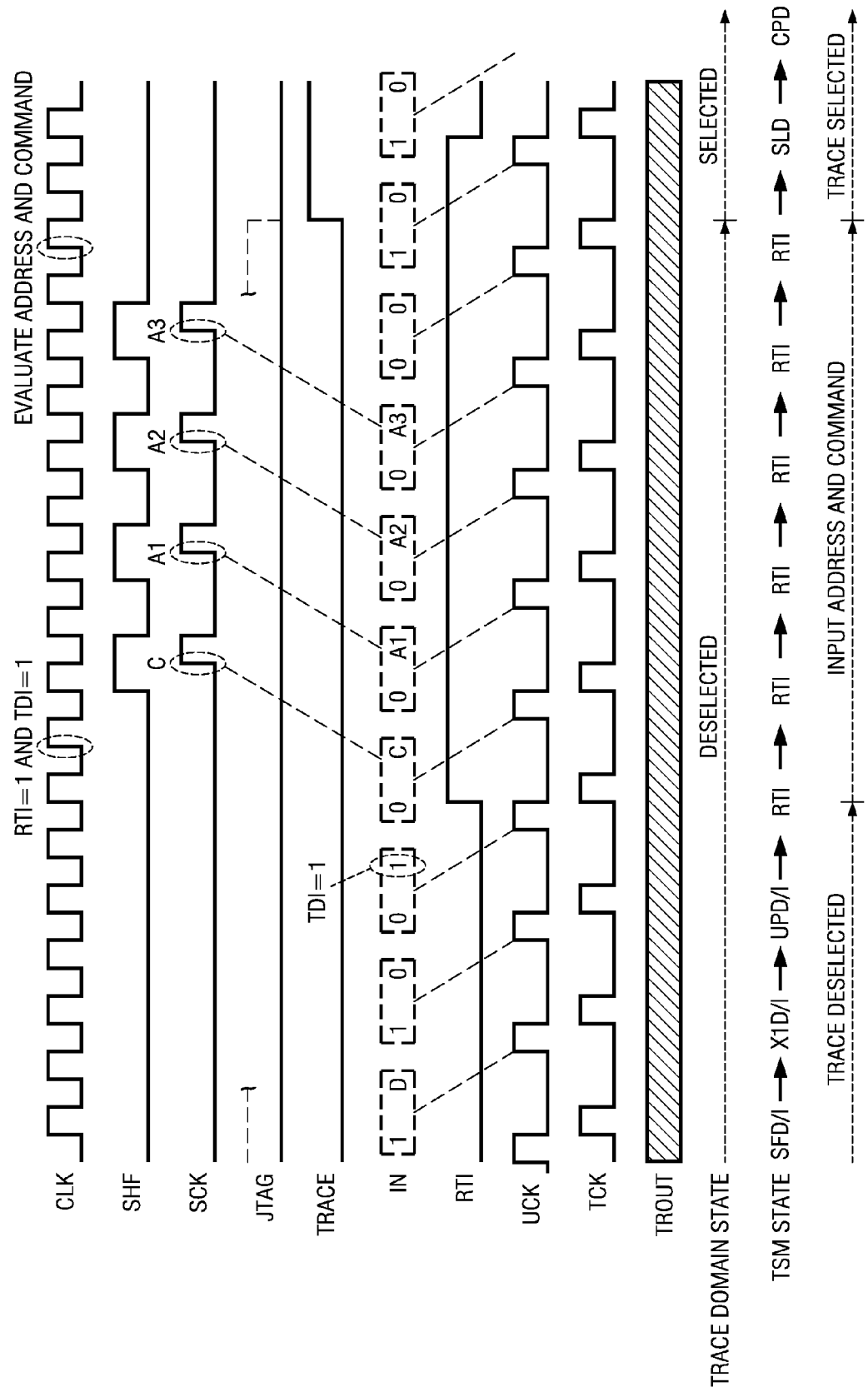
FIG. 54 illustrates an ACP timing example of selecting a Local Trace Output Only operation in the Run Test/Idle state.

FIG. 54 illustrates the timing of selecting a Trace domain to perform a Trace Output Only operation. As the name implies, the Trace Output Only operation comprises the step of outputting acquired trace data from a Trace domain. Prior to selecting the Trace domain, the Trace domain will have been accessed by a JTAG TAP domain, via the TDI, CTL, and TDI interface as described in regard to FIGS. 31A and 31B, to setup and enable the Trace Output Only operation. As can be seen, the timing of selecting a Trace Output Only operation in FIG. 54 is very similar to the timing of selecting a Trace & Output operation in FIG. 48.

At time 5440 the master controller 3010 detects the condition of the TSM being in the Run Test/Idle state (RTI=1) and the TDI signal being high (TDI=1). In response to this condition the master controller inputs the command (C) and address (A1-3) bits in packets 5408-5414. At time 5450 the master controller evaluates the command and address bits and executes action 3624, which sets the Trace signal high. While not shown in the timing diagram of FIG. 54, action 3624 also sets the enable signal from master controller 3010 high to enable the OE signal from TSM 3012 to enable the DIO output of I/O circuit 710 when the TSM is in the Shift-DR state.

In FIG. 54, the dotted line 5452 on the JTAG signal indicates that if a JTAG operation was previously selected it would become deselected at time 5450 as a result of the above mentioned action 3624.

FIG. 55 is a continuation of the timing of FIG. 54 and illustrates how the selected Trace Output Only operation is enabled when the TSM enters into the Shift-DR (SFD) state. When the TSM transitions from the Capture-DR (CPD) state to the Shift-DR (SFD) state it sets the ShiftDR signal high. As seen in FIG. 30, the ShiftDR signal is input to the Trace domains block 3008 to enable the Trace Output Only operation of the selected Trace domain.

When the Trace Output Only operation is enabled the Trace domain's TROUT output is enabled and the Trace domain enters into the Output Data mode 5504. In the Output Data mode 5504 the trace data stored in the Trace domain's memory during the previously described Trace Only operation is output to DIO from the TROUT output via multiplexer 3018 of FIG. 30. The data is output in frames, each frame having a leading Header bit followed by data bits as described in FIG. 49. The Header bit of each frame is used, as previously described, to start, continue, and stop the data output operation. After the data has been output, the Trace domain enters into an Idle mode 5506 as described in FIG. 49.

FIG. 56 is a continuation of the timing of FIG. 55 and illustrates how the idled Trace Output Only operation is deselected by transitioning the TSM from the Shift-DR (SFD) state to the RTI state so that an address and command can be input to the master controller 3010 to initiate an action that sets the Trace signal low at time 5050. The action may be action 3620 which will set the JTAG signal high, as shown in dotted line, in preparing for a JTAG operation or action 3628 which will not set the JTAG signal high. FIG. 56 is similar to FIG. 50.

Figure 57:
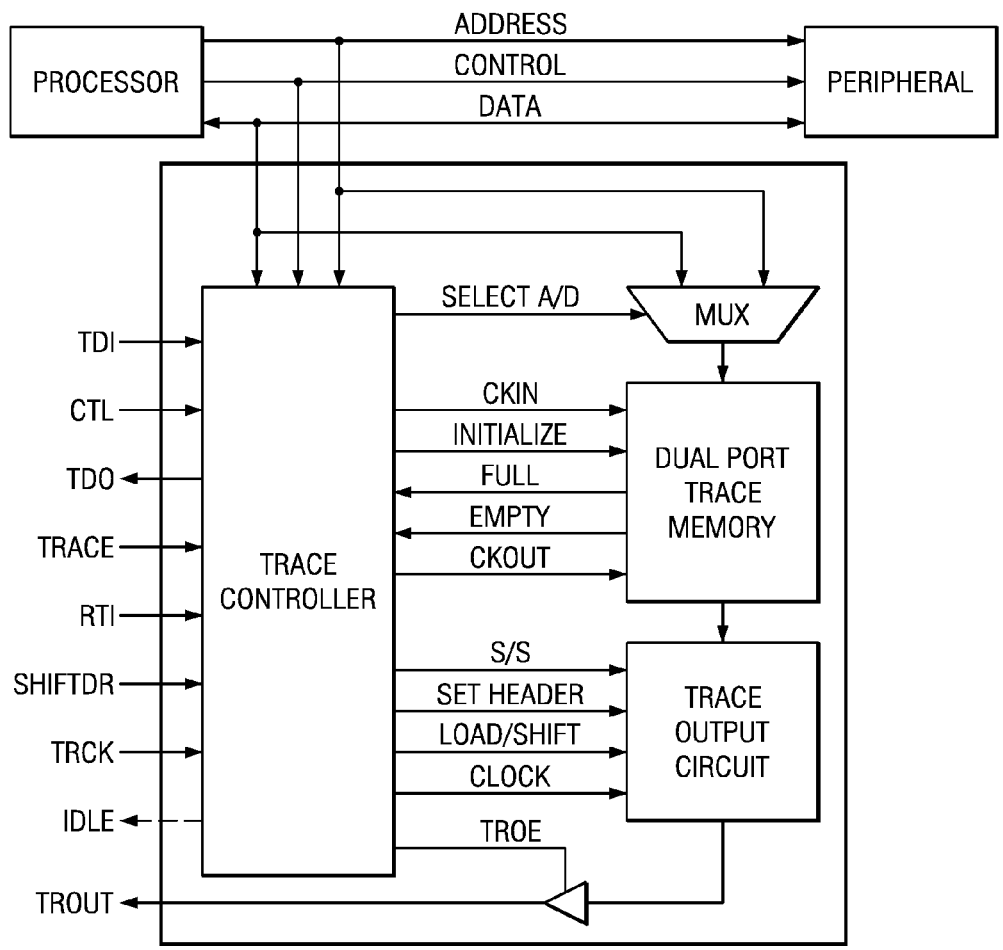
FIG. 57 illustrates a Trace Domain coupled to the Address, Data, and Control buses of a functional circuit.

FIG. 57 illustrates one example implementation of a Trace domain 5702 that may exist in Trace Domains block 3008. Trace Domains block 3008 may contain one or more of Trace domains 5702. Trace domain 5702 is designed to operate according to the timing diagrams of FIGS. 48-56. Trace domain 5702 comprises a trace controller 5704, a multiplexer 5706, a dual port trace memory 5708, a trace output circuit 5710, and a 3-state output buffer 5712. Trace domain 5702 is interfaced to the ACP 3004 of FIG. 30 by the Trace, RTI, ShiftDR, TRCK, and TROUT signals. Trace domain 5702 is interfaced to the Tap Domains block 3006 of FIG. 30 by the TDI, CTL, and TDO signals. Trace domain 5702 is connected to the data 5724, address 5720, and control 5722 buses coupled between a functional processor 5716 and peripheral 5718 circuit(s). The peripheral circuit 5718 could be any type of circuit (memory, DMA controller, I/O controller, another processor, etc) that is capable of being communicated to by the processor 5716 via the data, address, and control buses. The operation of the processor 5716 and peripheral circuit 5718 provides a functional operation within the target device. Trace domain 5702 is provided to allow non-intrusive observation and storage of the data and/or address signal pattern flow between the processor and peripheral circuit during the functional operation.

The data, address, and control buses are interfaced to the trace controller 5704. The data and address buses are interfaced to multiplexer 5706. The multiplexer 5706 receives a Select Address/Data (A/D) signal from the trace controller 5704 to select either the address or data bus signals as input to the dual port trace memory's parallel data input 5726.

The dual port trace memory 5708 inputs CKIN, Initialize, and CKOUT signals from the trace controller 5704, and outputs Full and Empty signals to the trace controller 5704. The Initialize signal is used to initialize the dual port trace memory prior to the beginning of the trace operation. The CKIN signal is used to control the dual port trace memory to input and store data or address signal patterns from multiplexer 5706 via the parallel data input 5726. The Full signal output from the dual port trace memory is an indication to the trace controller 5704 that the dual port trace memory is full of data. The CKOUT signal is used to control the dual port trace memory to output stored data patterns to the trace output circuit 5710 via the dual port trace memory's parallel output 5728. The Empty signal output from the dual port trace memory is an indication to the trace controller that the dual port trace memory only has one remain data pattern to be output, i.e. its a Look-Ahead-Empty indication.

Figure 57A:
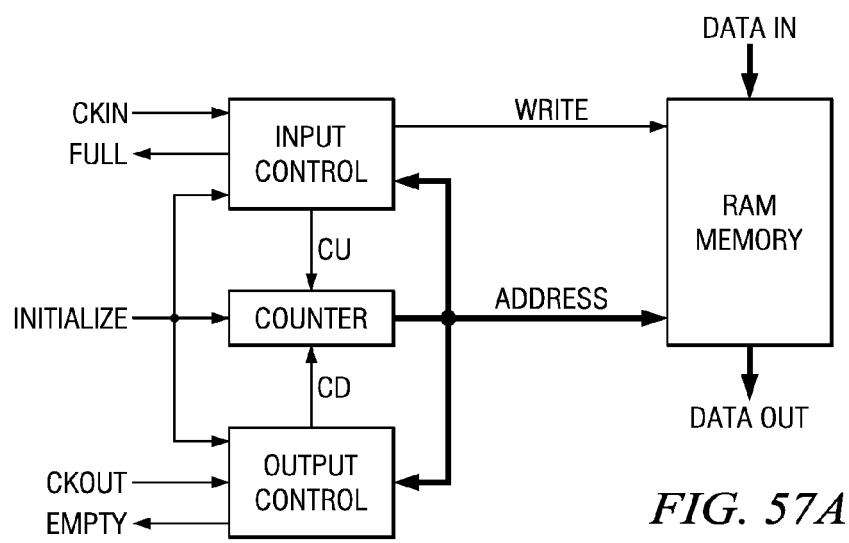
FIG. 57A illustrates an example design for the Dual Port Trace Memory of the Trace Domain of FIG. 57.

FIG. 57A illustrates one example implementation of the dual port trace memory 5708. The dual port trace memory comprises a RAM Memory 5730, an input control circuit 5732, an address Counter 5734, and an output control circuit 5736.

The Input control circuit 5732 inputs the CKIN and Initialize signals from trace controller 5704 and an address bus 5738 from address Counter 5734. The input control circuit 5732 outputs the Full signal to Trace Controller 5704, a Write signal 5742 to the RAM Memory 5730, and a count up (CU) signal 5740 to Counter 5734.

The Output Control circuit 5736 inputs the CKOUT and Initialize signals from trace controller 5704 and the address bus 5738 from address Counter 5734. The output control circuit 5736 outputs the Empty signal to Trace Controller 5704 and a count down (CD) signal 5744 to address Counter 5734.

The address Counter 5734 inputs the Initialize signal from Trace Controller 5704, the CU signal from Input control circuit 5732, and the CD signal from Output control circuit 5736. The address Counter 5734 outputs an address on address bus 5738 to the Ram Memory 5730, the Input control circuit 5732, and the Output control circuit 5736.

The RAM Memory 5730 inputs data on bus 5726 from multiplexer 5706, the Write signal from Input Control circuit 5732, and the Address bus 5738 from the address Counter. The RAM Memory 5730 outputs data on bus 5728 to Trace Output Circuit 5710.

The initialization, data input, and data output operation of the dual port trace memory 5708 is as follows.

To initialize the trace memory, the Initialize signal from the Trace Controller 5704 is activated. In response to the activation of the Initialize signal, the counter 5734 is reset to output an address of zero on address bus 5740 and the internal circuits of the Input Control 5732 and Output Control 5736 circuits are reset, which sets their outputs, Write, Full, Empty, to inactive states.

To input data to the trace memory, the CKIN signal input to the Input Control circuit 5732 is enabled to cause the data on bus 5726 to be written into the RAM Memory. In response to each CKIN signal, the Write signal from the Input Control circuit is activated to write data from bus 5726 into the currently addressed memory location, then the count up (CU) signal from the Input Control circuit is activated to increment the address Counter to produce the next address on Address bus 5738. This process of writing data to the RAM memory followed by incrementing the Address bus is repeated during each CKIN input until the address Counter 5734 reaches the RAM memory's maximum address. In response to reaching the maximum address, the Input Control circuit sets the Full signal high and activates the Write signal during the next CKIN signal to write data into the maximum RAM Memory address, but does not output a CU signal to the address Counter 5734. Thus the maximum RAM Memory address remains on the Address bus 5738. In response to the Full signal going high, the Trace Controller 5704 will disable further CKIN signals to the Input Control circuit to stop the data input operation.

To output data from the trace memory, the CKOUT signal input to the Output Control circuit is enabled to start the data output operation. Prior to enabling the CKOUT signal, the Trace Controller enables the Trace Output circuit 5710 to do a first load and shift out operation on the data output on bus 5728. Since the Counter 5734 contains the maximum RAM address, this first load and shift out operation shifts out the data stored in the RAM maximum memory address location. During each CKOUT input to the Output Control circuit, the count down (CD) signal will be activated to decrement the address bus 5738 output from address Counter 5744. Each time the Address bus decrements, the data stored at that RAM address is output on bus 5728 to be loaded and shifted out by the Trace Output circuit 5710. This process of decrementing the address Counter followed by the Trace Output circuit 5710 performing a load and shift out operation to output the addressed data, is repeated until the address Counter 5734 reaches the address prior to the zero address, i.e. the one address. When the address Counter outputs the one address on bus 5738, the Output Control circuit sets the Empty signal high. In response to the Empty signal being high, the Trace Controller 5704 outputs the last CKOUT signal to decrement address bus 5738 to the zero address, followed by controlling the Trace Output circuit 5710 to perform a last load and shift operation to output the data at the zero address location.

While the memory 5708 of FIG. 57A has been described for inputting and outputting trace data, it could be used generally for inputting and outputting other types of data as well.

Figure 72:
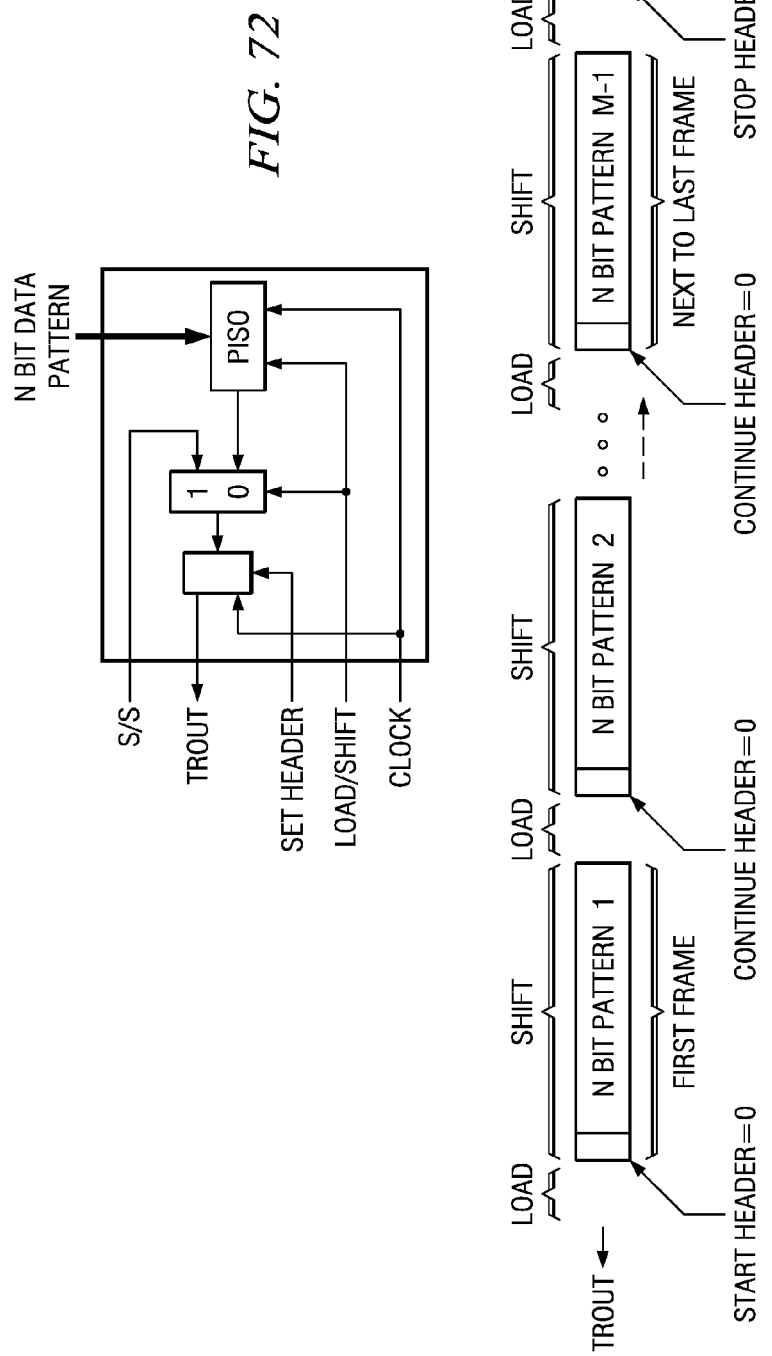
FIG. 72 illustrates an example design for the Trace Output Circuit of FIG. 57.

The trace output circuit, as will be described in more detail in FIG. 72, is used to output the previously mentioned data frames on the TROUT signal. The trace output circuit 5710 has a parallel input coupled to the parallel output 5728 of the dual port trace memory. The trace output circuit 5710 has a serial output coupled the input of 3-state buffer 5712. The trace output circuit receives Start/Stop (S/S), Set Header, Load/Shift, and Clock signals from the trace controller 5704. The S/S signal is used to load a data value in the Header bit of each data frame. The Set Header signal is used to initialize the Header bit at the beginning of a data frame output operation. The Load/Shift signal is used to load parallel data from the dual port trace memory and serially shift the data out in a data frame. The Clock signal is used to time the load and shift operations.

The 3-state buffer 5712 inputs the serial output from the trace output circuit and a trace output enable (TROE) signal from the trace controller 5704. When enabled by the TROE signal, buffer 5712 output the serial output from the trace output circuit to the TROUT signal. As mentioned in regard to FIGS. 31A and 31B, only one Trace domain 5702 may be enabled at a time to output serial data on the TROUT signal via buffer 5712.

As seen in FIG. 57, to facilitate the detection of the ending of the previously described Group Trace Only operation (by a controller 2902 adapted for detecting the ending) as described in FIGS. 51-53, an optional Idle output signal 5714 may be provided on Trace domain 5702. Each Trace domain 5702 in Trace Domains block 3008 may contain an Idle output signal 5714. In one embodiment, the Idle output signal 5714 from each Trace domain 5702 may be bussed onto a common "Wire OR'ed" global Idle signal, using open collector/open drain type output buffers. In another embodiment, the Idle output signal from each Trace domain may be input to voting logic to determine when all Trace domains are in the idle mode. The voting logic will output a global Idle signal in response to all Trace domain being idle.

Using one of the global Idle signal embodiments mentioned above, a controller 2902 adapted to receive the global Idle signal can determine when a Group of Trace domains have completed a Trace Only Operation as described in FIG. 52. For example in FIG. 52, when Trace domain 1 goes idle at time 5206 it will set its Idle signal high, when Trace domain 2 goes idle at time 5210 it will set its Idle signal high, and when Trace domain N goes idle at time 5214 it will set its Idle signal high. In response to all the Trace domain Idle signals being high, the global Idle signal will go high to indicate the Global Idle mode to a controller 2902.

Figure 58:
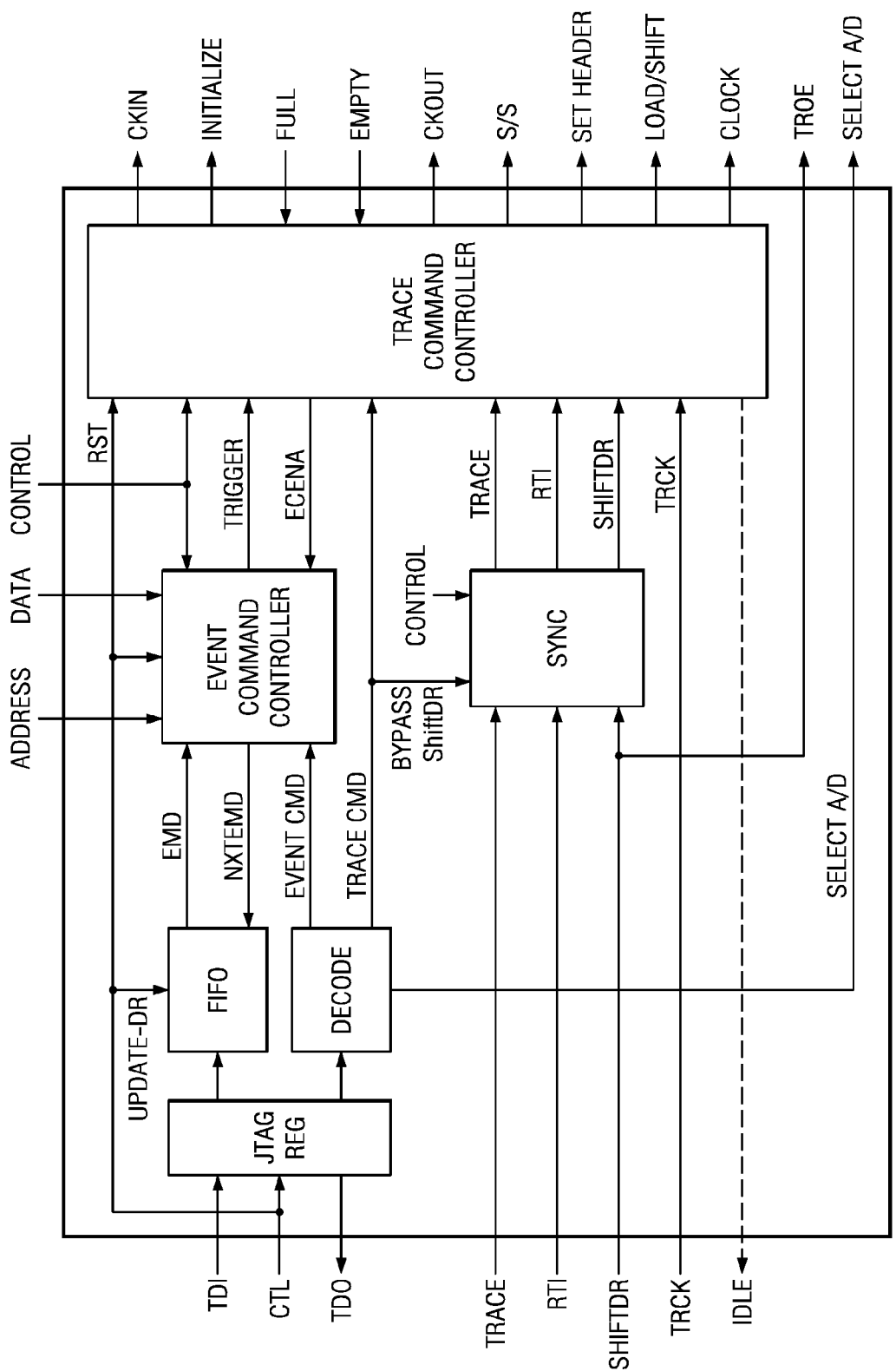
FIG. 58 illustrates an example design for the Trace Controller of the Trace Domain of FIG. 57.

FIG. 58 illustrates an example implementation of trace controller 5704. The trace controller comprises a trace command (CMD) controller 5802, an event command (CMD) controller 5804, a scannable JTAG register (REG) 5806, CMD decode circuit 5808, a FIFO 5810, and a synchronizer (SYNC) circuit 5812.

The trace command controller 5802 has the previously described input and output signals CKIN, Initialize, Full, Empty, CKOUT, S/S, Set Header, Load/Shift, Clock, and Idle. The trace command controller inputs additional signals comprising a TRST signal from the JTAG CTL bus, a trigger signal from the event command controller 5804, control input from the control bus 5722, trace CMD signals from decode circuit 5808, a synchronized Trace signal from SYNC circuit 5812, a synchronized RTI signal from SYNC circuit 5812, a synchronized ShiftDR signal from SYNC circuit 5812, and the TRCK signal. The trace command controller 5802 outputs an additional event command enable (ECENA) signal to event command controller 5804.

The event command controller 5804 inputs the previously described data bus 5720, address bus 5724, and control bus 5722. The event command controller 5804 additionally inputs the TRST signal from the JTAG CTL bus, the ECENA signal, event CMD signals from decode circuit 5808, and Expected and Mask Data (EMD) signals from FIFO 5810. The event command controller additionally outputs the Trigger signal to trace command controller 5802 and a next Expected and Mask Data (NXTEMD) signal to FIFO 5810. The NXTEMD signal is the FIFO clock out signal.

The JTAG REG 5806 inputs the TDI and CTL signals and outputs the TDO signal. These signals are used to scan data into the JTAG REG during a JTAG data register scan operation. The data scanned into the JTAG REG is output from the JTAG REG on first 5814 and second 5816 buses. The first bus is for inputting EMD patterns to FIFO 5810. The second bus is for inputting a command pattern to decode circuit 5808. The JTAG REG is accessed by data scan operations to load and output data on the first and second buses. Assuming the FIFO had a pattern memory depth of N, N JTAG data scan operations would be performed to shift in the N EMD patterns to fill the FIFO. During the Update-DR state of each data register scan operation, an Update-DR signal from the CTL bus is input to the FIFO to cause the FIFO to input the EMD pattern on the 5814. The Update-DR signal is the FIFO clock in signal. When the last EMD pattern (N) is shifted into the JTAG REG and output on bus 5814, a command pattern is also shifted into the JTAG REG and output on bus 5816. The command pattern is decoded by decode circuit 5808 to provide the Event CMD, Trace CMD, and the Select A/D signals.

Figure 66:
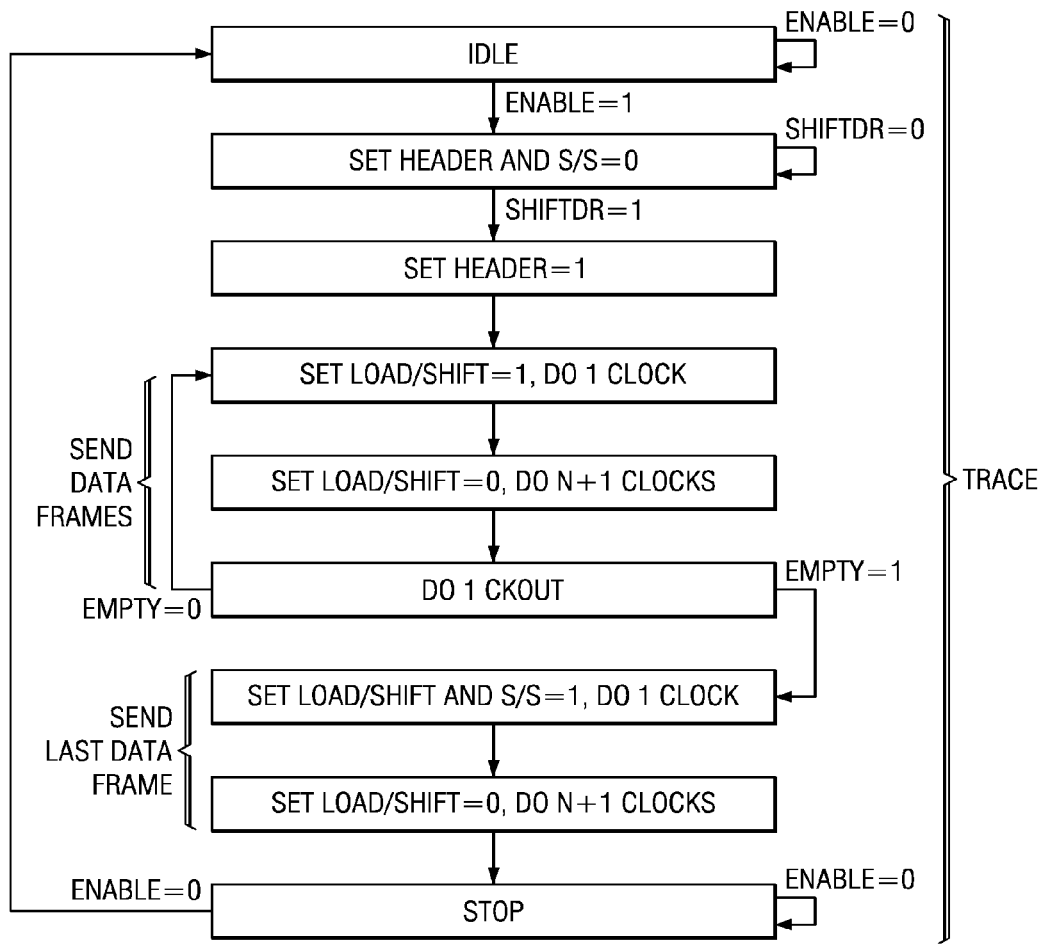
FIG. 66 illustrates the state diagram of a Trace Output Only operation of FIG. 59.

The SYNC circuit 5812 inputs the Trace, RTI, and ShiftDR signal from ACP 3004, control signals from control bus 5722, and Bypass ShiftDR signal from the Trace CMD bus for Decode circuit 5808. The SYNC circuit synchronizes the Trace, RTI, and ShiftDR signals with the control input and outputs synchronized versions of the Trace, RTI, and ShiftDR signals to trace command controller 5802. In the simplest case, the SYNC circuit may simply be three FFs that are clocked by the control signals to pass the Trace, RTI, and ShiftDR outputs from the ACP on to the Trace, RTI, and ShiftDR inputs to the trace command controller 5802. Synchronizing the Trace, RTI, and ShiftDR signals from the ACP with the control signals that operated the trace command controller 5802 is a better design style over inputting non-synchronized Trace, RTI, and ShiftDR signals from the ACP to the trace command controller. If the Bypass ShiftDR signal is set high, the SYNC circuit does not synchronize the ShiftDR signal, but rather bypasses the ShiftDR signal through the SYNC circuit 5812 to trace command controller 5802. A non-synchronized ShiftDR is preferred during Trace Output Only operations as shown in FIG. 66.

After the FIFO 5810 is filled with an appropriate number of EMD patterns and the Event CMD, Trace CMD, and Select A/D signals are set, the Trace controller 5704 is setup to execute a trace operation. The trace operation is initiated when the synchronized Trace signal input to the trace command controller 5802 goes high, as previously described in the Trace timing diagrams of FIGS. 48-56.

Figure 59:
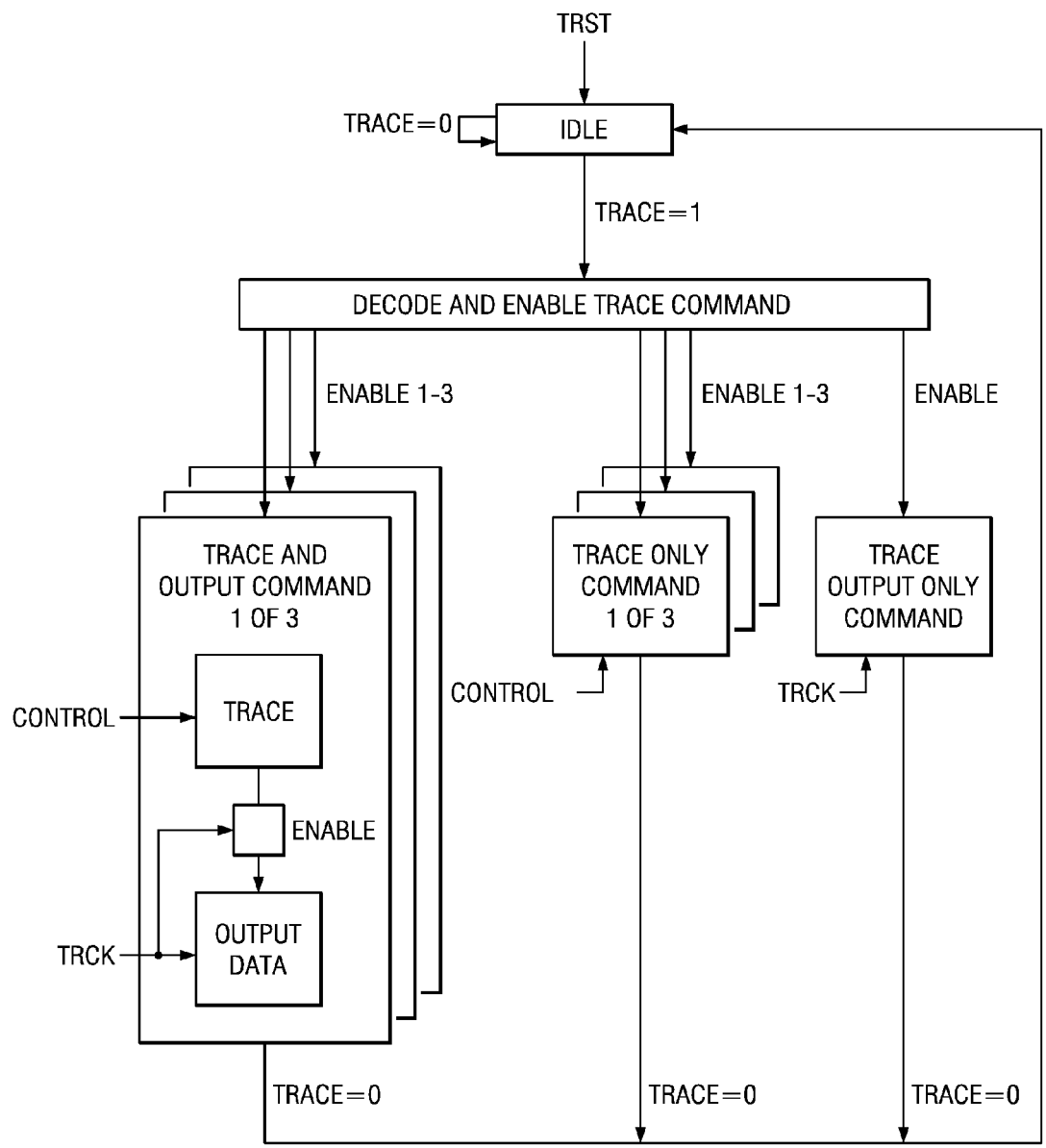
FIG. 59 illustrates the high level block diagram operation of the Trace Command Controller of FIG. 58.

FIG. 59 illustrates the high level operation of the trace command controller 5802. The operation of the trace command controller is timed by control inputs from control bus 5722. When the Trace input is low or in response to a TRST input, the trace command controller will be in the Idle state 5902. When the Trace input goes high, the trace command controller will transition to the Decode & Enable Trace CMD state 5904. As the name implies, the Decode & Enable Trace CMD state decodes the Trace CMD input from the decode circuit 5808 and enables one of the three types of previously described trace operations, Trace & Output, Trace Only, or Trace Output Only.

As seen in this example there are 3 types of Trace & Output CMD Operations 5906-5910, each enabled by a correspondingly numbered Enable signal 1-3. Likewise, in this example there are 3 types of Trace Only operations 5912-5916, each enabled by a correspondingly numbered Enable signal 1-3. In this example there is only one Trace Output Only operation 5918 which is enabled by a Enable signal 5920. When a Trace operation is enabled, that operation will begin and continue until it is completed. When a Trace operation completes, the Trace signal is set low to cause the trace command controller 5802 to return to the Idle state 5902. In the Idle state all Enable signal outputs from Decode & Enable Trace CMD state 5904 are set low.

As seen in dotted box 5928, the Trace & Output CMDs 5906-5910 comprise a Trace section 5922 and an Output Data section 5924. The Trace section is timed by control signals from control bus 5722 so that the trace operation is synchronized to the address and data bus being traced. The Output Data section is timed by the TRCK so that the data frame outputs are synchronized to the TRCK. The Trace section 5922 operates first to acquire data. When the Trace operation is completed, an enable signal 5926 is set by the Trace section. The enable signal is synchronized by the TRCK (via a synchronizing circuit 5930, such as a FF) and input to the Output Data section 5924. The enable signal 5926 enables the Output Data section 5924 to start outputting data frames to send the acquired data to a controller 2902 adapted to receive the data frames.

As seen the Trace Only CMDs 5912-5916 are timed only by control signals from control bus 5722 since the Trace Only CMD only acquires data. Also as seen, the Trace Output Only CMD 5918 is timed only by the TRCK since the Trace Output Only CMD only outputs acquired data.

Figure 60:
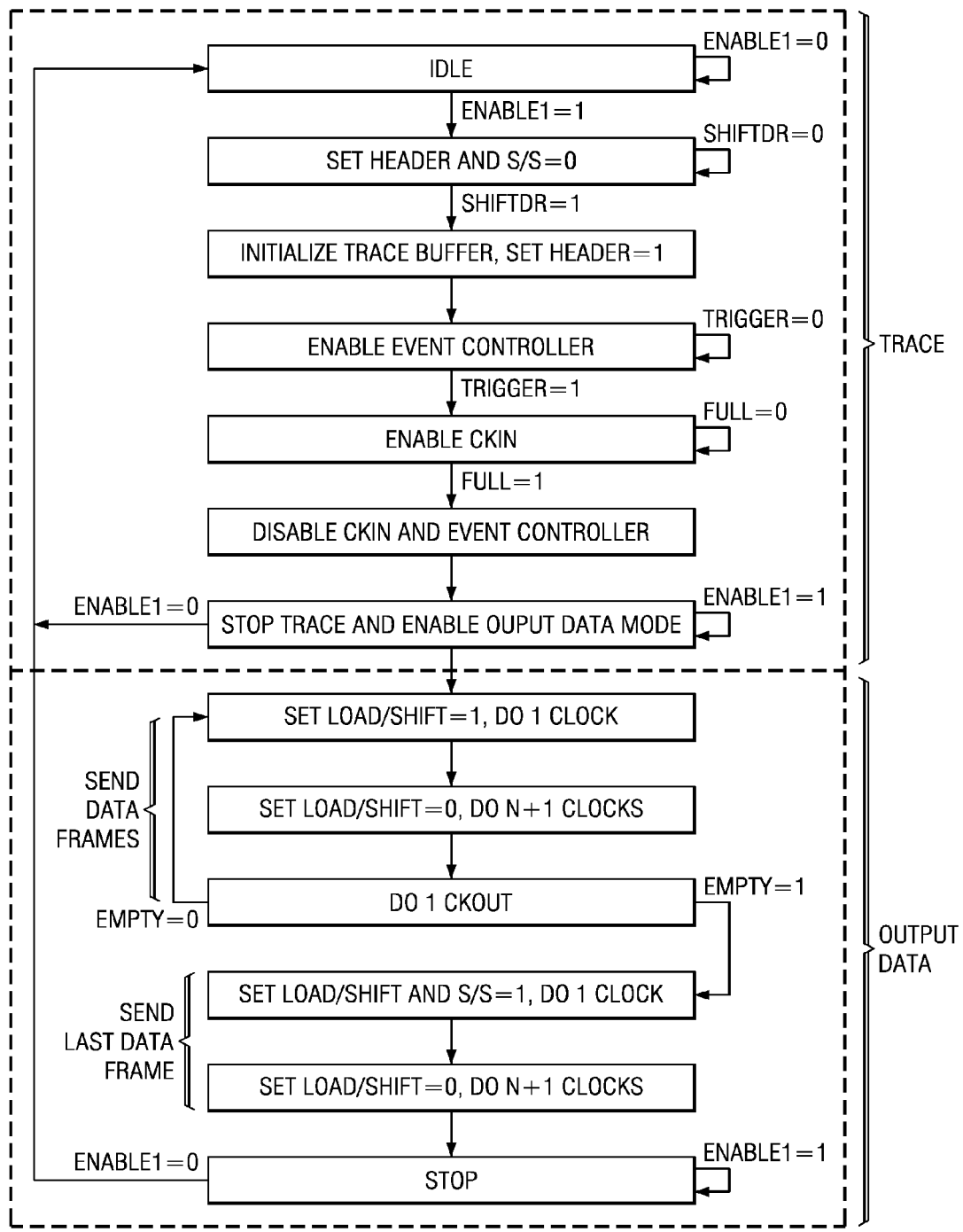
FIG. 60 illustrates the state diagram of a Trace & Output CMD 1 operation of FIG. 59.
Figure 61:
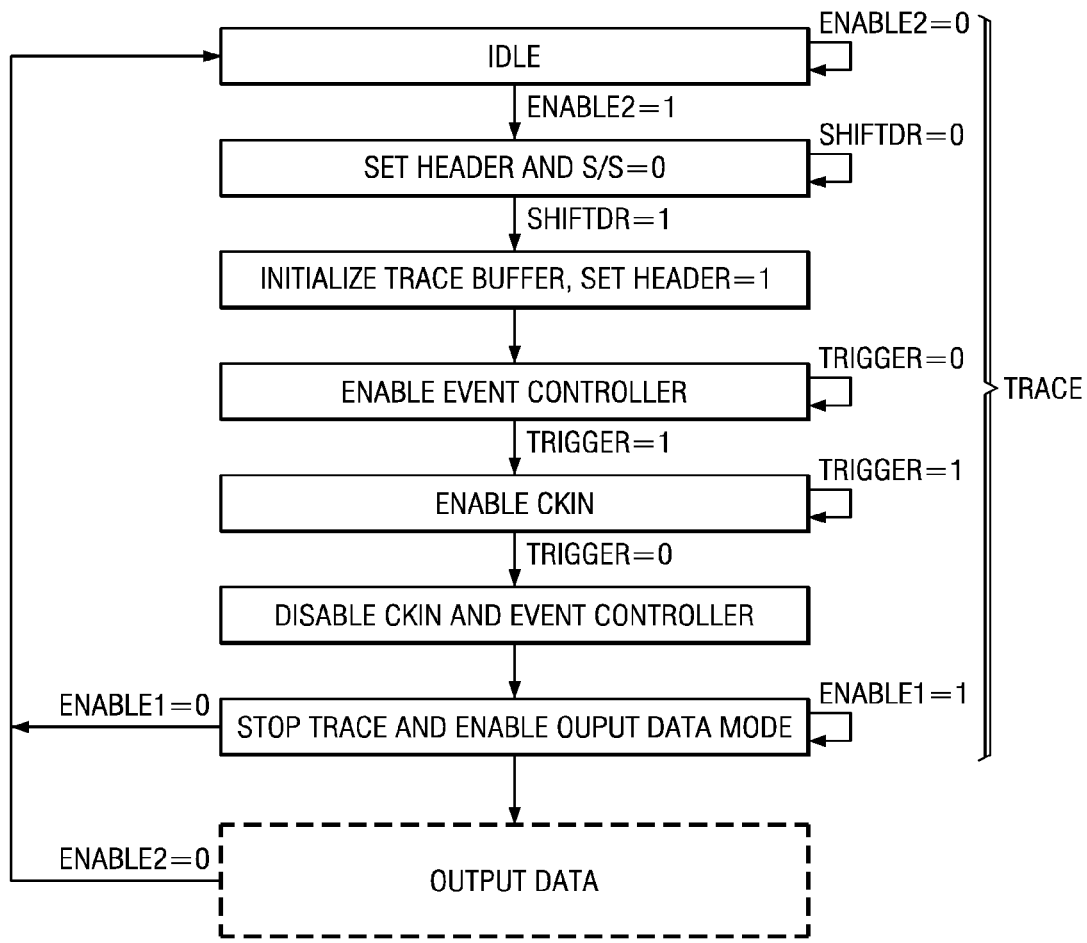
FIG. 61 illustrates the state diagram of a Trace & Output CMD 2 operation of FIG. 59.
Figure 62:
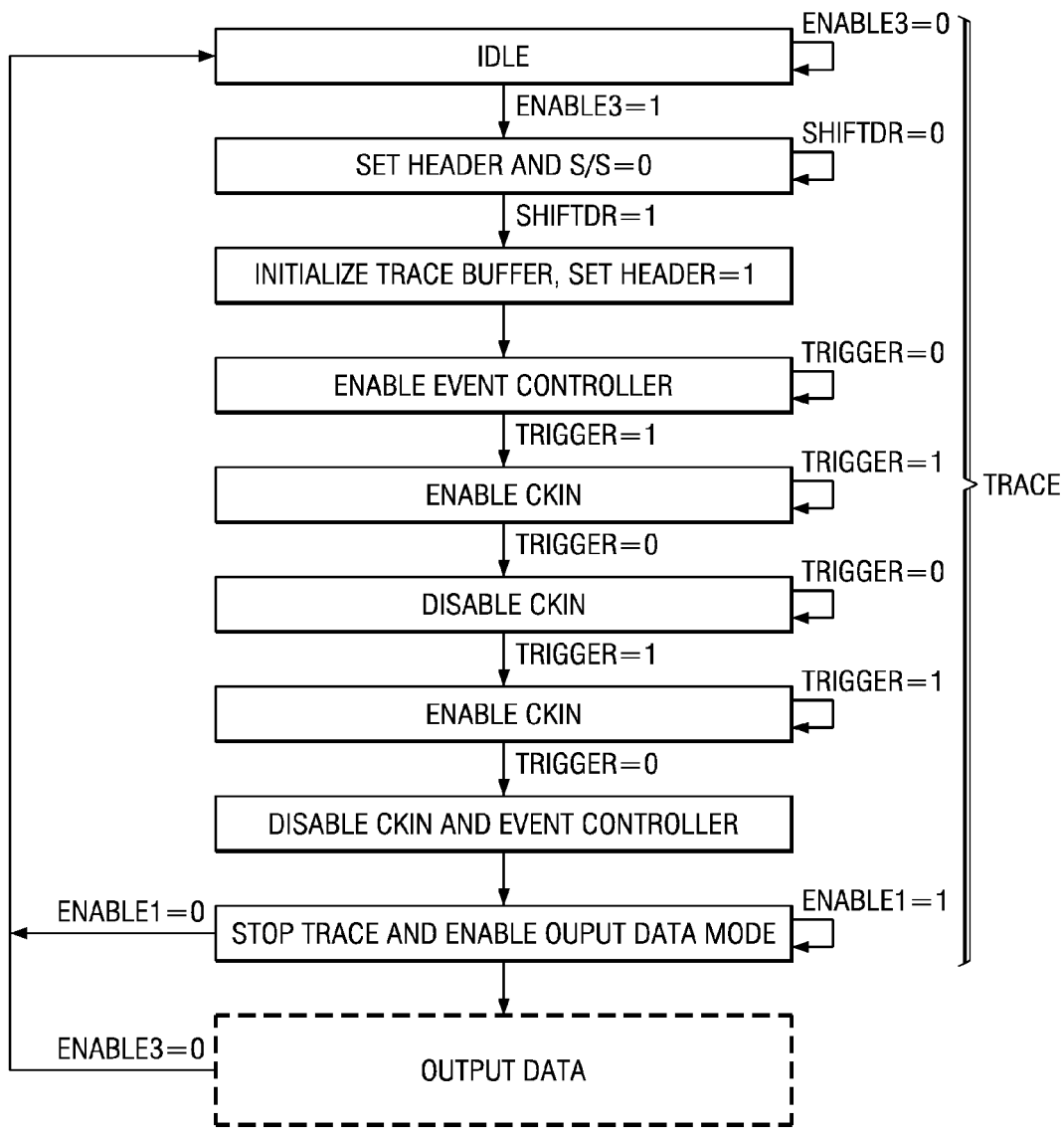
FIG. 62 illustrates the state diagram of a Trace & Output CMD 3 operation of FIG. 59.

The following FIGS. 60-62 detail the operation of the Trace & Output CMD 1-3 operations of FIG. 59. These Trace & Output CMD operations are setup and enabled by the Trace & Output timing diagrams shown in FIGS. 48-50.

FIG. 60 illustrates the state diagram of the Trace & Output CMD 1 operation 5906. As seen, the operation consists of a Trace section 6026 where data is acquired and an Output Data section 5924 where the acquired data is output to a controller 2902. Trace section 6026 is the first of three types of example Trace operations that can be performed in Trace section 5922 of FIG. 59. The data acquire operation is started in response to a Trigger input and is stopped in response to the dual port trace memory 5708 outputting the Full signal.

While the Enable1 signal is low, the Trace & Output CMD 1 operation will be in an Idle state 6002. When the Enable1 signal high the Trace & Output CMD 1 operation transitions from the Idle state 6002 to state 6004. In state 6004, the Set Header & S/S signals are set low. The Set Header signal presets the data frame Header bit 7202 of the trace output circuit 5710 of FIG. 72 to a logic one. The S/S signal sets the data input to the Header bit 7202 to a logic zero. When the ShiftDR signal goes high, the Trace & Output CMD 1 operation transitions to state 6006. When the ShiftDR signal goes high, the TROE signal of FIGS. 57-58 will be set high to enable TROUT buffer 5702. In state 6006 the Initialize signal is activated to initialize the dual port trace memory 5708 and the Set Header signal is set high to remove the preset condition on Header bit 7202. From state 6006 the Trace & Output CMD 1 operation transitions to state 6008. In state 6008, the ECENA signal is set high to enable the event command controller 5804 to start matching the data and/or address signals on buses 5720 and 5724 against the EMD data from the FIFO.

When the event command controller 5804 detects a match it outputs a logic high on the Trigger input to the trace command controller 5802. In response to the Trigger input going high, the Trace & Output CMD 1 operation transitions to state 6010. In state 6010 the Trace & Output CMD 1 operation enables the CKIN signal to the dual port trace memory 5708. In response to each CKIN signal, a data pattern from multiplexer 5706 is stored into the dual port trace memory 5708. The CKIN signal operates synchronous with the control signals on bus 5722. Thus the storage of data in dual port trace memory 5708 occurs synchronous to the functional operation of the data and address buses. As mentioned, the Select A/D signal to multiplexer 5706 determines whether the data output from the from multiplexer 5706 comes from the data bus 5724 or address bus 5720. When the dual port trace memory fills with data, it sets the Full signal high. In response to the Full signal being high, the Trace & Output CMD 1 operation transitions to state 6012. In state 6012, the Trace & CMD 1 operation disables the CKIN signal and sets the ECENA signal low to disable the event command controller 5804. From state 6012, the Trace & Output CMD 1 operation transitions to state 6013. Entry into state 6013 stops the Trace section 6026 of the Trace & Output CMD 1 operation. Also in state 6013 the previously mentioned enable signal 5906 is set to enable the Output Data section 5924. The Trace section will remain in state 6013 until the Enable1 signal goes low at the end of the Output Data section operation 5924.

While the Trace section remains in state 6013, the overall Trace & Output CMD 1 operation continues in state 6014 to start the Data Output section 5924 operation. In state 6014 the Load/Shift is set high and one Clock signal is generated. In FIG. 72 it is seen that when the Load/Shift signal is set high and a Clock signal occurs, the data frame Header bit 7202 is loaded with the low logic level on the S/S signal, via multiplexer 7204, and the Trace data pattern from the parallel output 5728 of dual port trace memory 5708 is loaded into a parallel input serial output (PISO) register 7206. In this and following examples it is assumed that the PISO has an N bit wide parallel input for receiving N bit wide Trace data patterns from the dual port trace memory 5708.

From state 6014 the Trace & Output CMD 1 operation transitions to state 6016. In state 6016 the Load/Shift signal is set low and N+1 Clocks are generated. As seen in FIG. 72, when the Load/Shift signal is low the Header bit 7202 is placed in series with the N bit wide PISO 7206. Thus N+1 Clocks are required to shift out a data frame consisting of the Header bit and the packet of N data bits in PISO 7206. When the shift out operation of state 6016 is completed, the Trace & Output CMD 1 operation will transition to state 6018. Entry into state 6018 will generate a CKOUT signal to cause the memory 5708 to output the next stored trace data pattern.

If the memory 5708 is not empty (Empty=0), the Trace & Output CMD 1 operation will transition from state 618 to state 6014 to repeat the step of loading of the Header bit 7202 and PISO 7206. From state 6014 the Trace & Output CMD 1 operation will transition to state 6016 to repeat the step of shifting out the Head bit and PISO. The transitions through states 6014, 6016, 6018 will continue until the memory 5708 sets the Empty signal high (Empty=1).

When the memory 5708 sets the Empty signal high (Empty=1), the Trace & Output CMD 1 operation transitions from state 6018 to state 6020 to start the last data frame output operation. As previously mentioned, the Empty signal is set when the memory 5708 contains only one more trace data pattern. In state 6020 the Load/Shift and the S/S signals are set high and one Clock signal is generated. With Load/Shift and S/S signals high, the Header bit 7202 of FIG. 72 is loaded with a logic one and the PISO is loaded with that last data pattern (M) in response to the Clock signal. As previously mentioned, a Header bit value of logic one indicates the stopping of data frame output operations. From state 6020 the Trace & Output CMD 1 operation transitions to state 6022. In state 6022 the Load/Shift signal is set low and N+1 Clocks are generated to shift out the last Header and PISO bits. From state 6022 the Trace & Output CMD 1 operation transitions to the Stop state 6024 to terminate the Trace & Output CMD 1 operation. The Trace & Output CMD 1 operation transitions back to the Idle state 6002 when the Enable1 signal is set low.

As shown in FIG. 72, the first through the next to last data frames are output on the TROUT output by transitioning through states 6014, 6016, and 6018, and the last data frame is output on the TROUT output by transitioning through state 6018, 6020, and 6022.

FIG. 61 illustrates the state diagram of the Trace & Output CMD 2 operation 5908. This operation uses an Output Data section 5924 identical to that previously described in FIG. 60. The Trace section 6126 of the Trace & Output CMD 2 operation is identical to the Trace section 6026 of the Trace & Output CMD 1 operation with the following two exceptions. First, the Enable2 signal from Decode & Enable Trace CMD state 5904 is used to enable the Trace & Output CMD 2 operation. Second, state 6110 polls for the Trigger signal to go low instead of polling for the Full signal to go high. As seen the Trace section 6126 enables the storing of data into the dual port trace memory in response to the Trigger signal going high and disables the storing of data into the dual port trace memory in response to the Trigger signal going low. Thus the Trace operation of FIG. 61 starts and stops in response to the Trigger signal, whereas the Trace operation of FIG. 60 starts in response to the Trigger signal and stops in response to the dual port trace memory filling with data.

FIG. 62 illustrates the state diagram of the Trace & Output CMD 3 operation 5908. This operation uses an Output Data section 5924 identical to that previously described in FIG. 60. This operation is identical to the operation of FIG. 61 up to state 6210. As seen, when this operation transitions from state 6210 to state 6212 the CKIN signal is disabled. When the Trigger input goes high again this operation transitions from state 6212 to state 6214 to re-enable the CKIN signal. When the Trigger input goes low again this operation transitions from state 6214 to states 6216 and 6218 to terminate the Trace section 6226 of this operation and enable the Output Data section 5924 as describe in FIG. 60.

As seen, the Trace section 6226 of this operation starts the storing of data into the dual port trace memory in state 6210 (CKIN enabled) in response to a first Trigger signal going high. The storing of data is paused in state 6212 (CKIN disabled) in response to the first Trigger signal going low. The storing of data is resumed in state 6214 (CKIN enabled) in response to a second Trigger signal going high. And the storing of data is stopped in state 6216 (CKIN disabled) in response to the second Trigger signal going low.

Command action 3624 of FIG. 36 is used during the above described Trace & Output CMD 1-3 operations. As previously described, action 3624 sets the Trace signal high, the JTAG signal low, and the Enable signal high. The Enable signal being set high allows the TROUT data frames that occur in the Output Data section 5924 of CMDs 1-3 to be output on the DIO signal of the ACP while the TSM is in the Shift-DR state (ShiftDR=1) as seen in FIG. 30. As seen, the Trace & Output CMD 1-3 operations of FIGS. 60-61 operate autonomously to acquire data and output the acquired data once they are enabled and the ShiftDR signal is set high.

Figure 63:
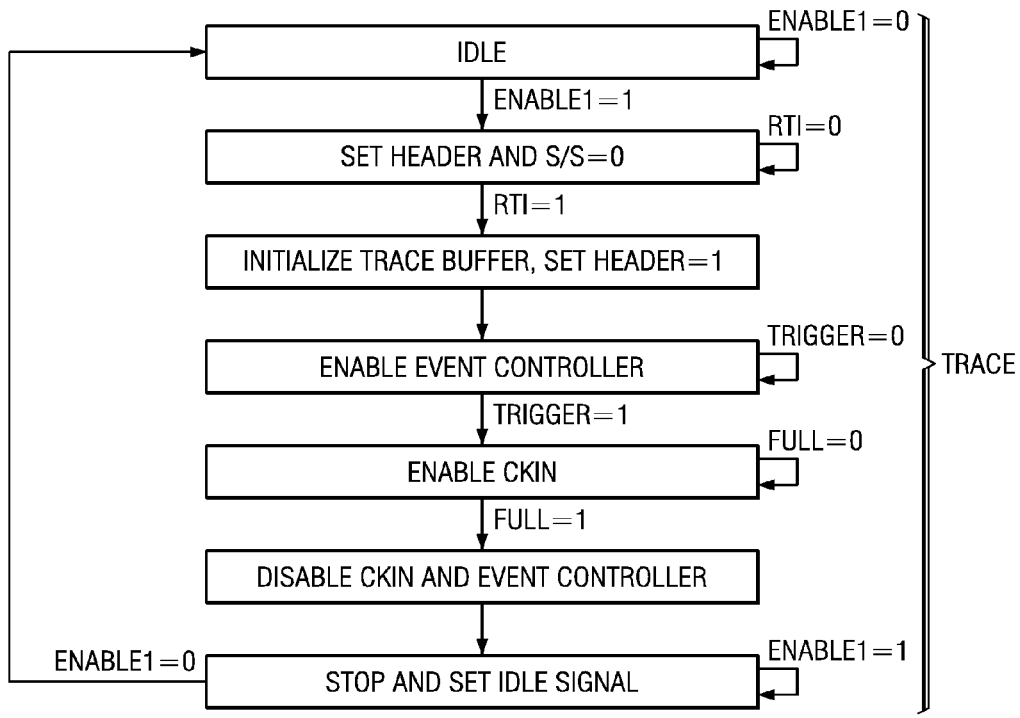
FIG. 63 illustrates the state diagram of a Trace Only CMD 1 operation of FIG. 59.
Figure 64:
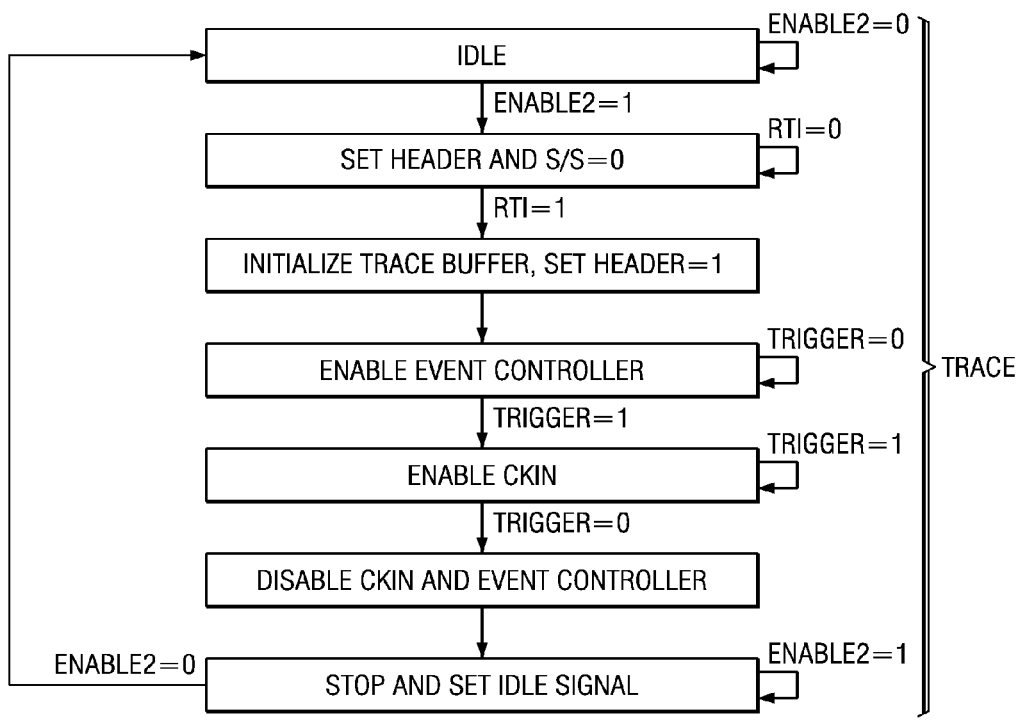
FIG. 64 illustrates the state diagram of a Trace Only CMD 2 operation of FIG. 59.
Figure 65:
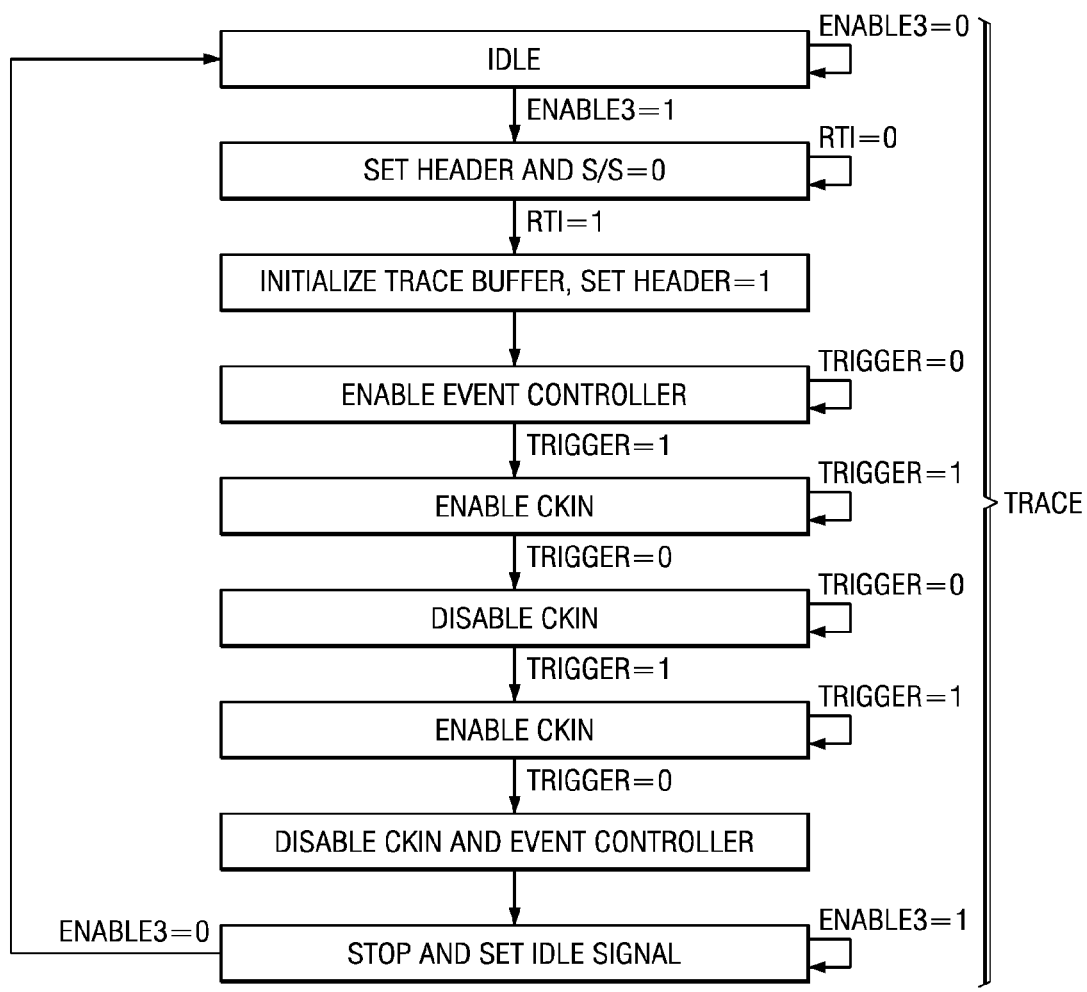
FIG. 65 illustrates the state diagram of a Trace Only CMD 3 operation of FIG. 59.

The following FIGS. 63-65 detail the operation of the Trace Only CMD 1-3 operations of FIG. 59. These Trace Only CMD operations are setup and enabled by the Trace Only timing diagrams shown in FIGS. 51-53. As previously mentioned, Trace Only operations are operations that acquire data, but do not output the acquired data.

FIG. 63 illustrates the state diagram of the Trace Only CMD 1 operation 5912. This operation is enabled by setting the Enable1 signal of FIG. 59. As can be seen, this operation is similar to the Trace & Output CMD 1 operation of FIG. 60. The differences between the operations of FIGS. 60 and 63 are; (1) the operation of FIG. 63 does not have an Output Data section 5924 as does the operation of FIG. 60, (2) state 6304 of the FIG. 63 operation transitions to state 6306 in response to the RTI signal whereas state 6004 of the FIG. 60 operation transitions to state 6006 in response to the ShiftDR signal, and (3) state 6312 of the FIG. 63 operation transitions to a Stop & Set Idle Signal state 6314 whereas state 6012 of the FIG. 60 operation transitions to the Stop Trace & Enable Output Data Mode state 6013. In state 6314, the previously described Idle signal 5714 of FIG. 57 is set to indicate to the controller that the Trace Only operation is completed. The operation of FIG. 63 transitions from state 6314 to the Idle state 6302 when the Enable1 signal goes low.

FIG. 64 illustrates the state diagram of the Trace Only CMD 2 operation 5914. This operation is enabled by setting the Enable2 signal of FIG. 59. As can be seen, this operation is similar to the Trace & Output CMD 2 operation of FIG. 61. The differences between the operations of FIGS. 61 and 64 are; (1) the operation of FIG. 64 does not have an Output Data section 5924 as does the operation of FIG. 61, (2) state 6404 of the FIG. 64 operation transitions to state 6406 in response to the RTI signal whereas state 6104 of the FIG. 61 operation transitions to state 6106 in response to the ShiftDR signal, and (3) state 6412 of the FIG. 64 operation transitions to a Stop & Set Idle Signal state 6414 whereas state 6112 of the FIG. 61 operation transitions to the Stop Trace & Enable Output Data Mode state 6113. The operation of FIG. 64 transitions from state 6414 to the Idle state 6402 when the Enable2 signal goes low.

FIG. 65 illustrates the state diagram of the Trace Only CMD 3 operation 5916. This operation is enabled by setting the Enable3 signal of FIG. 59. As can be seen, this operation is similar to the Trace & Output CMD 3 operation of FIG. 62. The differences between the operations of FIGS. 62 and 65 are; (1) the operation of FIG. 65 does not have an Output Data section 5924 as does the operation of FIG. 62, (2) state 6504 of the FIG. 65 operation transitions to state 6506 in response to the RTI signal whereas state 6204 of the FIG. 62 operation transitions to state 6206 in response to the ShiftDR signal, and (3) state 6516 of the FIG. 65 operation transitions to a Stop & Set Idle Signal state 6518 whereas state 6216 of the FIG. 62 operation transitions to the Stop Trace & Enable Output Data Mode state 6218. The operation of FIG. 65 transitions from 6518 to the Idle state 6502 when the Enable3 signal goes low.

Command action 3626 of FIG. 36 is used during the above described Trace Only CMD 1-3 operations. As previously described, action 3626 sets the Trace signal high, the JTAG signal low, and the Enable signal low. The Enable signal is set low since no data is output on DIO from TROUT during these operations. Also as seen in the Trace Only timing diagrams of FIGS. 51-53, the Trace Only operations are enabled while the TSM is in the RTI state (RTI=1). Thus during the Trace Only operations the TROUT buffer 5702 of FIG. 57 is disabled by the ShiftDR signal being low.

FIG. 66 details the Trace Output Only CMD operation 5918 of FIG. 59. The Trace Output Only CMD operation is setup and enabled by the Trace Output Only timing diagrams shown in FIGS. 54-56. As previously mentioned, the Trace Output Only operation is an operation that outputs data that has been acquired by a Trace Only operation 5912-5916. Also as previously mentioned in FIG. 58, the Bypass ShiftDR signal is set during this operation mode to allow the ShiftDR signal from the ACP 3004 to be directly input to the Trace Command Controller 5802. This bypass operation removes the need for a control signal from control bus 5722 to clock the ShiftDR signal to the controller 5802 via SYNC circuit 5812.

While the Enable signal 5920 of FIG. 59 is low, the Trace Output Only operation 5918 will be in Idle state 6602. When the Enable signal goes high the operation transitions to state 6604. In state 6604 the Set Header and S/S signals are set low. The low on the Set Header signal presets the Header bit 7202 of FIG. 72. When the ShiftDR signal goes high, the operation transitions to state 6606. In state 6606 the Set Header bit is set high to remove the preset condition on Header bit 7202. From state 6606 the operation transitions to state 6608. The operations that occur in states 6608 through 6618 of FIG. 66 are identical to the operations that occur in the previously described and corresponding states 6014 through 6024 of FIG. 60. Thus no further description is required for the Trace Output Only CMD operation of FIG. 66.

Command action 3624 of FIG. 36 is used during the above described Trace Output Only CMD operation 5918. As previously described, action 3624 sets the Trace signal high, the JTAG signal low, and the Enable signal high. The Enable signal being set high allows the data frame outputs on the TROUT signal to be output on the DIO signal of the ACP while the TSM is in the Shift-DR state (ShiftDR=1) as seen in FIG. 30.

Figure 67:
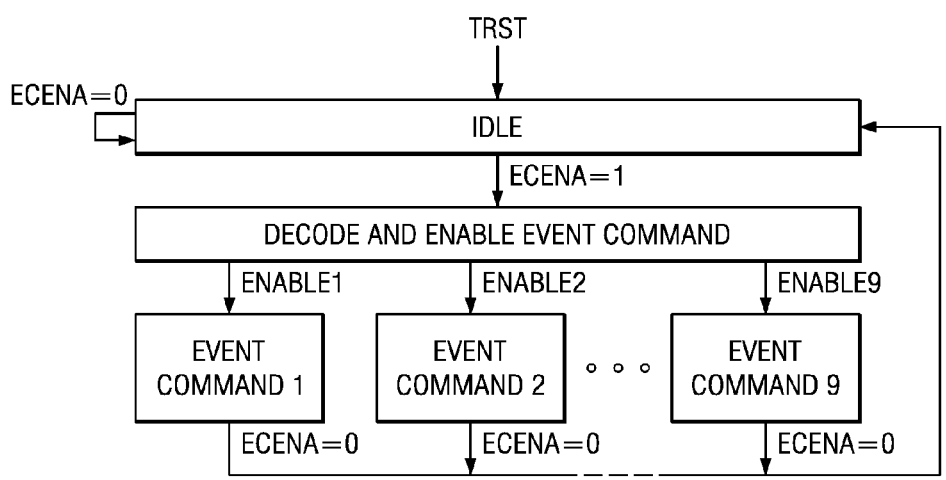
FIG. 67 illustrates the high level block diagram operation of the Event Command Controller of FIG. 58.

FIG. 67 illustrates the high level operation of the event command controller 5804. The operation of the event command controller is timed by control inputs from control bus 5722, enabling it to operate synchronous with functional transactions on the address and data buses 5720, 5724. When the ECENA input from trace command controller 5802 is low or in response to a TRST input, the event command controller will be in the Idle state 6702. When the ECENA input goes high, the event command controller will transition to the Decode & Enable Event CMD state 6704. As the name implies, the Decode & Enable Event CMD state decodes the Event CMD input from the decode circuit 5808 and enables one of nine types of example Event CMD operations 6706-6714. These Event CMD operations are used to detect matches between the EMD output from FIFO 5810 and signal patterns appearing on the data 5724 and address 5720 buses. In response to a match the Event CMD operations will input Trigger signals to the trace command controller 5802. The Trigger signals are used to control data acquisition operations in the trace command controller 5802. Each Event CMD operation operates synchronous to control signals input from the functional control bus 5722.

As seen in this example, each of the nine types of Event CMD Operations 6706-6714 are enabled by a correspondingly numbered Enable signal 1-9. When an Event CMD operation is enabled, it will begin and continue until it is completed. When an Event CMD operation completes, the Trace command controller 5802 will set the ECENA signal low to cause the event command controller 5802 to return to the Idle state 6702. In the Idle state, all Enable signal outputs from Decode & Enable Event CMD state 6704 are set low. The following FIGS. 68-71 detail the operation of the example Event CMD operations 6706-6714.

Figure 68:
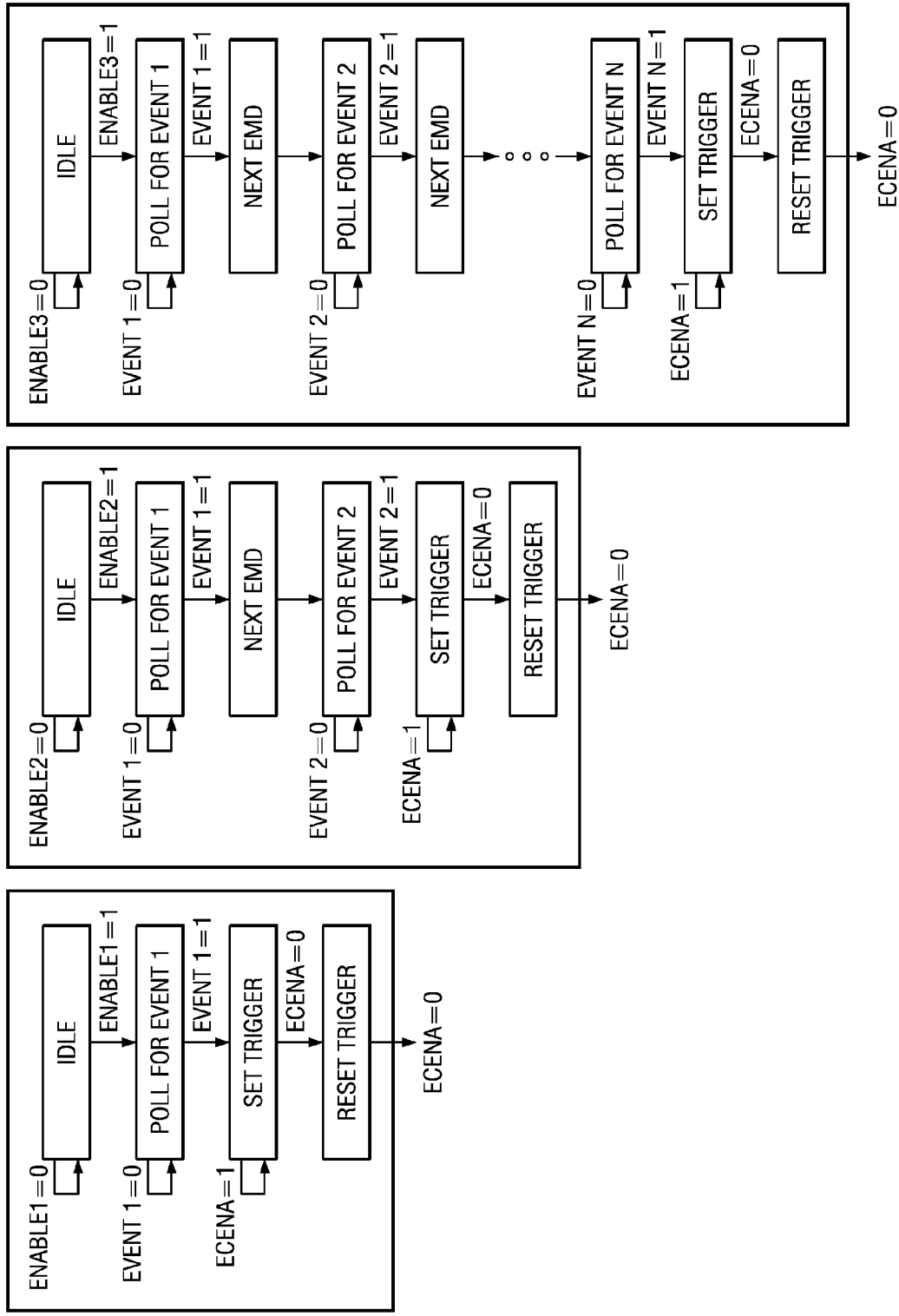
FIG. 68 illustrates the state diagrams of the Event CMD 1, Event CMD 2, and Event CMD 3 operations of FIG. 67.

FIG. 68 illustrates the Event CMD 1 operation 6706. The Event CMD 1 operation will be disabled in the Idle state whenever the Enable1 signal is low. The Event CMD 1 operation will transition from the Idle state to the Poll for Event 1 state when the Enable1 signal goes high.

The process of polling for an event in each of the following Event CMD operation examples 6706-6714 comprises the step of comparing the EMD pattern output from FIFO 5810 against the functional signals appearing on the address and/or data buses 5720, 5724. The EMD pattern contains an expected data bit for each functional data signal and an expected address bit for each functional address signal. Further, the EMD pattern contains a mask bit for each data signal and each address signal. The mask bits allow masking off compare operations on selected address and data signals so that only non-masked address and data signals are used in detecting an event.

Figure 71:
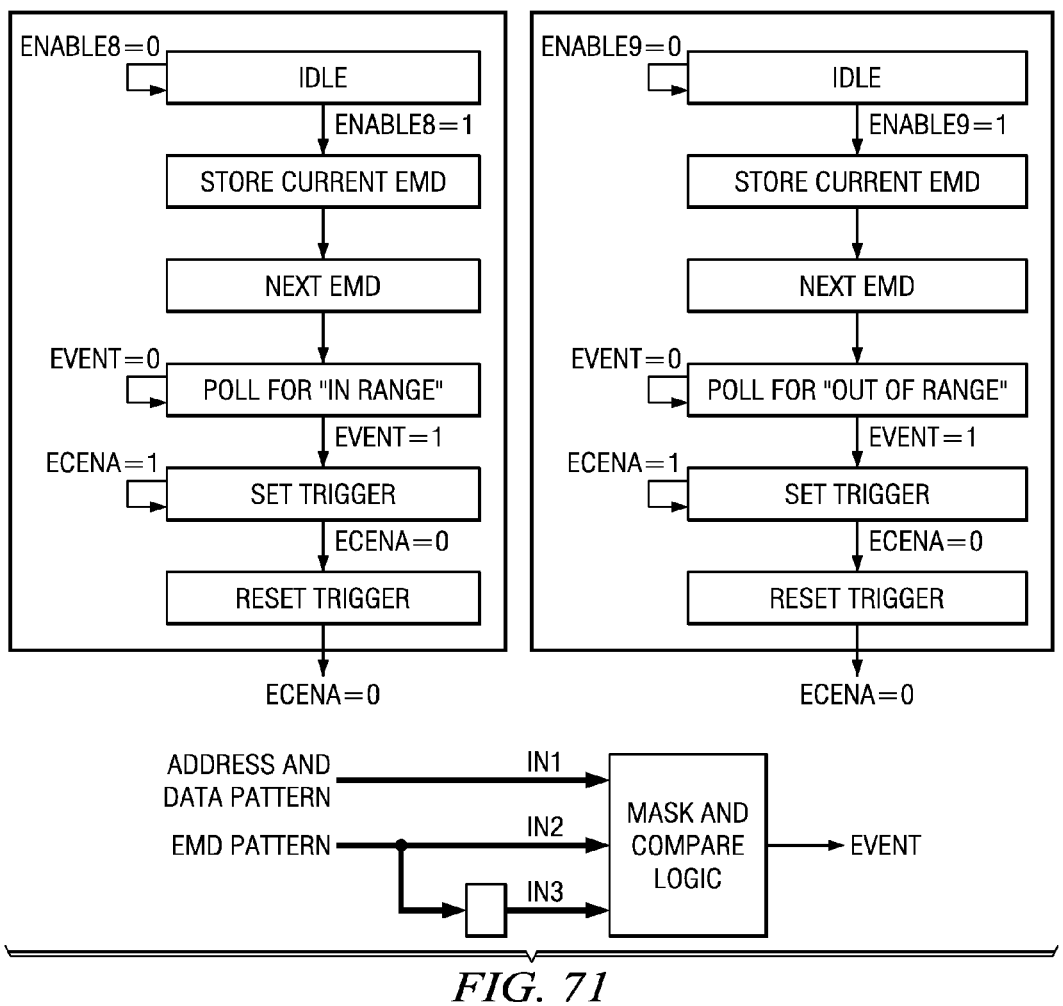
FIG. 71 illustrates the state diagrams of the Event CMD 8 and Event CMD 9 operations of FIG. 67.

An example event detection circuit 7102 is shown in FIG. 71. The event detection circuit exists in the event command controller 5804 of FIG. 58. The event detection circuit consists of mask & compare logic 7104 and register 7106. The mask & compare logic has a first input port (IN1) for receiving the functional address 5720 and data 5724 bus signals, a second input port (IN2) for receiving the EMD data output from FIFO 5810, a third input port (IN3) for receiving the output from the register 7106, and an Event output 7108 for indicating an event. The Event output signal in the described Event CMD operations 6706-6714 is referred to as Event 1, Event 2, . . . Event N. The mask & compare logic 7104 can be set to output a high logic level on the Event output in response to the following condition; (1) if the signal patterns on the IN1 and IN2 inputs are equal, (2) if the signal pattern on the IN1 input is logically greater than the signal pattern on the IN2 input, (3) if the signal pattern on the IN1 input is logically lesser than the signal pattern on the IN2 input, (4) if the signal pattern on the IN1 input is logically within a window (in range) formed by the signal pattern on the IN2 input and the signal pattern on the IN3 input, and (5) if the signal pattern on the IN1 input is logically outside a window (out of range) formed by the signal pattern on the IN2 input and the signal pattern on the IN3 input.

Returning to the Event CMD 1 operation 6706, it is seen that when the Event 1 signal goes high in response to an "=", ">", or "<" condition as described above, the Event CMD 1 operation transitions to the Set Trigger state and sets the Trigger input to the trace command controller high. In response to the Trigger input being high the trace command controller performs a data acquisition operation. Event CMD 1 operation 6706 can be used to control the Trace operations of FIGS. 60 and 63. When the Trace operations of FIGS. 60 and 63 are complete, the ECENA signal is set low which causes the Event CMD 1 operation to transition to the Reset Trigger state to set the Trigger low, then return to the Idle state 6702 of FIG. 67. In the following Event CMD operations 6707-6712 it is understood that the Event signals can be set high in response to an "=", ">", or "<" condition.

FIG. 68 illustrates the Event CMD 2 operation 6707. The Event CMD 2 operation will be disabled in the Idle state whenever the Enable2 signal is low. The Event CMD 2 operation will transition from the Idle state to the Poll for Event 1 state when the Enable2 signal goes high. When the Event 1 signal goes high, the Event CMD 2 operation transitions to the Next EMD state. In the Next EMD state, the event command controller 5804 outputs the NXTEMD signal to FIFO 5810. The NXTEMD signal causes the FIFO to output the next EMD pattern. From the Next EMD state the Event CMD 2 operation transitions to the Poll for Event 2 state. When the Event 2 signal goes high, the Event CMD 2 operation transitions to the Set Trigger state and sets the Trigger input to the trace command controller 5802 high. In response to the Trigger input being high the trace command controller performs a data acquisition operation. Event CMD 2 operation 6707 can be used to control the Trace operations of FIGS. 60 and 63. The difference between Event CMD 1 and 2 is that Event CMD 2 sets the Trigger following the detection of two events instead of one event. The ability to set the Trigger in response to a sequence of expected events improves the ability to trace software algorithm flows in a target device. When the Trace operations of FIGS. 60 and 63 are complete, the trace command controller sets the ECENA signal low which causes the Event CMD 2 operation to transition to the Reset Trigger state to set the Trigger low, then return to the Idle state 6702 of FIG. 67.

The Event CMD 3 operation 6708 of FIG. 68 is provided to illustrate that the event command controller can operate to set the Trigger signal in response to the detection of a sequence of N Events to start the Trace operations of FIGS. 60 and 63. In this and other multiple event detection examples, the FIFO 5810 must be able to store the number of EMD patterns used to detect a sequence of address and data signal pattern events.

Figure 69:
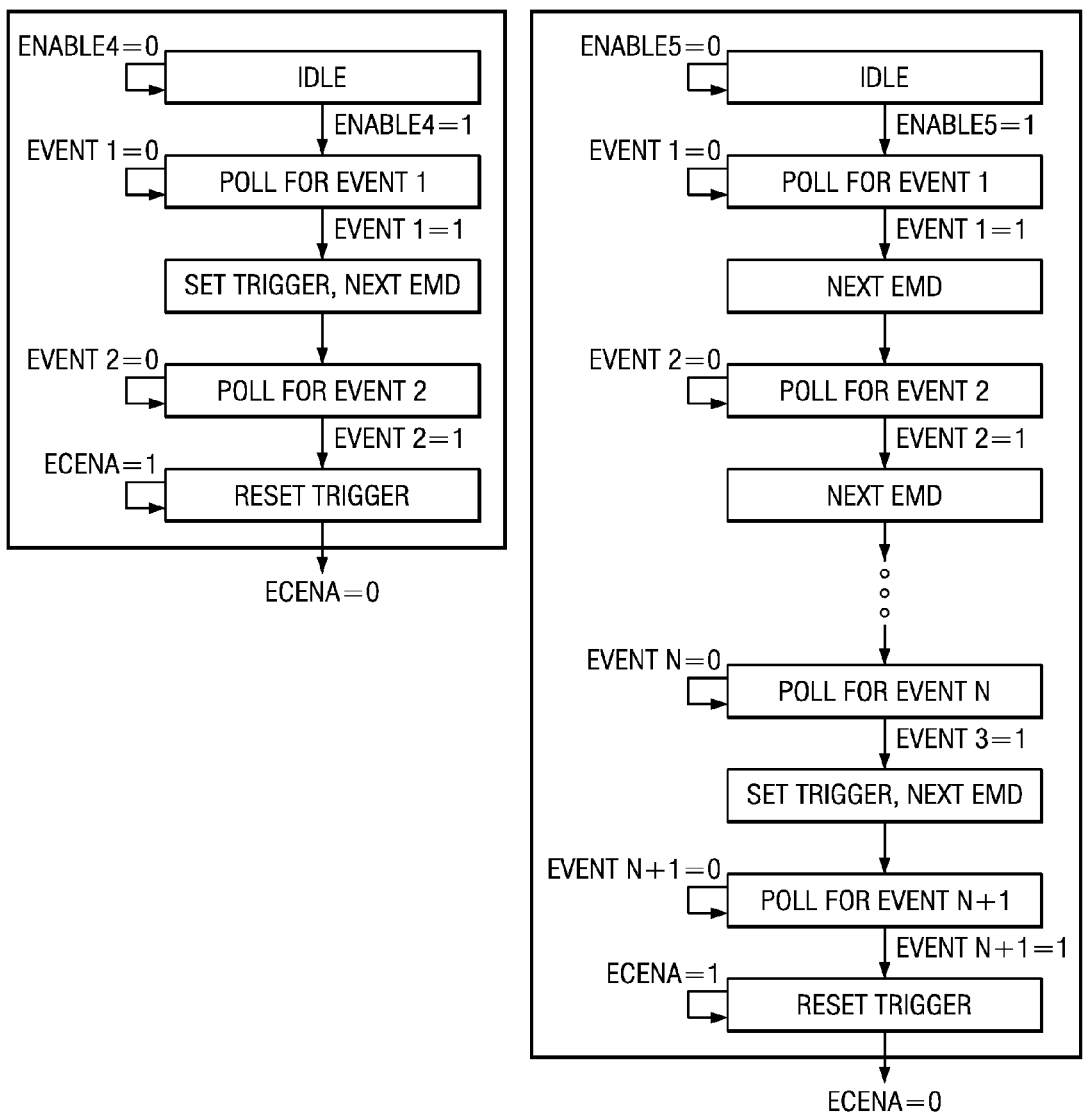
FIG. 69 illustrates the state diagrams of the Event CMD 4 and Event CMD 5 operations of FIG. 67.

FIG. 69 illustrates the Event CMD 4 operation 6709. The Event CMD 4 operation will be disabled in the Idle state whenever the Enable4 signal is low. The Event CMD 4 operation will transition from the Idle state to the Poll for Event 1 state when the Enable4 signal goes high. When the Event 1 signal goes high, the Event CMD 4 operation transitions to the Set Trigger, Next EMD state. In the Set Trigger, Next EMD state, the event command controller 5804 sets the Trigger output high to start a data acquisition operation in trace command controller 5802 and to output the NXTEMD signal to FIFO 5810 to get the next EMD pattern. From the Set Trigger, Next EMD state the Event CMD 4 operation transitions to the Poll for Event 2 state. When the Event 2 signal goes high, the Event CMD 4 operation transitions to the Reset Trigger state to set the Trigger low to stop the data acquisition operation. Event CMD 4 operation 6709 can be used to control the Trace operations of FIGS. 61 and 64. The ability to start and stop the acquisition of data in response to the Trigger signal provides improved control of how much data is acquired in the dual port trace memory 5708 during a trace operation. For example, the previously described Event CMDs 1-3 use the Trigger signal to start a Trace operation and the Full signal (Full=1) of the memory 5708 to stop the Trace operation. Thus Event CMD 1-3 operations always fill the memory 5708 whereas the Event CMD 4 operation does not have to fill the memory 5708. When the Trace operations of FIGS. 61 and 64 are complete, the trace command controller sets the ECENA signal low which causes the Event CMD 4 operation to transition to the Idle state 6702 of FIG. 67.

The Event CMD 5 operation 6710 of FIG. 69 is provided to illustrate that the event command controller can operate to start and stop the Trace operations of FIGS. 61 and 64 by setting and resetting the Trigger signal after detecting a sequence of N Events. Event CMD 5 6710 is therefore similar to Event CMD 4 6709 with the exception that Event CMD 5 delays the setting and resetting of the Trigger signal until after the sequence of N events have occurred.

Figure 70:
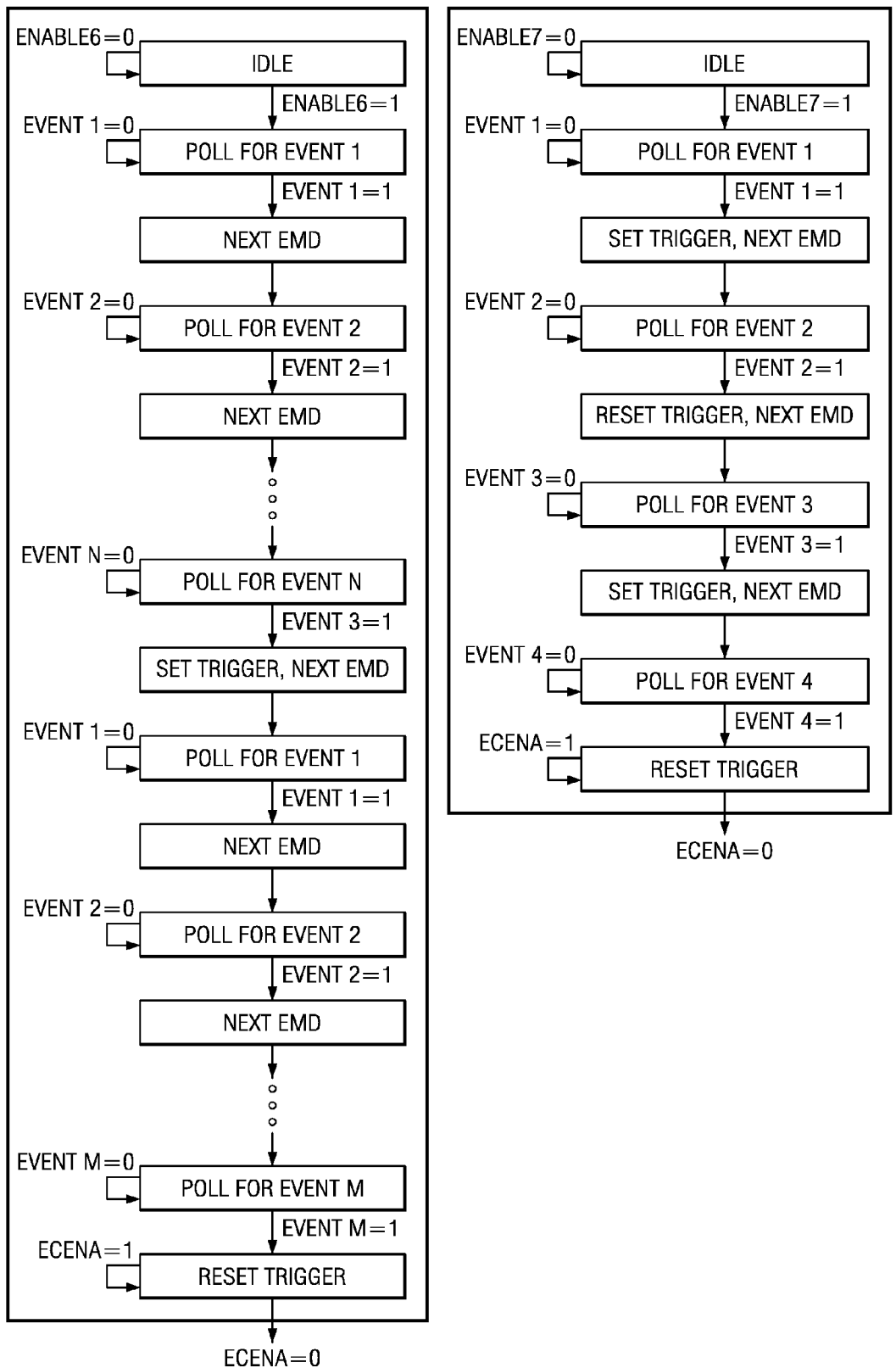
FIG. 70 illustrates the state diagrams of the Event CMD 6 and Event CMD 7 operations of FIG. 67.

The Event CMD 6 operation 6711 of FIG. 70 is provided to illustrate that the event command controller can operate to set the Trigger signal to start the Trace operations of FIGS. 61 and 64 following a sequence of N events, then reset the Trigger signal to stop the Trace operations of FIGS. 61 and 64 following a sequence of M events. Event CMD 6 6711 is therefore similar to Event CMD 5 6710 with the exception that Event CMD 6 delays the resetting of the Trigger signal until after the sequence of M events have occurred.

The Event CMD 7 operation 6712 of FIG. 70 is provided to illustrate that the event command controller can detect an Event 1 to set the Trigger signal to start a Trace operation, detect an Event 2 to reset the Trigger signal to pause a Trace operation, detect an Event 3 to set the Trigger to resume a Trace operation, and detect an Event 4 to reset the Trigger to stop the Trace operation. Event CMD 7 is used to control the Trace operations of FIGS. 62 and 65.

FIG. 71 illustrates the Event CMD 8 operation 6713 which uses the "in range" condition, described in regard to Event CMD 1 of FIG. 68, as the event that sets the Trigger signal. The Event CMD 8 operation will be disabled in the Idle state whenever the Enable8 signal is low. The Event CMD 8 operation will transition to the Store Current EMD state when the Enable8 signal goes high. In the Store Current EMD state, the current EMD output from FIFO 5810 is stored in register 7104 of event detection circuit 7102. The Event CMD 8 operation will transition from the Store Current EMD state to the Next EMD state. In the Next EMD state the event command controller 5804 outputs the NXTEMD signal to cause the FIFO to output the next EMD pattern. From the Next EMD state the Event CMD 8 operation transitions to the Poll for "In Range" state. In the Poll for "In Range" state the Event CMD 8 operation polls for the Event signal to go high. The Event signal will go high whenever a functional address and/or data pattern occurs on the IN1 input of mask & compare logic 7104 that is logically within a window bounded by the EMD pattern input on IN2 from FIFO 5810 and the EMD pattern input on IN2 from register 7106. When Event goes high the Event CMD 8 operation transitions to the Set Trigger state to set the Trigger signal high to start a Trace operation. When the Trace operation completes, the trace command controller 5802 sets the ECENA signal low, causing the Event CMD 8 operation to reset the Trigger signal and transition to the Idle state 6702 of FIG. 67. This operation is used to start a FIG. 60 or 63 Trace operation based on the detection of an address and/or data pattern that is logically inside the boundary of two EMD patterns.

FIG. 71 illustrates the Event CMD 9 operation 6714 which uses the "out of range" condition, described in regard to Event CMD 1 of FIG. 68, as the event that sets the Trigger signal. The Event CMD 9 operation will be disabled in the Idle state whenever the Enable8 signal is low. The Event CMD 9 operation will transition to the Store Current EMD state when the Enable9 signal goes high. In the Store Current EMD state, the current EMD output from FIFO 5810 is stored in register 7104 of event detection circuit 7102. The Event CMD 9 operation will transition from the Store Current EMD state to the Next EMD state. In the Next EMD state the event command controller 5804 outputs the NXTEMD signal to cause the FIFO to output the next EMD pattern. From the Next EMD state the Event CMD 9 operation transitions to the Poll for "Out of Range" state. In the Poll for "Out of Range" state the Event CMD 9 operation polls for the Event signal to go high. The Event signal will go high whenever a functional address and/or data pattern occurs on the IN1 input of mask & compare logic 7104 that is logically outside a window bounded by the EMD pattern input on IN2 from FIFO 5810 and the EMD pattern input on IN2 from register 7106. When Event goes high the Event CMD 9 operation transitions to the Set Trigger state to set the Trigger signal high to start a Trace operation. When the Trace operation completes, the trace command controller 5802 sets the ECENA signal low, causing the Event CMD 9 operation to reset the Trigger signal and transition to the Idle state 6702 of FIG. 67. This operation is used to start a FIG. 60 or 63 Trace operation based on the detection of an address and/or data pattern that is logically outside the boundary of two EMD patterns.

In the above described Event CMD 8 and 9 operations the patterns on the data bus 5724 may be masked off to allow the "in range" or "out of range" event detection to be based only on address bus 5720 patterns. Alternately, the patterns on the address bus 5720 may be masked off to allow the "in range" or "out of range" event detection to be based only on data bus 5720 patterns.

FIG. 72 illustrates an example of the Trace Output Circuit 5710 of FIG. 57. The circuit consists of a Header bit FF 7202, a PISO register 7206, and a multiplexer 7204. When the Load/Shift signal is high and a Clock occurs, the Header bit loads with the S/S signal logic level and the PISO loads the N bit data pattern output from dual port trace memory 5708. When the Load/Shift is low and Clocks occur, the data in the Header bit and PISO are shifted out onto the TROUT output. The Header bit and the N PISO bits form a data frame. The circuit operates to repeatedly load and shift out data frames. The Clock signal is timed by the TRCK signal which in turn is timed by the CLK 310 signal of the ACP 3004.

As seen in FIG. 72, during a trace output operation a first data frame is output on TROUT. Subsequent data frames are output following the first data frame. The Header bits in the first and next to last data frames are low. The trace output operation is complete when the last data frame is output on TROUT. The Header bit of the last data frame will be set high as a signal to indicate that the last data frame is being output on TROUT. A controller 2902 adapted to receive the data frames will detect the Header bit of the last data frame being high and stop receiving data frames after it has received the last data frame. The data frame outputs on TROUT occur in response to the previously described Trace & Output CMD operations of FIGS. 60-62 and the Trace Output Only CMD operation of FIG. 66.

Figure 73:
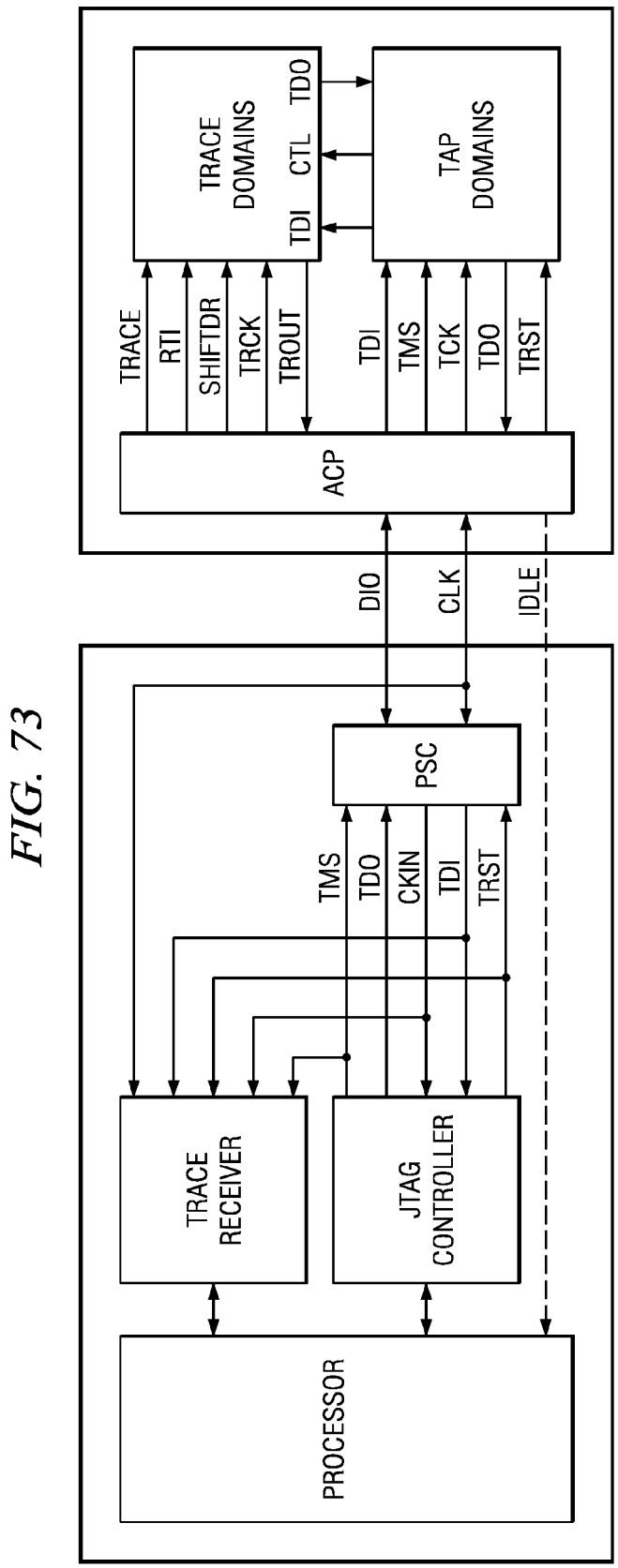
FIG. 73 illustrates the Address and Command Port (ACP) of a target device coupled to a JTAG controller that has been adapted for receiving trace data frame outputs from the Trace Domain of the target device.

FIG. 73 illustrates a target device 7301 comprising the ACP 3004, Tap domains 3006, and Trace domains 3008 of the present disclosure being interfaced to a controller 7302 adapted for receiving trace output data frames according to the present disclosure. The controller 7302 comprises the previously described PSC circuit 302 and JTAG controller circuit 100. Additionally, the controller 7302 comprises a Trace Receiver 7304 and a processor 7310. The processor controls the operation of the JTAG controller 100 via bus 7308 and the Trace Receiver 7304 via bus 7306. The processor 7310 is typically, but not necessarily, a personal computer (PC) having address, data, control, interrupt, and I/O ports for interfacing with the JTAG controller 100 and Trace Receiver 7304. The JTAG controller 100, Trace Receiver 7304, and PSC 302 circuits are typically, but not necessarily, located on a printed circuit card inserted into one of the PC's card slots. The JTAG controller 100, Trace Receiver 7304, and PSC 302 circuits could be realized on a single integrated circuit or on multiple integrated circuits. If desired, the processor 7310, JTAG controller 100, Trace Receiver 7304, and PSC 302 could all be realized on a single integrated circuit.

The Trace Receiver 7304 is interfaced to the TMS and TRST signal outputs from the JTAG controller 100, to the TDI and CKIN outputs from the PSC 302, and to the CLK signal 310. Controller 7302 can communicate to the target device via the DIO 308 and CLK 310 signals to address and command the ACP 3004 to perform JTAG or Trace operations as previously described.

When a Trace output operation is to be performed, the processor 7310 enables the Trace Receiver 7304 for inputting data frames and enables a Trace domain 3008 to output data frames. When the data frame output process starts, Trace domain 3008 begins outputting data frames on its TROUT output to the DIO 308 signal of the ACP 3004. The data frames are input to the Trace Receiver 7304 via the TDI output of PSC circuit 302. The CLK signal 310 times the data frame output operation from the Trace Domain 3008 to the Trace Receiver 7304. As previously described, the data frame output operation occurs in the Shift-DR state and continues until a logic high input occurs on the data frame Header bit 7202.

Figure 74:
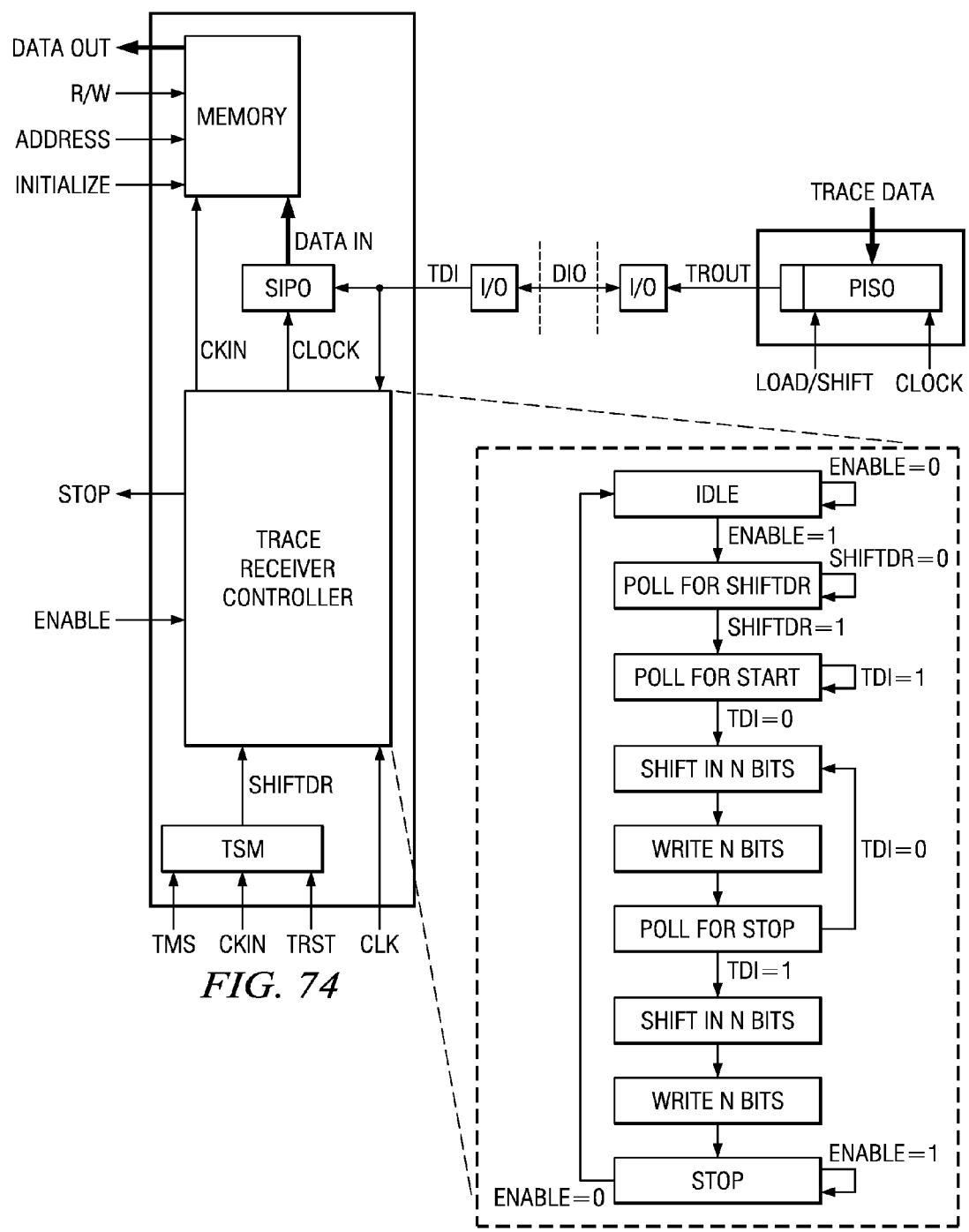
FIG. 74 illustrates an example design of the Trace Receiver of FIG. 73.

FIG. 74 illustrates a more detail example of the Trace Receiver 7304 of controller 7302 of FIG. 73 coupled to the Trace Output circuit 5710 of the target circuit 7301 via I/O circuits 504 and 710 and the DIO signal 308. As seen, the Trace Output circuit 5710 is simplified to only show the Header bit 7202 and PISO 7206. The Trace Receiver 7304 comprises a Trace Receiver controller 7402, a TAP State Machine (TSM) 7404, a Serial Input Parallel Output (SIPO) register 7406, and a memory 7408.

The TSM 7404 inputs the TMS, CKIN, and TRST signals and outputs a ShiftDR signal to the Trace Receiver Controller 7402. The TSM 7404 tracks the states of the JTAG controller 100 and sets the ShiftDR signal high when the JTAG controller 100 is in the Shift-DR state.

The Trace Receiver controller 7402 inputs the ShiftDR signal from the TSM, the TDI signal from the I/O circuit 504 of PSC 302, and an Enable signal from the processor 7310 via bus 7306. The Trace Receiver controller 7402 outputs a CKIN signal to memory 7408, a Clock signal to SIPO 7406, and a Stop signal on bus 7306 to processor 7310.

The SIPO 7406 inputs the Clock signal from Trace Receiver controller 7402 and the TDI signal from I/O circuit 504. The SIPO 7406 outputs a parallel data bus to the Data In bus of Memory 7408.

Memory 7408 inputs the parallel data output from SIPO 7406, the CKIN signal from Trace Receiver controller 7402, a Read/Write (R/W) control signal from processor 7310 via bus 7306, an Address bus from processor 7310 via bus 7306, and an Initialize signal from processor 7310 via bus 7306. Memory 7408 outputs parallel data on a Data Out bus to processor 7310 via bus 7306.

When the R/W control input to the Memory 7408 is set for Write operations, parallel data from the SIPO 7406 is written into the Memory each time a CKIN signal is input to the Memory from the Trace Receiver Controller 7402. When the R/W control input to the Memory 7408 is set for Read operations, the processor reads data from the Memory via the Data Out bus.

Figure 75:
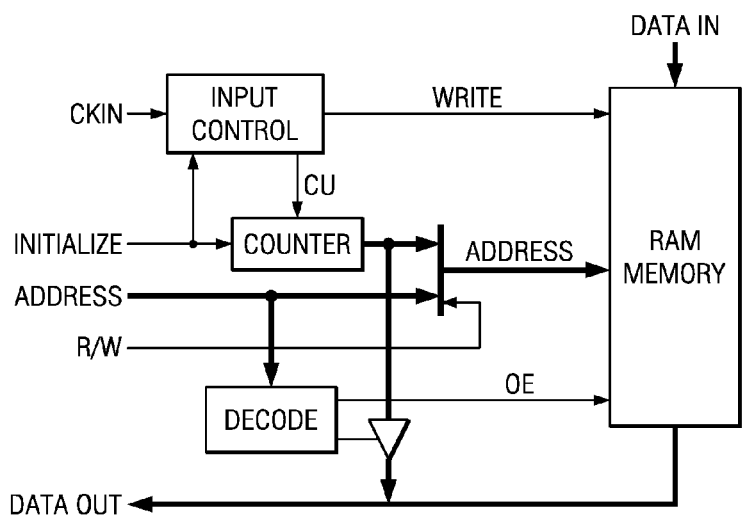
FIG. 75 illustrates an example design of the Memory within the Trace Receiver of FIG. 74.

FIG. 75 illustrates an example design for Memory 7408. Memory 7408 comprises a RAM memory 7502, an Input Control circuit 7504, an address Counter 7506, an address multiplexer 7522, an address Decode circuit 7508, and 3-state output buffers 7510.

In Input Control circuit 7504 inputs the CKIN input from Trace Receiver Controller 7402 and the Initialize signal from processor 7310. The Input Control circuit outputs a Write signal to RAM memory 7502, and a count up (CU) signal to address Counter 7506.

The address Counter 7506 inputs the Initialize signal from the processor 7310 and the count up (CU) signal from Input Control circuit 7504, and outputs an address on address bus 7513 to Address Multiplexer 7522.

The Address Multiplexer 7522 inputs the address bus from counter 7506 and the address bus and R/W signal from processor 7310. The Address Multiplexer 7522 outputs one of the two address input buses to the RAM memory 7502 via address bus 7516, in response to the R/W signal.

The Decode circuit 7508 inputs the address bus from the processor and outputs output enable signals 7518-7520 to the RAM memory and output buffers 7510 respectively.

The output buffers 7510 input the Address bus 7512 from Counter 7506 and the output enable signal 7520 from Decode circuit 7508. The output buffers 7510 output the Counter address to processor 7310 on the Data Out bus.

The RAM memory inputs the Data In bus from SIPO 7406, the Write signal from the Input Control circuit 7504, the Address bus output from Multiplexer 7522, and the output enable (OE) signal from Decode circuit 7508. The RAM memory outputs data to the processor 7310 on the Data Out bus.

The RAM data write operation of the memory is similar to that previously described in FIG. 57A. Prior to performing a data write operation, the processor activates the Initialize signal on bus 7306 to reset the address Counter 7506 to a address of zero, and sets the R/W signal such that the Counter address is input to the RAM memory 7502 address. Following this setup procedure, the CKIN signal from Trace Receiver Controller 7402 is enabled. During each CKIN signal the Input Control circuit 7504 outputs a Write signal RAM Memory 7502 to write the data on the Data In bus into the addressed memory location, then the Input Control circuit outputs a count up (CD) signal to the Counter 7506 to increment the RAM address. This process of activating the Write signal followed by activating the CU signal is repeated for each subsequent CKIN input. When the CKIN input is disabled the data write operation is complete and the RAM will have been loaded with data from the zero address location to some upper address location. When the data write operation stops, the Counter will contain the upper address location written plus one due to the last CU signal output from Input Control circuit 7504.

During the RAM data read operation the processor 7310 sets the R/W signal to select the processors address bus 7514 to be input to the RAM memory via multiplexer 7522. Following the setting of the R/W signal, the processor inputs an address that causes the Decoder to enable the output buffers 7510 so that the address output from counter 7506 may be read by the processor on the Data Out bus. By first reading the counter's address, the processor knows how many RAM memory locations were written too. The processor knows that the address count read exceeds the RAM memory locations written to by one, due to the last CU signal, so the processor decrements the count value read by one. After determining the correct number of address locations written to, the processor starts addressing and reading the data from the RAM memory starting with address location zero on up to the last location written to. After the data has been read, the processor can process the data to analyze the functional operation of the Target device and software.

In FIG. 74, the operation of the Trace Receiver controller 7402 during a data frame input operation is shown in diagram 7410. To facilitate the description, it is assumed that the processor 7310 has set the Enable input to the Trace Receiver controller 7402 high and that the Trace Output circuit 5710 of the target circuit has been set up to output trace data frames. Also the processor has prepared Memory 7408 for a write operation, as described previously in regard to FIG. 75. As seen in the operation diagram 7410, with the Enable signal high, the Trace Receiver controller 7402 transitions from the Idle state 7412 to the "Poll for ShiftDR" state 7414. In the "Poll for ShiftDR" state, the Trace Receiver controller polls for the ShiftDR signal to go high, which indicates the TSM 7404 of controller 7302 is in the Shift-DR state. As mentioned previously in regard to FIGS. 49 and 55, trace data frame output operations from a Trace Domain are enabled in the Shift-DR state.

When the ShiftDR signal goes high, the Trace Receiver controller transitions to the "Poll for Start" state 7416. In the "Poll for Start" state the Trace Receiver controller waits for the TDI input to go low, which signals the arrival of the Header bit 7202 of the first data frame. Prior to the start of the first data frame output from the Trace Domain, the TDI input will be set high by the pull up element 1114 of I/O circuit 710 of FIG. 11A. When TDI goes low the Trace Receiver controller transitions to the "Shift in N Bits" state 7418. In the "Shift in N Bits" state, the Trace Receiver controller 7402 enables N Clock signal inputs to SIPO 7406 to shift in the N data bits of the first frame. When enabled, the Clock signal is driven by the CLK input 310. From the "Shift in N Bits" state the Trace Receiver controller transitions to the "Write N Bits" state 7420. In the "Write N Bits" state the Trace Receiver controller outputs a CKIN signal to Memory 7408 to write the N bit pattern shifted into SIPO 7406 to Memory 7408. As the write operation is taking place to memory 7408, a Load operation is taking place in Header Bit 7202 and PISO 7206 of Trace Output circuit 5710, in preparation for shifting out the next data frame.

From the "Write N Bits" state, the Trace Receiver controller transitions to the "Poll for Stop" state 7422. In the "Poll for Stop" state the Trace Receiver controller polls the logic level of TDI which is driven by the logic level of the Header bit 7202 of the next data frame. If TDI is low, the Trace Receiver controller transitions back to the "Shift in N Bits" state 7418 to input the N data bits of the second data frame. The Trace Receiver controller loops through states 7418-7422 as long as the TDI input is polled low in the "Poll for Stop" state 7422. When the TDI input is polled high in the "Poll for Stop" state, indicating the Header bit 7202 is high and the last data frame is being sent, the Trace Receiver controller transitions to the "Shift in N Bits" state 7424 to shift that last N data bits into SIPO 7406. From the "Shift in N Bits" state 7424, the Trace Receiver controller transitions to the "Write N Bits" state 7426 to write the last N bits shifted into SIPO 7406 to Memory 7408. From the "Write N Bits" state 7426, the Trace Receiver controller transitions to the Stop state 7428. In the Stop state, the Trace Receiver controller sets the Stop signal on processor bus 7306 high to indicate to the processor that the Trace data frame output operation has been completed. In response to the Stop signal, the processor sets the Enable signal on bus 7306 low, which causes the Trace Receiver controller to transition to the Idle state 7412.

After the Trace data frame output operation is completed, the processor can read the data stored in memory 7408, via the memory's Data Out bus, by following the data read procedure described previously in regard to FIG. 75. The RAM memory 7502 portion of Memory 7408 should be designed sufficiently large enough to store all the data from the RAM memory 5730 portion of any memory 5708.

Figure 76:
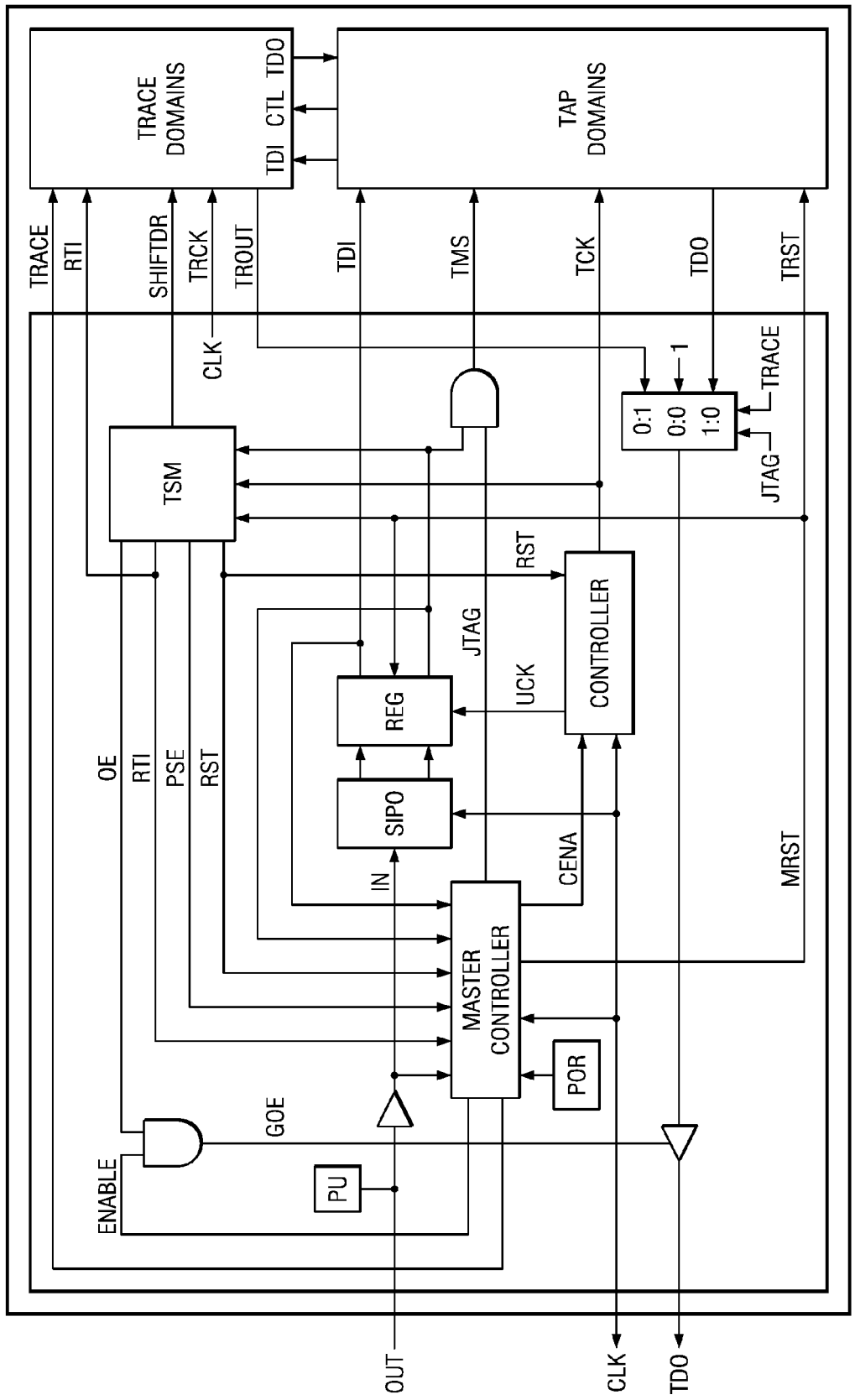
FIG. 76 illustrates an Address and Command Port (ACP) that uses a three signal interface as opposed to the two signal interface of FIG. 30

FIG. 76 is provided to indicate that the ACP 3004 of FIG. 30 can be adapted to use separate input (OUT) 7604 and output (TDO) 7606 signals instead of the single DIO signal 308 if desired. In this example the I/O circuit 710 of FIG. 30 has been removed. The input buffer 1308 of FIG. 13A is connected directly to the OUT input 7604 and the pull up element 1114 of FIG. 11A is connected to the OUT input 7604. The 3-state output buffer 1110 of FIG. 11A is connected between the output of multiplexer 3018 of FIG. 30 and the TDO output 7606. The output of gate 3014 is connected to the enable input of output buffer 1110. The overall operation of the modified ACP 3004 of FIG. 76 is the same as previously described.

Figure 77:
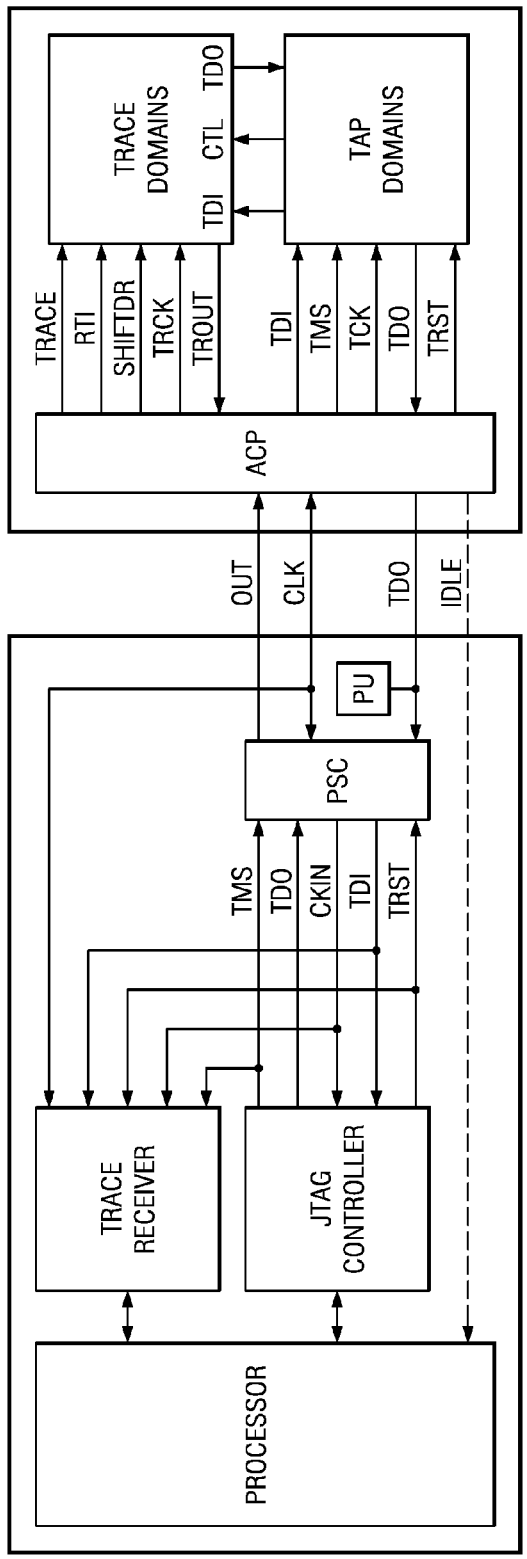
FIG. 77 illustrates the three signal interface Address and Command Port (ACP) of FIG. 76 coupled to a JTAG controller that has been adapted for communication with the three signal interface.

FIG. 77 is provided to indicate that the modified ACP 3004 of FIG. 76 can be interfaced to a JTAG controller 7302 that has been modified to interface with the three signal ACP of FIG. 76. The modification of the JTAG controller 7302 includes substituting PSC 2102 of FIGS. 21A and 23A for PSC 302 of FIG. 73, and placing a pull up element 7702 on the TDO input 7606. The pull up element 7702 insures that the TDO input 7606 will be pulled high at the beginning of the trace data frame output operation, i.e. prior to the "Poll for Start" state 7416 of FIG. 74.

It should be clear that the CLK signal 310 can be supplied by a clock source within the JTAG controller as seen in FIG. 16, by a clock source within the Target device as seen in FIG. 17, or by a clock source external of the JTAG controller or Target device as seen in FIG. 20. In any of these cases, the Target device will have a two signal interface if the DIO 308 signal is used, or a three signal interface if DIO 308 is replaced by separate OUT 7604 and TDO 7606 signals as seen in FIG. 76.

Further, it should be clear that the CLK signal 310 can be supplied by a functionally required clock input to the Target circuit as seen in FIG. 18, or by a functionally required clock output from the Target circuit as seen in FIG. 19. In either of these cases, the Target device will have a one signal interface if the DIO 308 signal is used or a two signal interface if DIO 308 is replaced by separate OUT 7604 and TDO 7606 signals as seen in FIG. 76.

Figure 78:
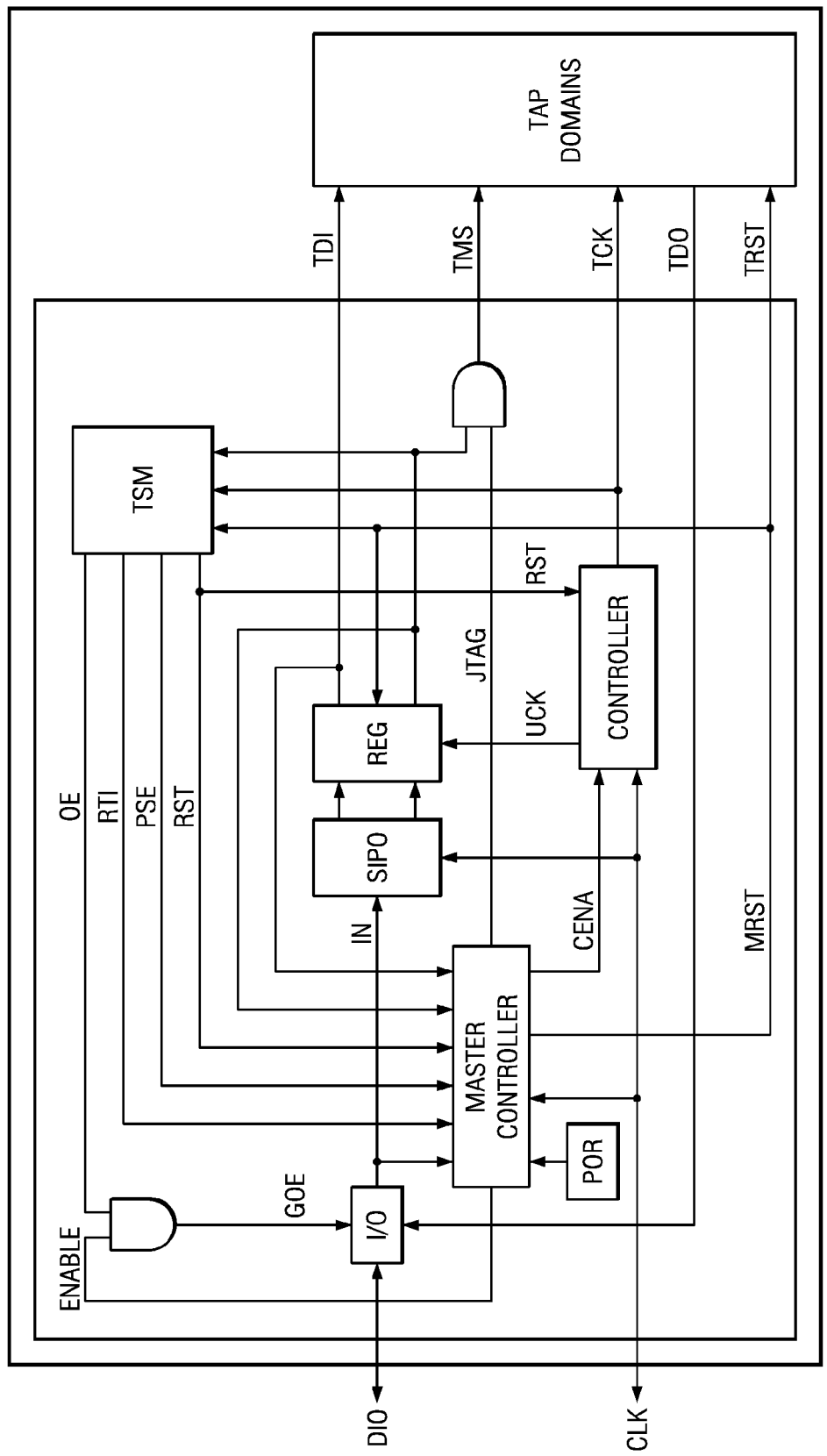
FIG. 78 illustrates an Addressable JTAG Port (AJP) of the present disclosure. The AJP is used in place of the ACP of FIG. 30 when the target device does not include Trace Domains.

In some instances, Trace domains 3008 may not be used in the present disclosure. If they are not used, the ACP 3004 of FIG. 30 may be simplified, as shown in FIG. 78, into an Addressable JTAG Port (AJP) 7804 within a target device 7802. The differences between the ACP 3004 of FIG. 30 and the AJP 7804 of FIG. 78 is the deletion of the Trace Domains 3008 of FIG. 30 and associated signal interconnects, the deletion of the multiplexer 3018 of FIG. 30, the connection of the TDO output from TAP Domains 3006 to the I/O circuit 710 of FIG. 78, and minor modifications to the Master Controller 7806 and TSM 7808 of FIG. 78.

Figure 79:
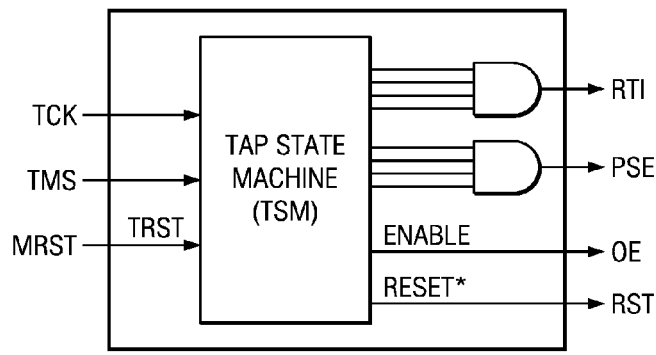
FIG. 79 illustrates the Tap State Machine (TSM) used in the AJP of FIG. 78.

FIG. 79 shows the modified TSM 7808 of FIG. 78. The modification is simply the deletion of the ShiftDR gate 3202 of FIG. 32. Without the Trace Domains 3008 the ShiftDR signal is not necessary.

Figure 80:
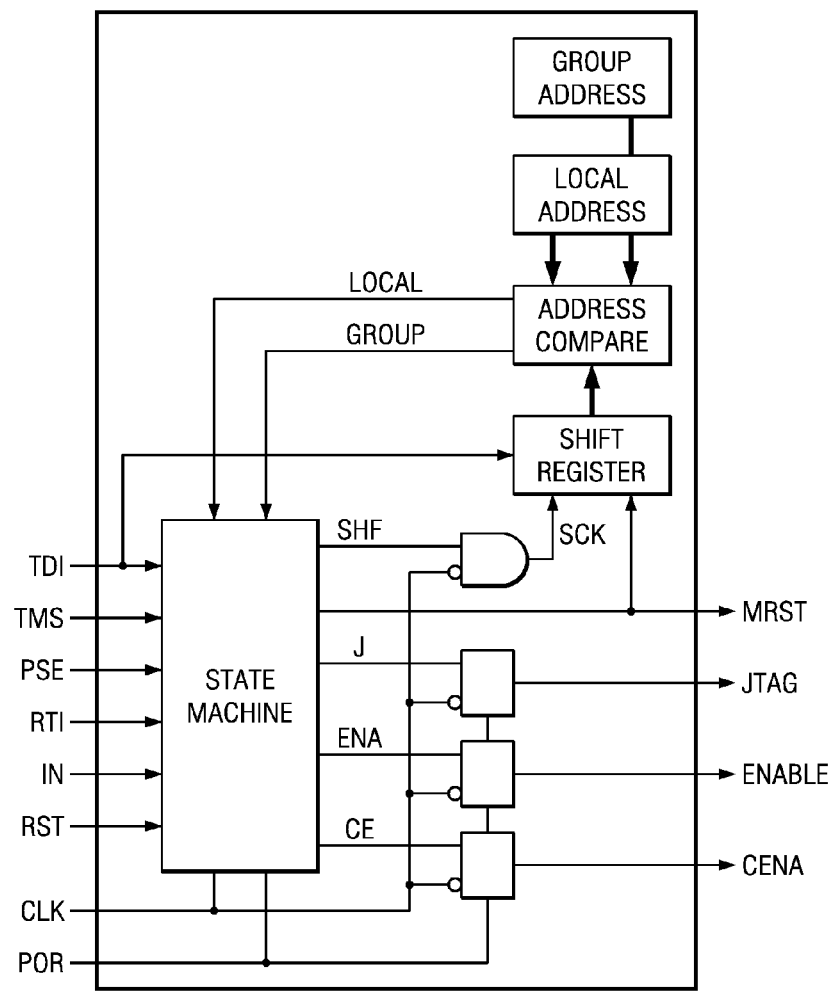
FIG. 80 illustrates the Master Controller used in the AJP of FIG. 78.

FIG. 80 shows the modified Master Controller 7806 of FIG. 78. A first modification is the deletion of the Trace output signal and FF 3314 of FIG. 33 since that signal is not required with the Trace Domains 3008. A second modification is to delete the command output of shift register 3304 of FIG. 33, resulting in the new shift register 8002 of FIG. 80. A third modification is to delete the command input signal to and the Trace output signal from the state machine 3302 of FIG. 33, resulting in the new state machine 8004 of FIG. 80.

Figure 81:
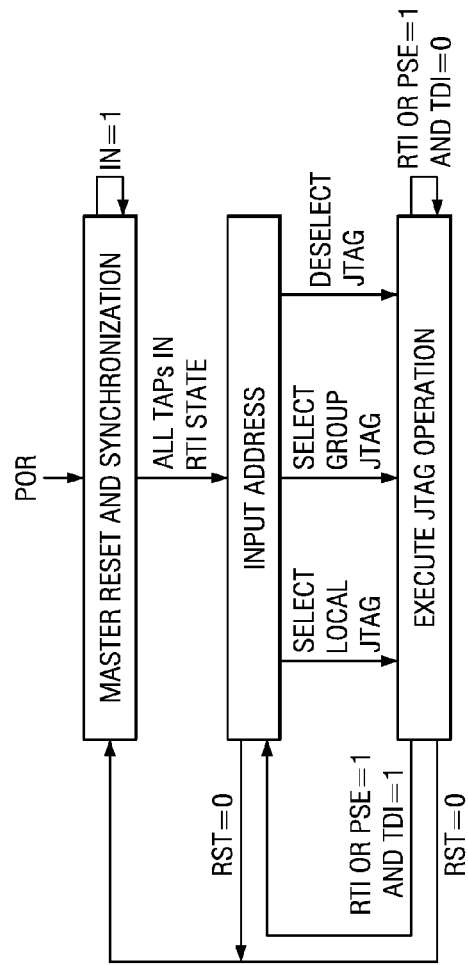
FIG. 81 illustrates the high level block operation of the Master Controller of FIG. 80.

FIG. 81 shows the high level block operation of state machine 8004 of FIG. 80. The operation consists of a Master Reset & Initialization block 8102, an Input Address block 8104, and an Execute JTAG block 8106.

Figure 82:
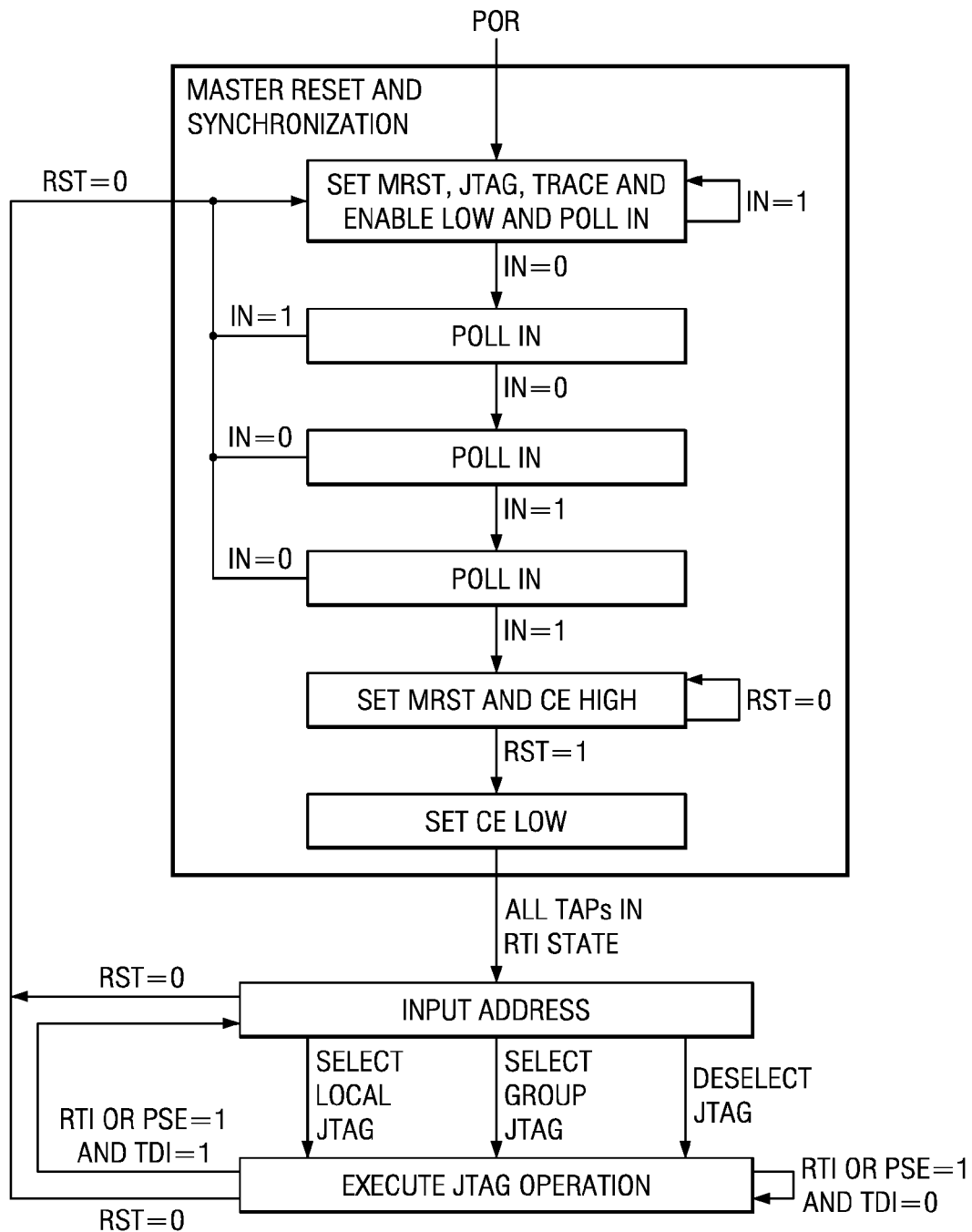
FIG. 82 illustrates the state diagram of the Master Reset & Synchronization block of FIG. 81.

FIG. 82 shows that the Master Reset & Initialization block 8102 of FIG. 81 is identical to the Master Reset & Initialization block 3402 of FIG. 35 with the exception that the Trace signal is not set low in state 8108 as it was in state 3502 of FIG. 35 since the Trace signal has been deleted.

Figure 83:
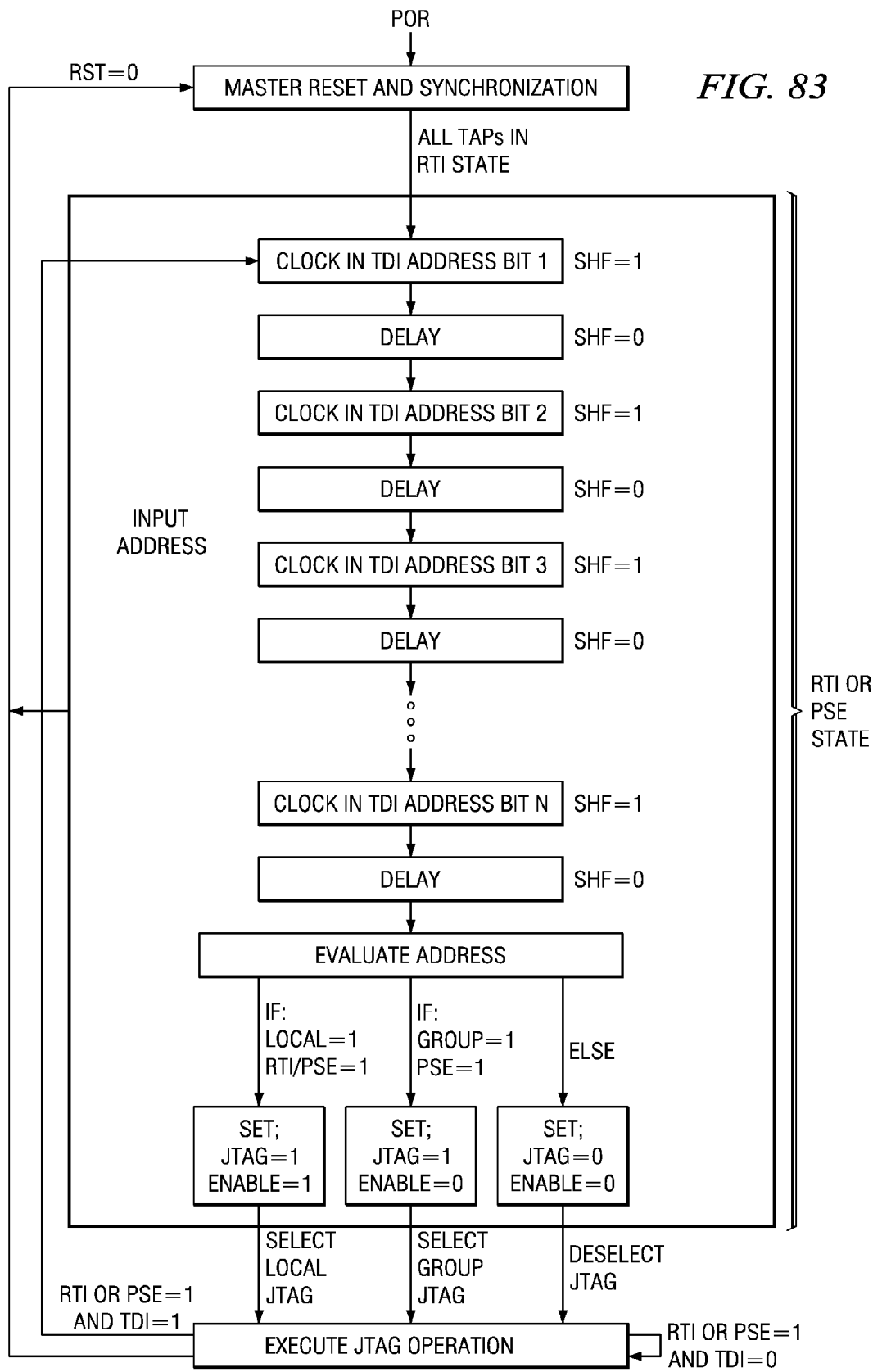
FIG. 83 illustrates the state diagram of the Input Address block of FIG. 81.

FIG. 83 shows that the Input Address block 8104 of FIG. 81 is similar to the Input Address & Command block 3406 of FIG. 36 with the following exceptions. The first exception is that only address bits (A1-AN) are shifted into shift register 8002 from TDI, since the command bit has been deleted. The second exception is that only the address is evaluated in the Evaluate Address state 8302 of FIG. 83 as opposed to the address and command being evaluated in state 3618 of FIG. 36. The result of the address evaluation in state 8302 is one of three actions 8304, 8306, or 8308. Action 8304 sets the JTAG and Enable signals high if the address matches the Local address and the TSM is in either the RTI or PSE state, selecting a Local JTAG operation. Action 8306 sets the JTAG signal high and the Enable signal low if the address matches the Group address and the TSM is in the PSE state, selecting a Group JTAG operation. Action 8308 sets the JTAG and Enable signals low if the address does not match either the Local or Group address, selecting no JTAG operation.

The Execute JTAG block 8106 of FIG. 83 is entered from the Input address block 8104. The Execute JTAG block 8106 is the same as the Execute JTAG & Trace Block 3408 of FIG. 36 except that only JTAG operations are performed in the Execute JTAG block 8106, as opposed to JTAG or Trace operations in the Execute JTAG & Trace Operation block 3408.

Figure 84:
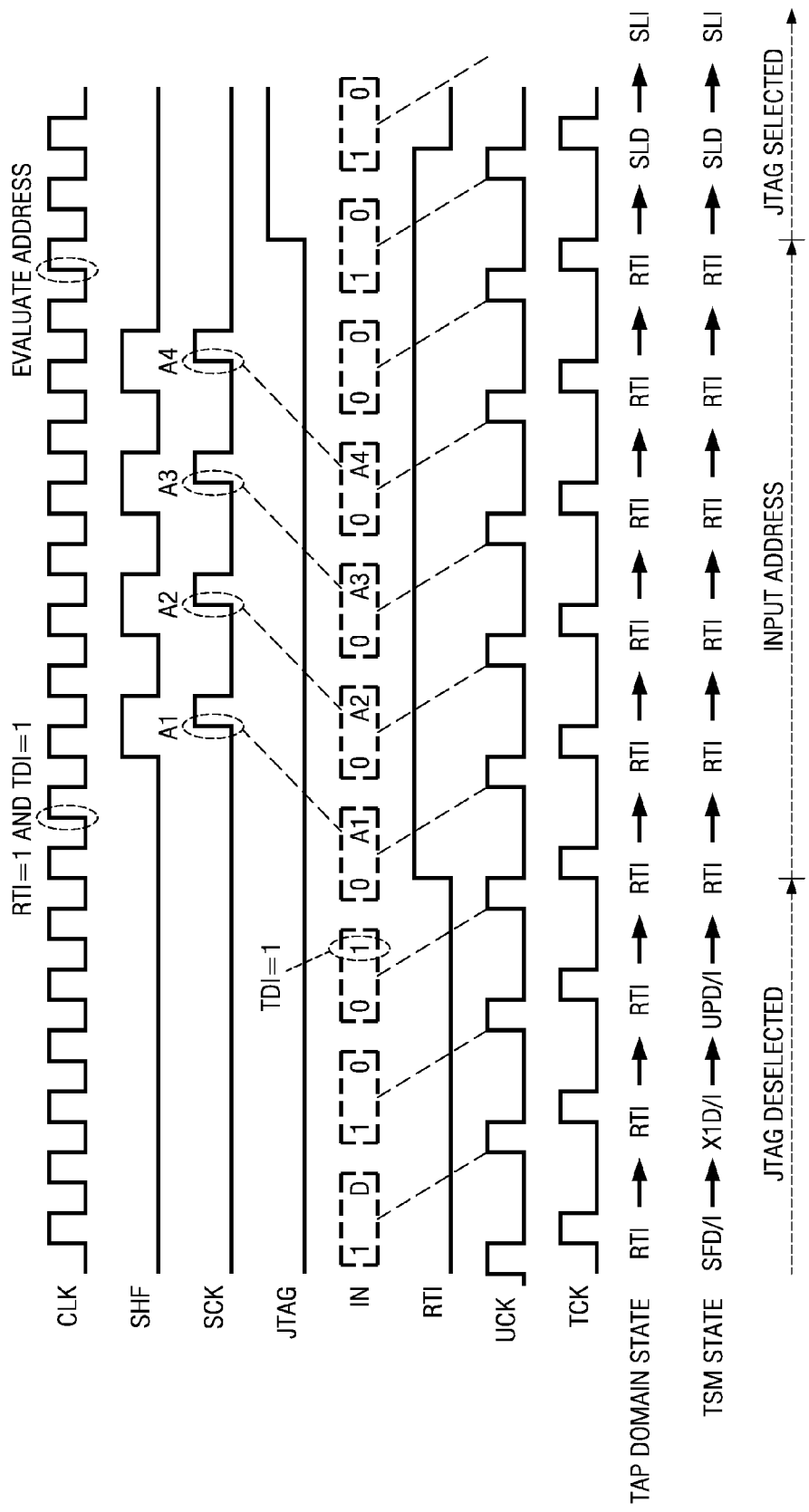
FIG. 84 illustrates an AJP timing example of selecting a JTAG operation in the Run Test/Idle state.

FIG. 84 shows the timing example of selecting a JTAG operation in the Run Test/Idle state. The timing of FIG. 84 is similar to that of FIG. 37 with the exception that only address bits are input to select the JTAG operation.

Figure 85:
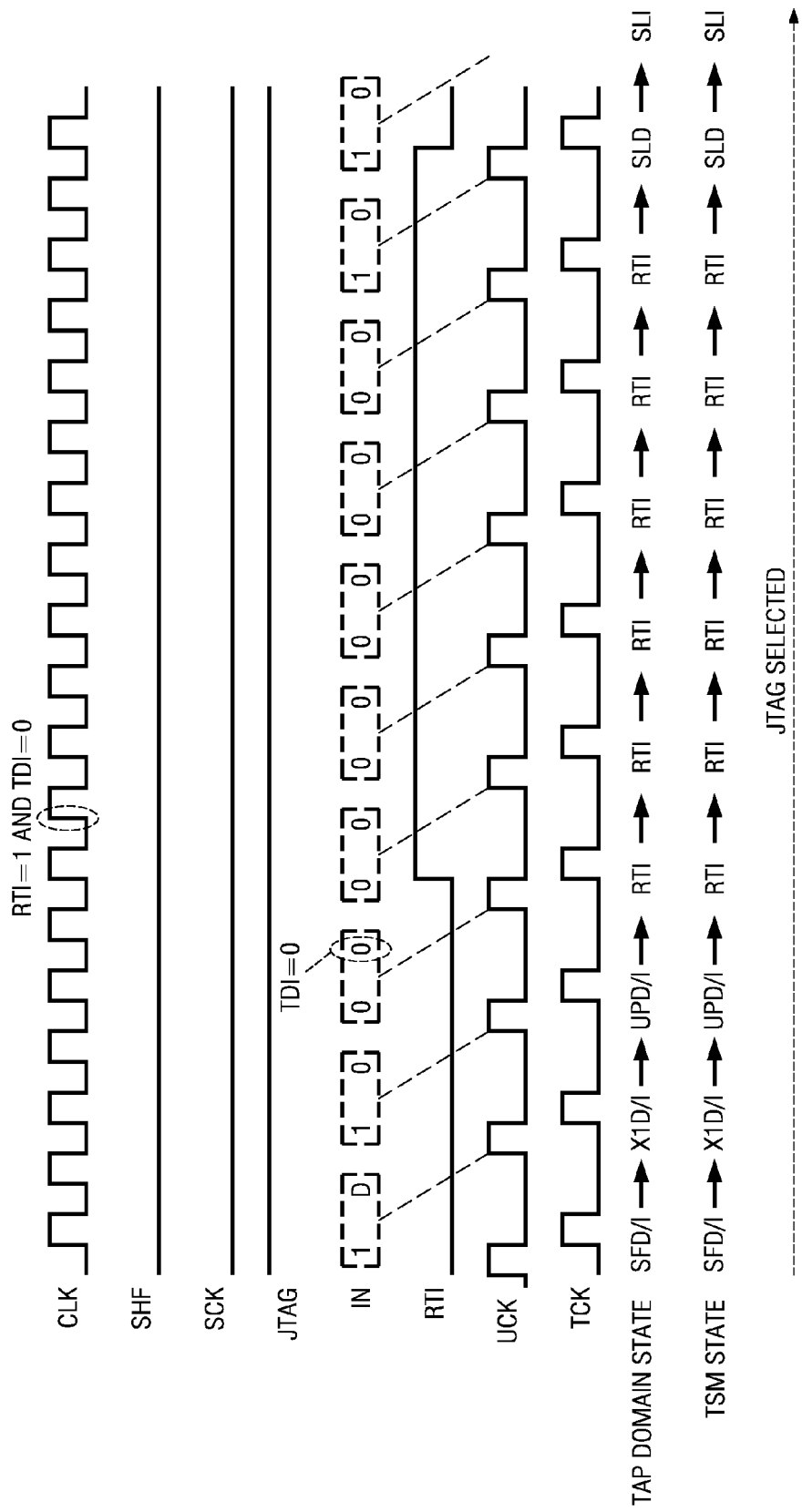
FIG. 85 illustrates an AJP timing example of JTAG operation through the Run Test/Idle state.

FIG. 85 shows the timing example of a selected JTAG operation passing through the Run Test/Idle state. The timing of FIG. 85 is identical to that of FIG. 38 with the exception that the Trace signal has been deleted.

Figure 86:
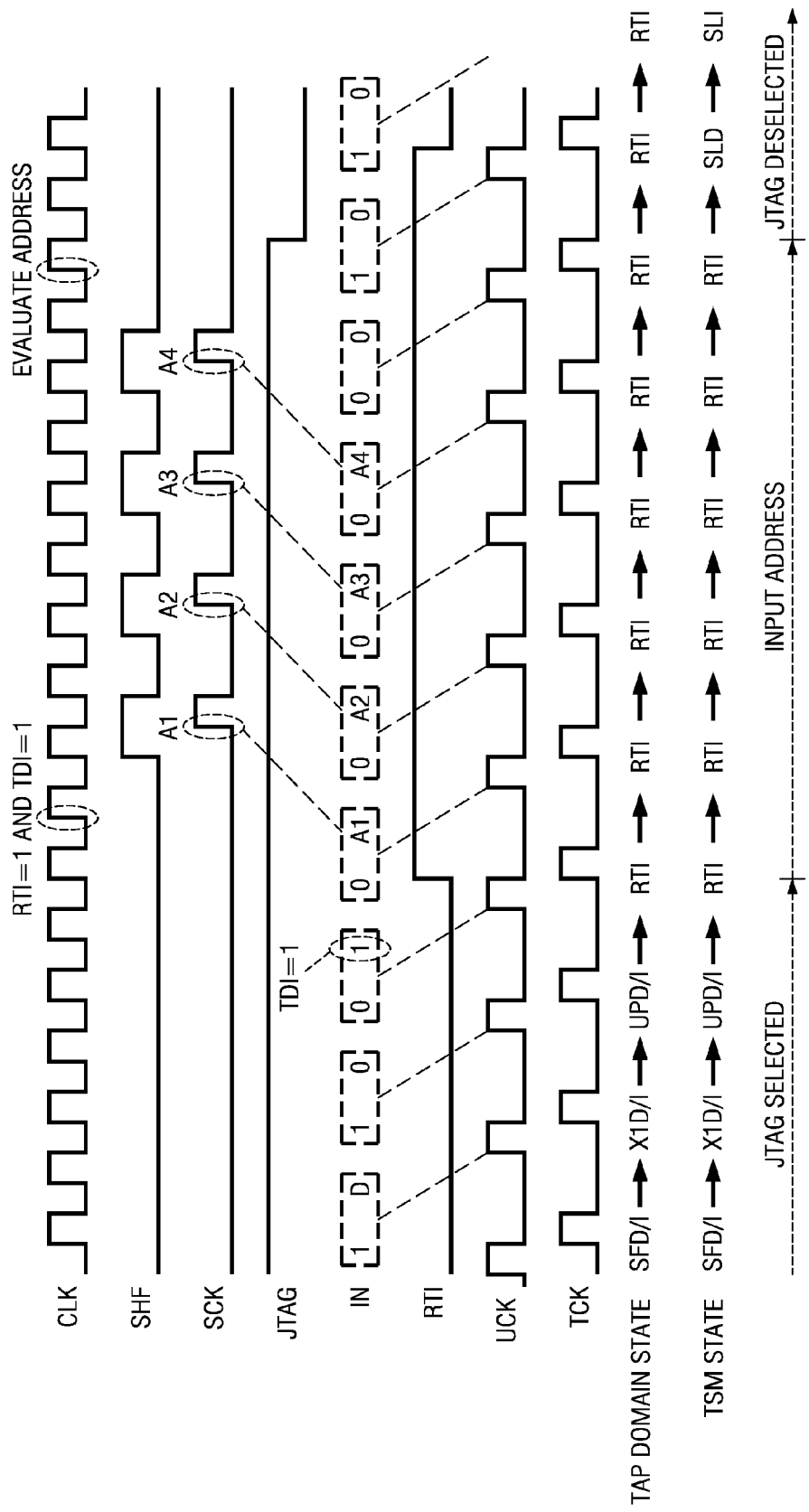
FIG. 86 illustrates an AJP timing example of de-selecting a JTAG operation in the Run Test/Idle state.

FIG. 86 shows the timing example of de-selecting a JTAG operation in the Run Test/Idle state. The timing of FIG. 86 is similar to that of FIG. 39 with the exception that only address bits are input to de-select the JTAG operation.

Figure 87:
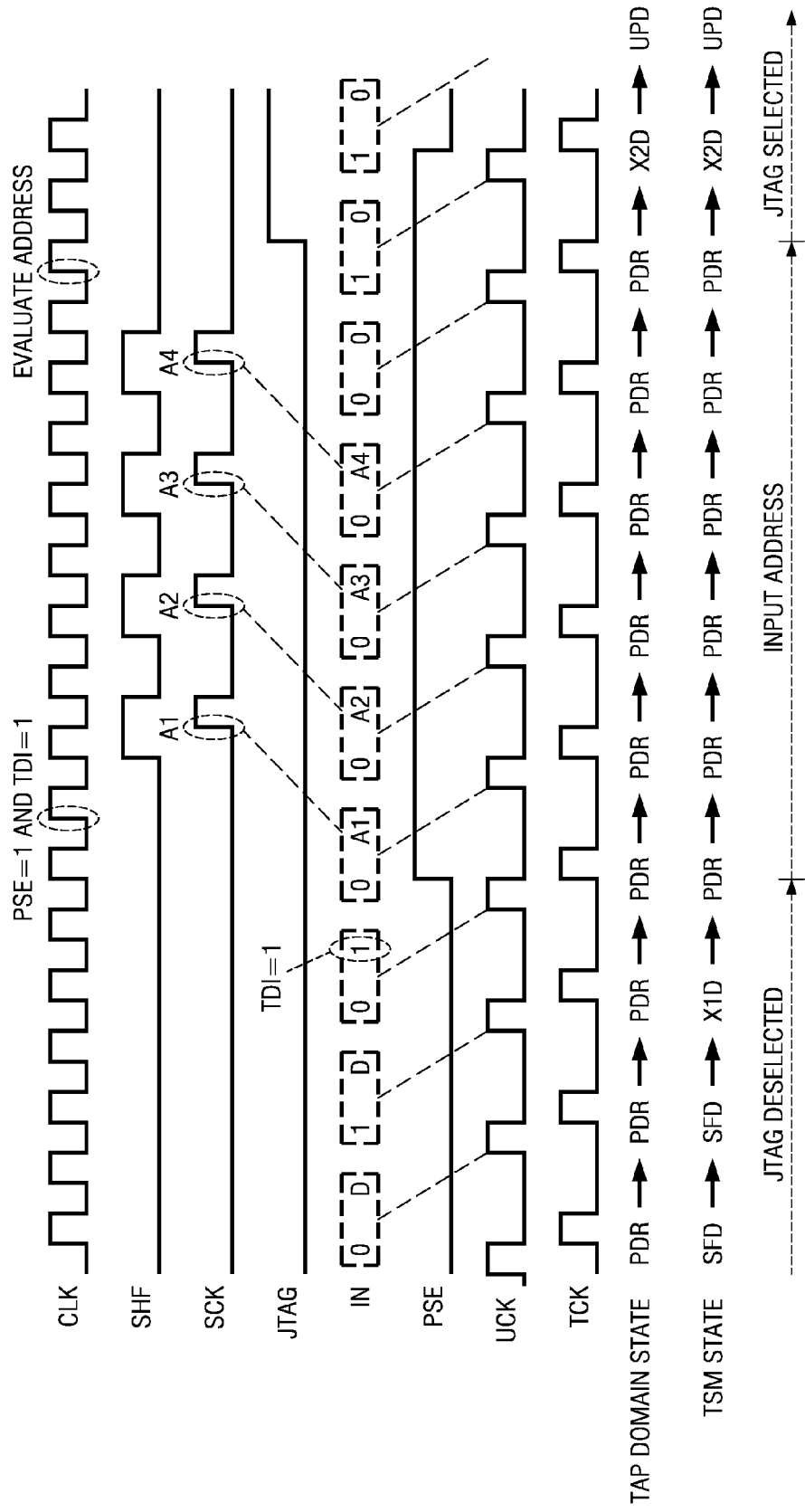
FIG. 87 illustrates an AJP timing example of selecting a JTAG operation in the Pause-DR state.

FIG. 87 shows the timing example of selecting a JTAG operation in the Pause-DR state. The timing of FIG. 87 is similar to that of FIG. 40 with the exception that only address bits are input to select the JTAG operation.

Figure 88:
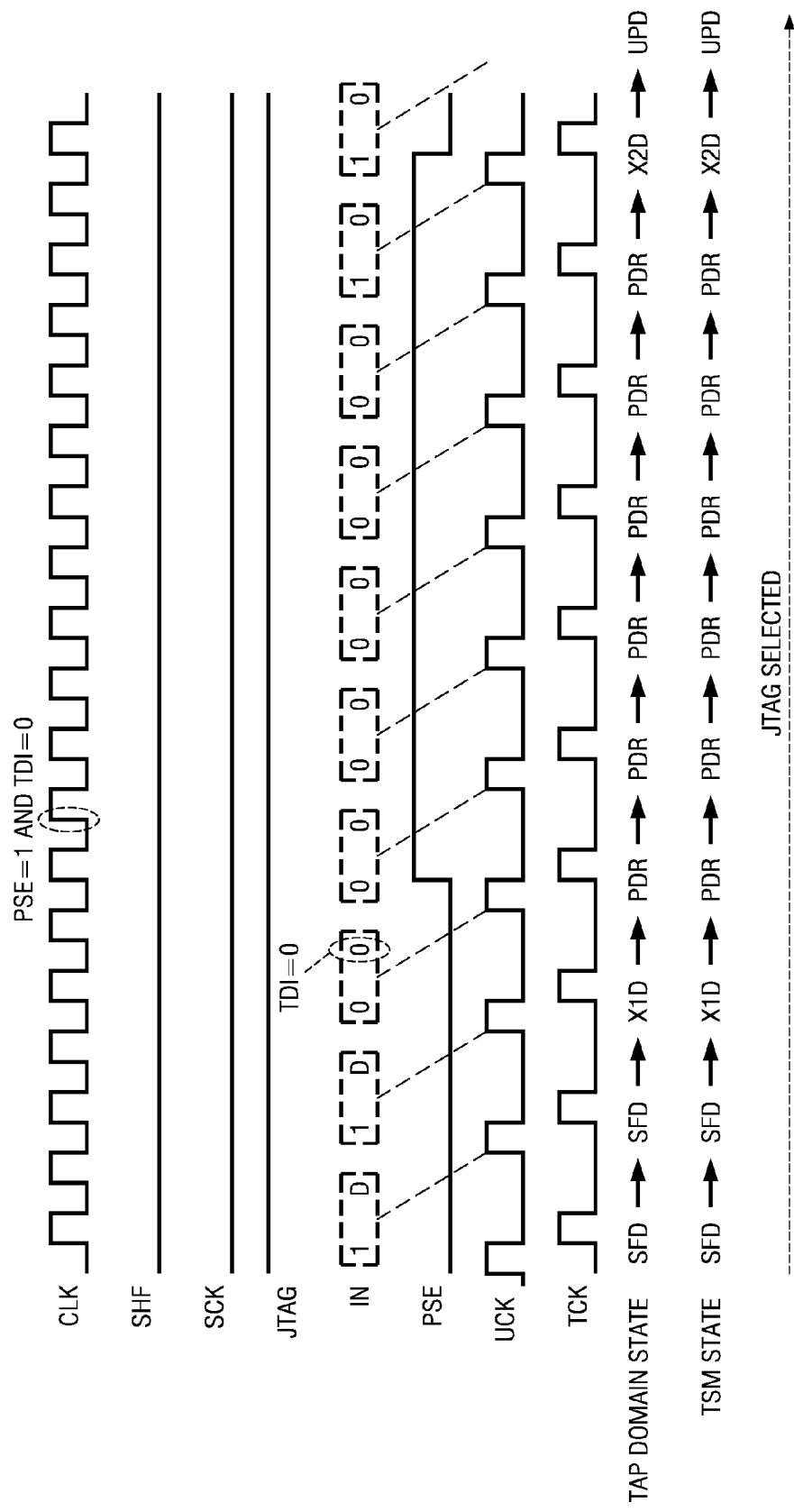
FIG. 88 illustrates an AJP timing example of JTAG operation through the Pause-DR state.

FIG. 88 shows the timing example of a selected JTAG operation passing through the Pause-DR state. The timing of FIG. 88 is identical to that of FIG. 41 with the exception that the Trace signal has been deleted.

Figure 89:
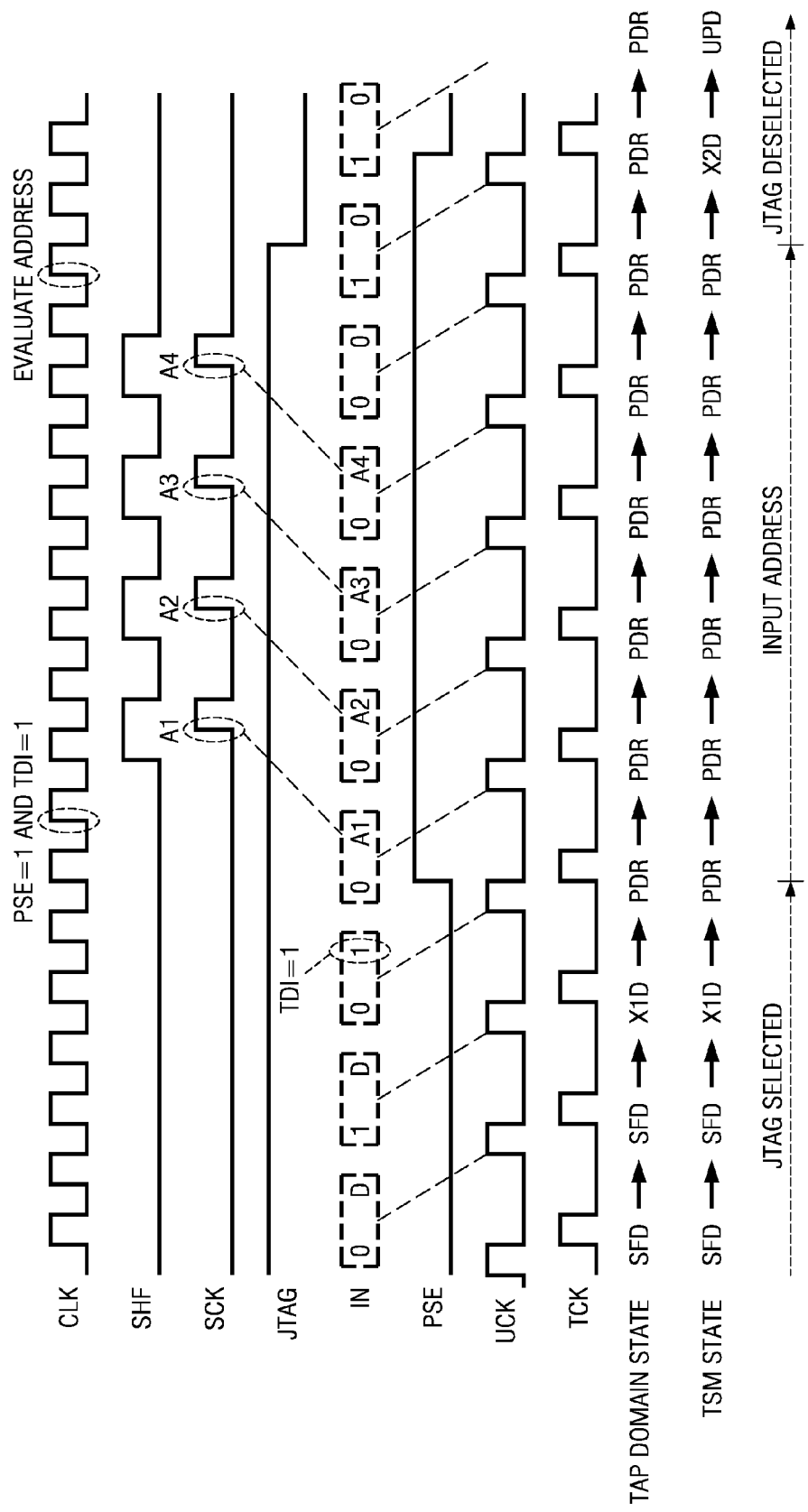
FIG. 89 illustrates an AJP timing example of de-selecting a JTAG operation in the Pause-DR state.

FIG. 89 shows the timing example of de-selecting a JTAG operation in the Pause-DR state. The timing of FIG. 89 is similar to that of FIG. 42 with the exception that only address bits are input to de-select the JTAG operation.

Figure 90:
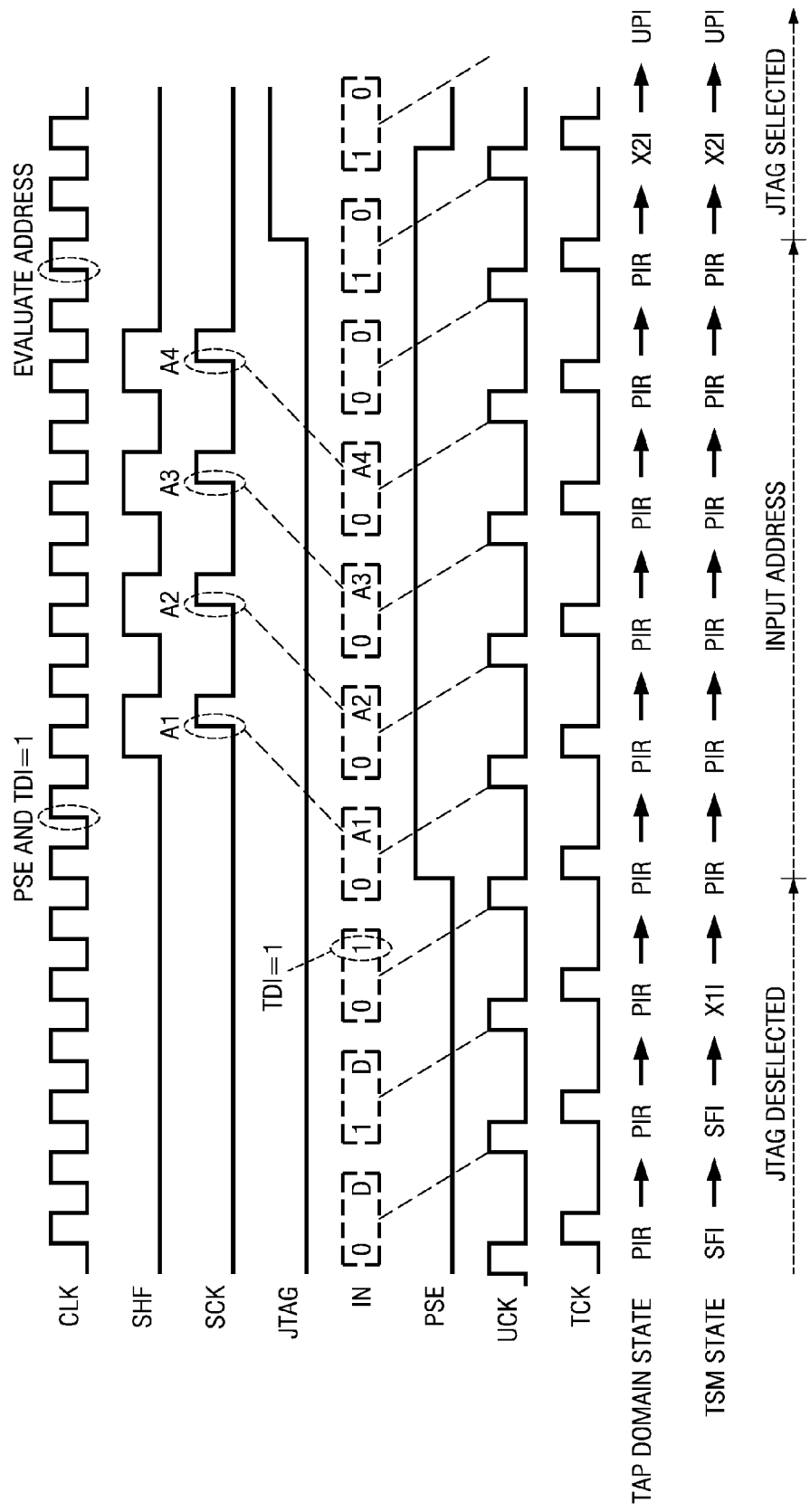
FIG. 90 illustrates an AJP timing example of selecting a JTAG operation in the Pause-IR state.

FIG. 90 shows the timing example of selecting a JTAG operation in the Pause-IR state. The timing of FIG. 90 is similar to that of FIG. 43 with the exception that only address bits are input to select the JTAG operation.

Figure 91:
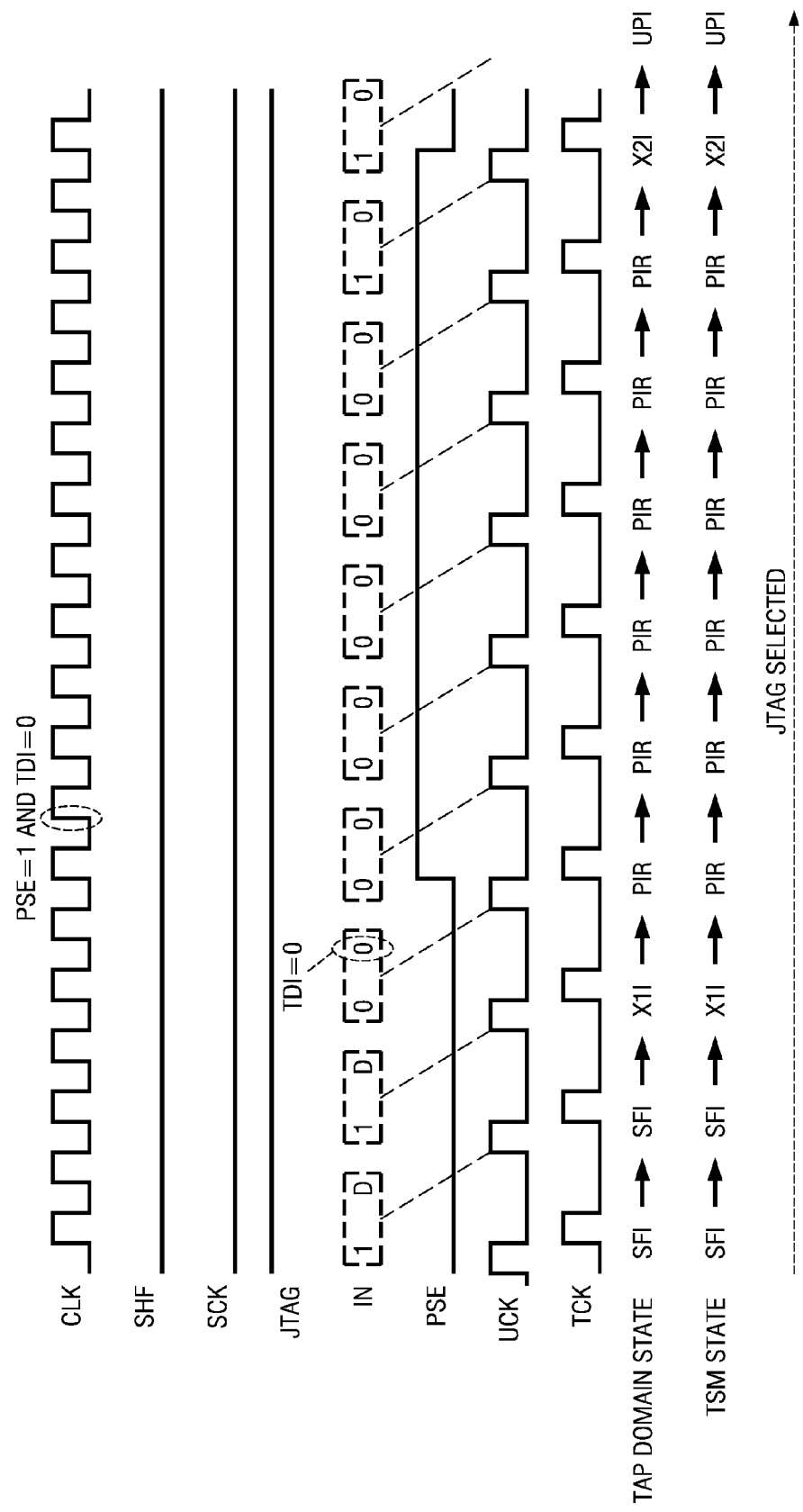
FIG. 91 illustrates an AJP timing example of JTAG operation through the Pause-IR state.

FIG. 91 shows the timing example of a selected JTAG operation passing through the Pause-IR state. The timing of FIG. 91 is identical to that of FIG. 44 with the exception that the Trace signal has been deleted.

Figure 92:
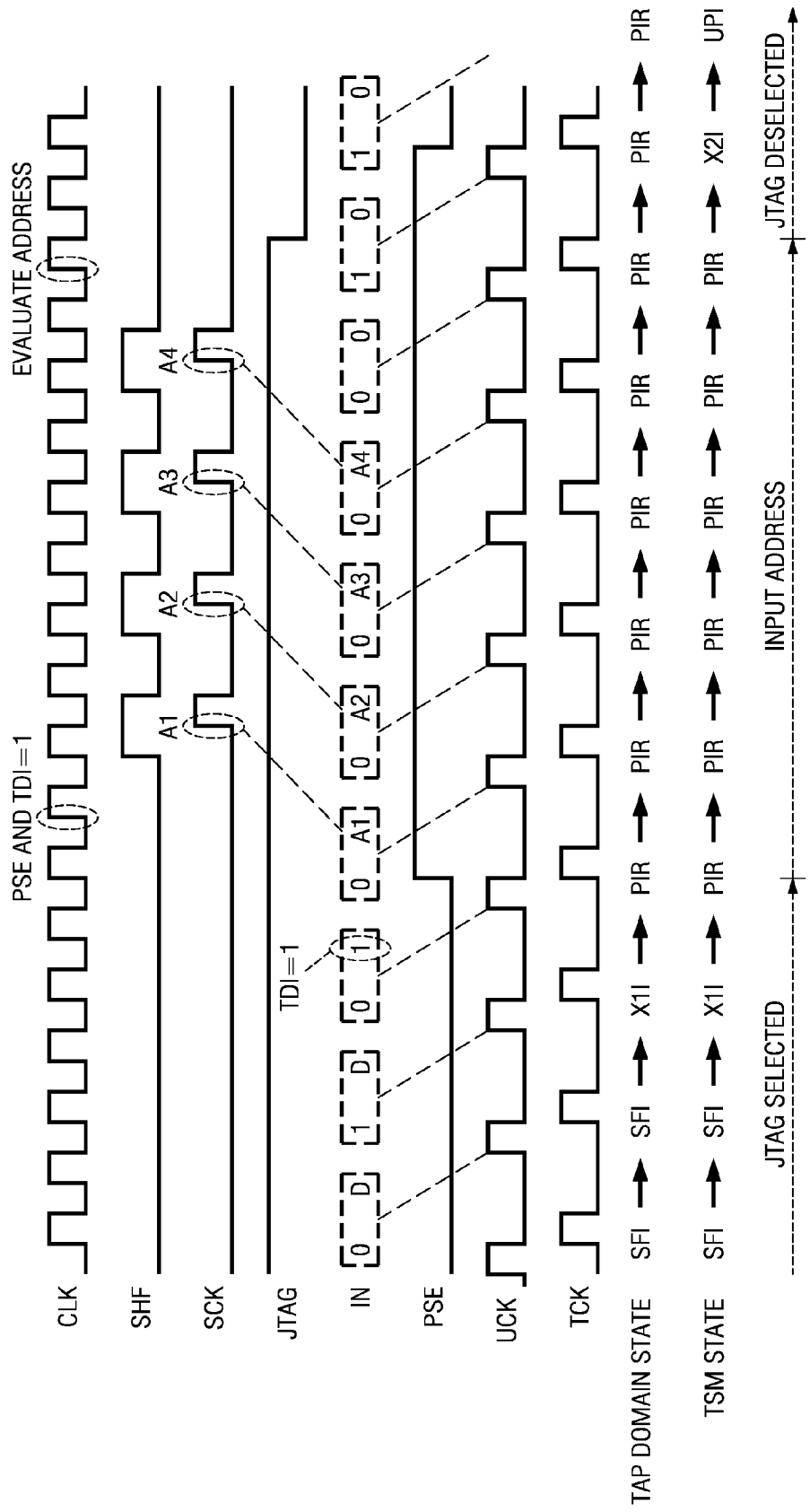
FIG. 92 illustrates an AJP timing example of de-selecting a JTAG operation in the Pause-IR state.

FIG. 92 shows the timing example of de-selecting a JTAG operation in the Pause-IR state. The timing of FIG. 92 is similar to that of FIG. 45 with the exception that only address bits are input to de-select the JTAG operation.

Figure 93:
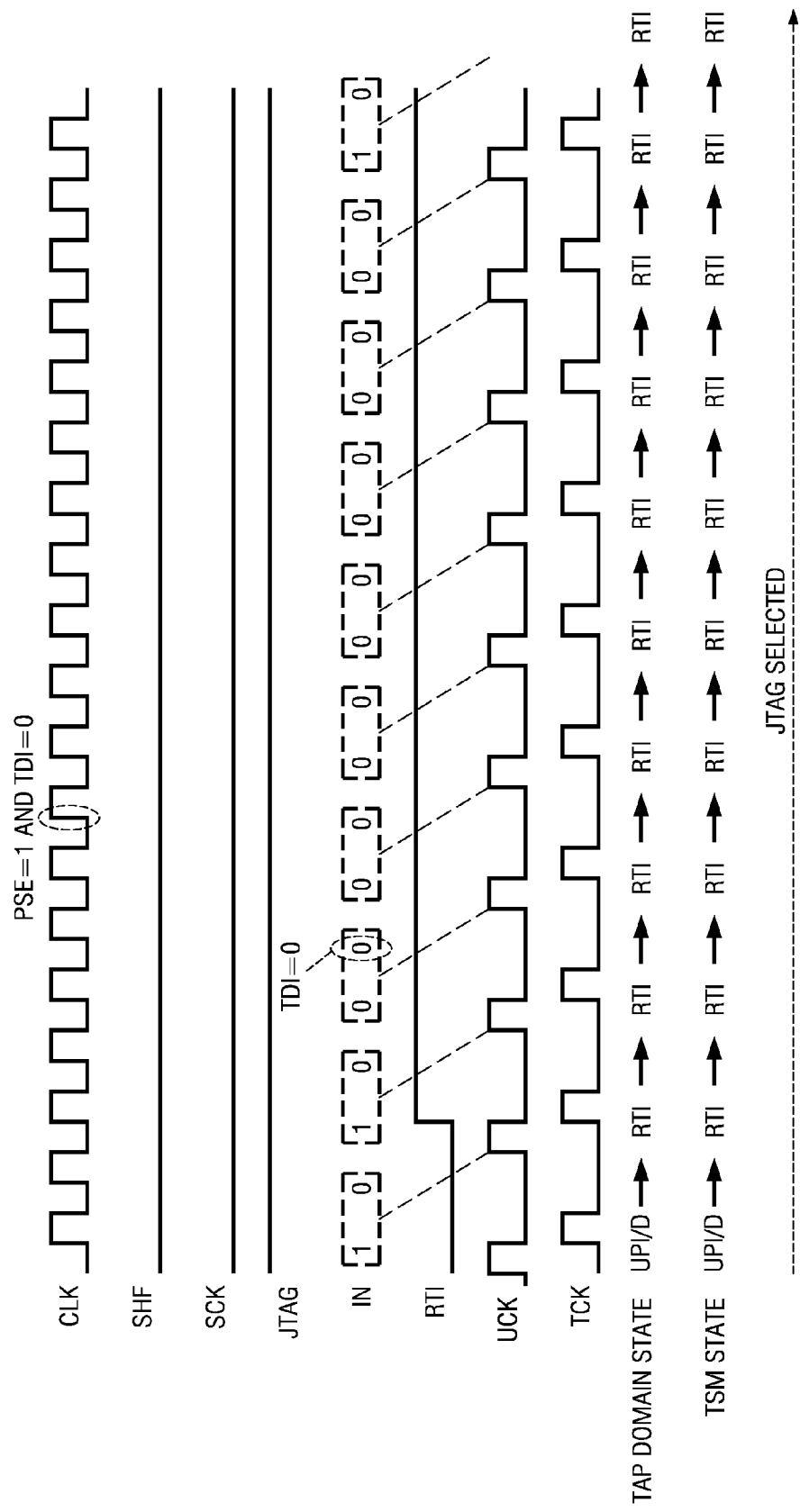
FIG. 93 illustrates an AJP timing example of transitioning a selected JTAG group from the Pause-IR or Pause-DR state to the Run Test/Idle state.

FIG. 93 shows the timing example of transitioning a selected JTAG group from the Pause-IR or Pause-DR state to the Run Test/Idle state. The timing of FIG. 93 is identical to that of FIG. 46 with the exception that the Trace signal has been deleted.

Figure 94:
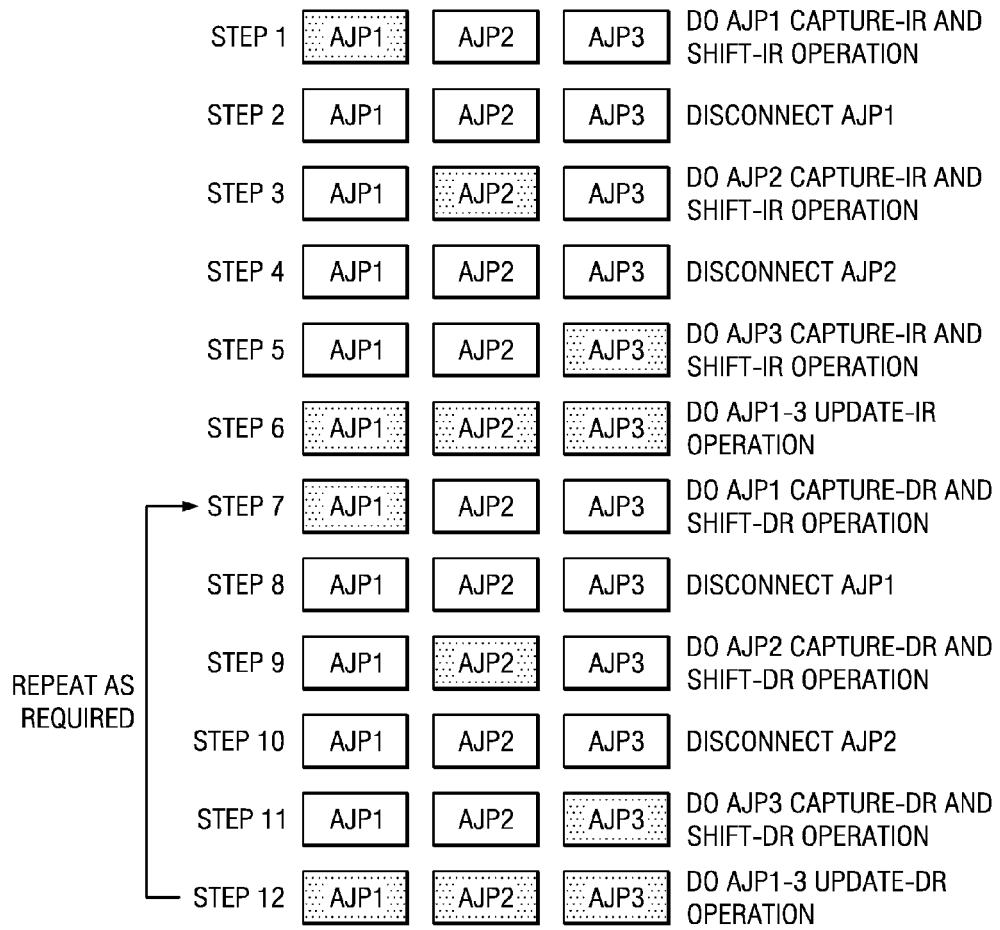
FIG. 94 illustrates the steps of performing a boundary scan operation on three target devices, each device having an Addressable JTAG Port (AJP).

FIG. 94 is provided to show that Addressable JTAG Ports (AJPs) 7804 can be operated to perform boundary scan testing on a plurality of target devices 7802, as previously described in FIG. 47 using Address & Command Ports (ACPs).

Step 1—In RTI, input Local AJP1 Address to select AJP1, then execute JTAG Instruction Scan ending in Pause-IR.

Step 2—In Pause-IR, input Disconnect Address to deselect AJP1, then transition TSM to RTI.

Step 3—In RTI, input Local AJP2 Address to select AJP2, then execute JTAG Instruction Scan ending in Pause-IR.

Step 4—In Pause-IR, input Disconnect Address to deselect AJP2, then transition TSM to RTI.

Step 5—In RTI, input Local AJP3 Address to select AJP3, then execute JTAG Instruction Scan ending in Pause-IR.

Step 6—In Pause-IR, input Group Address to select AJP1-3, then transition AJP1-3 through Update-IR to RTI.

Step 7—In RTI, input Local AJP1 Address to select AJP1, then execute JTAG Data Scan ending in Pause-DR.

Step 8—In Pause-DR, input Disconnect Address to deselect AJP1, then transition TSM to RTI.

Step 9—In RTI, input Local AJP2 Address to select AJP2, then execute JTAG Data Scan ending in Pause-DR.

Step 10—In Pause-DR, input Disconnect Address to deselect AJP2, then transition TSM to RTI.

Step 11—In RTI, input Local AJP3 Address to select AJP3, then execute JTAG Data Scan ending in Pause-DR.

Step 12—In Pause-DR, input Group Address to select AJP1-3, then transition AJP1-3 through Update-DR to RTI.

Steps 7-12 define one JTAG Capture-DR, Shift-DR, and Update-DR Boundary Scan Operation.

Figure 95:
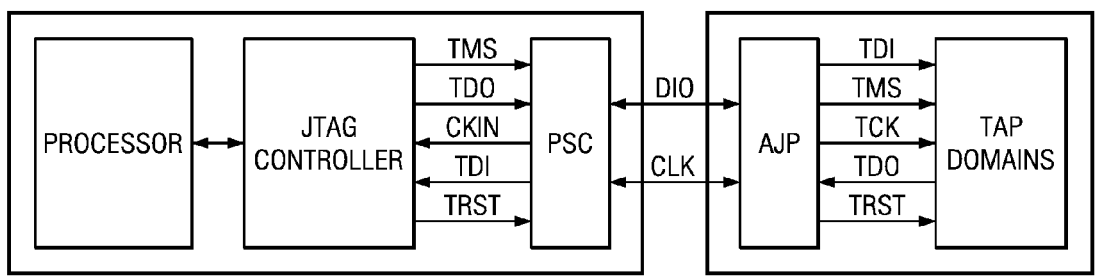
FIG. 95 illustrates the Addressable JTAG Port (AJP) of a target device coupled to a JTAG controller via DIO and CLK signals.

FIG. 95 is provided to show a controller 9502 that has been modified for communication with a target device 7802 that uses an AJP 7804 instead of an ACP 3004. The controller 9502 in FIG. 95 is different from controller 7302 of FIG. 73 in that it does not require the Trace Receiver 7304, since the target device 7802 does not include Trace Domains 3008. With this exception, the controller 9502 of FIG. 95 is identical to the controller 7302 of FIG. 73.

Figure 96:
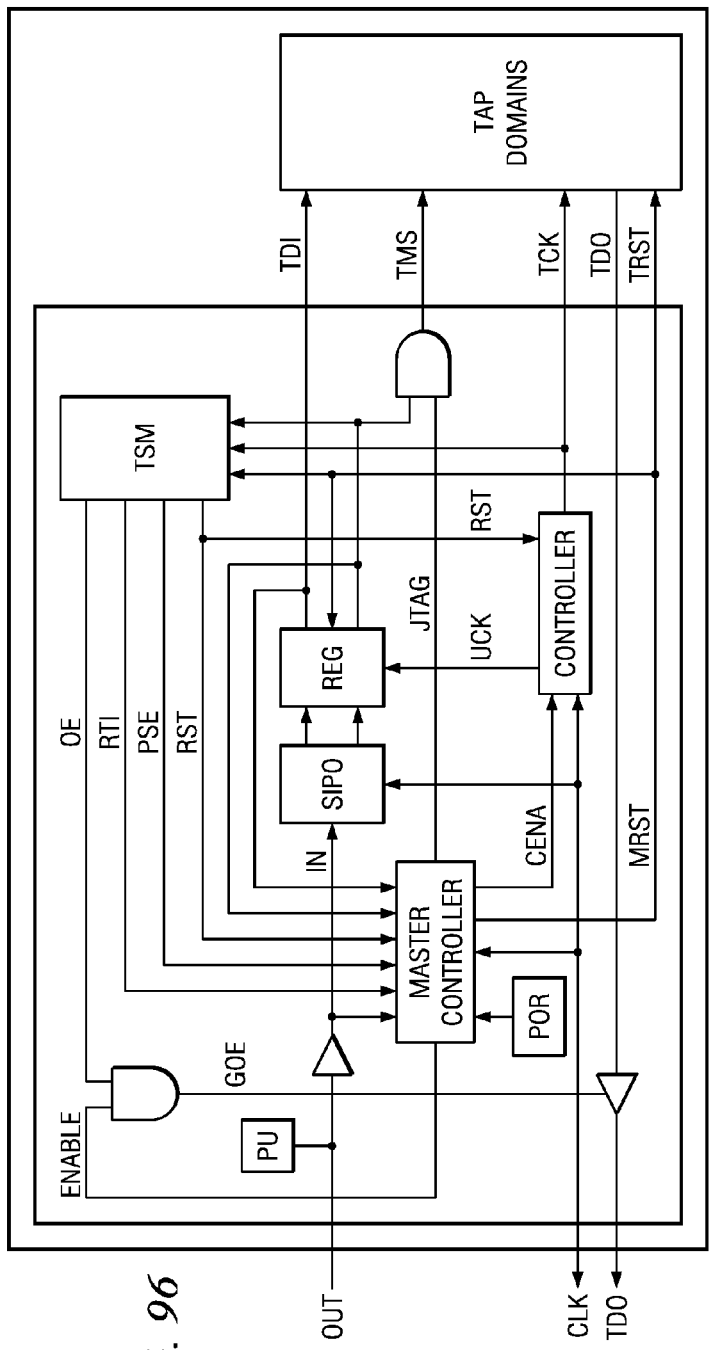
FIG. 96 illustrates an Addressable JTAG Port (AJP) of the present disclosure using a three signal interface.

FIG. 96 illustrates an AJP 9604 of a target device 9602 that has been modified to use a separate OUT input signal and a separate TDO output signal instead of the DIO signal used in AJP 7804 of FIG. 78. The modifications to the AJP 9604 include the use of a pull up element 1114 on the OUT input signal, an input buffer 1308 located between the OUT input signal and SIPO 702, a 3-state output buffer 1110 located between the TDO output of TAP domains 3006 and the TDO output signal, and deletion of the I/O circuit 710. All these modification were previously described in regard to the modified ACP of FIG. 76.

Figure 97:
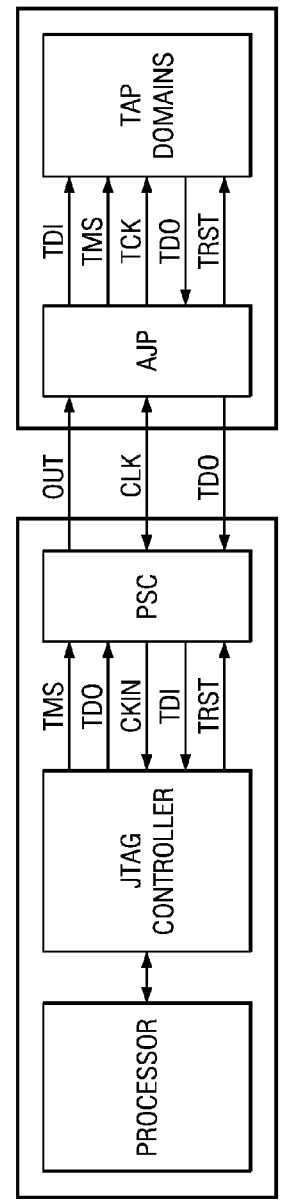
FIG. 97 illustrates the three signal interface Addressable JTAG Port (AJP) of FIG. 96 coupled to a JTAG controller that has been adapted for communication with the three signal interface.

FIG. 97 is provided to show a controller 9702 that has been modified for communication with the AJP 9604 of FIG. 96 using the separate OUT and TDO signals. The controller 9702 in FIG. 97 is different from controller 7302 of FIG. 77 in that it does not require the Trace Receiver, since the target device 9602 does not include Trace Domains 3008. Also the pull up element 7702 of FIG. 77 has been removed since, without the Trace Receiver, the TDO input does not need to be pulled up unless it is desired to do so. With these exceptions, the controller 9702 of FIG. 97 is identical to the controller 7302 of FIG. 77.

Although the present disclosure has been described in detail, it should be understood that various changes, substitutions and alterations may be made without departing from the spirit and scope of the disclosure as defined by the appended claims.

What is claimed is:

1. An integrated circuit comprising:
    (a) an address and command port having a data input and output lead, a clock in lead, a trace out lead, a trace clock out lead, a trace data in lead, a test data in lead, a test mode select out lead, a test clock out lead, and a test data out lead;
    (b) plural trace circuits, each trace circuit having a trace input connected to the trace out lead, a trace clock input connected to the trace clock out lead, a trace data output connected to the trace data in lead, a test data in input, a control input, and a test data out output; and
    (c) plural TAP domain circuits, each TAP domain circuit having a test data input connected to the test data in lead, a test mode select input connected to the test mode select out lead, a test clock input connected to the test clock out lead, a test data output connected to the test data out lead, a test data in output coupled to the test data in input of the trace circuitry, a control output coupled to the control input of the trace circuitry, and a test data out input coupled to the test data out output of the trace circuitry, there being one TAP domain circuit for each trace circuit.

2. The integrated circuit of claim 1 in which the address and command port includes serial input parallel output circuitry having a serial input coupled to the data input and output lead, a test mode select output, a test data output, and a clock input coupled to the clock in lead.

3. The integrated circuit of claim 1 in which the address and command port includes serial input parallel output circuitry having a serial input coupled to the data input and output lead, a test mode select output, a test data output, and a clock input coupled to the clock in lead, the address and command port including a register having inputs connected to the outputs of the serial input parallel output circuitry and having a select mode output coupled to the test mode select out lead, and a test in data output coupled to the test data in lead.

4. The integrated circuit of claim 1 in which the address and command port includes a run/test idle out lead and a ShiftDR out lead, and the trace circuitry includes a run/test idle input connected to the run/test idle out lead and a ShiftDR input connected to the ShiftDR out lead.

* * * * *